US012457736B2

(12) United States Patent
Namba

(10) Patent No.: US 12,457,736 B2
(45) Date of Patent: Oct. 28, 2025

(54) THREE-DIMENSIONAL MEMORY DEVICE CONTAINING ETCH STOP METAL PLATES FOR BACKSIDE VIA STRUCTURES AND METHODS FOR FORMING THE SAME

(71) Applicant: SANDISK TECHNOLOGIES LLC, Addison, TX (US)

(72) Inventor: Hiroaki Namba, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 711 days.

(21) Appl. No.: 17/857,375

(22) Filed: Jul. 5, 2022

(65) Prior Publication Data

US 2024/0015960 A1    Jan. 11, 2024

(51) Int. Cl.
| | |
|---|---|
| H10B 41/27 | (2023.01) |
| H01L 23/522 | (2006.01) |
| H01L 23/528 | (2006.01) |
| H10B 41/10 | (2023.01) |
| H10B 41/35 | (2023.01) |
| H10B 43/10 | (2023.01) |

(Continued)

(52) U.S. Cl.
CPC ......... *H10B 41/27* (2023.02); *H01L 23/5226* (2013.01); *H01L 23/5283* (2013.01); *H10B 41/10* (2023.02); *H10B 41/35* (2023.02); *H10B 43/10* (2023.02); *H10B 43/27* (2023.02); *H10B 43/35* (2023.02)

(58) Field of Classification Search
CPC .............. H10B 43/27; H01L 27/11556; H01L 23/5283; H01L 23/535; H01L 23/5226; H01L 27/11582

See application file for complete search history.

(56) References Cited

U.S. PATENT DOCUMENTS

| | | | |
|---|---|---|---|
| 6,075,712 A | 6/2000 | McMahon | |
| 10,354,987 B1 * | 7/2019 | Mushiga | ................. H01L 24/80 |

(Continued)

OTHER PUBLICATIONS

Invitation to Pay Additional Fee and Communication Relating to the Results of the Partial International Search for International Patent Application No. PCT/US2023/025298, mailed Nov. 5, 2023, 5 pages.

(Continued)

*Primary Examiner* — Christine S. Kim
*Assistant Examiner* — Andrew Victor Prostor
(74) *Attorney, Agent, or Firm* — THE MARBURY LAW GROUP PLLC

(57) ABSTRACT

A semiconductor structure includes an alternating stack of insulating layers and electrically conductive layers that is located on a front side of at least one semiconductor material layer; memory openings vertically extending through the alternating stack; memory opening fill structures; a dielectric material portion contacting sidewalls of the insulating layers of the alternating stack. In one embodiment, a connection via structure can vertically extend through the dielectric material portion, and a metal plate can contact the connection via structure. Alternately or additionally, an integrated via and pad structure may be provided, which includes a conductive via portion vertically extending through the dielectric material portion and a conductive pad portion located on an end of the conductive via portion.

11 Claims, 97 Drawing Sheets

(51) Int. Cl.
  *H10B 43/27* (2023.01)
  *H10B 43/35* (2023.01)

(56) References Cited

U.S. PATENT DOCUMENTS

| | | | |
|---|---|---|---|
| 10,453,798 | B2 | 10/2019 | Tsutsumi et al. |
| 10,453,854 | B2 | 10/2019 | Kanno et al. |
| 10,461,163 | B2 | 10/2019 | Kanakamedala et al. |
| 10,580,783 | B2 | 3/2020 | Cui et al. |
| 10,608,010 | B2 | 3/2020 | Terasawa et al. |
| 10,700,089 | B1 | 6/2020 | Hojo et al. |
| 2019/0148506 | A1 | 5/2019 | Kanakamedala et al. |
| 2019/0229125 | A1 | 7/2019 | Zhou et al. |
| 2020/0098787 | A1 | 3/2020 | Kaneko |
| 2020/0258816 | A1* | 8/2020 | Okina .................... H10B 43/40 |
| 2021/0225736 | A1 | 7/2021 | Kim et al. |
| 2022/0028879 | A1 | 1/2022 | Mochizuki et al. |
| 2022/0093629 | A1 | 3/2022 | Kim et al. |
| 2022/0208748 | A1 | 6/2022 | Rabkin et al. |
| 2022/0302146 | A1* | 9/2022 | Shimomura ........... H10B 43/35 |
| 2022/0328413 | A1* | 10/2022 | Kubo .................... H10B 41/27 |

OTHER PUBLICATIONS

U.S. Appl. No. 17/355,883, filed Jun. 23, 2021, Sandisk Technologies LLC.
U.S. Appl. No. 17/411,689, filed Aug. 25, 2021, Sandisk Technologies LLC.
U.S. Appl. No. 17/411,726, filed Aug. 25, 2021, Sandisk Technologies LLC.
U.S. Appl. No. 17/525,233, filed Nov. 12, 2021, Sandisk Technologies LLC.
U.S. Appl. No. 17/682,515, filed Feb. 28, 2022, Sandisk Technologies LLC.
U.S. Appl. No. 17/682,550, filed Feb. 28, 2022, Sandisk Technologies LLC.
U.S. Appl. No. 17/662,926, filed May 11, 2022, Sandisk Technologies LLC.
U.S. Appl. No. 17/857,335, filed Jul. 5, 2022, Sandisk Technologies LLC.
ISR—Notification of Transmittal of The International Search Report and Written Opinion of the International Searching Authority for International Patent Application No. PCT/US2023/025298, mailed Dec. 10, 2023, 13 pages.
IPRP—Notification Concerning Transmittal of International Preliminary Report on Patentability and Written Opinion of the International Searching Authority for International Patent Application No. PCT/US2023/025298, mailed Jan. 16, 2025, 8 pages.
USPTO Office Communication, Non-Final Office Action for U.S. Appl. No. 17/857,335, mailed May 9, 2025, 32 pages.

* cited by examiner

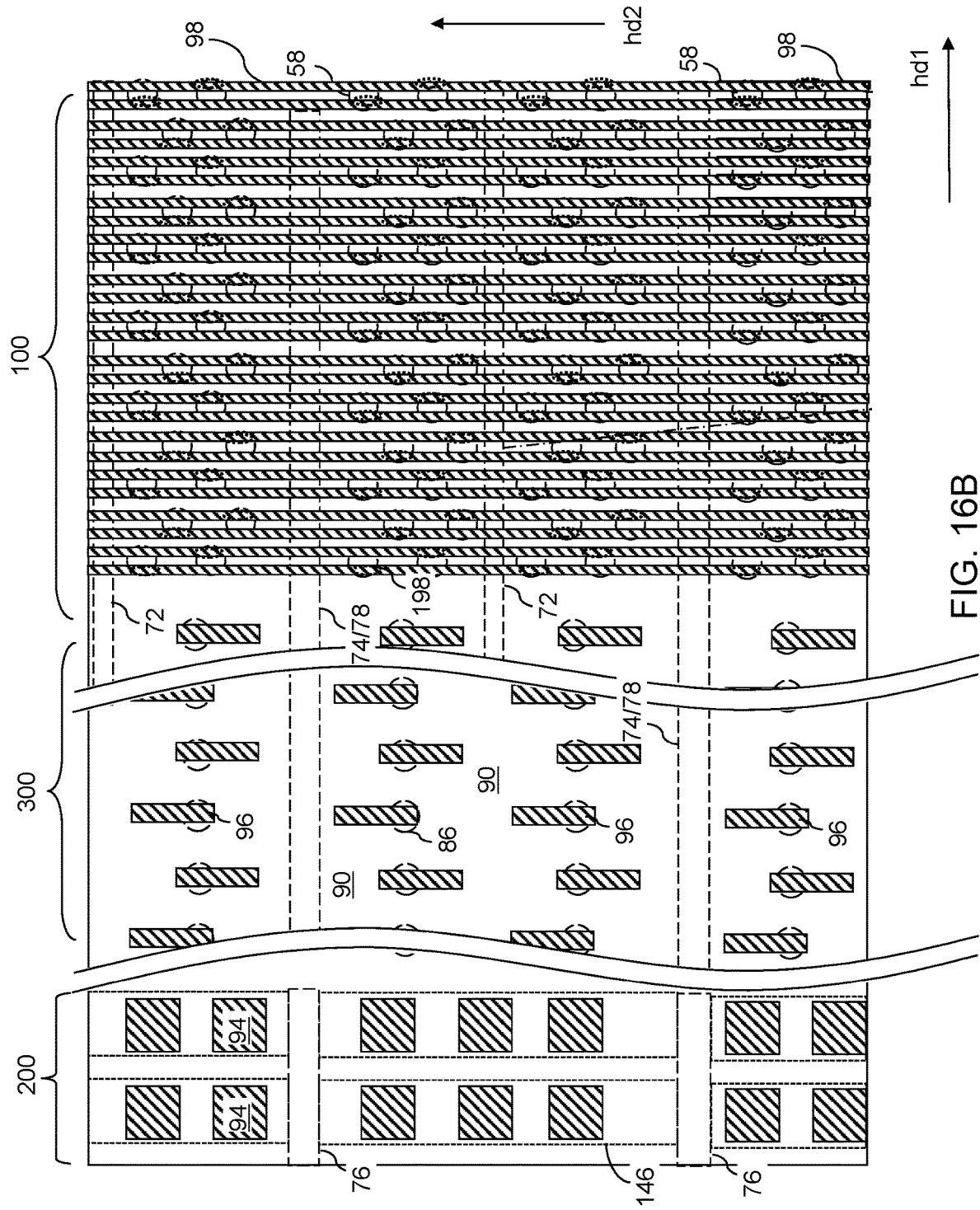

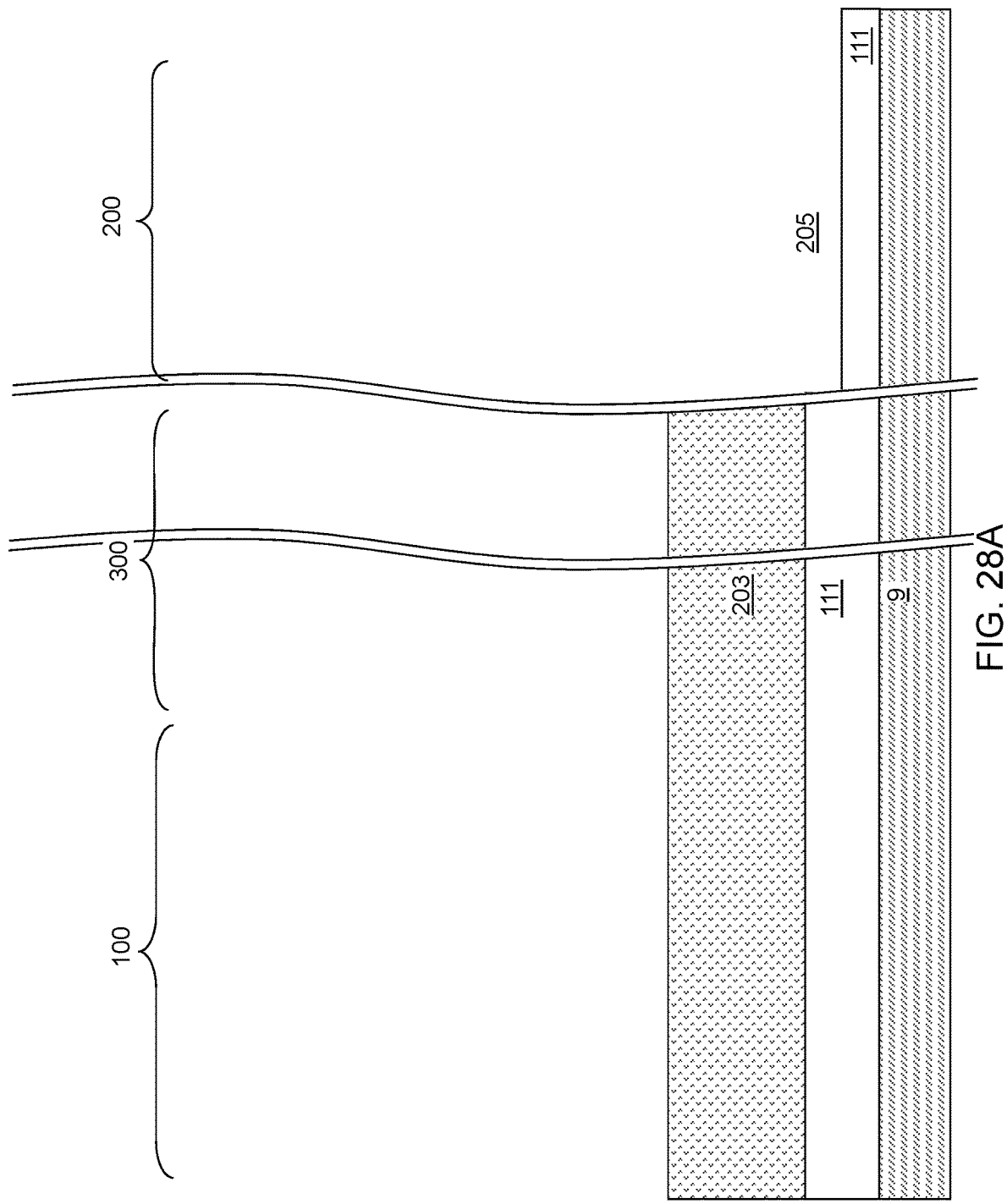

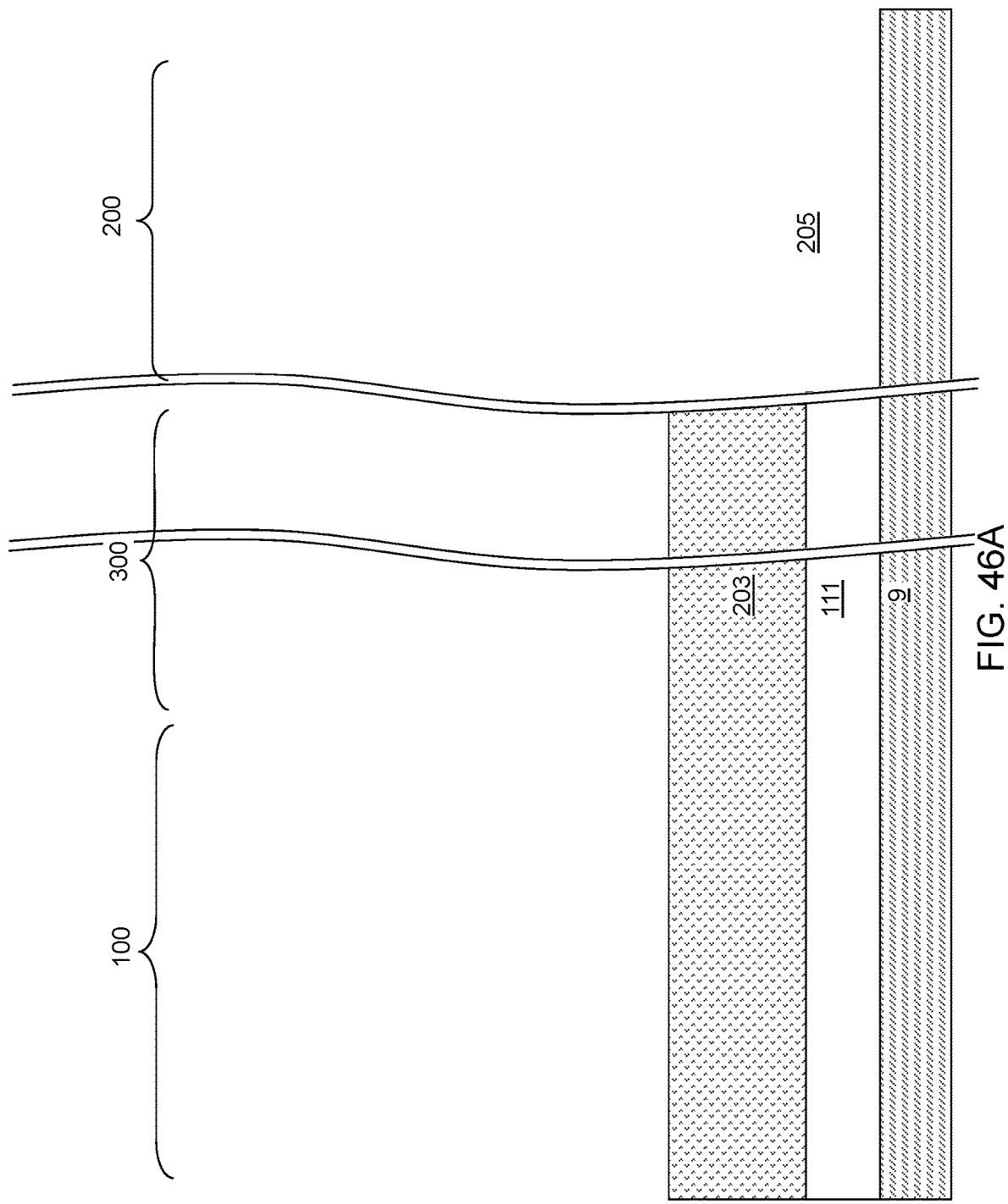

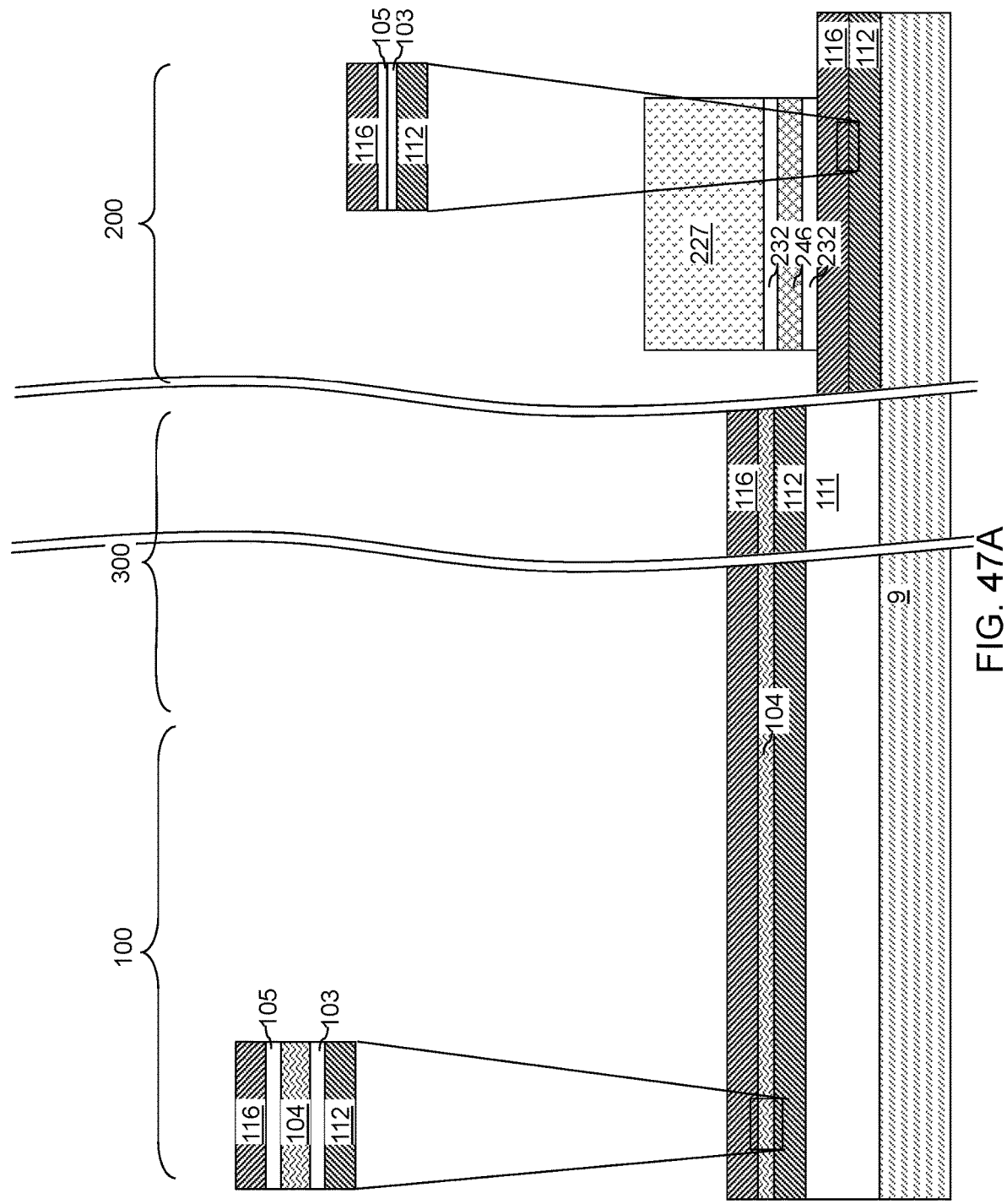

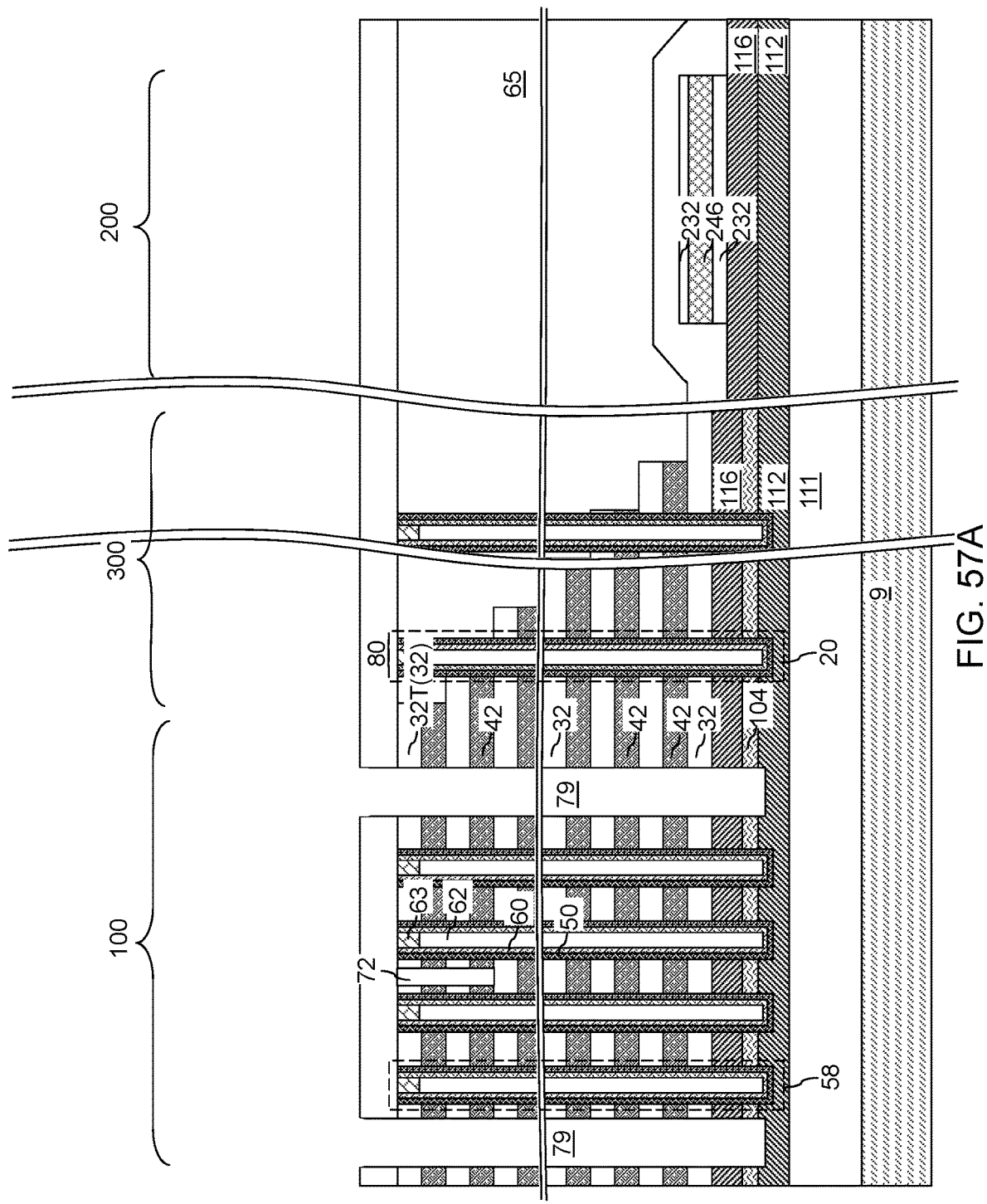

THREE-DIMENSIONAL MEMORY DEVICE CONTAINING ETCH STOP METAL PLATES FOR BACKSIDE VIA STRUCTURES AND METHODS FOR FORMING THE SAME

FIELD

The present disclosure relates generally to the field of semiconductor devices, and particularly to a three-dimensional memory device including etch stop metal plates which provide electrical connection for backside via structures and methods for forming the same.

BACKGROUND

Support circuitry for performing write, read, and erase operations of the memory cells in the vertical NAND strings may be provided by complementary metal oxide semiconductor (CMOS) devices formed on a same substrate as the three-dimensional memory device.

SUMMARY

According to an aspect of the present disclosure, a semiconductor structure is provided, which comprises: an alternating stack of insulating layers and electrically conductive layers; memory openings vertically extending through the alternating stack; memory opening fill structures located in the memory openings and comprising a respective vertical semiconductor channel and a respective vertical stack of memory elements; a dielectric material portion; contact via structures vertically extending through the dielectric material portion and contacting a respective one of the electrically conductive layers; and an integrated via and pad structure and contacting a front side of a conductive pad portion; and a backside contact pad structure contacting a planar backside surface of the integrated via and pad structure.

According to another aspect of the present disclosure, a method of forming a semiconductor structure is provided. The method comprises: forming an alternating stack of insulating layers and spacer material layers over at least one semiconductor material layer located over a first substrate, wherein the spacer material layers are formed as or are subsequently replaced with electrically conductive layers; forming a dielectric material portion; forming contact via cavities through the dielectric material portion on a respective one of the electrically conductive layers; forming a connection via cavity through the dielectric material portion into the at least one semiconductor material layer; forming a pad cavity be recessing portions of the at least one semiconductor material layer around a bottom region of the connection via cavity, wherein a continuous void comprising the connection via cavity and the pad cavity is formed; and forming contact via structures in the contact via cavities and forming an integrated via and pad structure in the continuous void.

According to an aspect of the present disclosure, a semiconductor structure is provided, which comprises: an alternating stack of insulating layers and electrically conductive layers that is located on a front side of at least one semiconductor material layer; memory openings vertically extending through the alternating stack; memory opening fill structures located in the memory openings and comprising a respective vertical semiconductor channel and a respective vertical stack of memory elements, wherein the at least one semiconductor material layer is in contact with the vertical semiconductor channels; a dielectric material portion; a connection via structure vertically extending through the dielectric material portion; a metal plate in contact with a proximal end surface of the connection via structure; and a backside contact pad structure in contact with the metal plate and spaced from the connection via structure by the metal plate.

According to another aspect of the present disclosure, a method of forming a semiconductor structure is provided, which comprises: forming an alternating stack of insulating layers and spacer material layers over at least one semiconductor material layer located over a first substrate, wherein the spacer material layers are formed as or are subsequently replaced with electrically conductive layers; forming a metal plate over the at least one semiconductor material layer; forming a dielectric material portion; forming memory openings through the alternating stack; forming memory opening fill structures in the memory openings, wherein each of the memory opening fill structures comprises a respective vertical semiconductor channel and a respective vertical stack of memory elements; forming a connection via structure through the dielectric material portion directly on a top surface of the metal plate; removing a portion of the at least one semiconductor material layer that have an areal overlap with the metal plate; and forming a backside contact pad structure directly on a backside surface of the metal plate.

BRIEF DESCRIPTION OF THE DRAWINGS

FIG. 16B is a partial see-through top-down view of the first exemplary structure of FIG. 16A. The vertical plane A-A' is the plane of the schematic vertical cross-sectional view of FIG. 16A.

FIGS. 28A and 28B are schematic vertical cross-sectional views of alternative configurations of the second exemplary structure after formation of a recess region in a buffer dielectric layer according to a second embodiment of the present disclosure.

FIG. 46A is a schematic vertical cross-sectional view of a third exemplary structure after formation of a recess region through a buffer dielectric layer according to a third embodiment of the present disclosure.

FIG. 47A is a schematic vertical cross-sectional view of the third exemplary structure after formation of in-process source-level material layers and plate stacks including a respective metal plate according to the third embodiment of the present disclosure.

FIG. 57A is a schematic vertical cross-sectional view of the fourth exemplary structure after formation of a contact-level dielectric layer and through-stack trenches according to the fourth embodiment of the present disclosure.

DETAILED DESCRIPTION

Figure 1:
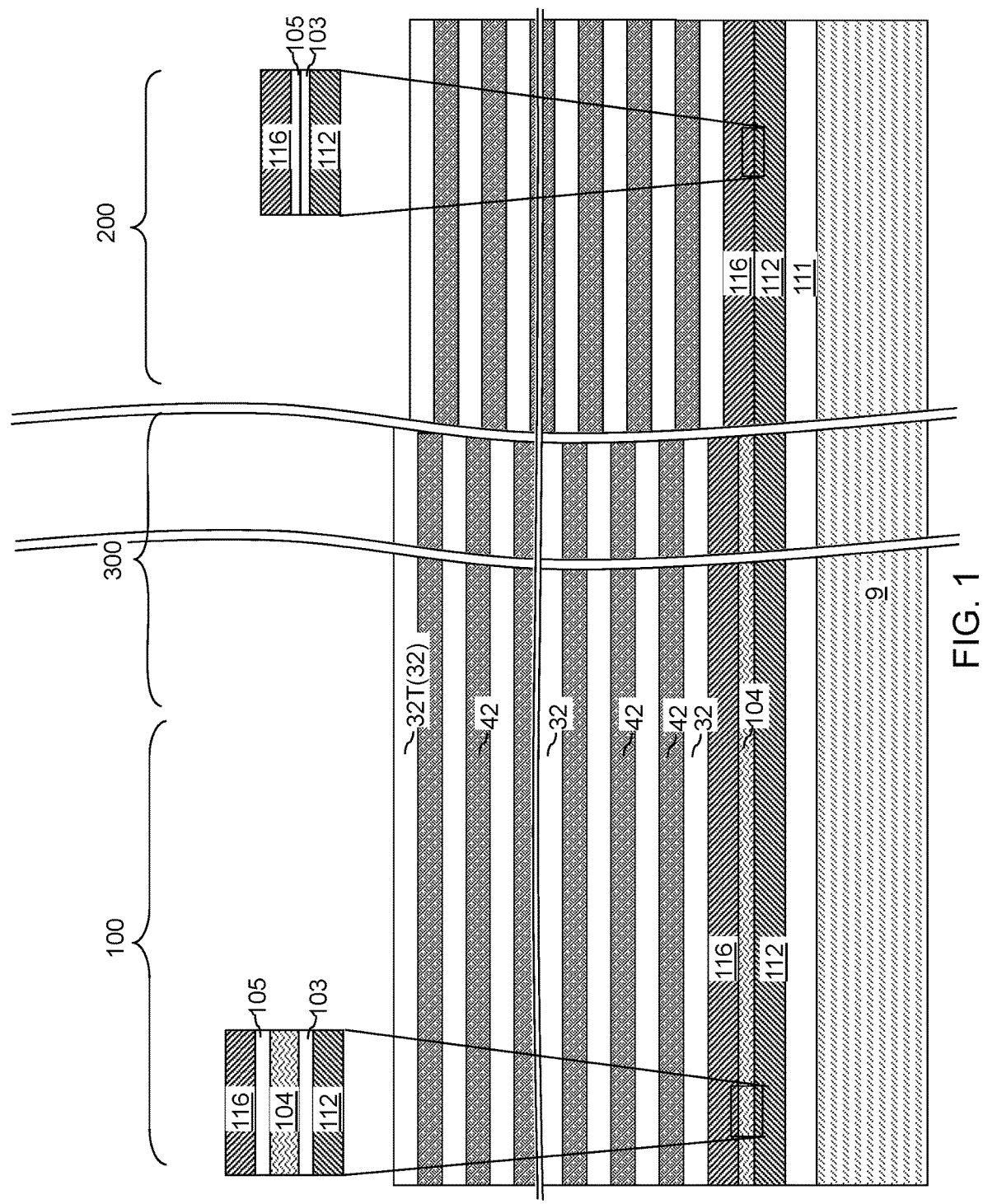
FIG. 1 is a schematic vertical cross-sectional view of a first exemplary structure after formation of a buffer dielectric layer, in-process source-level material layers, and an alternating stack of insulating layers and sacrificial material layers over a carrier substrate according to a first embodiment of the present disclosure.

As discussed above, embodiments of the present disclosure are directed to a three-dimensional memory device including etch stop metal plates which provide electrical connection for backside via structures and methods for forming the same, the various aspects of which are described below. The embodiments of the present disclosure can be used to form various structures including a multilevel memory structure, non-limiting examples of which include semiconductor devices such as three-dimensional memory array devices comprising a plurality of NAND memory strings. The embodiments of the present disclosure can be used to form a bonded assembly of multiple semiconductor dies including a memory die.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein. As used herein, a first electrical component is electrically connected to a second electrical component if there exists an electrically conductive path between the first electrical component and the second electrical component.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of dies therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. Each plane contains a number of memory blocks (or "blocks"), which are the smallest unit that can be erased by in a single erase operation. Each memory block contains a number of pages, which are the smallest units that can be selected for programming.

Referring to FIG. 1, a first exemplary structure according to a first embodiment of the present disclosure is illustrated. The first exemplary structure comprises a carrier substrate 9, which is also referred to as a first substrate. The carrier substrate 9 may comprise a semiconductor material, on insulating material, and/or a conductive material. In an illustrative example, the carrier substrate 9 may be a commercially available semiconductor wafer such as a single crystalline silicon wafer.

A buffer dielectric layer 111 can be deposited one a front-side of the carrier substrate 9. The buffer dielectric layer 111 includes a dielectric material that is different from the material of the carrier substrate 9. For example, a buffer dielectric layer 111 may comprise silicon oxide. The thickness of the buffer dielectric layer 111 may be in a range from 50 nm to 1,000 nm, such as from 100 nm to 500 nm, although lesser and greater thicknesses may also be employed.

In-process source-level material layers (112, 103, 104, 105, 116) can be deposited over the buffer dielectric layer 111. The in-process source-level material layers (112, 103, 104, 105, 116) may comprise, from bottom to top, a first source-level semiconductor layer 112 including a doped semiconductor material, a lower sacrificial dielectric liner 103, a source-level sacrificial layer 104 including a source-level sacrificial material, an upper sacrificial dielectric liner 105, and the second source-level semiconductor layer 116 including a doped semiconductor material. The doped semiconductor material of the second source-level semiconductor layer 116 may be the same as, or may be different from, the doped semiconductor material of the first source-level semiconductor layer 112. In one embodiment, vertical semiconductor channels to be subsequently formed may have a doping of a first conductivity type, and the first source-level semiconductor layer 112 and the second source-level semiconductor layer 116 may have a doping of a second conductivity type that is the opposite of the first conductivity type. Each of the first source-level semiconductor layer 112 and the second source-level semiconductor layer 116 may comprise undoped polysilicon or amorphous silicon layers having a thickness in a range from 100 nm to 1,000 nm, although lesser and greater thicknesses may also be employed.

The source-level sacrificial material of the source-level sacrificial layer 104 comprises a material that may be removed selective to the doped semiconductor materials of the first source-level semiconductor layer 112 and the second source-level semiconductor layer 116. The source-level sacrificial material of the source-level sacrificial layer 104 may comprise silicon nitride, a silicon-germanium alloy, undoped amorphous silicon, undoped polysilicon, organosilicate glass, or any other material that may be subsequently removed selective to the materials of the first source-level semiconductor layer 112 and the second source-level semiconductor layer 116. The source-level sacrificial layer 104 may be patterned such that portions of the source-level sacrificial layer 104 located in a connection via region 200 are removed, while the source-level sacrificial material layer 104 is present in the memory array region 100 and in the staircase region 300. The connection via region 200 is a region in which connection via structures are to be subsequently formed, the memory array region 100 is a region in which a three-dimensional memory array is to be subsequently formed, and the staircase region 300 is a region in which stepped surfaces of electrically conductive layers and layer contact via structures are to be subsequently formed. Thus, the source-level sacrificial layer 104 is located between the lower sacrificial dielectric liner 103 and the upper sacrificial dielectric liner 105 in the memory array region 100 and in the staircase region 300. The lower sacrificial dielectric liner 103 contacts the upper sacrificial dielectric liner 105 in the connection via region 300, and the source-level sacrificial layer 104 is absent in the connection via region 200. The thickness of the source-level sacrificial layer 104 may be in a range from 10 nm to 100 nm, such as from 20 nm to 50 nm, although lesser and greater thicknesses may also be employed. The lower dielectric liner 103 and the upper dielectric liner 105 comprise a sacrificial dielectric material such as silicon oxide, and may have a thickness in a range from 3 nm to 60 nm, such as from 15 nm to 30 nm, although lesser and greater thicknesses may also be employed.

A stack of an alternating plurality of first material layers (which can be insulating layers 32) and second material layers (which can be sacrificial material layer 42) is formed over the top surface of the in-process source-level material layers (112, 103, 104, 105, 116). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is used for the insulating layers 32, tetraethyl orthosilicate (TEOS) can be used as the precursor material for the CVD process. The second material of the sacrificial material layers 42 can be formed, for example, CVD or atomic layer deposition (ALD).

The topmost layer of the alternating stack (32, 42) may be an insulating layer 32, which is hereafter referred to as a topmost insulating layer 32T. The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While in the prior embodiment the spacer material layers are sacrificial material layers 42 that are subsequently replaced with electrically conductive layers, in other embodiments the sacrificial material layers are formed as electrically conductive layers. In such embodiments, steps for replacing the spacer material layers with electrically conductive layers can be omitted. Generally, an alternating stack (32, 42) of insulating layers 32 and spacer material layers can be formed over at least one semiconductor material layer (112, 104, 116). The spacer material layers are formed as, or are subsequently replaced with, electrically conductive layers.

Figure 2:
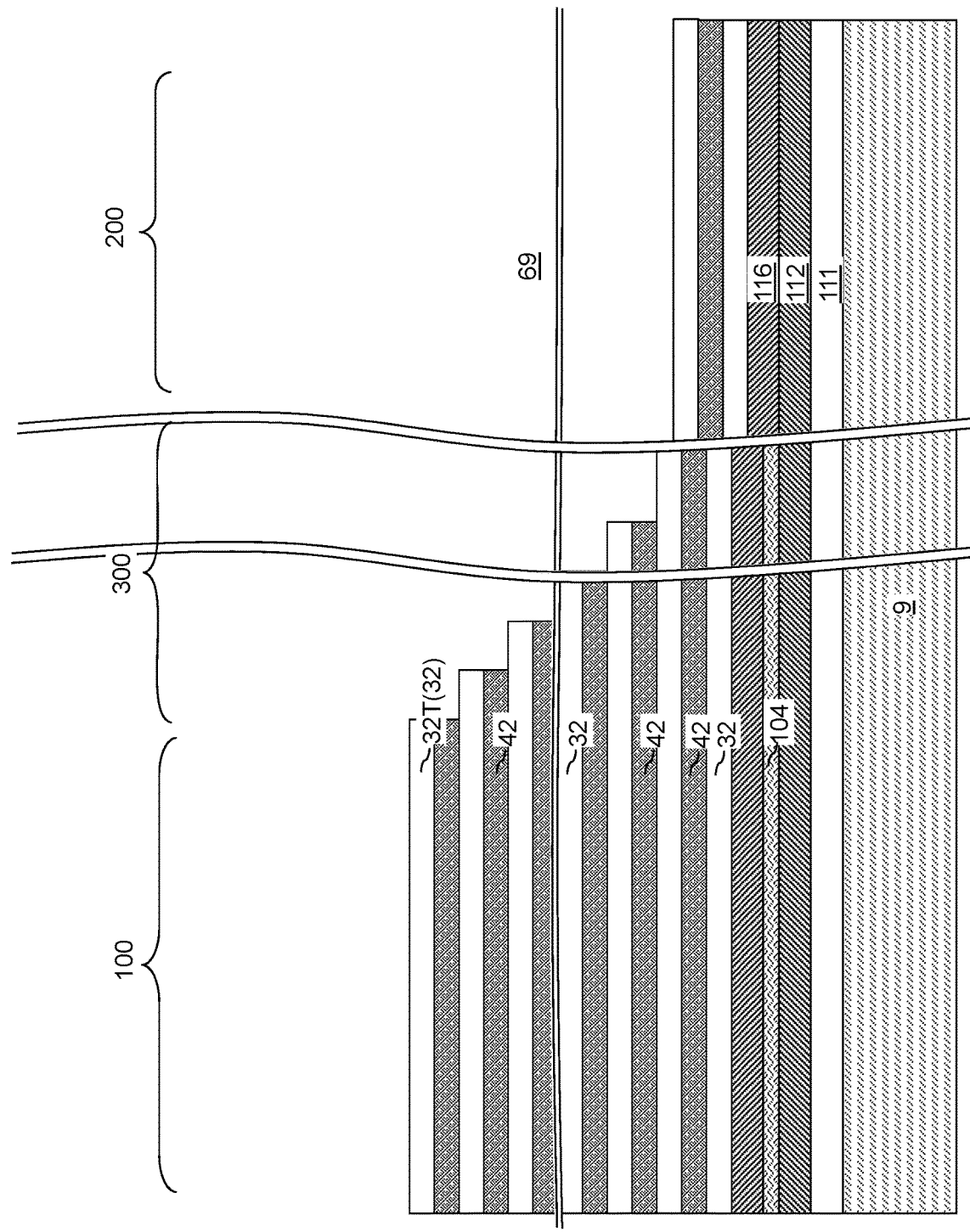
FIG. 2 is a schematic vertical cross-sectional view of the first exemplary structure after formation of stepped surfaces according to the first embodiment of the present disclosure.

Referring to FIG. 2, stepped surfaces are formed by patterning the alternating stack (32, 42). The region including the stepped surfaces is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity 69 is formed within the volume from which portions of the alternating stack (32, 42) are removed through formation of the stepped surfaces. A "stepped cavity" refers to a cavity having stepped surfaces.

The stepped cavity 69 can have various stepped surfaces such that the horizontal cross-sectional shape of the stepped cavity changes in steps as a function of the vertical distance from the bottom surface of the buffer dielectric layer 111. In one embodiment, the stepped cavity 69 can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

In one embodiment, all layers of the alternating stack (32, 42) other than the bottommost insulating layer 32, the bottommost sacrificial material layer 42, and an insulating layer 32 immediately overlying the bottommost a sacrificial material layer 42 may be patterned to provide stepped surfaces. In this case, each layer of the alternating stack (32, 42) other than the bottommost insulating layer 32, the bottommost sacrificial material layer 42, and an insulating layer 32 immediately overlying the bottommost a sacrificial material layer 42 may have a respective physically exposed sidewall that is exposed to the stepped cavity 69. In one embodiment, each physically exposed sidewall of a sacrificial material layer 42 may be vertically coincident with a physically exposed sidewall of a respective overlying or underlying insulating material layer 32. Upon formation of the stepped surfaces, lateral extents of the sacrificial material layers 42 decrease with a vertical distance from the in-process a source-level material layers (112, 103, 104, 105, 116).

Figure 3:
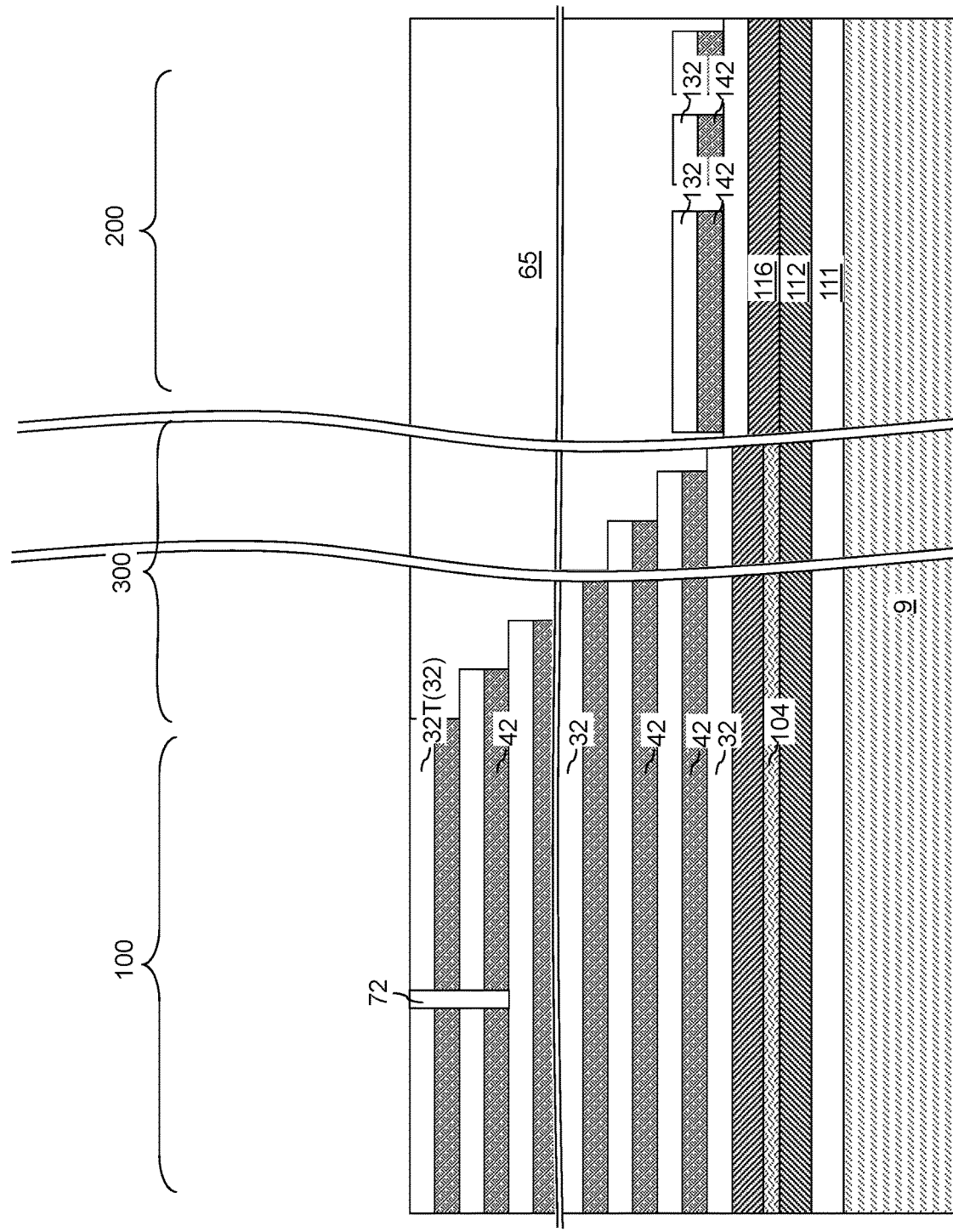
FIG. 3 is a schematic vertical cross-sectional view of the first exemplary structure after formation of patterned plates, a stepped dielectric material portion, and drain-select-level isolation structures according to the first embodiment of the present disclosure.

Referring to FIG. 3, a photoresist layer (not shown) may be applied over the patterned alternating stack (32, 42), and may be patterned to form moat-shaped openings laterally surrounding a respective remaining patterned portion of the photoresist layer. The pattern of the moat-shaped openings in the photoresist layer may be formed in areas in which no more than one sacrificial material layer 42 is present. In other words. The pattern of the moat-shaped openings in the photoresist layer may be formed in areas in which the bottommost two sacrificial material layer 42 is present and no other sacrificial material layer 42 is present. An etch process can be performed to transfer the pattern of the moat-shaped openings in the photoresist layer through an underlying insulating layer 32 and the bottommost sacrificial material layer 42. Portions of the bottommost sacrificial material layer 42 are isolated from the rest of the bottommost sacrificial material layer 42 by a respective moat trench that cuts through the insulating layer 32 (which is the second insulating layer from the bottom 32) and the bottommost sacrificial material layer 42.

Each patterned portion of the bottommost a sacrificial material layer 42 constitutes a sacrificial material plate 142.

Each patterned portion of the insulating layer 32 constitutes an insulating plate 132. Each insulating plate 132 may have a same area as an underlying sacrificial material plate 142. Each sidewall of a sacrificial material plate 142 may be vertically coincident with a sidewall of a respective overlying insulating plate 132. As used herein, a first surface is vertically coincident with the second surface if the second surface overlies or underlies the first surface and if a vertical plane exists that includes the first surface and the second surface. In one embodiment, each insulating plate 132 may be in contact with a front horizontal surface of a respective sacrificial material plate 142. A sidewall of each sacrificial material plate 142 may be vertically coincident with a sidewall of a respective insulating plate 132.

A stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the stepped dielectric material portion 65. As used herein, a "stepped" element refers to an element that has stepped surfaces and a horizontal cross-sectional area that increases monotonically as a function of a vertical distance from a top surface of a substrate on which the element is present. If silicon oxide is used for the stepped dielectric material portion 65, the silicon oxide of the stepped dielectric material portion 65 may, or may not, be doped with dopants such as B, P, and/or F. In one embodiment, the stepped dielectric material portion 65 has a stepwise-increasing lateral extent that increases with a vertical distance from the carrier substrate 9.

The stepped dielectric material portion 65 contacts sidewalls of the insulating layers 32 of the alternating stack (32, 42). In one embodiment, the stepped dielectric material portion 65 contacts stepped surfaces of the alternating stack (32, 42), and has a variable lateral extent that increases with a vertical distance from a horizontal plane including an interface between the alternating stack (32, 42) and the in-process source-level material layers (112, 103, 104, 105, 116).

Optionally, drain-select-level isolation structures 72 can be formed through the topmost insulating layer 32T and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the topmost insulating layer 32T. Alternatively, the drain-select-level isolation structures 72 can be formed at a later step in the process.

Figure 4:
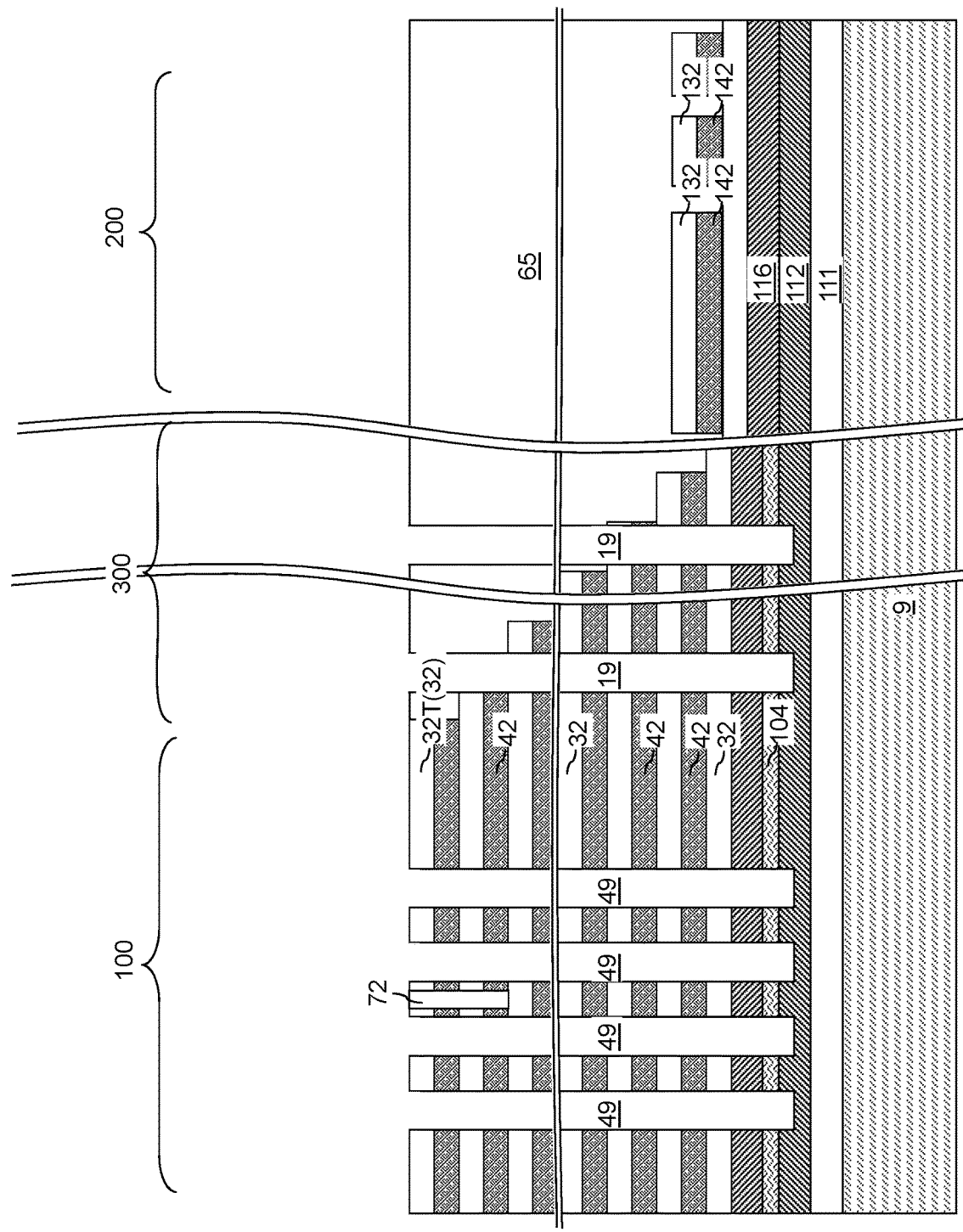
FIG. 4 is a schematic vertical cross-sectional view of the first exemplary structure after formation of memory openings and support openings according to the first embodiment of the present disclosure.

Referring to FIG. 4, a lithographic material stack (not shown) including at least a photoresist layer can be formed over the topmost insulating layer 32T and the stepped dielectric material portion 65, and can be lithographically patterned to form openings therein. The openings include a first set of openings formed over a memory array region in which each layer of the alternating stack (32, 42) is present, and a second set of openings formed over a staircase region including the stepped surfaces of the alternating stack (32, 42). The pattern in the lithographic material stack can be transferred through the topmost insulating layer 32T or the stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the topmost insulating layer 32T and the entirety of the alternating stack (32, 42) in the memory array region. The support openings 19 are formed through the stepped dielectric material portion 65 and the portion of the alternating stack (32, 42) that underlie the stepped surfaces in the staircase region.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to on upper portion of the first source-level semiconductor layer 112. A surface of the first to source-level semiconductor layer 112 may be physically exposed at the bottom of each memory opening 49 and at the bottom of each support opening 19.

Figure 5:
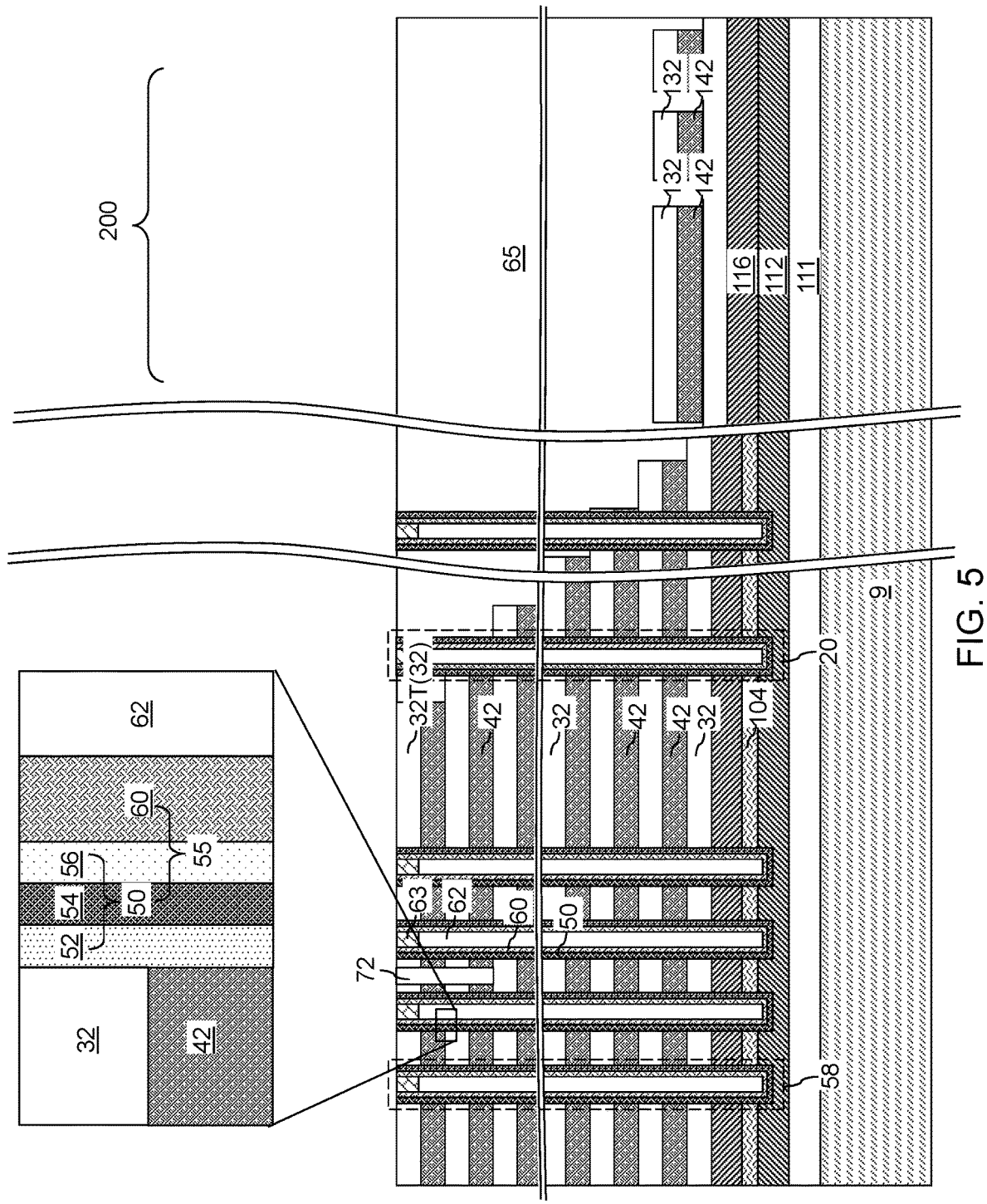
FIG. 5 is a schematic vertical cross-sectional view of the first exemplary structure after formation of memory opening fill structures and support pillar structures according to the first embodiment of the present disclosure.

Referring to FIG. 5, a sequence of processing steps can be performed to form a memory opening fill structure 58 in each memory opening 49 and to form a support pillar structure 20 in each support opening 19.

In an illustrative example, a stack of layers including a blocking dielectric layer 52, a memory material layer 54, and a dielectric material liner 56 may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the memory material layer 54 can be formed. Generally, the memory material layer may comprise any memory material such as a charge storage material, a ferroelectric material, a phase change material, or any material that can store data bits in the form of presence or absence of electrical charges, a direction of ferroelectric polarization, electrical resistivity, or another measurable physical parameter. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the memory material layer 54 as a plurality of discrete memory material portions that are vertically spaced apart. Thus, while in the above embodiment the memory material layer 54 is a single continuous layer, embodiments are expressly contemplated herein in which the memory material layer 54 is replaced with a plurality of discrete memory material portions (which can be charge trapping material portions or floating gates) that are vertically spaced apart. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The dielectric material liner 56 is an optional material layer that may, or may not, be employed. In case the memory material layer 54 comprises a charge storage layer, the dielectric material liner 56 may comprise a tunneling dielectric layer including a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The dielectric material liner 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 may include a stack of a silicon oxide layer, a silicon oxynitride layer, and a second silicon oxide layer, which is commonly known as an ONO stack. In one embodiment, the dielectric material liner 56 may include a silicon oxide layer that is substantially free of carbon or a silicon oxynitride layer that is substantially free of carbon. The thickness of the dielectric material liner 56 may be in a range from 2 nm to 20 nm, although lesser and greater thicknesses may also be used.

A semiconductor channel material layer can be conformally deposited in the memory openings 49 and in the support openings 19. The semiconductor channel material layer may include an undoped semiconductor material, or a doped semiconductor material. The semiconductor channel material layer comprises at least one elemental semiconductor material, at least one III-V compound semiconductor material, at least one II-VI compound semiconductor material, at least one organic semiconductor material, or other semiconductor materials known in the art. In one embodiment, the semiconductor channel material layer may have a uniform doping. In one embodiment, the semiconductor channel material layer comprises amorphous silicon or polysilicon and includes dopants of a first conductivity type at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The thickness of the semiconductor channel material layer may be in a range from 2 nm to 10 nm, although lesser and greater thicknesses may also be used. A cavity may be present in a volume of each memory opening 49 that is not filled with the deposited material layers (52, 54, 56).

In case the memory openings 49 and/or the support openings 19 are not completely filled by the semiconductor channel material layer, a dielectric core layer may be deposited in unfilled volumes of the memory openings 49 and/or the support openings 19. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the topmost surface of the vertically-alternating sequence (32, 42) may be removed, for example, by a recess etch. The recess etch continues until top surfaces of the remaining portions of the dielectric core layer are recessed to a height between the top and bottom surfaces of the topmost insulating layer 32. Each remaining portion of the dielectric core layer constitutes a dielectric core 62.

A doped semiconductor material having a doping of a second conductivity type may be deposited in cavities overlying the dielectric cores 62. The second conductivity type is the opposite of the conductivity type. For example, if the conductivity type is p-type, the second conductivity type is n-type, and vice versa. Portions of the deposited doped semiconductor material, the semiconductor channel material layer, the dielectric material liner 56, the memory material layer 54, and the blocking dielectric layer 52 that overlie the horizontal plane including the top surface of the topmost insulating layer 32T may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{18}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer constitutes a vertical semiconductor channel 60 through which electrical current may flow when a vertical NAND device including the vertical semiconductor channel 60 is turned on. A dielectric material liner 56 is surrounded by a memory material layer 54, and laterally surrounds a vertical semiconductor channel 60. Each adjoining set of a blocking dielectric layer 52, a memory material layer 54, and a dielectric material liner 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a dielectric material liner 56, a plurality of memory elements comprising portions of the memory material layer 54, and an optional blocking dielectric layer 52. Each combination of a memory stack structure 55, a dielectric core 62, and a drain region 63 within a memory opening 49 constitutes a memory opening fill structure 58. Generally, memory opening fill structures 58 are formed within the memory openings 49. Each of the memory opening fill structures 58 comprises a respective memory film 50 and a respective vertical semiconductor channel 60.

Each support opening 19 can be filled with a respective set of material portions having the same material composition as a corresponding component in a memory opening fill structure 58. Each set of material portions filling a support opening 19 is herein referred to as a support pillar structure 20. Generally, the support pillar structures 20 are formed in the staircase region. Each of the memory opening fill structures 58 comprises a respective vertical semiconductor channel 60 and a respective vertical stack of memory elements, which comprise portions of a respective memory material layer 54 that are located at levels of the sacrificial material layers 42. At least one semiconductor material layer within the in-process source-level material layers (112, 103, 104, 105, 116), such as the first source-level semiconductor layer 112 and/or the second source-level semiconductor layer 116, is in contact with each of the memory opening fill structures 58.

Figure 6A:
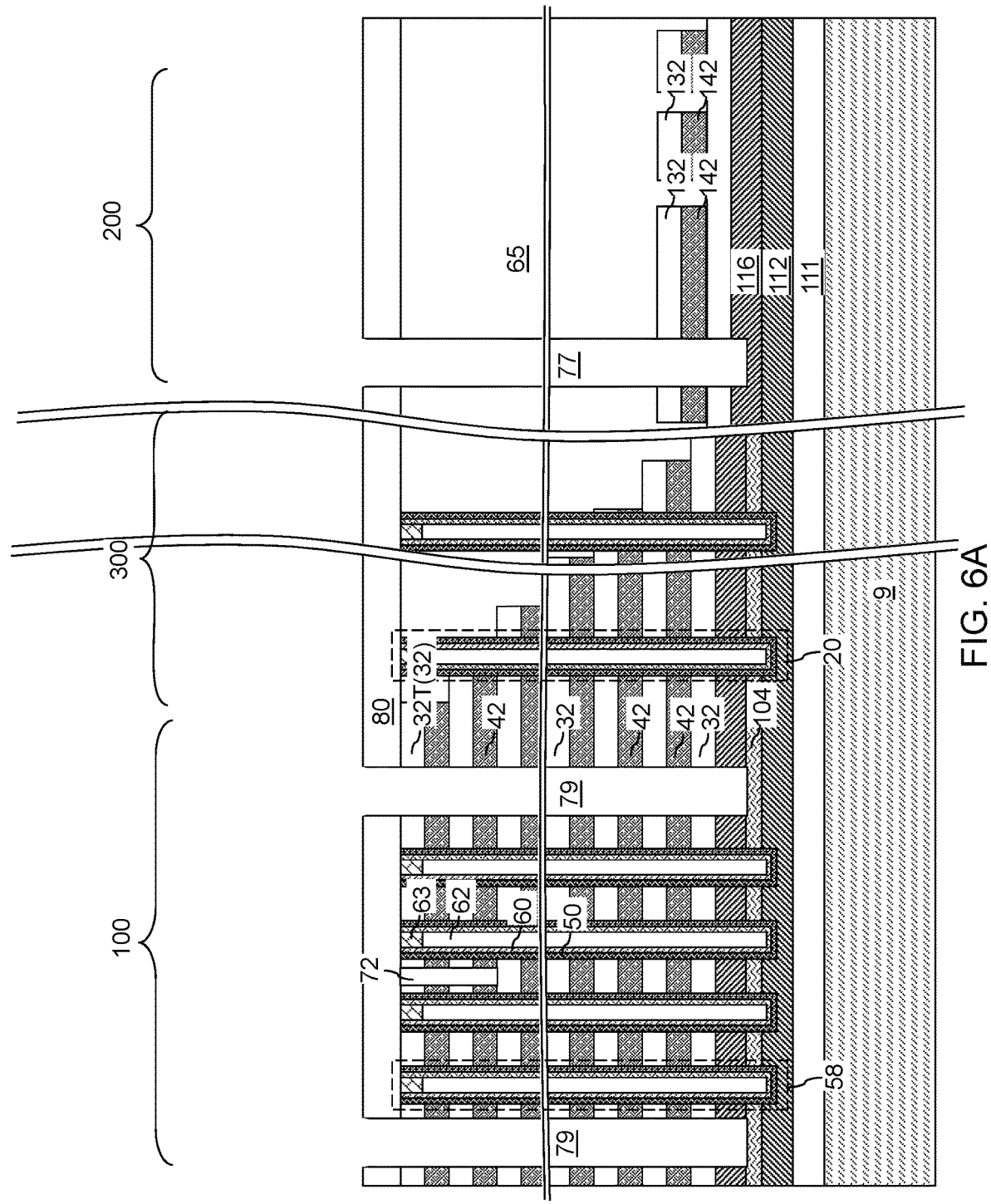
FIG. 6A is a schematic vertical cross-sectional view of the first exemplary structure after formation of a contact-level dielectric layer, through-stack trenches, and connection-region trenches according to the first embodiment of the present disclosure.
Figure 6B:
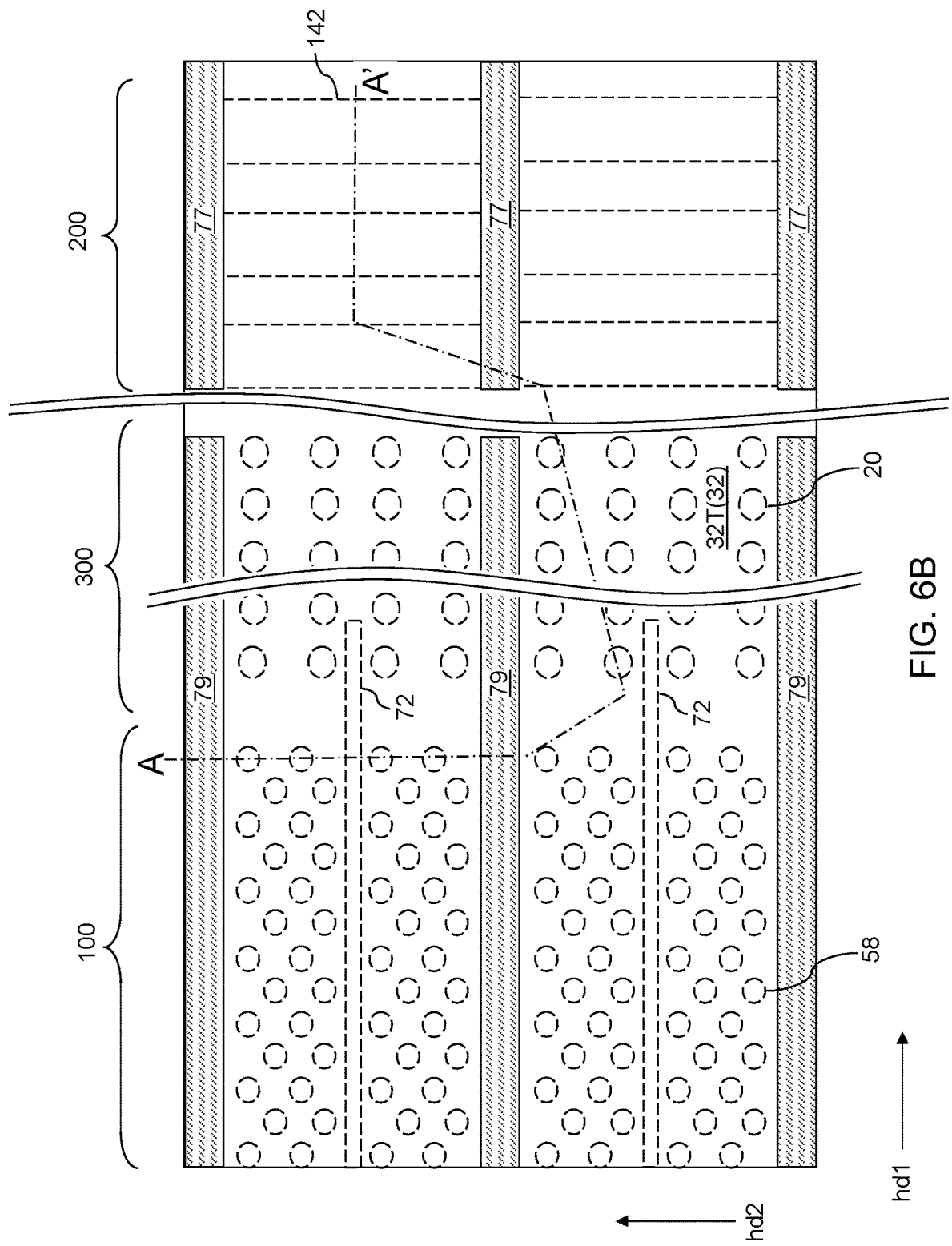
FIG. 6B is a partial see-through top-down view of the exemplary structure of FIG. 6A. The hinged vertical plane A-A' is the plane of the schematic vertical cross-sectional view of FIG. 6A.

Referring to FIGS. 6A and 6B, a contact-level dielectric layer 80 can be formed over the alternating stack (32, 42) of insulating layer 32 and sacrificial material layers 42, and over the memory opening fill structures 58 and the support pillar structures 20. The contact-level dielectric layer 80 includes a dielectric material that is different from the dielectric material of the sacrificial material layers 42. For example, the contact-level dielectric layer 80 can include silicon oxide formed by decomposition of tetraethyl orthosilicate (TEOS). The contact-level dielectric layer 80 can have a thickness in a range from 50 nm to 500 nm, although lesser and greater thicknesses can also be used.

A photoresist layer (not shown) can be applied over the contact-level dielectric layer 80, and is lithographically patterned to form first openings in areas between clusters of memory opening fill structures 58, and to form second openings in the connection via region 200. The pattern in the photoresist layer can be transferred through the contact-level dielectric layer 80, the alternating stack (32, 42) and/or the stepped dielectric material portion 65 using an anisotropic etch to form through-stack trenches 79 in the memory array region 100 and in the staircase region 300, and to form connection-region trenches 77 in the connection region 200. Each of the through-stack trenches 79 vertically extends from the top surface of the contact-level dielectric layer 80 at least to the top surface of the source-level sacrificial layer 104. Each of the connection-region trenches 77 vertically extends from the top surface of the contact-level dielectric layer 80 at least to the top surface of the upper sacrificial dielectric liner 105. The through-stack trenches 79 and the connection-region trenches 77 can be formed simultaneously.

According to an aspect of the present disclosure, each of the sacrificial material plates 142 can be partly etched during formation of the connection-region trenches 77 such that each remaining portion of the sacrificial material plates 142 has at least one sidewall that is physically exposed to a respective one of the connection-region trenches 77. In one embodiment, one or more sacrificial material plates 142 may be cut into a respective plurality of sacrificial material plates 142 during formation of the connection-region trenches 77. In one embodiment, the memory opening fill structures 58 may be formed in a memory array region 100, the support pillar structures 20 and the stepped surfaces of the alternating stack (32, 42) may be formed in a staircase region 300, and the sacrificial material plates 142 may be formed in the connection via region 200. The through-stack trenches 79 may laterally extend continuously into the entirety of the memory array region 100 and the staircase region 300, and may optionally extend into the connection via region 200. The connection-region trenches 77 can be formed in the connection via region 200.

In one embodiment, the through-stack trenches 79 can laterally extend along a first horizontal direction hd1 and can be laterally spaced apart one from another along a second horizontal direction hd2 that is perpendicular to the first horizontal direction hd1. The memory opening fill structures 58 can be arranged in rows that extend along the first horizontal direction hd1. The drain-select-level isolation structures 72 can laterally extend along the first horizontal direction hd1. Each through-stack trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory opening fill structures 58 can be located between a neighboring pair of a through-stack trench 79 and a drain-select-level isolation structure 72, or between a neighboring pair of drain-select-level isolation structures 72 (if present at this point in the process). In one embodiment, the through-stack trenches 79 can include a source contact opening in which a source contact via structure can be subsequently formed. The photoresist layer can be removed, for example, by ashing.

Figure 7:
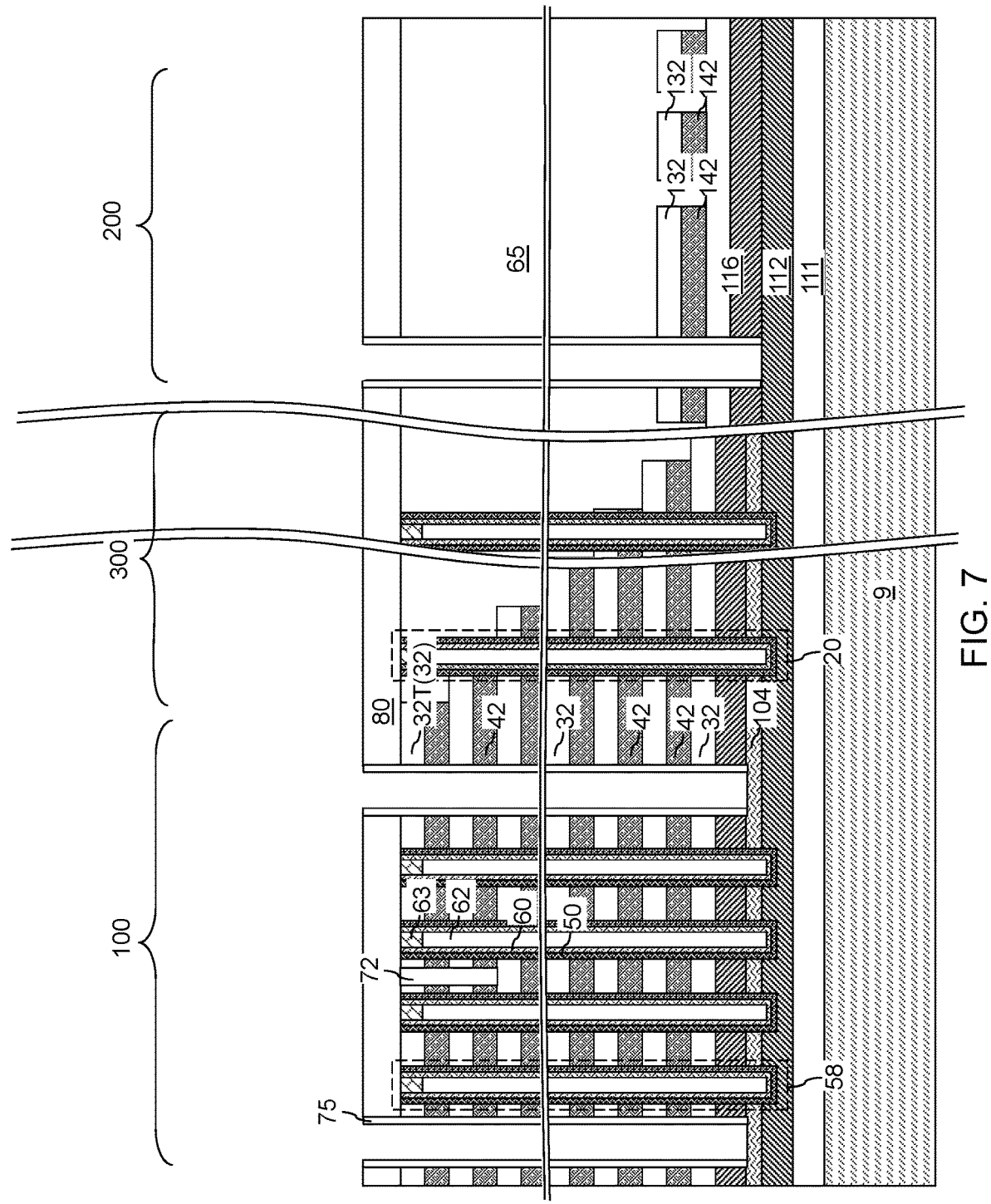
FIG. 7 is a schematic vertical cross-sectional view of the first exemplary structure after formation of sacrificial etch stop spacers according to the first embodiment of the present disclosure.

Referring to FIG. 7, a sacrificial etch stop material may be conformally deposited in the through-stack trenches 79 and the connection-region trenches 77 and over the contact-level dielectric layer 80, and can be anisotropically etched to form sacrificial etch stop spacers 75 at a peripheral portion of each of the through-stack trenches 79 and the connection-region trenches 77. The sacrificial etch stop material is different from the material of the source-level sacrificial layer 104. In an illustrative example, if the source-level sacrificial layer 104 comprises silicon nitride, the sacrificial etch stop material may comprise silicon oxide. The thickness of the sacrificial etch stop spacers 75, as measured between an inner sidewall and an outer sidewall of a respective sacrificial etch stop spacer 75, may be in a range from 10 nm to 100 nm, although lesser and greater thicknesses may also be employed.

Figure 8:
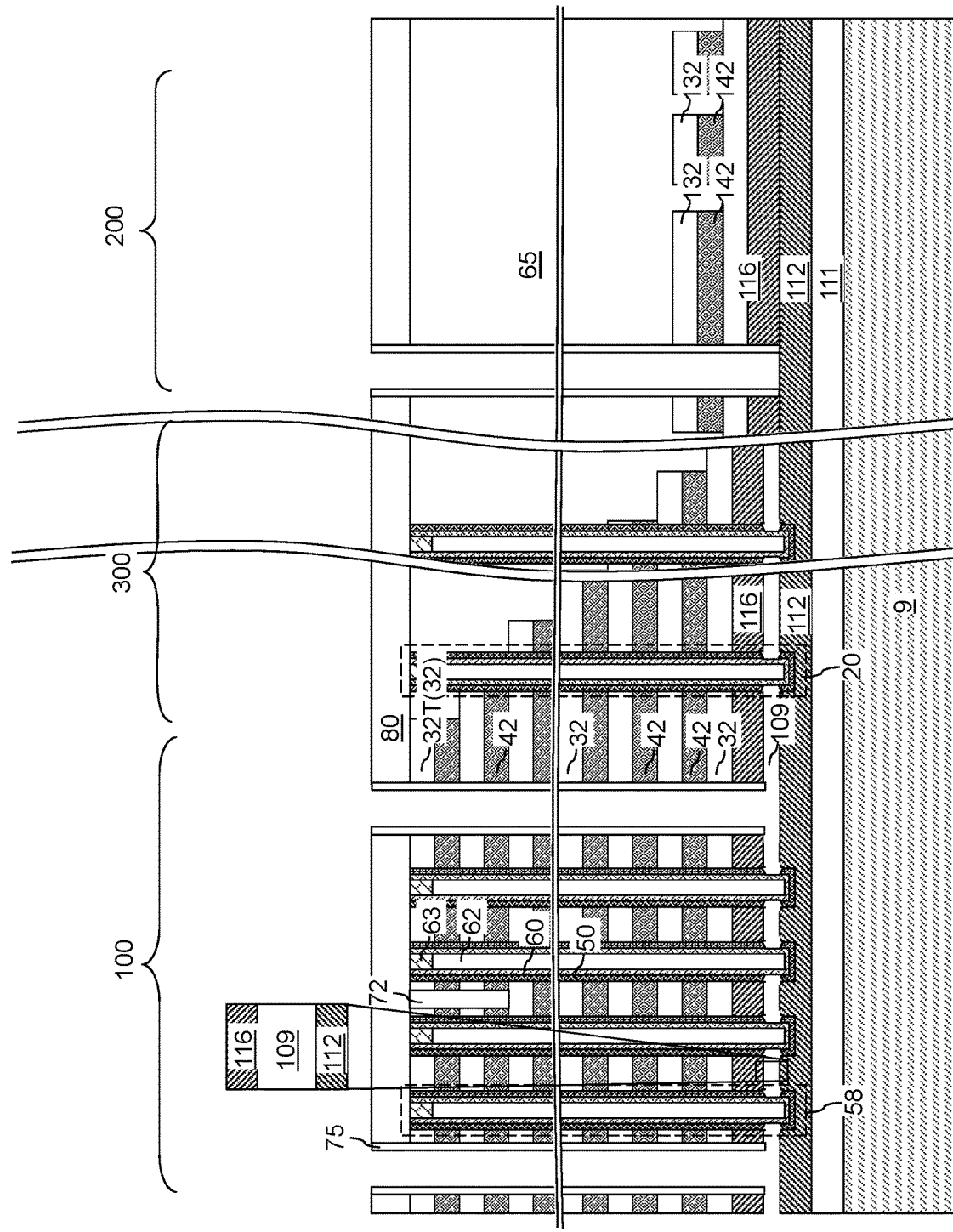
FIG. 8 is a schematic vertical cross-sectional view of the first exemplary structure after formation of a source cavity according to the first embodiment of the present disclosure.

Referring to FIG. 8, a selective isotropic etch process can be performed to etch the material of the source-level sacrificial layer 104 selective to the materials the lower sacrificial dielectric liner 103 and the upper sacrificial dielectric liner 105, and selective to the material of the sacrificial etch stop spacers 75. For example, if the source-level sacrificial layer 104 comprises silicon nitride, a wet etch process employing hot phosphoric acid may be performed to etch the source-level sacrificial layer 104 selective to the sacrificial dielectric liners (103, 105), the sacrificial etch stop spacers 75, and the contact-level dielectric layer 80. If the source-level sacrificial layer 104 comprises undoped amorphous silicon, a wet etch process employing tetramethylammonium hydroxide may be performed to etch the source-level sacrificial layer 104 selective to the sacrificial dielectric liners (103, 105), the sacrificial etch stop spacers 75, and the contact-level dielectric layer 80. A source cavity 109 is formed in the volume from which the material of the source-level sacrificial layer 104 is removed. The sacrificial dielectric liners (103, 105) may be collaterally etched in the source cavity 109 during the etching of the source-level sacrificial layer 104.

Subsequently, a sequence of isotropic etch processes may be performed to remove physically exposed portions of the memory films 50 in the memory opening fill structures 58 and in the support pillar structures 20. For example, the sequence of isotropic etch processes may sequentially etch portions of the blocking dielectric layer 52, memory material layers 54, and the dielectric material liners 56. A cylindrical outer surface segment of each vertical semiconductor channel 60 can be physically exposed to the source cavity 109.

Figure 9:
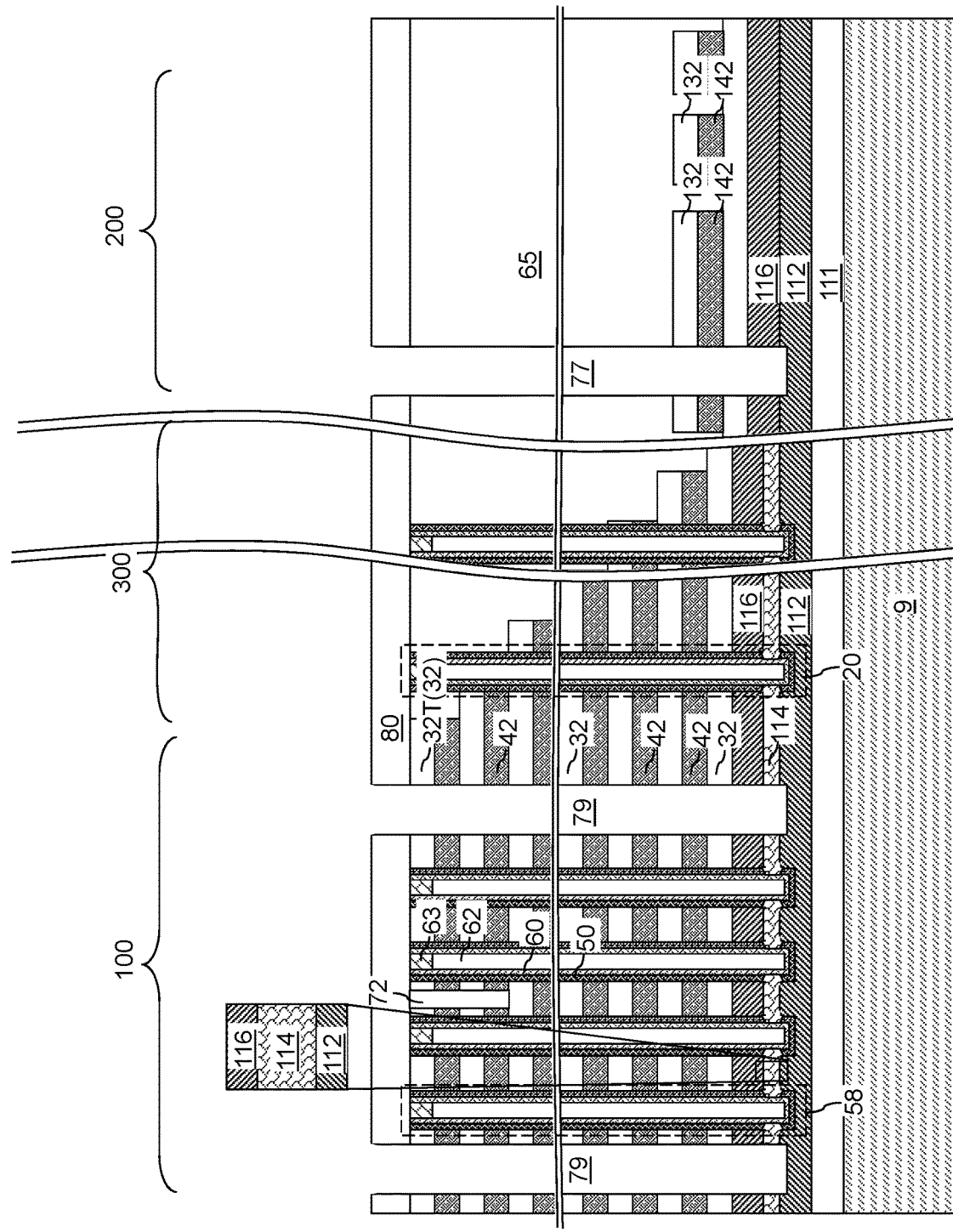
FIG. 9 is a schematic vertical cross-sectional view of the first exemplary structure after formation of a source contact layer according to the first embodiment of the present disclosure.

Referring to FIG. 9, a source contact layer 114 can be formed in the source cavity 109 by depositing a heavily doped semiconductor material, such as polysilicon or amorphous silicon, having a doping of the second conductivity type in the source cavity 109. In one embodiment, the source contact layer 114 may be formed by a selective doped semiconductor deposition process in which a semiconductor precursor gas (such as silane, disilane, or dichlorosilane) and a dopant gas (such as phosphine, arsine, or stibine) are flowed into a process chamber concurrently with or alternately with an etchant gas (such as hydrogen chloride gas). In this case, the growth rate of a doped semiconductor material from semiconductor surfaces is greater than the etch rate during the selective doped semiconductor deposition process, and the growth rate of the doped semiconductor material from dielectric surfaces (such as the surfaces of the sacrificial etch stop spacers 75 and the contact-level dielectric layer 80) is less than the etch rate during the selective doped semiconductor deposition process. Thus, the doped semiconductor material grows only form the semiconductor surfaces of the first and second source-level semiconductor layers (112, 116) to fill the source cavity 109, thereby forming the source contact layer 114 in the memory array region 100 and in the staircase region 300.

Alternatively, the source contact layer 114 may be formed by a non-selective doped semiconductor deposition process. In this case, a doped semiconductor material, such as polysilicon or amorphous silicon, can be deposited on all physically exposed surfaces of the first exemplary structure. The duration of the non-selective doped semiconductor deposition process can be selected such that the entire volume of the source cavity 109 is filled with the doped semiconductor material. An etch back process can be performed to remove portions of the doped semiconductor material that are present in the through-stack trenches 79, in the connection-region trenches 77, or above the contact-level dielectric layer 80. The etch back process may comprise an isotropic etch process or an anisotropic etch process. The remaining portion of the doped semiconductor material that fills the source cavity 109 constitutes the source contact layer 114.

The combination of the first source-level semiconductor layer 112, the source contact layer 114, and the second source-level semiconductor layer 116 constitutes source-level material layers (112, 114, 116) (e.g., a horizontal source region and/or source contact line). Generally, the source-level material layers (112, 114, 116) comprise at least one doped semiconductor material layer. In one embodiment, each of the first source-level semiconductor layer 112, the source contact layer 114, and the second source-level semiconductor layer 116 may be a doped semiconductor layer having a doping of the second conductivity type, which is the opposite of the first conductivity type of the vertical semiconductor channels 60. As such, p-n junctions may be formed between the source contact layer 114 and the vertical semiconductor channels 60. The dopant concentrations in the first source-level semiconductor layer 112, the source contact layer 114, and the second source-level semiconductor layer 116 may be different from each other. In one embodiment, each of the vertical semiconductor channels 60 comprises a respective cylindrical surface in contact with a respective surface segment of the source contact layer 114.

Figure 10:
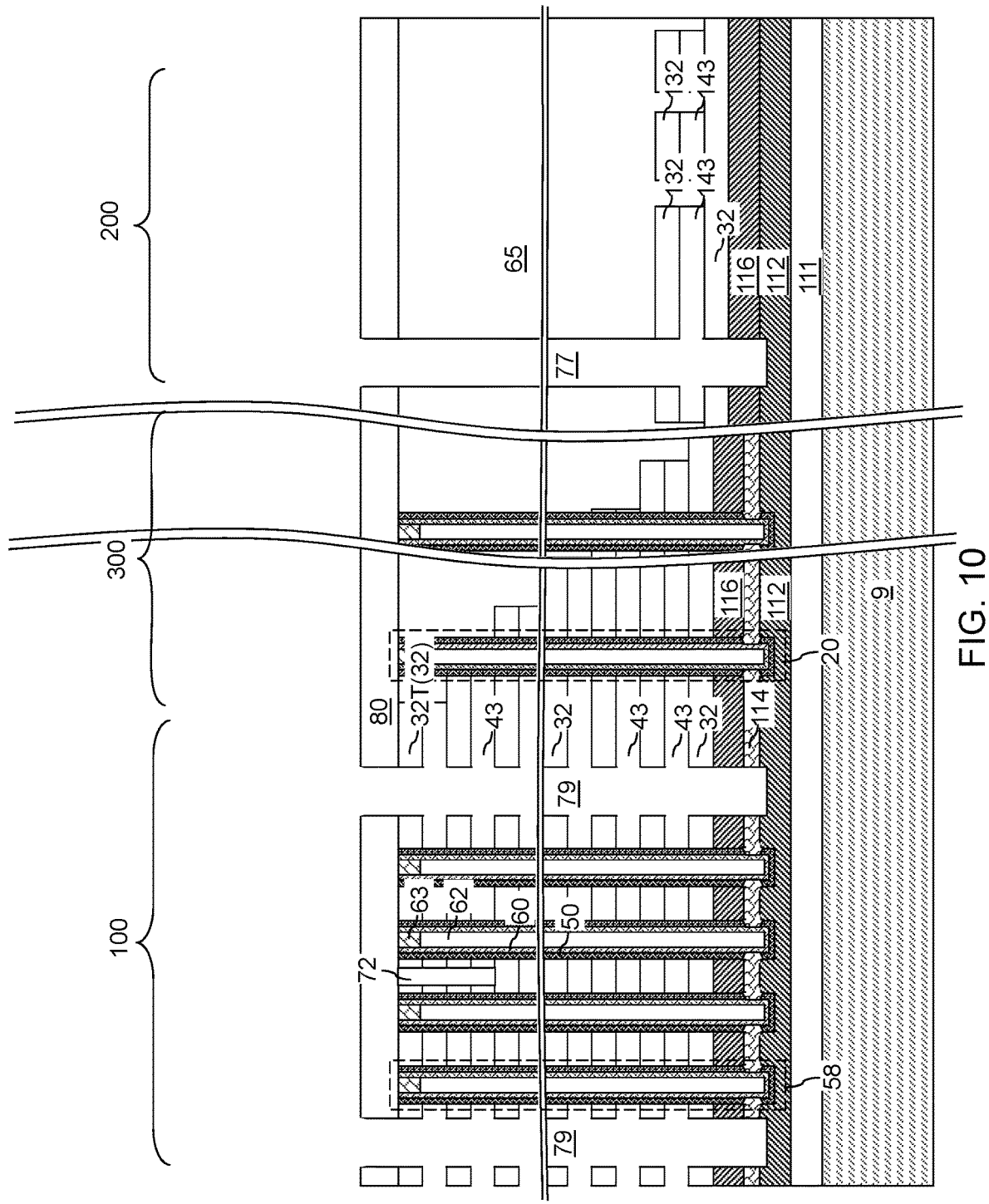
FIG. 10 is a schematic vertical cross-sectional view of the first exemplary structure after removal of the sacrificial etch stop spacers and formation of backside recesses according to the first embodiment of the present disclosure.

Referring to FIG. 10, an etchant that selectively etches the second material of the sacrificial material layers 42 with respect to the first material of the insulating layers 32 can be introduced into the through-stack trenches 79 and the connection-region trenches 77, for example, using an etch process. Backside recesses 43 are formed in volumes from which the sacrificial material layers 42 are removed. The removal of the second material of the sacrificial material layers 42 can be selective to the first material of the insulating layers 32, the material of the stepped dielectric material portion 65, the semiconductor material of the source-level material layers (112, 114, 116), and the material of the outermost layer of the memory films 50. In one embodiment, the sacrificial material layers 42 can include silicon nitride, and the materials of the insulating layers 32 and the stepped dielectric material portion 65 can be selected from silicon oxide and dielectric metal oxides.

The etch process that removes the second material selective to the first material and the outermost layer of the memory films 50 can be a wet etch process using a wet etch solution, or can be a gas phase (dry) etch process in which the etchant is introduced in a vapor phase into the through-stack trenches 79 and the connection-region trenches 77. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials used in the art. The support pillar structure 20, the stepped dielectric material portion 65, and the memory opening fill structures 58 provide structural support while the backside recesses 43 are present within volumes previously occupied by the sacrificial material layers 42. Generally, the backside recesses 43 can be formed by removing the sacrificial material layers 42 selective to the insulating layers 32 and the memory opening fill structures 58.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory opening fill structures 58 are formed are herein referred to as front side openings or front side cavities in contrast with the backside recesses 43. In one embodiment, the memory array region comprises an array of three-dimensional NAND strings. In this case, each backside recess 43 can define a space for receiving a respective word line of the array of three-dimensional NAND strings. Each of the plurality of backside recesses 43 can extend substantially parallel to the topmost surface of the source-level material layers (112, 114, 116). A backside recess 43 can be vertically bounded by a top surface of an underlying insulating layer 32 and a bottom surface of an overlying insulating layer 32. In one embodiment, each backside recess 43 can have a uniform height throughout.

According to an aspect of the present disclosure, each of the sacrificial material plates 142 can be etched by the isotropic etchant of the etch process. Plate cavities 143 are formed in volumes from which the sacrificial material plates 142 are removed. Each of the plate cavities 143 is adjoined to a respective one of the connection-region trenches 77. Each of the plate cavities 143 may underlie a respective one of the insulating plates 132.

Figure 11:
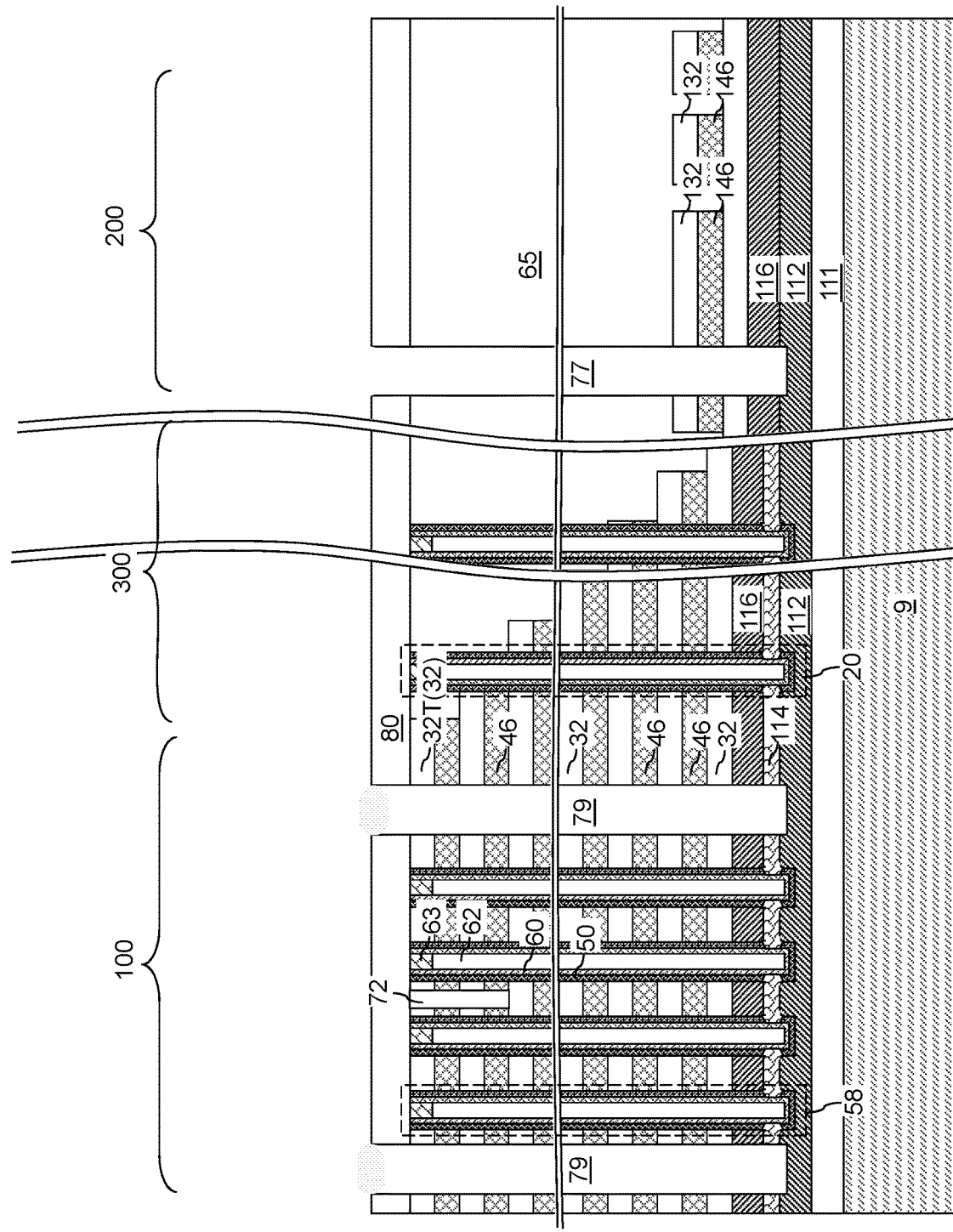
FIG. 11 is a schematic vertical cross-sectional view of the first exemplary structure after formation of electrically conductive layers according to the first embodiment of the present disclosure.

Referring to FIG. 11, a backside blocking dielectric layer (not shown) can be optionally formed by a conformal deposition on physically exposed surfaces of the memory opening fill structures 58, the support pillar structures 20, the insulating layers 32, the contact-level dielectric layer 80, and the source-level material layers (112, 114, 116). The backside blocking dielectric layer, if present, comprises a dielectric material that functions as a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present.

At least one conductive material may be deposited in the plurality of backside recesses, on the sidewalls of the through-stack trenches 79, on the sidewalls of the connection-region trenches 77, and over the contact-level dielectric layer 80. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses may be a combination of titanium nitride layer and a tungsten fill material.

Electrically conductive layers 46 may be formed in the backside recesses 43 by deposition of the at least one conductive material. Metal plates 146 may be formed in the plate cavities 143 by deposition of the at least one conductive material. A plurality of electrically conductive layers 46 may be formed in the plurality of backside recesses 43, and a continuous metallic material layer (not shown) may be formed on the sidewalls of each through-stack trench 79 and each connection-region trench 77 and over the contact-level dielectric layer 80. Each of the electrically conductive layers may include a respective conductive metallic nitride liner and a respective conductive fill material. Thus, the and second sacrificial material layers 42 may be replaced with the electrically conductive layers 46. Specifically, each sacrificial material layer 42 may be replaced with an optional portion of the backside blocking dielectric layer and an electrically conductive layer 46. A backside cavity is present in the portion of each through-stack trench 79 that is not filled with the continuous metallic material layer, and in a portion of each connection-region trench 77 that is not filled with the continuous metallic material layer.

Residual conductive material may be removed from inside the through-stack trenches 79 and the connection-region trenches 77. Specifically, the deposited metallic material of the continuous metallic material layer may be etched back from the sidewalls of each through-stack trench 79, from the sidewalls of each connection-region trench 77, and from above the contact-level dielectric layer 80, for example, by an anisotropic or isotropic etch. Each remaining portion of the deposited metallic material in the backside recesses 43 constitutes an electrically conductive layer 46. Each remaining portion of the deposited metallic material in the plate cavities 143 constitutes a metal plate 146. Sidewalls of the electrically conductive material layers 46 may be physically exposed to a respective through-stack trench 79.

Each electrically conductive layer 46 may be a conductive sheet including openings therein. A subset of the openings through each electrically conductive layer 46 may be filled with memory opening fill structures 58. A second subset of the openings through each electrically conductive layer 46 may be filled with the support pillar structures 20. A subset of the electrically conductive layers 46 may comprise word lines for the memory elements.

In the first embodiment, the spacer material layers are formed as sacrificial material layers 42, and are subsequently replaced with the electrically conductive layers 46. The metal plates 146 are formed by patterning a bottommost spacer material layer, i.e., a bottommost sacrificial material layer 42, into a sacrificial material plate 142, and subsequently replacing the sacrificial material plate 142 with a metallic material portion that constitutes the metal plates 146. The bottommost sacrificial material layer 42 is the most proximal sacrificial material layer to the source-level material layers (112, 114, 116). The sacrificial material plates 142 may be replaced with the metal plates 146 by forming through-stack trenches 79 through the alternating stack (32, 46) and through the sacrificial material plates 142, forming plate cavities 143 by removing the sacrificial material plates 142, and depositing metal plates in the plate cavities 143 by providing a metal-containing precursor gas through the through-stack trenches 79 into the plate cavities 143. Generally, the metal plates 146 are formed over the source-level material layers (112, 114, 116) that include at least one semiconductor material layer. The metal plates 146 may extend along horizontal directions with a uniform vertical thickness.

The metal plates 146 may comprise a same material as and have a same vertical thickness as the bottommost electrically conductive layer 46. The bottommost electrically conductive layer 46 is an electrically conductive layer 46 that is most proximal to the source-level material layers (112, 114, 116).

The lateral extents of the electrically conductive layers 46 decrease with a vertical distance from the at least one semiconductor material layer (112, 114, 116). The dielectric material portion 65 contacts stepped surfaces of the alternating stack (32, 46), and has a variable lateral extent that increases stepwise with a vertical distance from a horizontal plane including an interface between the alternating stack (32, 46) and the at least one semiconductor material layer (112, 114, 116).

Figure 12:
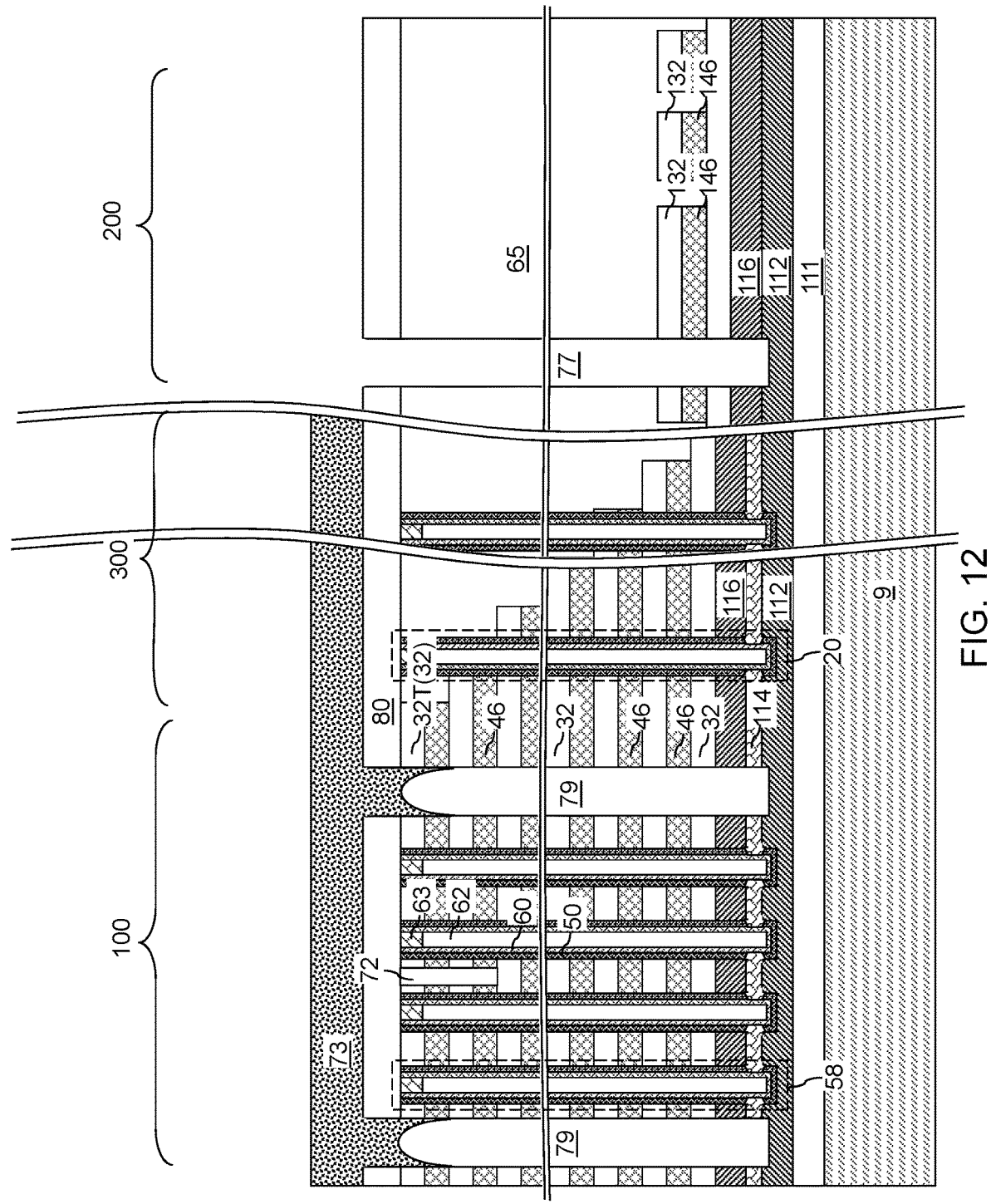
FIG. 12 is a schematic vertical cross-sectional view of the first exemplary structure after application and patterning of a patterning film according to the first embodiment of the present disclosure.

Referring to FIG. 12, an optional patterning film 73 may be applied over the contact-level dielectric layer 80 by an anisotropic deposition method. The patterning film 73 may comprise a carbon-based material such as amorphous carbon or diamond-like carbon, and may be deposited by a plasma-enhanced chemical vapor deposition process. Cavities can be formed in a lower portion of each through-stack trenches 79 in a volume that is not filled with the patterning film 73. The patterning film 73 can be subsequently lithographically patterned so that portions of the patterning film 73 located in the connection via region 200 are removed. The connection-region trenches 77 are physically exposed. Thus, the patterning film 73 covers the through-stack trenches 79, and does not cover the connection-region trenches 77.

Figure 13:
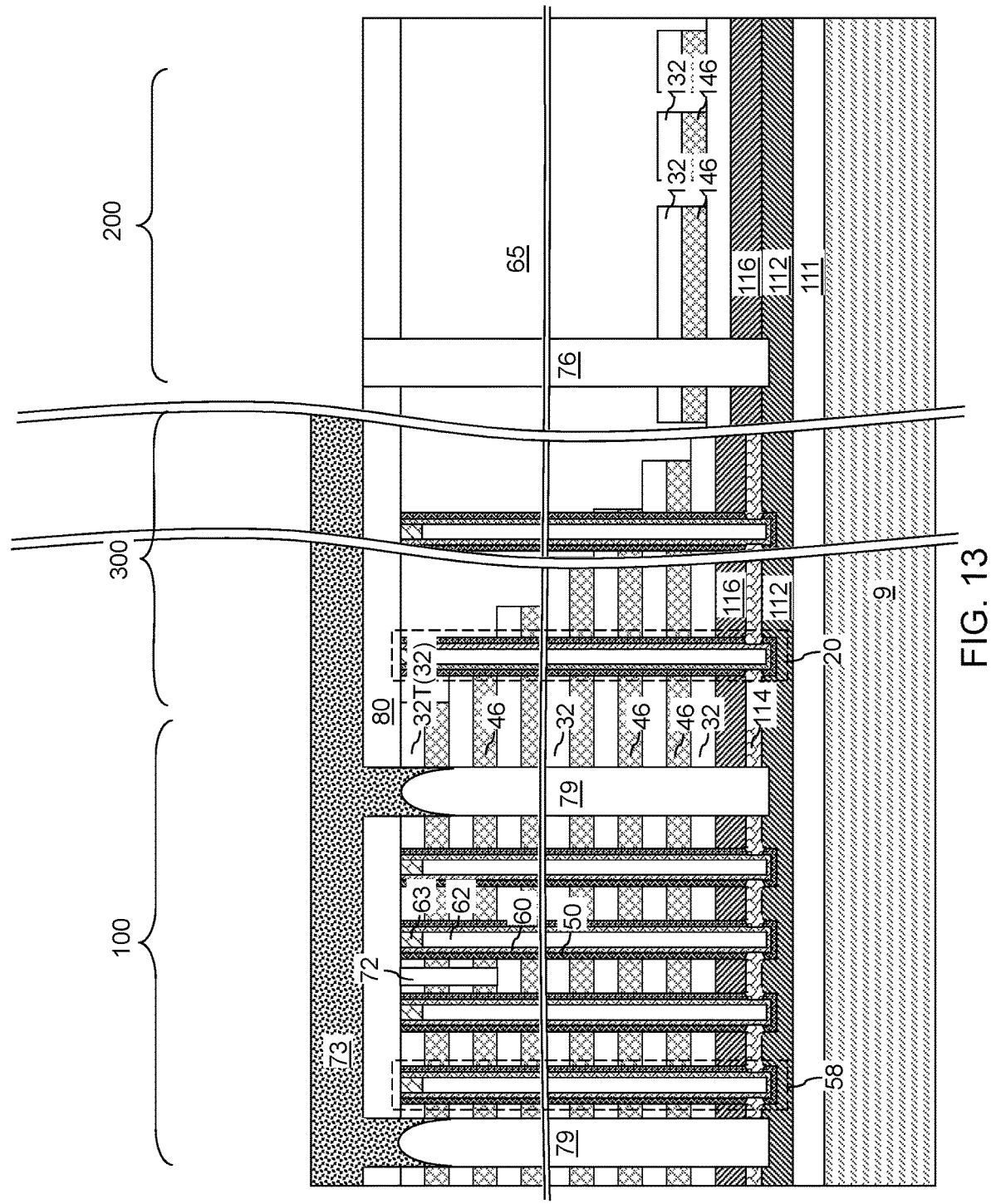
FIG. 13 is a schematic vertical cross-sectional view of the first exemplary structure after formation of trench fill dielectric structures according to the first embodiment of the present disclosure.

Referring to FIG. 13, a dielectric fill material such as silicon oxide can be deposited in the connection-region trenches 77 and over the patterning film 73. A recess etch process can be performed to remove portions of the dielectric fill material that are deposited over the contact-level dielectric layer 80. Remaining portions of the dielectric fill material that fill the connection-region trenches 77 constitutes trench dielectric fill structures 76. Generally, the duration of the deposition process that deposits the dielectric fill material is selected such that the connection-region trenches 77 are fully filled within the dielectric fill material. The duration of the recess etch process can be selected such that the dielectric fill material is entirely removed from above the top surface of the patterning film 73. In one embodiment, each dielectric trench fill structure 76 may be embedded in the dielectric material portion 65, and may be laterally spaced from each of the electrically conductive layers 46.

Figure 14:
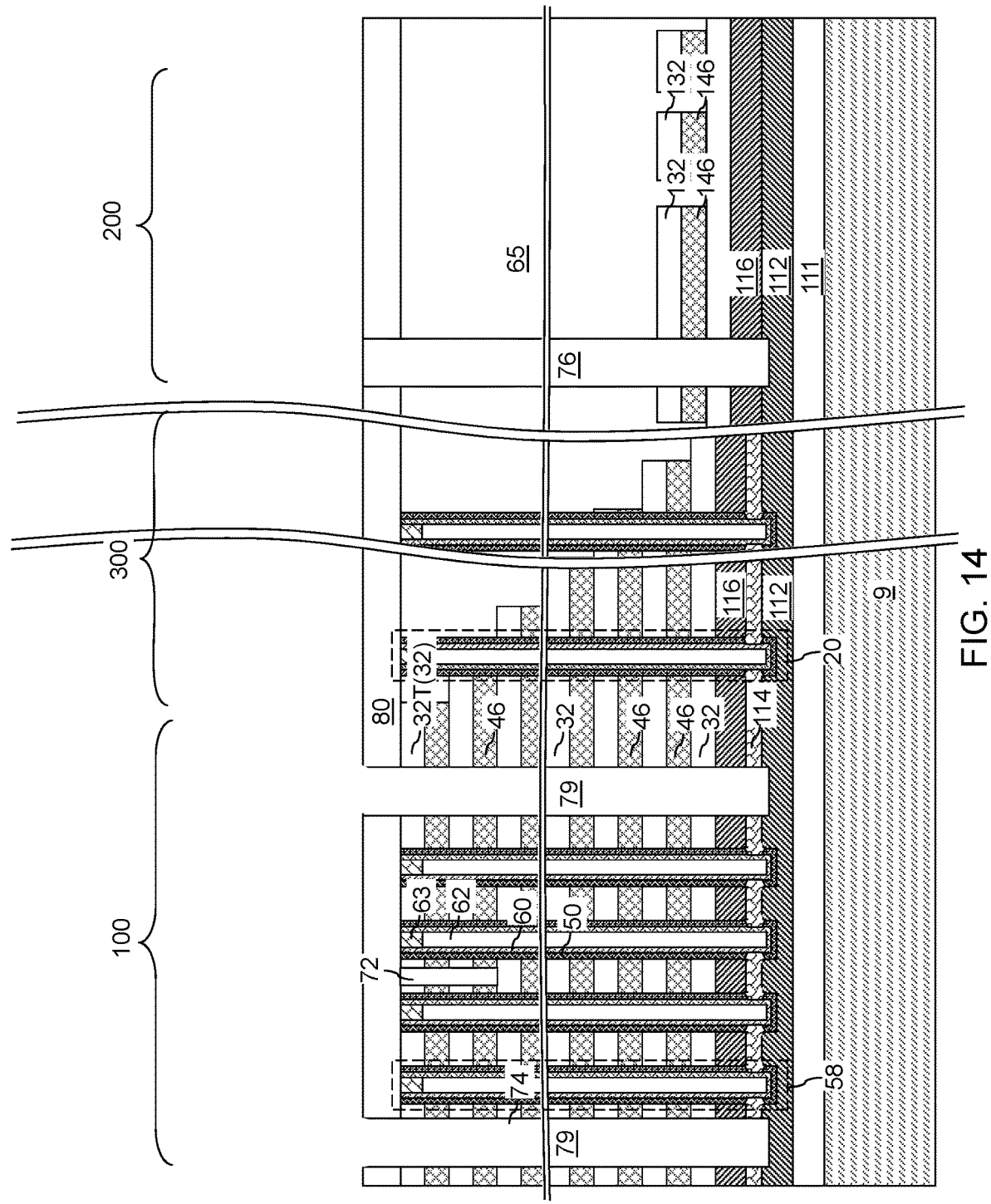
FIG. 14 is a schematic vertical cross-sectional view of the first exemplary structure after removal of the patterning film according to the first embodiment of the present disclosure.

Referring to FIG. 14, the patterning film 75 can be removed, for example, by ashing.

Figure 15:
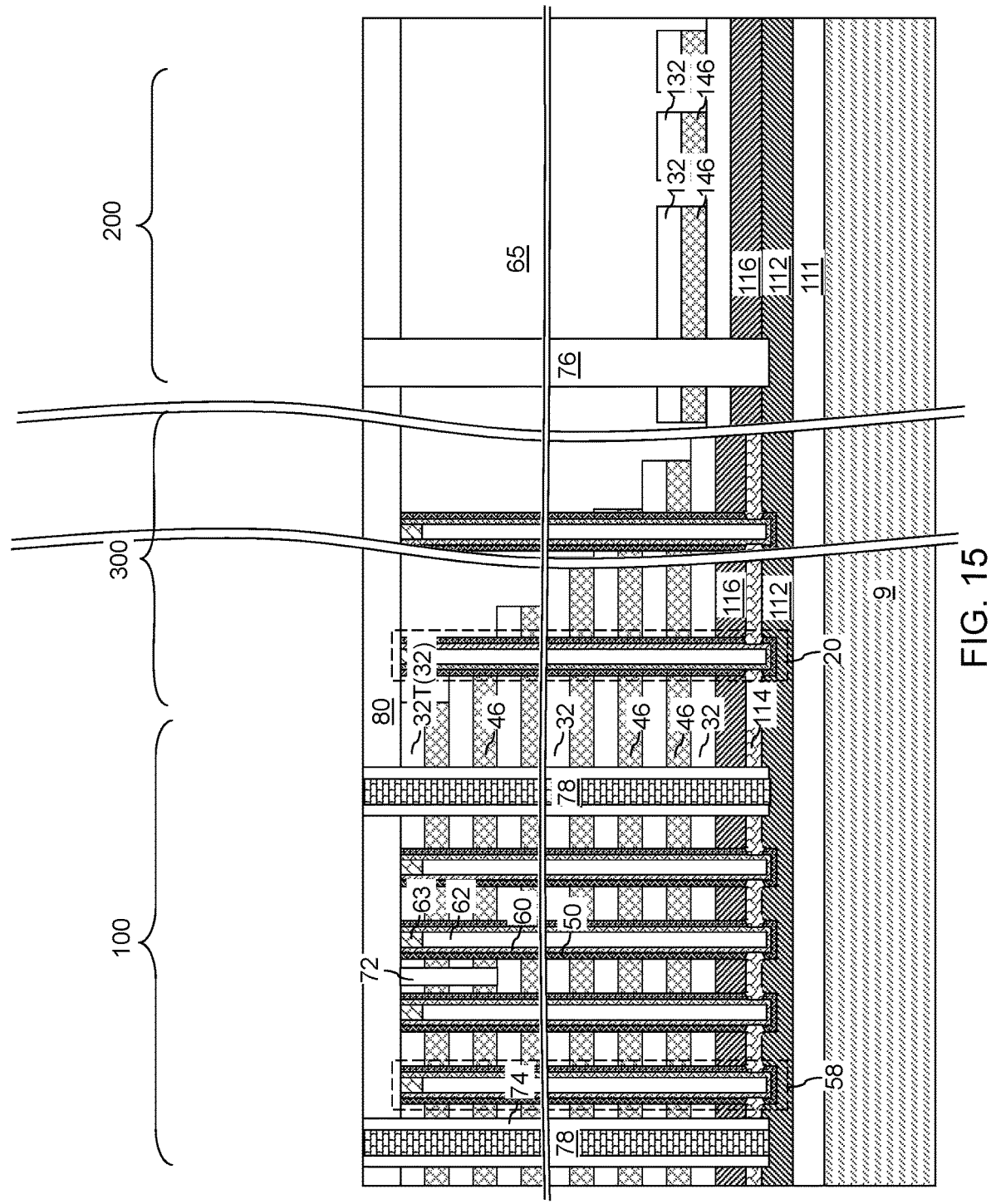
FIG. 15 is a schematic vertical cross-sectional view of the first exemplary structure after formation of insulating trench spacers and through-stack contact via structures in remaining volumes of the through-stack trenches according to the first embodiment of the present disclosure.

Referring to FIG. 15, a conformal insulating material layer (such as a silicon oxide layer) can be deposited in the peripheral portions of the through-stack trenches 79 and over the contact-level dielectric material layer 80. The thickness of the conformal insulating material layer may be in a range from 10 nm to 200 nm, although lesser and greater thicknesses may also be employed. An anisotropic etch process can be performed in to removal horizontally-extending portions of the conformal insulating material layer. Each remaining vertically-extending portion of the conformal insulating material layer that remains in a respective one of the through-stack trenches 79 constitutes an insulating trench spacer 74.

At least one conductive material can be deposited in remaining unfilled volumes of the through-stack trenches 79, and excess portions of the at least one conductive fill material may be removed from above the horizontal plane including the top surface of the contact-level dielectric layer 80. Each remaining portion of the at least one conductive material constitutes a through-stack contact via structure 78. Each through-stack contact via structure 78 contacts the at least one semiconductor material layer (112, 114, 116), i.e., the source-level material layers (112, 114, 116). Each through-stack contact via structure 78 is laterally surrounded by an insulating trench spacer 74. Each contiguous combination of a through-stack contact via structure 78 and an insulating trench spacer 74 constitutes a through-stack trench fill structure (74, 78).

In an alternative embodiment, all through-stack trenches 79 may be filled with respective dielectric trench fill structures. In this alternative embodiment, the steps shown in FIGS. 12, 14 and 15 may be omitted.

Figure 16A:
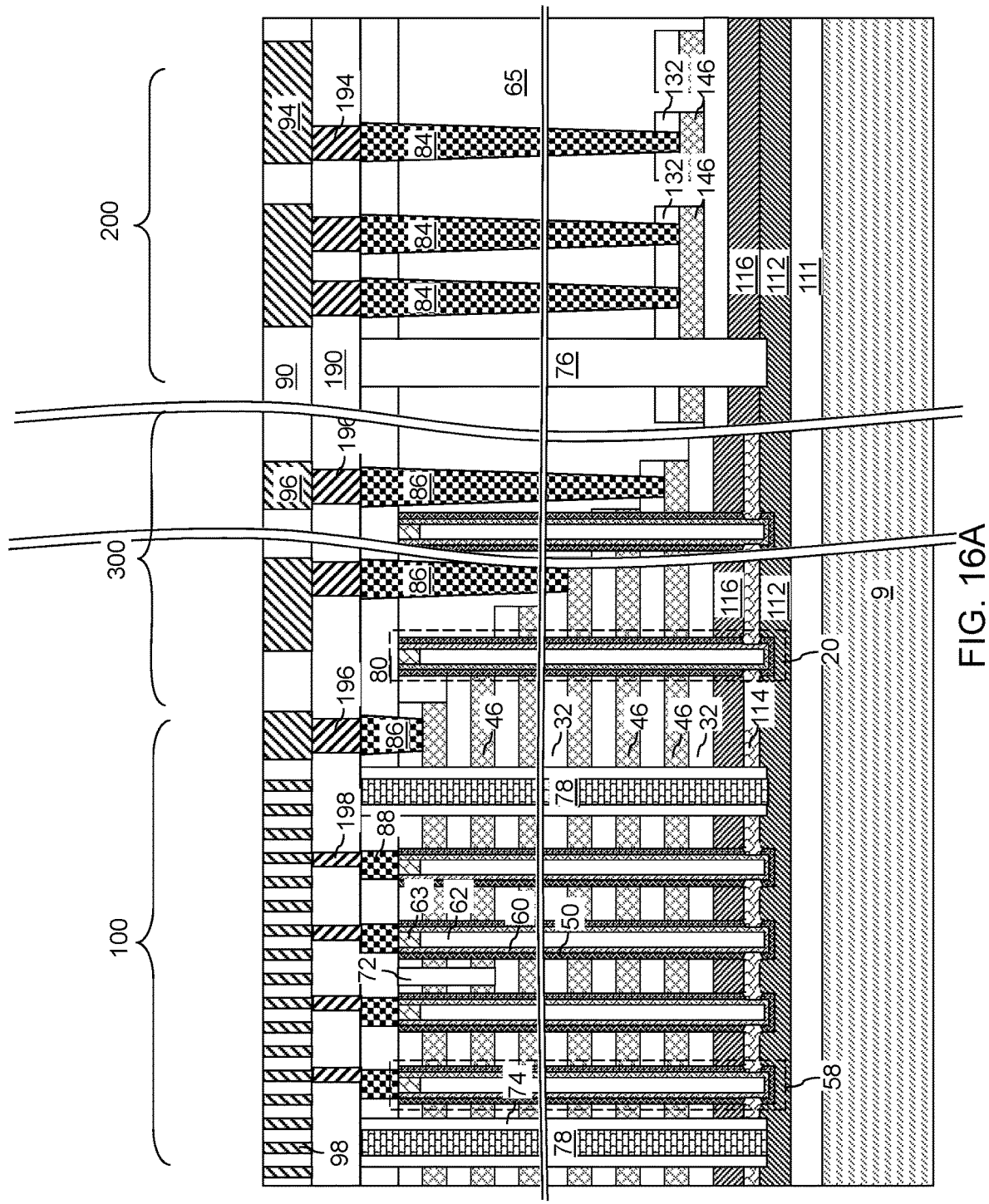
FIG. 16A is a schematic vertical cross-sectional view of the first exemplary structure after formation of additional contact via structures, connection via structures, and bit-line-level metal lines according to the first embodiment of the present disclosure.

Referring to FIGS. 16A and 16B, various via cavities can be formed through the contact-level dielectric layer 80 and the stepped dielectric material portion 65. The via cavities may comprise drain contact via cavities extending down to a respective drain region 63 in the memory opening fill structures 58, layer contact via cavities extending down to a respective electrically conductive layer 46 at or underneath the stepped surfaces of the alternating stack (32, 46) underneath the stepped dielectric material portion 65, and connection via cavities extending down to a top surface of a respective metal plate 146.

At least one conductive material can be deposited in each of the via cavities, and excess portions of the at least one conductive material can be removed from above the horizontal plane including the top surface of the contact-level dielectric layer 80. Each remaining portion of the at least one conductive material constitutes a via structure (88, 86, 84). The via structures (88, 86, 84) comprise drain contact via structures 88 formed in the drain contact via cavities and contacting a top surface of a respective one of the drain regions 63. Thus, the drain contact via structures 88 vertically extend through the contact-level dielectric layer 80 and contact an end surface of a respective one of the memory opening fill structures 58. The via structures (88, 86, 84) further comprise layer contact via structures (e.g., word line and select gate contacts) 86 formed in the layer contact via cavities and contacting a top surface of a respective one of the electrically conductive layers 46. The via structures (88, 86, 84) further comprise connection via structures (e.g., word line terminal contacts) 84 formed in the connection via cavities and contacting a top surface of a respective one of the metal plates 146. Each connection via structure 84 may be formed through the dielectric material portion 65 directly on a top surface of a respective metal plate 146. The connection via structures 84 are also referred to as through-memory-level connection via structures. Distal end surfaces of the drain contact via structures 88, distal end surfaces of the layer contact via structures 86, and distal end surfaces of the connection via structures 84 can be located within a same horizontal plane, such as a horizontal plane including the top surface of the contact-level dielectric layer 80.

Generally, at least one connection via structure 84 vertically extends through the dielectric material portion 65. A metal plate 146 can be in contact with a proximal end surface of a respective connection via structure 84. As used herein, a proximal end of a connection via structure 84 refers to an end of the connection via structure 84 that is proximal to a horizontal plane including an interface between the alternating stack (32, 46) and the source-level material layers (112, 114, 116). In one embodiment, an insulating plate 132 may be in contact with a front horizontal surface (i.e., a top surface) of each metal plate 146. A sidewall of each metal plate 146 is vertically coincident with a sidewall of a respective overlying insulating plate 132. In one embodiment, a connection via structure 84 vertically extends through an insulating plate 132 and contacts a top surface of an underlying metal plate 146.

A via-level dielectric layer 190 is formed over the contact-level dielectric layer 80. Various connection via structures (198, 196, 194) can be formed through the via-level dielectric layer 190. For example, bit line connection via structures 198 can be formed on the drain contact via structures 88, word line connection via structures 196 can be formed on the layer contact via structures 86, and peripheral extension via structures 194 can be formed on the connection via structures 84.

A first line-level dielectric layer 90 is deposited over the via-level dielectric layer 190. Various metal line structures (98, 96, 94) are formed in the first line-level dielectric layer 90. The metal line structures (98, 96, 94) are herein referred to as first line level metal interconnect structures. The various metal line structures (98, 96, 94) include bit lines 98 that are electrically connected to a respective plurality of the drain contact via structures 88 (for example, through the bit line connection via structures 198), a word-line-connection metal interconnect lines 96 that are electrically connected to a respective one of the layer contact via structures 86 (for example, through a word line connection via structure 196), and peripheral metal interconnect lines 94 that are electrically connected to a respective one of the connection via structures 94 (for example, through a peripheral extension via structure 194).

The bit lines 98 are electrically connected to upper ends of a respective subset of the vertical semiconductor channels 60 in the memory opening fill structures 58 in the memory array region 100. In one embodiment, the memory opening fill structures 58 are arranged in rows that extend along the first horizontal direction hd1, and the bit lines 98 laterally extend along the second horizontal direction hd2.

Figure 17:
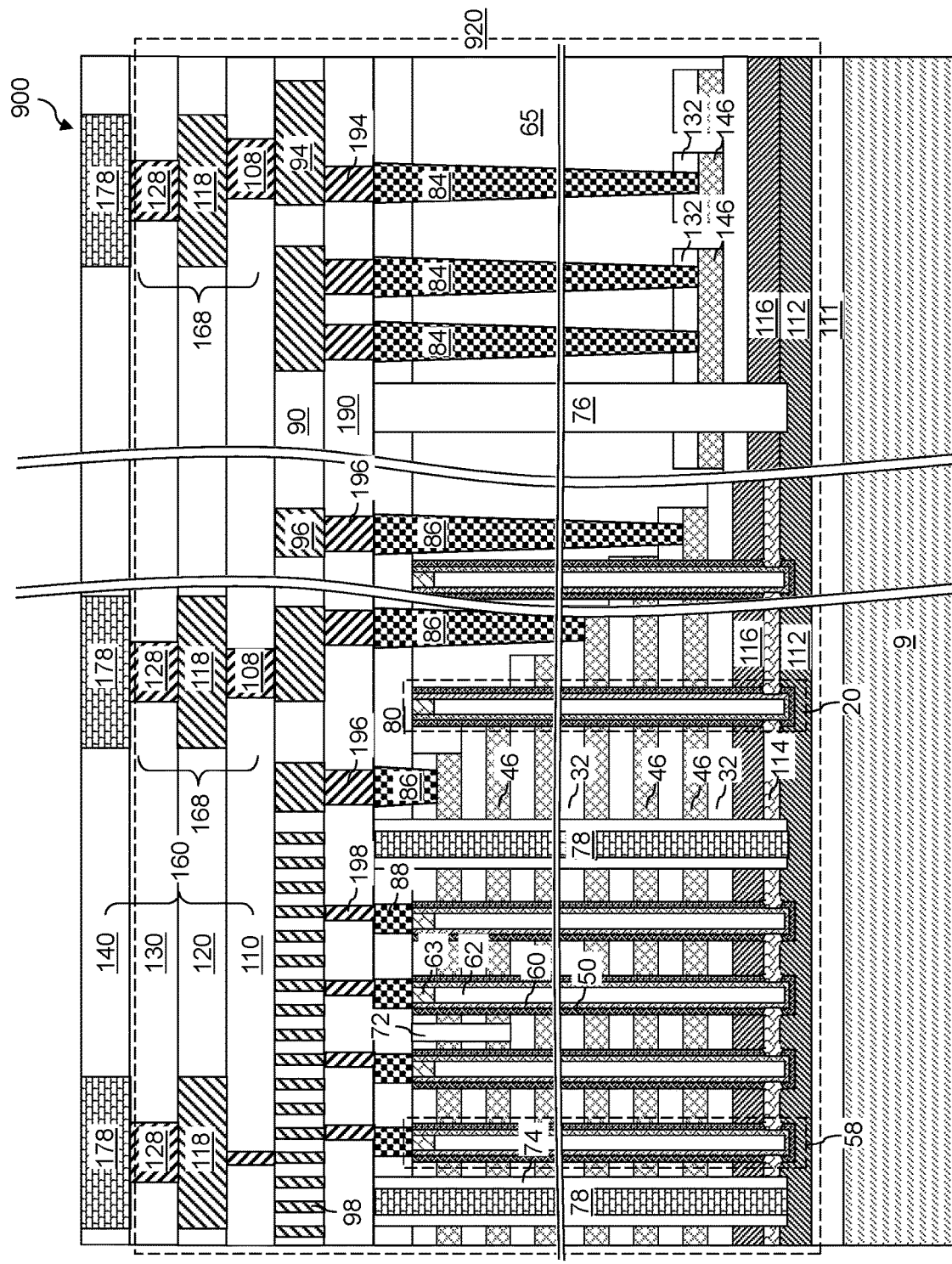
FIG. 17 is a schematic vertical cross-sectional view of the first exemplary structure that forms a memory die after formation of additional metal interconnect structures according to the first embodiment of the present disclosure.

Referring to FIG. 17, a memory die 900 is provided by performing additional processing steps. Specifically, additional metal interconnect structures 168 embedded in additional interconnect-level dielectric layers 160 are formed. In an illustrative example, the additional interconnect-level dielectric layers 160 can include a via-level dielectric layer 110, a second line-level dielectric layer 120, a second via-level dielectric layer 130, and a bonding-level dielectric layer 140. The metal interconnect structures 168 can include first metal via structures 108 included in the first via-level dielectric layer 110, second metal line structures 118 included within the second line-level dielectric layer 120, second metal via structures 128 included in the second via-level dielectric layer 130, and memory-side bonding pads 178 (such as metallic pad structures) included in the bonding-level dielectric layer 140. Generally, first bonding pads such as the memory-side bonding pads 178 can be formed on the first metal interconnect structures.

While in the prior embodiment the additional interconnect-level dielectric layers 160 include the first via-level dielectric layer 110, the second line-level dielectric layer 120, the second via-level dielectric layer 130, and the bonding-level dielectric layer 140, embodiments are expressly contemplated herein in which the additional interconnect-level dielectric layers 160 include a different number and/or different combinations of dielectric material layers. The memory die 900 includes a three-dimensional array of memory elements. Electrical connection paths can be provided between each memory-side bonding pad 178 and a respective set of metal interconnect structures {(194, 94, 108, 118, 128), (196, 96, 108, 118, 128), or (198, 98, 108, 118, 128)}. The memory die 900 includes a memory device 920, which may include a three-dimensional memory array containing vertical NAND strings and memory-side metal interconnect structures (86, 88, 194, 94, 196, 96, 198, 98, 168). Generally, memory-side dielectric material layers 160 embedding memory-side metal interconnect structures (86, 88, 194, 94, 196, 96, 198, 98, 168) and memory-side bonding pads 178 can be formed over the alternating stack (32, 46) to provide a memory die 900.

Figure 18:
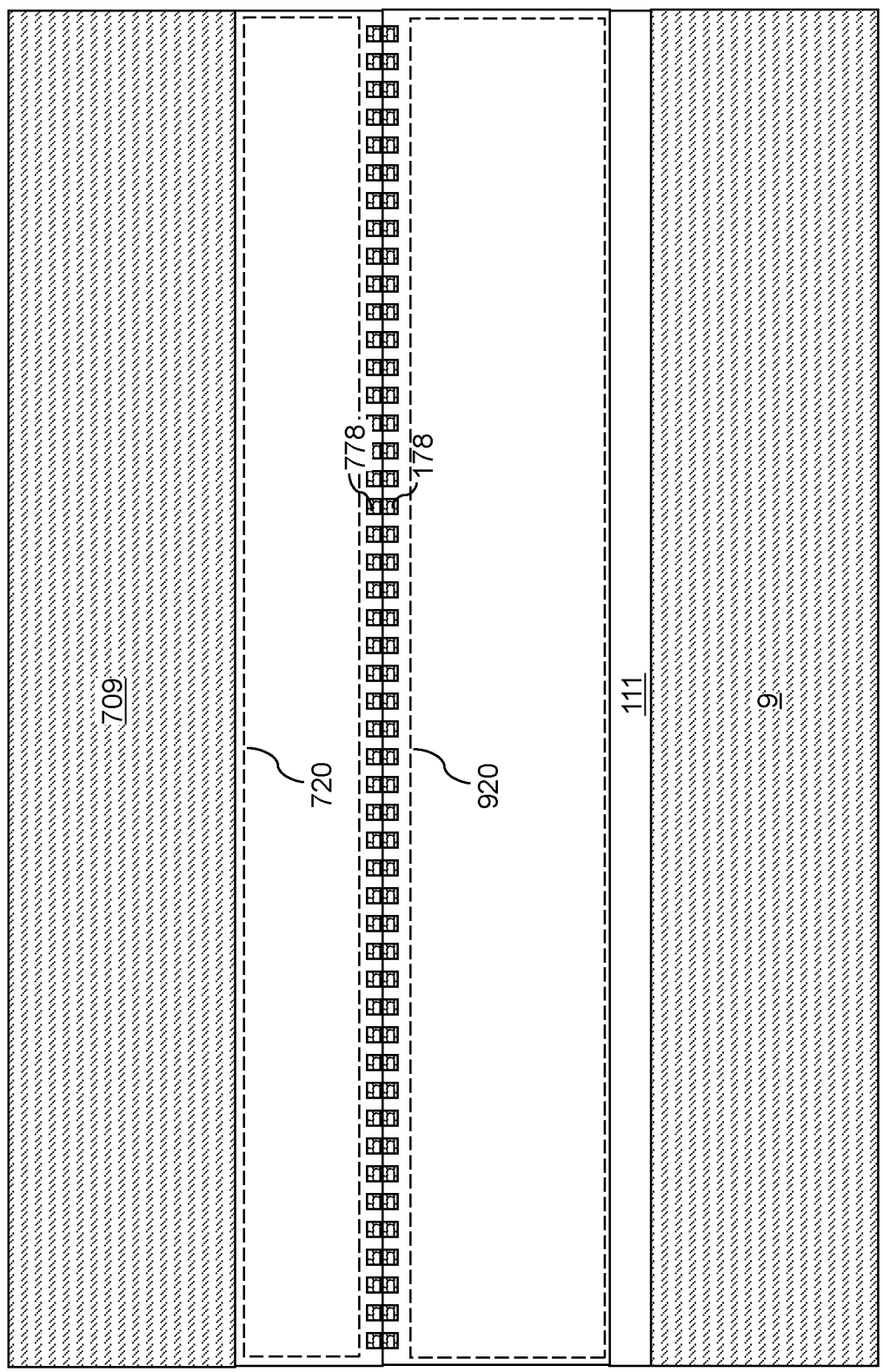
FIG. 18 is a schematic vertical cross-sectional view of the first exemplary structure after bonding a logic die to the memory die according to the first embodiment of the present disclosure.
Figure 19:
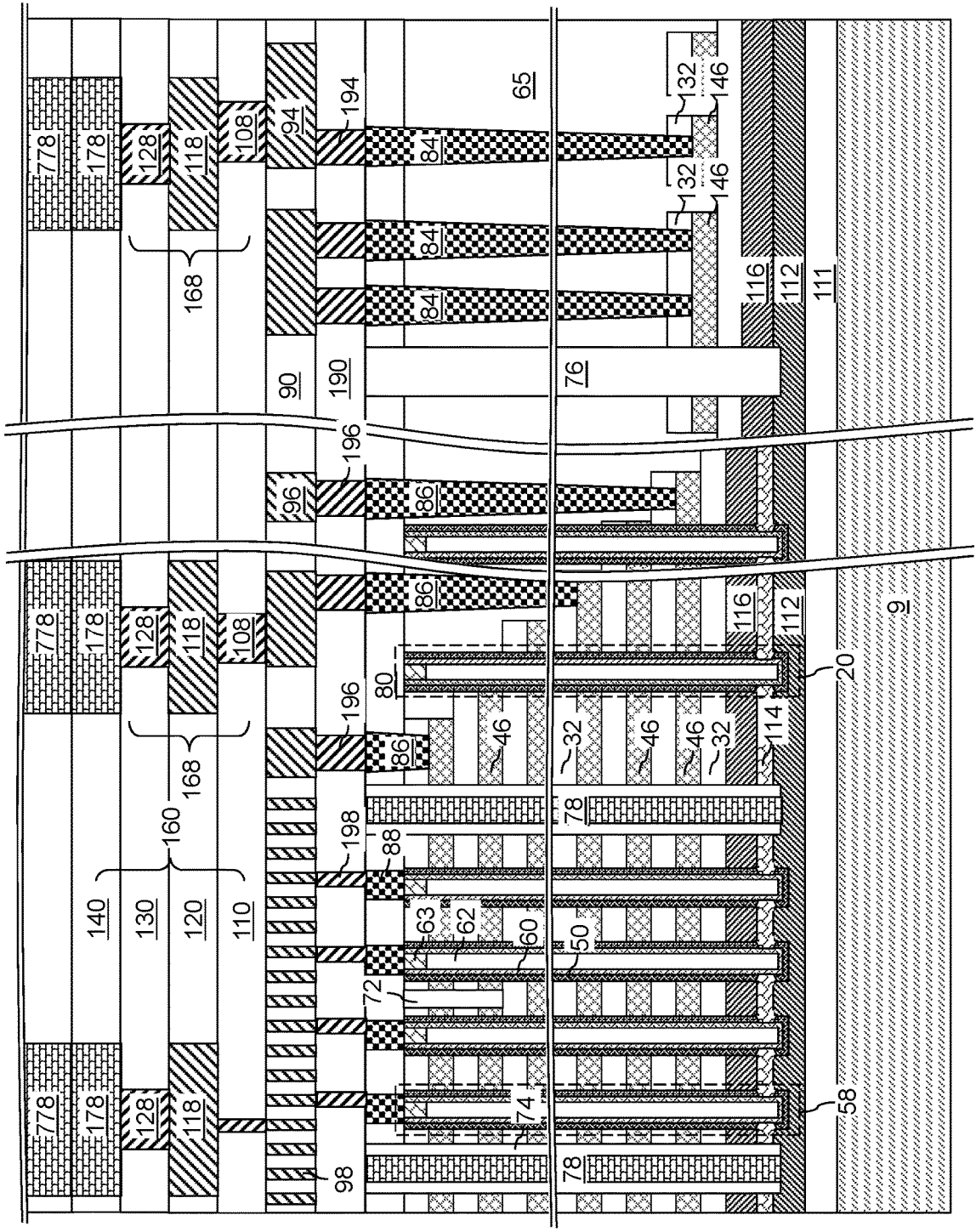
FIG. 19 is a schematic vertical cross-sectional view of a region of the first exemplary structure of FIG. 18.

Referring to FIGS. 18 and 19, a logic die 700 can be provided, which includes a logic-side substrate 709, a peripheral circuit 720 located on the logic-side substrate 709 and comprising logic-side semiconductor devices (such as field effect transistors) and logic-side metal interconnect structures, and logic-side bonding pads 778. The peripheral circuit 720 can be configured to control operation of the memory device 920 within the memory die 900. Specifically, the peripheral circuit 720 can be configured to drive various electrical components within the memory device 920 including, but not limited to, the electrically conductive layers 46 (e.g., word lines and select gate electrodes) and bit lines 98.

The logic die 700 can be attached to the memory die 900, for example, by bonding the logic-side bonding pads 778 to the memory-side bonding pads 178. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process.

Generally, an assembly comprising the at least one semiconductor material layer (112, 114, 116), the alternating stack (32, 46), the first dielectric material layers, and the first bonding pads (such as the memory-side bonding pads 178) can be bonded to second bonding pads (such as the logic-side bonding pads 778) located on a semiconductor die comprising a second substrate, semiconductor devices, second metal interconnect structures embedded in second dielectric material layers.

Figure 20:
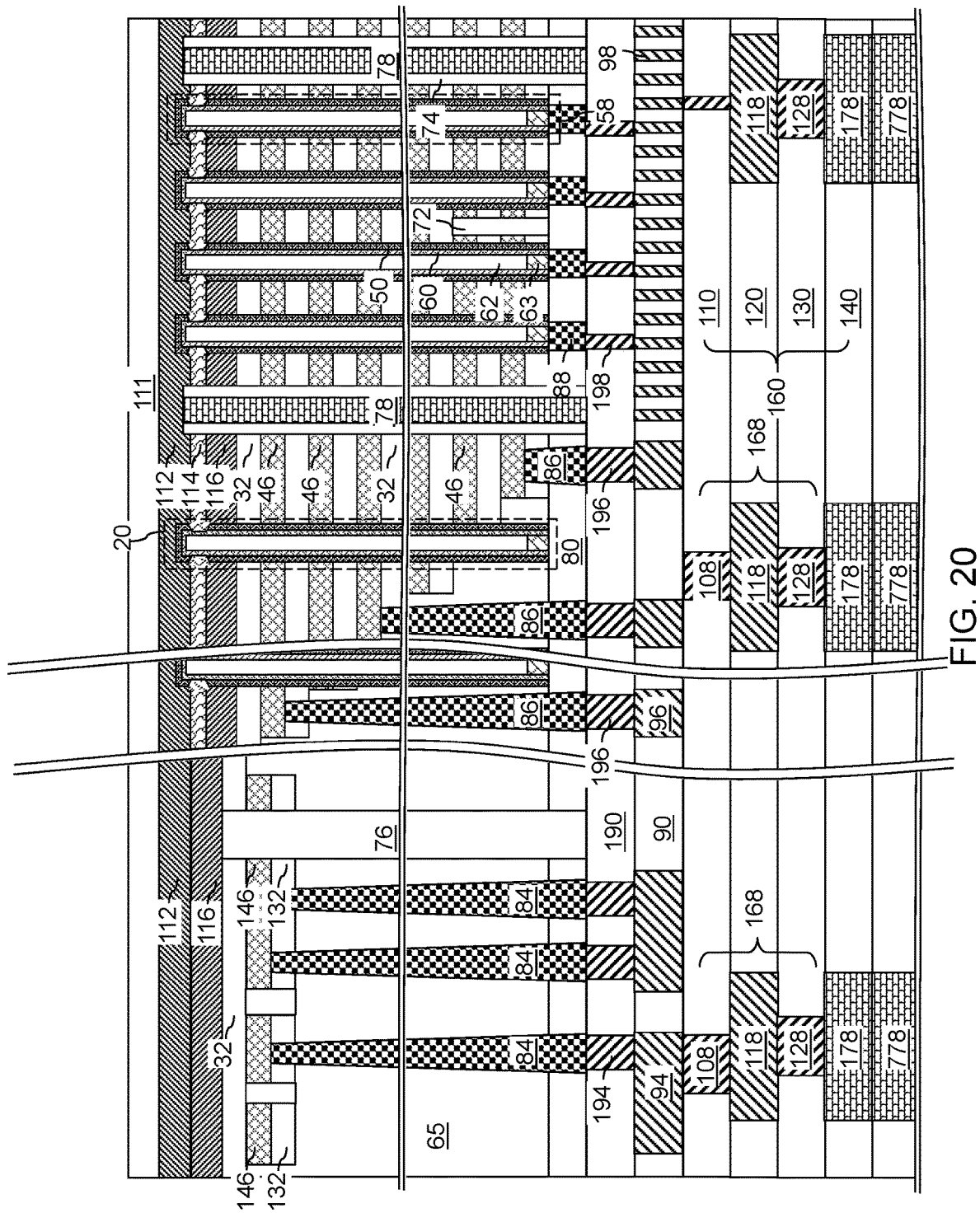
FIG. 20 is a schematic vertical cross-sectional view of the first exemplary structure after removal of the carrier substrate according to the first embodiment of the present disclosure.

Referring to FIG. 20, the carrier substrate 9 can be removed, and a backside planar surface of the buffer dielectric layer 111 can be physically exposed. For example, the carrier substrate 9 can be thinned by grinding, polishing, an isotropic etch process, and/or an anisotropic etch process. Other substrate removal processes may also be used.

Figure 21:
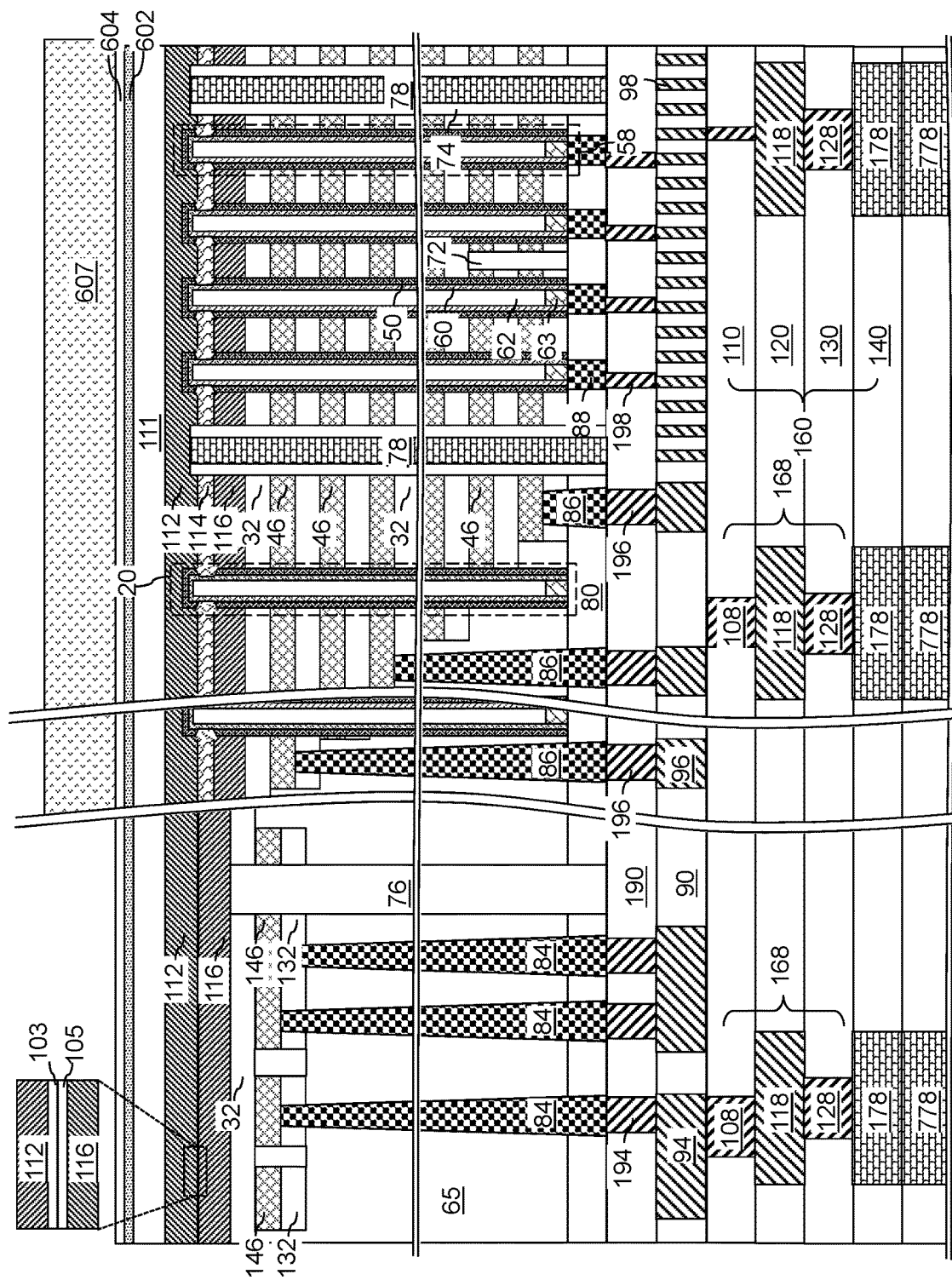
FIG. 21 is a schematic vertical cross-sectional view of the first exemplary structure after formation of backside dielectric liners and a patterned photoresist layer according to the first embodiment of the present disclosure.

Referring to FIG. 21, backside dielectric liners (602, 604) can be optionally formed on the backside planar surface of the buffer dielectric layer 111. The backside dielectric liners (602, 604) can include a layer stack of a first backside dielectric liner 602 and a second backside dielectric liner 604. For example, the first backside dielectric liner 602 may be a silicon nitride or silicon carbonitride liner having a thickness in a range from 10 nm to 200 nm, and the second backside dielectric liner 604 may be a silicon oxide liner having a thickness in a range from 10 nm to 200 nm.

A photoresist layer 607 may be subsequently applied over the backside dielectric liners (602, 604), and may be lithographically patterned such that the patterned photoresist layer covers a continuous area including all of the memory opening fill structures 58, and does not cover the areas of the metal plates 146.

Figure 22:
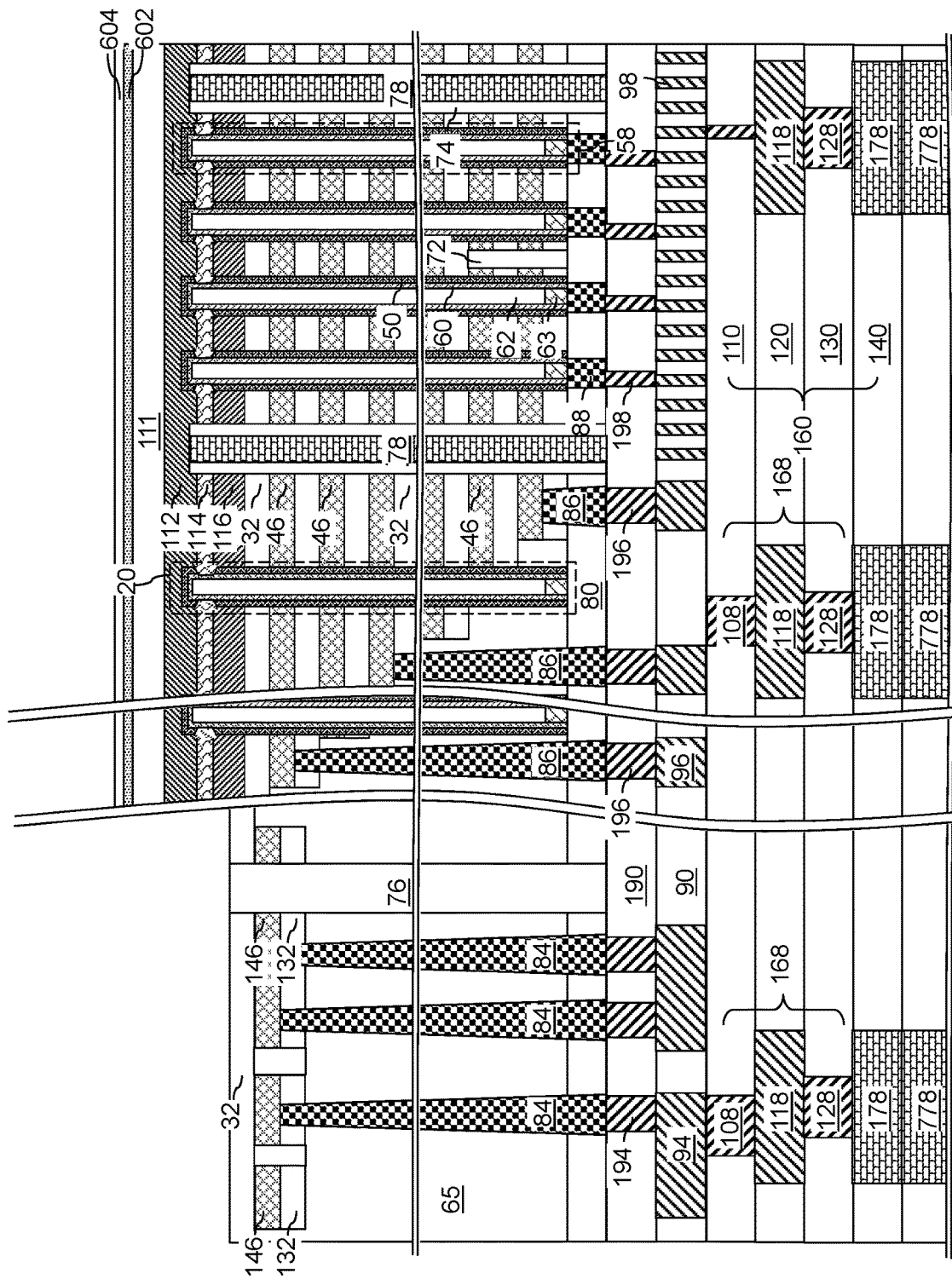
FIG. 22 is a schematic vertical cross-sectional view of the first exemplary structure after removal of unmasked portions of the backside dielectric liners, the buffer dielectric layer, and the source-level material layers according to the first embodiment of the present disclosure.

Referring to FIG. 22, a sequence of etch processes may be performed to remove portions of the backside dielectric liners (602, 604), the buffer dielectric layer 111, and the source-level material layers (112, 103, 105, 116) that are not masked by the patterned photoresist layer 607. The sequence of etch processes may comprise at least one anisotropic etch process and/or at least one isotropic etch process. For example, the sequence of etch processes may comprise a first etch process that etches the material of the second backside dielectric liner 604, a second etch process that etches the material of the first backside dielectric liner 602, a third etch process that etches the dielectric materials of the buffer dielectric layer 111 and the dielectric trench fill structure 76, and a fourth etch process that etches the semiconductor materials of the source-level material layers (112, 103, 105, 116) selective to the insulating layers 32 and the dielectric trench fill structures 76. In one embodiment, the duration of the fourth etch process may be performed such that recessed surfaces of the dielectric trench fill structures 76 are formed at or close to the horizontal plane including an interface between the alternating stack (32, 46) and the source-level material layers (112, 103, 105, 116). Portions of the source-level material layers (112, 103, 105, 116) that have an areal overlap with the metal plates 146 are removed. Generally, unmasked portions of the backside dielectric liners (602, 604), the buffer dielectric layer 111, and source-level material layers (112, 103, 105, 116) may be removed. Subsequently, the patterned photoresist layer 607 may be removed, for example, by ashing.

Figure 23:
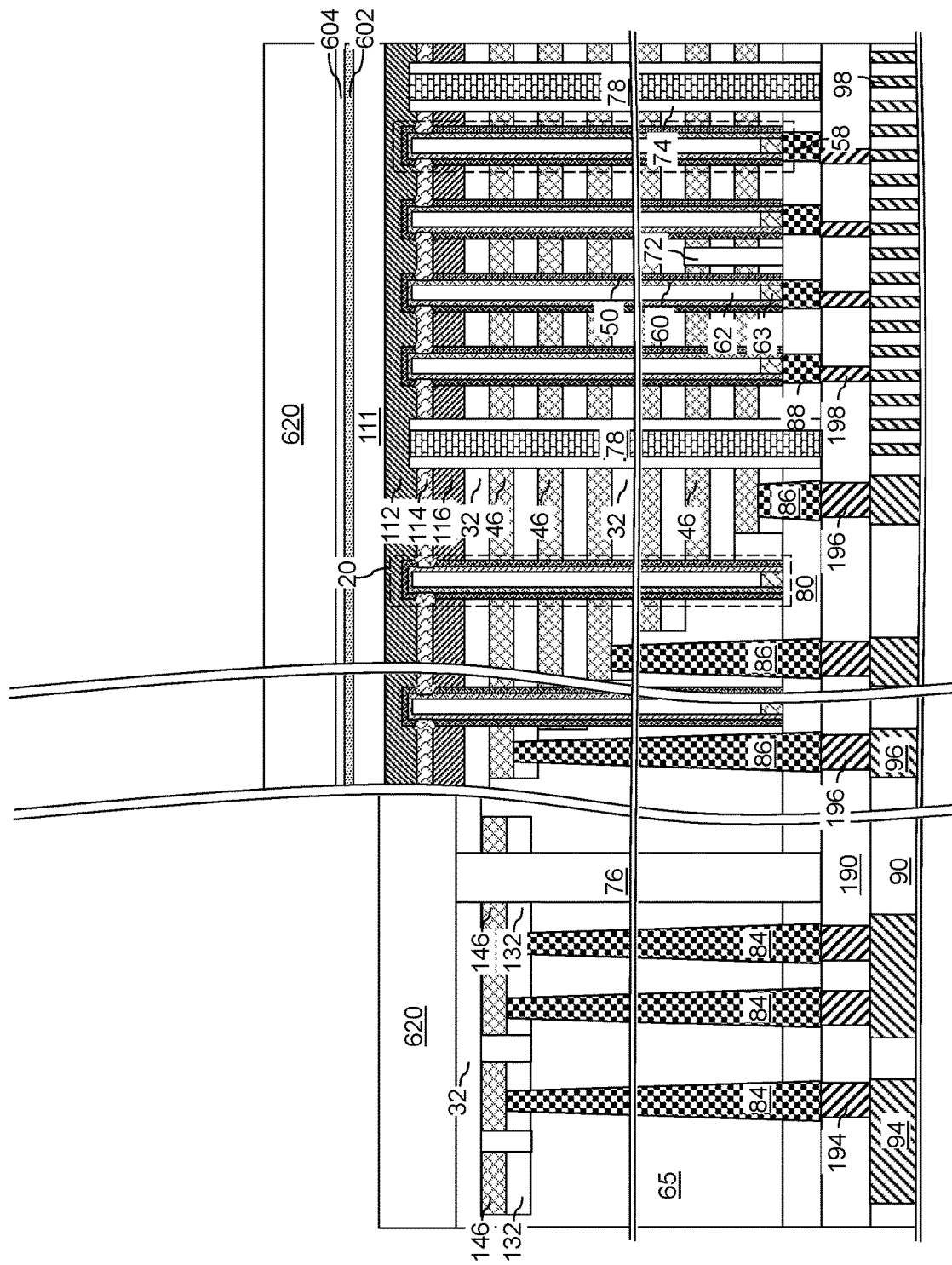
FIG. 23 is a schematic vertical cross-sectional view of the first exemplary structure after formation of a backside dielectric layer according to the first embodiment of the present disclosure.

Referring to FIG. 23, a backside dielectric material layer 620 can be deposited over a backside of the metal plates 146. The backside dielectric material layer 620 comprises a dielectric material such as silicon oxide, and may be deposited by a conformal or non-conformal deposition method. The vertical thickness of a planar portion of the backside dielectric material layer 620 may be in a range from 100 nm to 1,000 nm, such as from 200 nm to 600 nm, although lesser and greater vertical thicknesses may also be employed.

Figure 24:
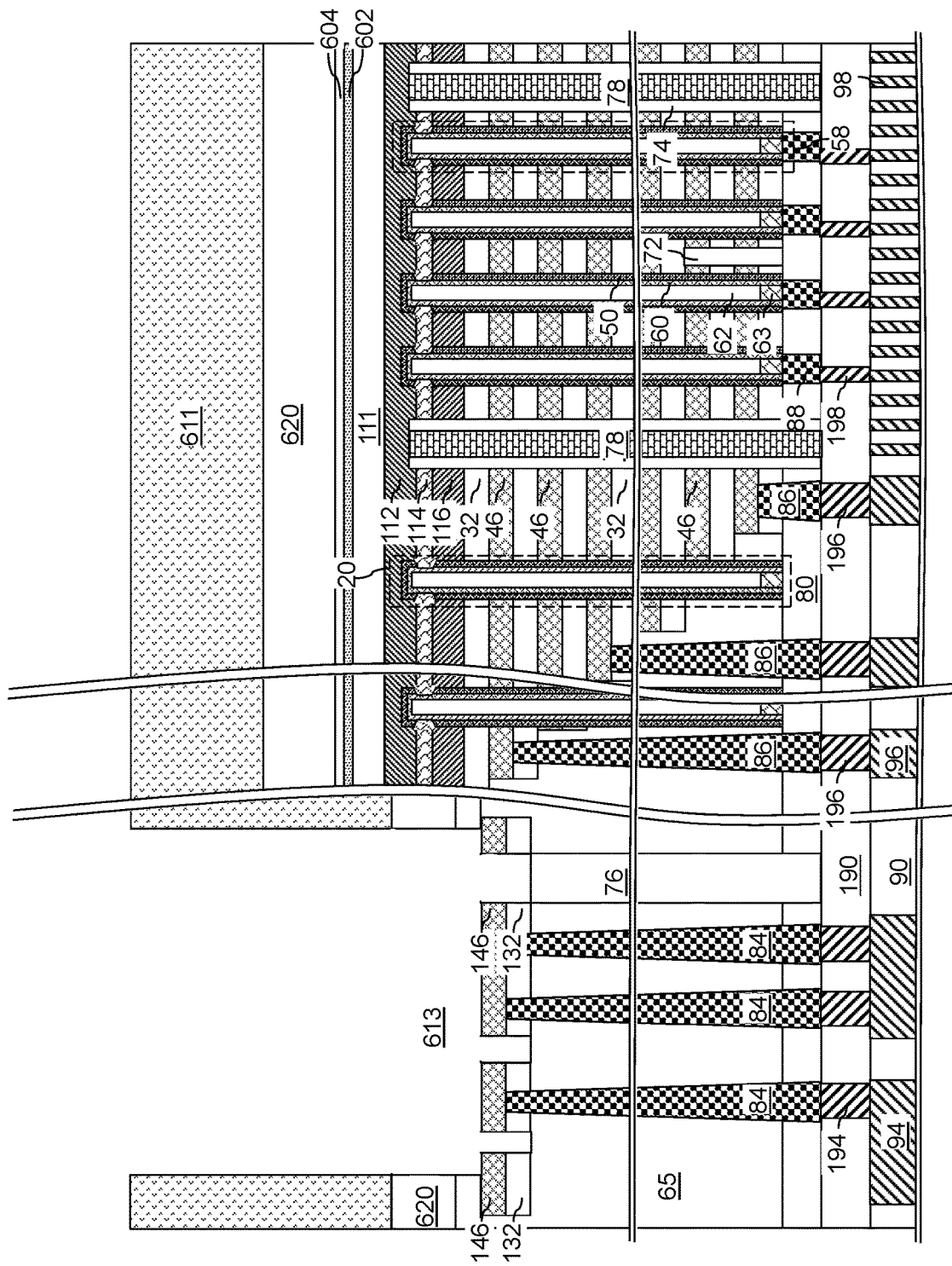
FIG. 24 is a schematic vertical cross-sectional view of the first exemplary structure after formation of a first backside contact via cavity according to the first embodiment of the present disclosure.

Referring to FIG. 24, a first photoresist layer 611 may be applied over the backside dielectric material layer 620, and can be lithographically patterned to form at least one opening that overlies a respective subset of the metal plates 146. An anisotropic etch process can be performed to remove portions of the backside dielectric material layer 620 that are not masked by the first photoresist layer 611. The anisotropic etch process may collaterally etch segments of the stepped dielectric material portion 65 and the dielectric trench fill structures 76 that are not masked by the first photoresist layer 611 or the metal plates 146. Sidewalls of the metal plates 146 can be physically exposed by the anisotropic etch process. The metal plates 146 act as an etch stop layers during this etch process. A first backside contact via cavity 613 can be formed in each volume from which the materials of the backside dielectric material layer 620, a most proximal insulating layer 32, and segments of the stepped dielectric material portion 65 and the dielectric fill structures 76 are removed. The first photoresist layer 611 may be subsequently removed, for example, by ashing.

Figure 25:
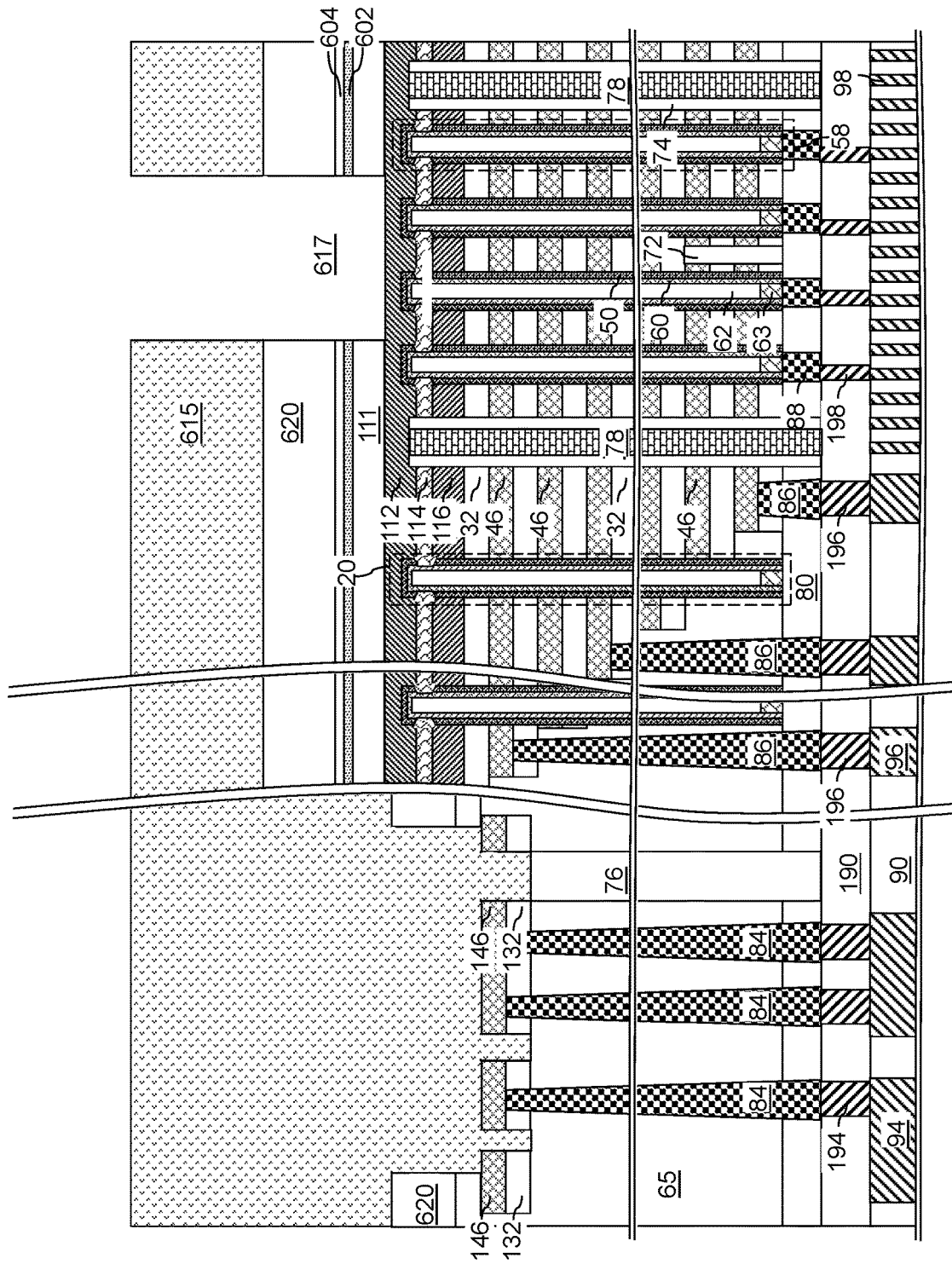
FIG. 25 is a schematic vertical cross-sectional view of the first exemplary structure after formation of a second backside contact via cavity according to the first embodiment of the present disclosure.

Referring to FIG. 25, a second photoresist layer 615 may be applied over the backside dielectric material layer 620, and can be lithographically patterned to form at least one opening that overlies the source-level material layers (112, 114, 116) (which include at least one semiconductor material layer) in the memory array region 100. An anisotropic etch process can be performed to remove portions of the backside dielectric material layer 620, the backside dielectric liners (602, 604), and the buffer dielectric layer 111 that are not masked by the second photoresist layer 615. The anisotropic etch process may be selective to the semiconductor material of the source-level material layers (112, 114, 116). A backside surface of the source-level material layers (112, 114, 116), such as a backside surface of the first source-level semiconductor layer 112, can be physically exposed by the anisotropic etch process. A second backside contact via cavity 617 can be formed in each volume from which the materials of the backside dielectric material layer 620, the backside dielectric liners (602, 604), and the buffer dielectric layer 111 are removed. The second photoresist layer 615 may be subsequently removed, for example, by ashing.

Figure 26:
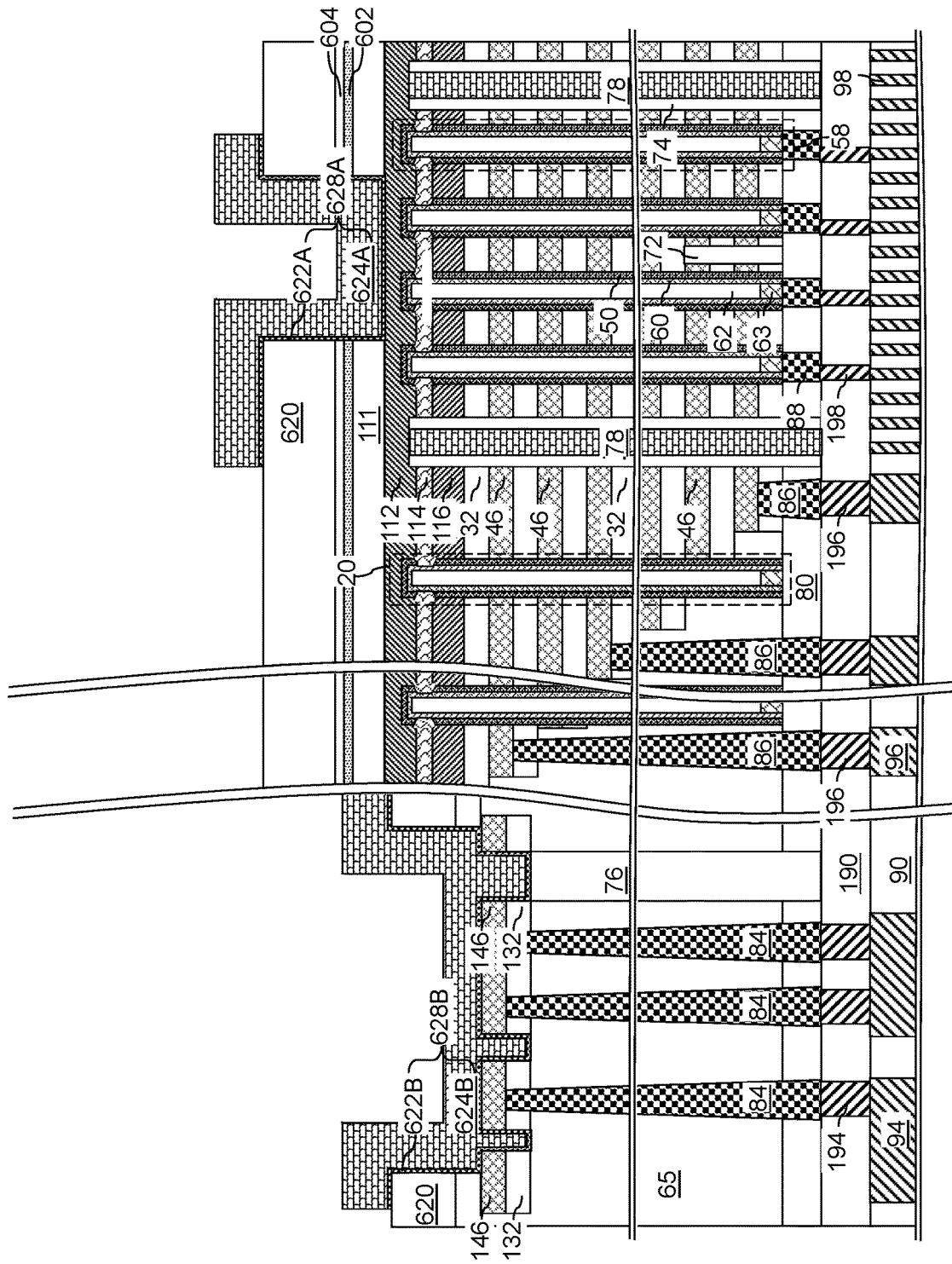
FIG. 26 is a schematic vertical cross-sectional view of the first exemplary structure after formation of backside contact pad structures according to the first embodiment of the present disclosure.

Referring to FIG. 26, at least one metallic material can be deposited in the openings in the backside dielectric material layer 620 and over physically exposed backside surfaces of the backside dielectric material layer 620. The at least one metallic material may comprise a metallic liner layer and a metal layer. The metallic liner layer may comprise a metallic barrier material such as Ti, Ta, TiN, TaN, WN, MoN, or a combination thereof. The thickness of the metallic liner layer may be in a range from 10 nm to 100 nm, although lesser and greater thicknesses may also be employed. The metal layer includes a metal such as W, Mo, Ti, Ta, Ru, Co, Cu, Al or any other suitable metal that can provide high electrical conductivity. The thickness of the metal layer may be in a range from 100 nm to 1,000 nm, although lesser and greater thicknesses may also be employed. The metallic liner layer and the metal layer may be patterned to form contact pad structures (628A, 628B). The patterning of the metal layer and the metallic liner layer may employ a patterned photoresist layer and at least one etch process. Alternatively, the metal layer may be formed by electroplating while a patterned photoresist layer covers the metallic liner layer. In this case, portions of the metallic liner layer that are not covered by electroplated metal portions may be removed by an etch process. Generally, any known process for forming contact pad structures (628A, 628B) may be employed.

The contact pad structures (628A, 628B) may comprise at least one source contact pad structure 628A that is formed directly on a backside surface of the at least one semiconductor material layer, such as the source-level material layers (112, 114, 116). Further, the contact pad structures (628A, 628B) may comprise at least one backside contact pad structure 628B that is formed directly on the backside surface(s) of a respective subset of metal plate 146. Each backside contact pad structure 628B can be in contact with at least one metal plate 146, can be spaced from at least one connection via structure 84 by the at least one metal plate 146, and can be electrically connected to the at least one connection via structure 84 through the at least one metal plate 146.

Each source contact pad structure 628A contacts a backside surface of the at least one semiconductor material layer (112, 114, 116), and comprises a same set of materials as the backside contact pad structures 628B. In one embodiment, each source contact pad structure 628A may comprise a first metallic liner 622A including the material of the metallic liner layer, and a first contoured metal plate 624A including the material of the metal layer. Each backside contact pad structure 628B may comprise a second metallic liner 622B including the material of the metallic liner layer, and a second contoured metal plate 624B including the material of the metal layer.

In one embodiment, the second metallic liner 622B contacts at least one sidewall of at least one metal plate 146, and optionally contacts at least one sidewall of at least one insulating plate 132. The second metallic liner 622B may contact at least one horizontal surface segment of the stepped dielectric material portion 65 that is more distal from the horizontal plane including the interface between the alternating stack (32, 46) and the at least one semiconductor material layer (112, 114, 116) than the insulating plates 132 are from the horizontal plane. In one embodiment, the second metallic liner 622B may contact a recessed end surface of a dielectric trench fill structure 76 that is more distal from the horizontal plane including the interface between the alternating stack (32, 46) and the at least one semiconductor material layer (112, 114, 116) than the insulating plates 132 are from the horizontal plane.

Figure 27A:
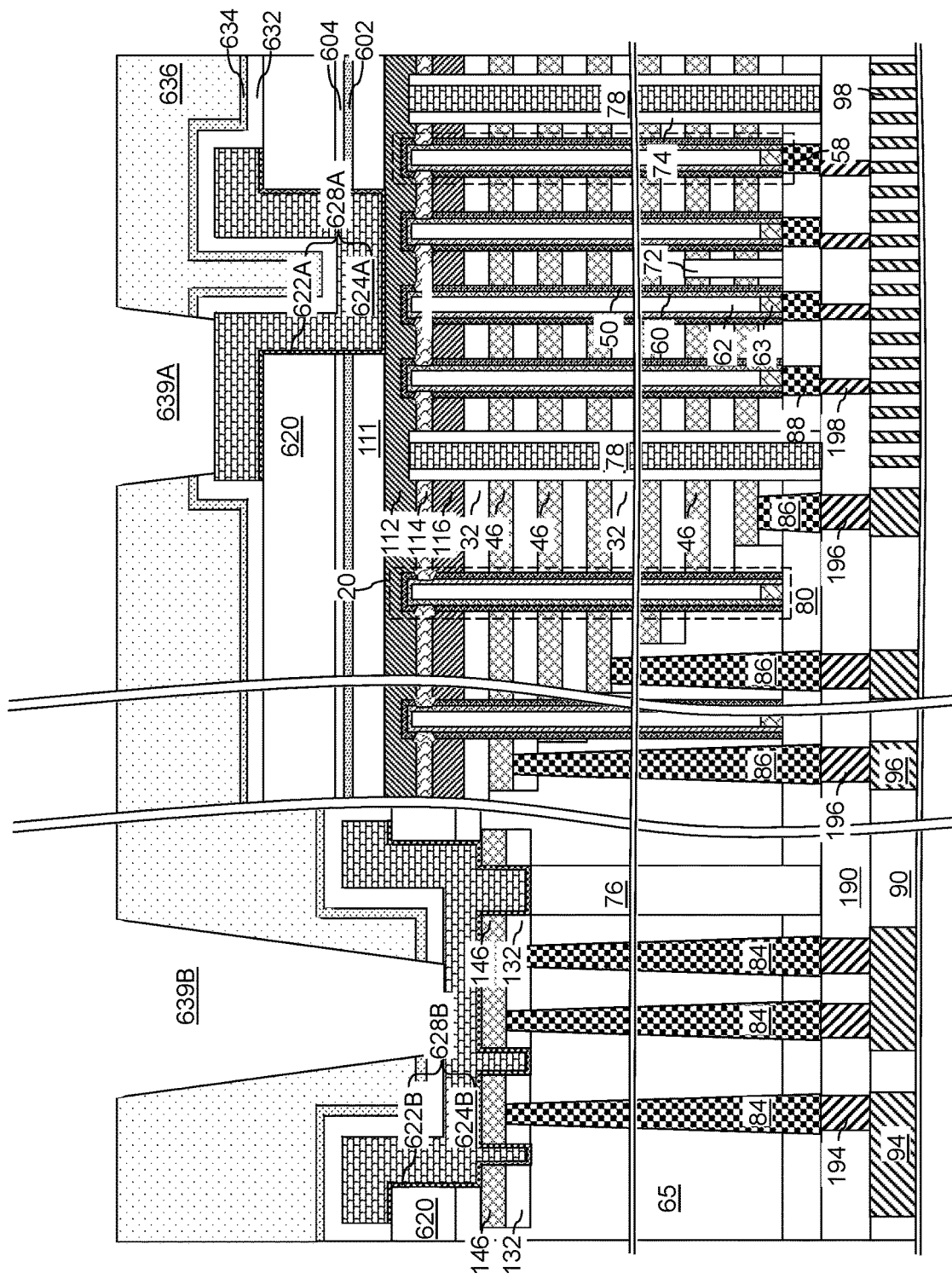
FIG. 27A is a schematic vertical cross-sectional view of the first exemplary structure after formation of a passivation dielectric layer and via cavities according to the first embodiment of the present disclosure.

Referring to FIG. 27A, at least one backside dielectric cover layer (632, 634) may be deposited over the source contact pad structures 628A and the backside contact pad structures 628B. The at least one backside dielectric cover layer (632, 634) may comprise a first backside dielectric cover layer 632 and a second backside dielectric cover layer 634. In one embodiment, the first backside dielectric cover layer 632 may comprise a silicon oxide layer, and the second backside dielectric cover layer 634 may comprise a silicon nitride layer.

A passivation dielectric layer 636 can be formed over the at least one backside dielectric cover layer (632, 634). The passivation dielectric layer 636 comprises a passivation dielectric material, such as polyimide. The passivation dielectric layer 636 can be patterned to form via cavities (639A, 639B) therethrough. An etch process can be performed to form openings through the at least one backside dielectric cover layer (632, 634) over a respective one of the source contact pad structures 628A and the backside contact pad structures 628B underneath the via cavities (639A, 639B) in the passivation dielectric layer 636. The via cavities (639A, 639B) can vertically extend through the passivation dielectric layer 636 and the at least one backside dielectric cover layer (632, 634). A backside surface of one of the source contact pad structures 628A and the backside contact pad structures 628B at a bottom region of each via cavity (639A, 639B). The via cavities (639A, 639B) are also referred to as backside via cavities, which can accommodate external contacts.

Figure 27B:
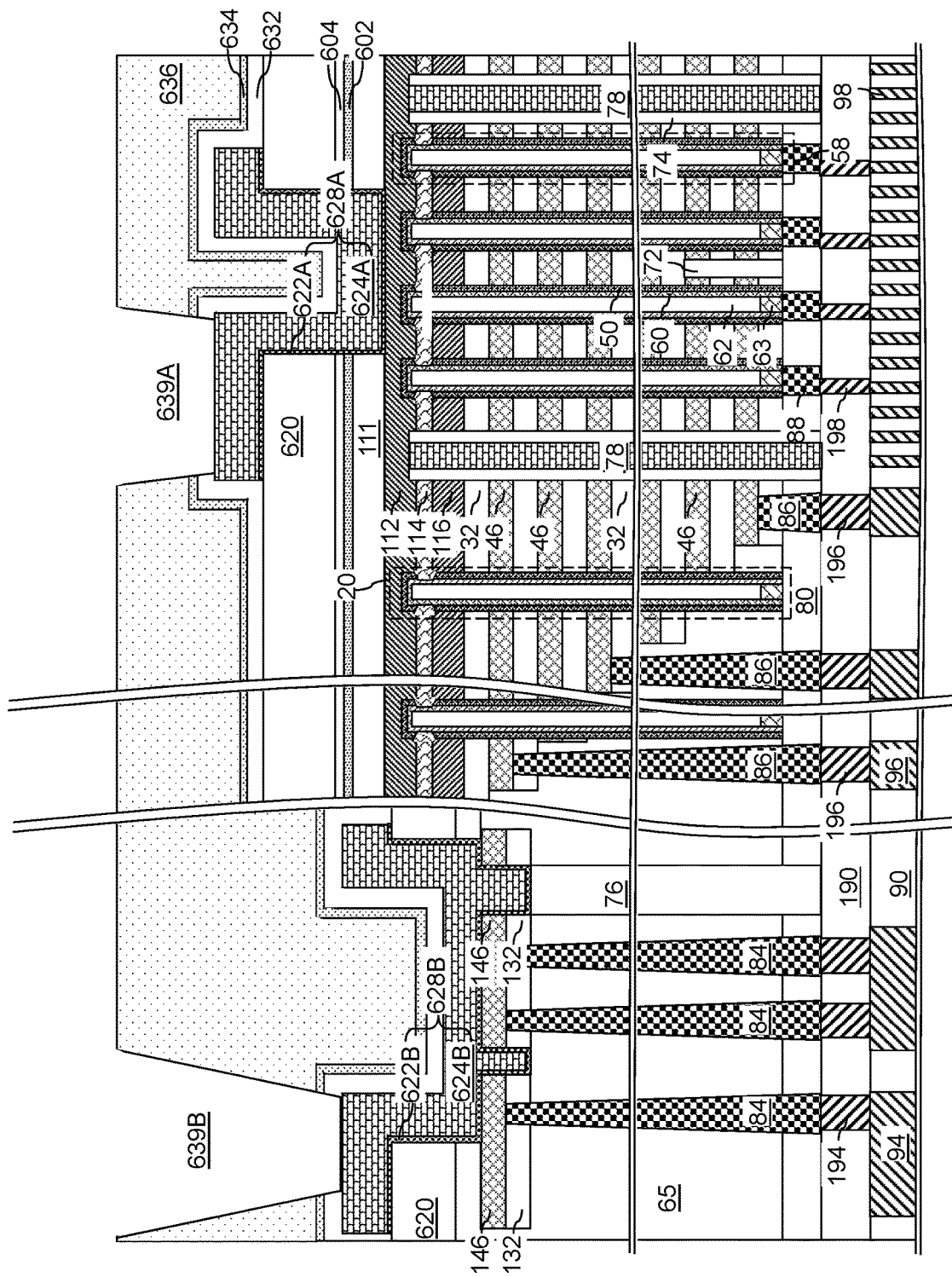
FIG. 27B is a schematic vertical cross-sectional view of a first alternative configuration of the first exemplary structure after formation of a passivation dielectric layer and via cavities according to the first embodiment of the present disclosure.
Figure 27C:
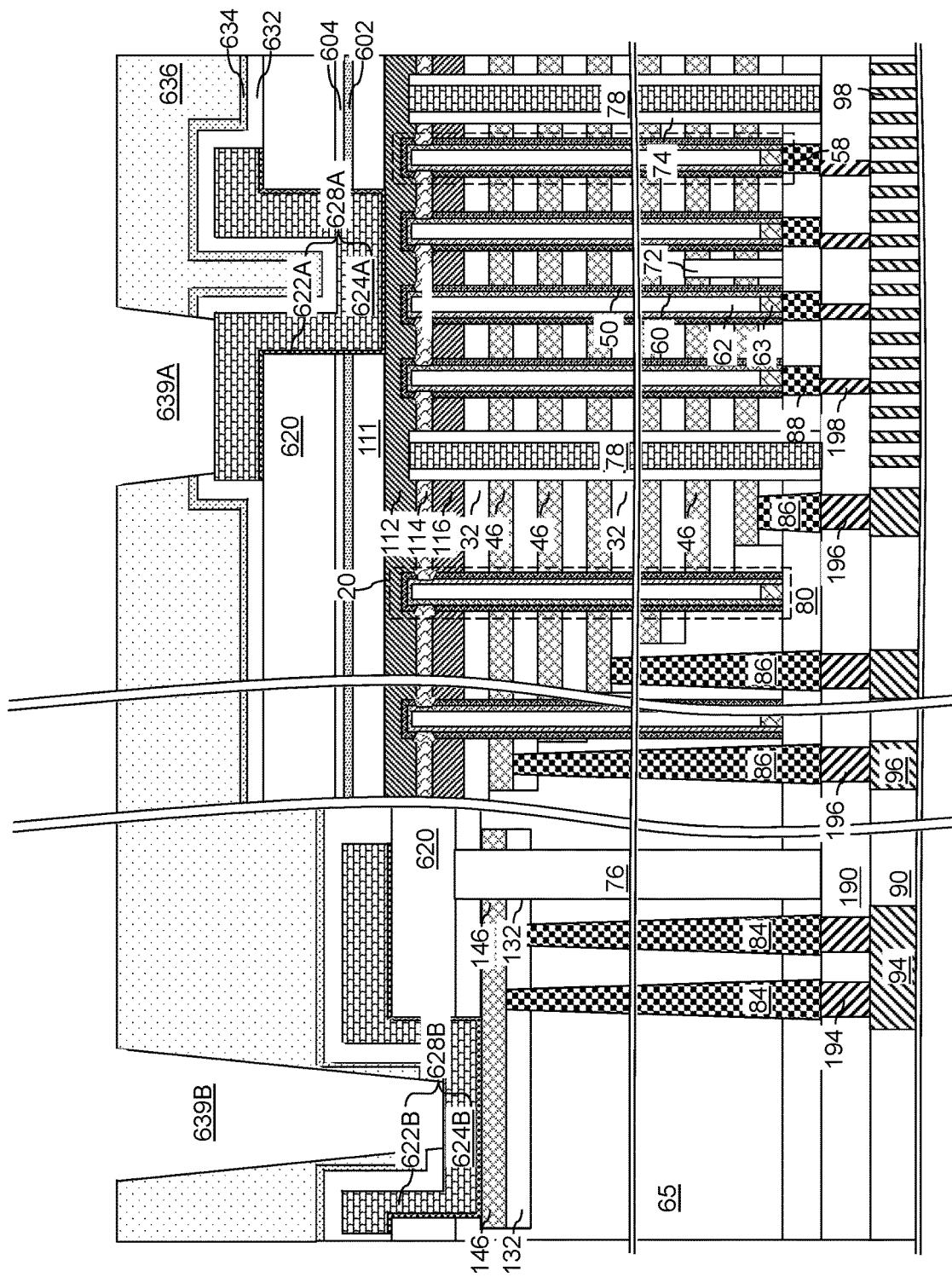
FIG. 27C is a schematic vertical cross-sectional view of a second alternative configuration of the first exemplary structure after formation of a passivation dielectric layer and via cavities according to the first embodiment of the present disclosure.

FIGS. 27B and 27C illustrate alternative configurations of the first exemplary structure in which the via cavity 639B overlying the backside contact pad structure 628B is formed on a non-recessed portion of the backside contact pad structure 628B that is vertically offset from the recessed portion of the backside contact pad structure 628B that directly contacts the metal pad(s) 146. The physically exposed area of the backside contact pad structure 628B underlying the via cavity 639B may or may not have an areal overlap with the metal pad(s) 146. Further, the physically exposed area of the backside contact pad structure 628B underlying the via cavity 639B may or may not have an areal overlap with the connection via structures 84. Further, the area of the via cavity 639B may or may not have an areal overlap with the contact area between the backside contact pad structure 628B and the metal pad(s) 146. The backside contact pad structure 628B may or may not have vertically protruding portions that contact sidewalls of the metallic plate(s) 146. The backside contact pad structure 628B may contact a single metal pad 146, or may contact a plurality of metal pads 146. Generally, the at least one backside dielectric cover layer (632, 634) comprises openings therethrough.

Each opening may have an end periphery that is located on a backside surface of a respective one of the source contact pad structures 628A and the backside contact pad structures 628B.

Referring to FIG. 28A, a second exemplary structure according to a second embodiment of the present disclosure is illustrated. The second exemplary structure comprises a carrier substrate 9 and a buffer dielectric layer 111 that is formed on the carrier substrate 9. The carrier substrate 9 may be the same as in the first exemplary structure illustrated in FIG. 1. The buffer dielectric layer 111 can be deposited one a front-side of the carrier substrate 9. The buffer dielectric layer 111 includes a dielectric material that is different from the material of the carrier substrate 9. For example, a buffer dielectric layer 111 may comprise silicon oxide. The thickness of the buffer dielectric layer 111 may be in a range from 50 nm to 1,000 nm, such as from 100 nm to 500 nm, although lesser and greater thicknesses may also be employed.

A photoresist layer 203 can be formed on a front surface of the buffer dielectric layer 111, and can be lithographically patterned to form an opening within an area in which connection via structures are to be subsequently formed. An etch process can be performed to vertically recess portions of the buffer dielectric layer 111 that are not masked by the photoresist layer 203. At least one recess 205 is formed within an upper region of the buffer dielectric layer 111. The photoresist layer 203 can be subsequently removed, for example, by ashing.

Figure 28B:
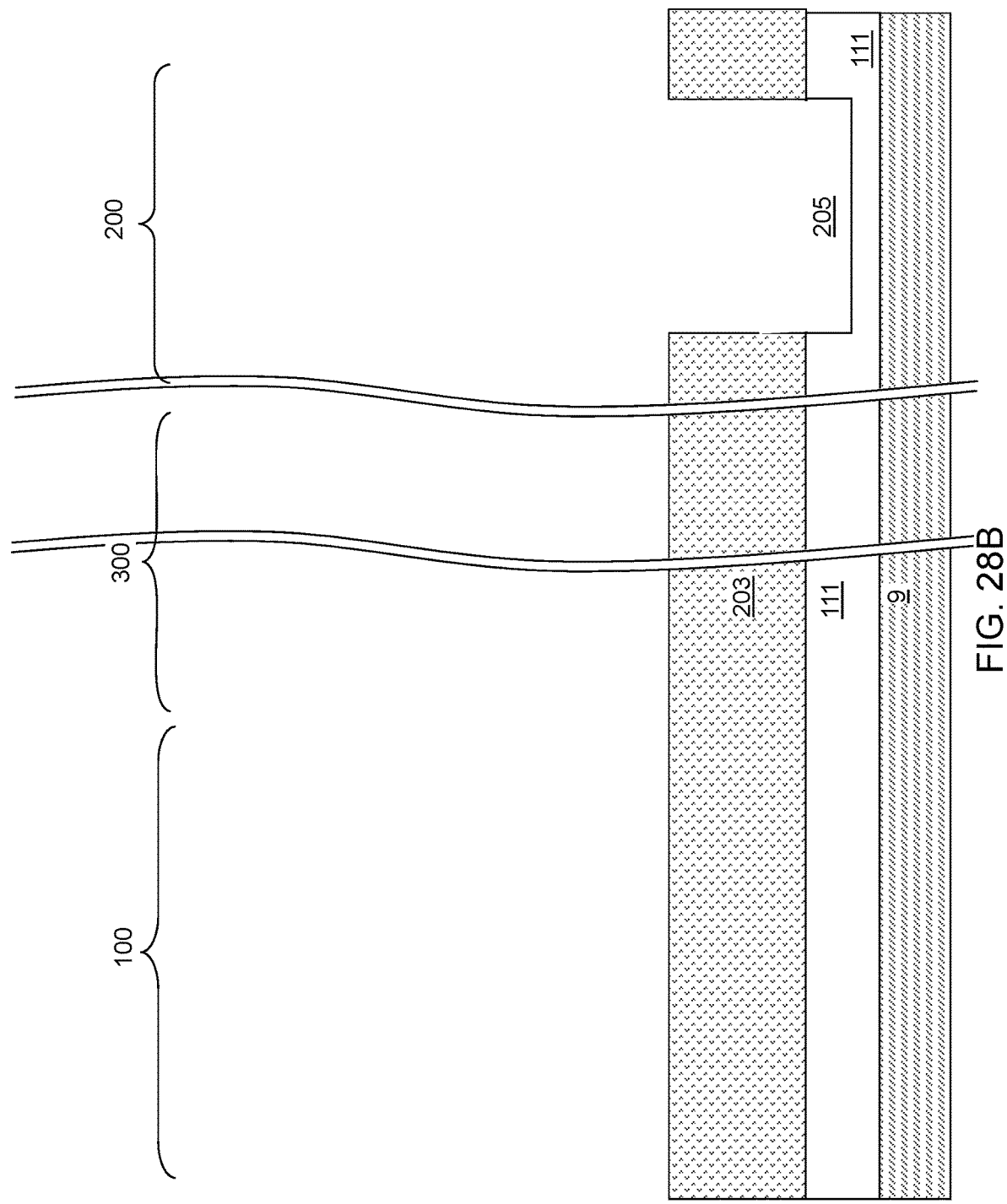

Referring to FIG. 28B, in an alternative configuration, the opening(s) in the photoresist layer 203 may be formed only within the contact pad areas in which metal plates are to be subsequently formed. In this configuration, each recess 205 is formed only within areas in which metal plates are to be subsequently formed within the area of the connection via region 200.

Figure 29:
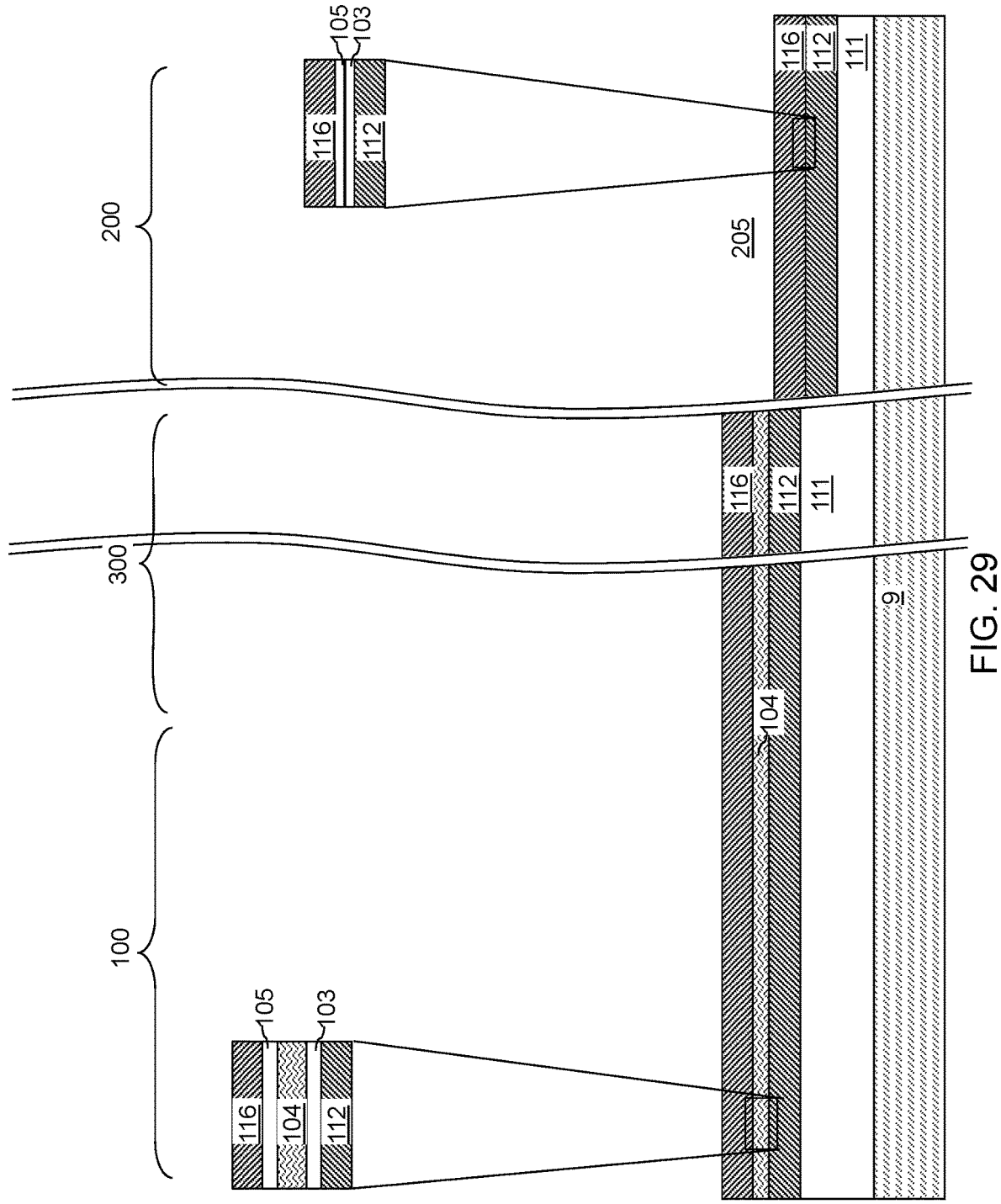
FIG. 29 is a schematic vertical cross-sectional view of the second exemplary structure after formation of in-process source-level material layers according to the second embodiment of the present disclosure.

Referring to FIG. 29, in-process source-level material layers (112, 103, 104, 105, 116) can be formed over the buffer dielectric layer 111 in the memory array region 100 and in the staircase region 300. As described above, in-process source-level material layers (112, 103, 105, 116) can be formed over the buffer dielectric layer 111 in the connection via region 200. Each component within the in-process source-level material layers (112, 103, 104, 105, 116) may have the same material composition and the same thickness range as in the first exemplary structure illustrated in FIG. 1. The topography of a recessed front surface of the buffer dielectric layer 111 is replicated on a top surface of the in-process source-level material layers (112, 103, 105, 116) in the connection via region 200, such that a recess 205 is formed in a top surface of the second source-level semiconductor layer 116 in the connection via region 200.

Figure 30:
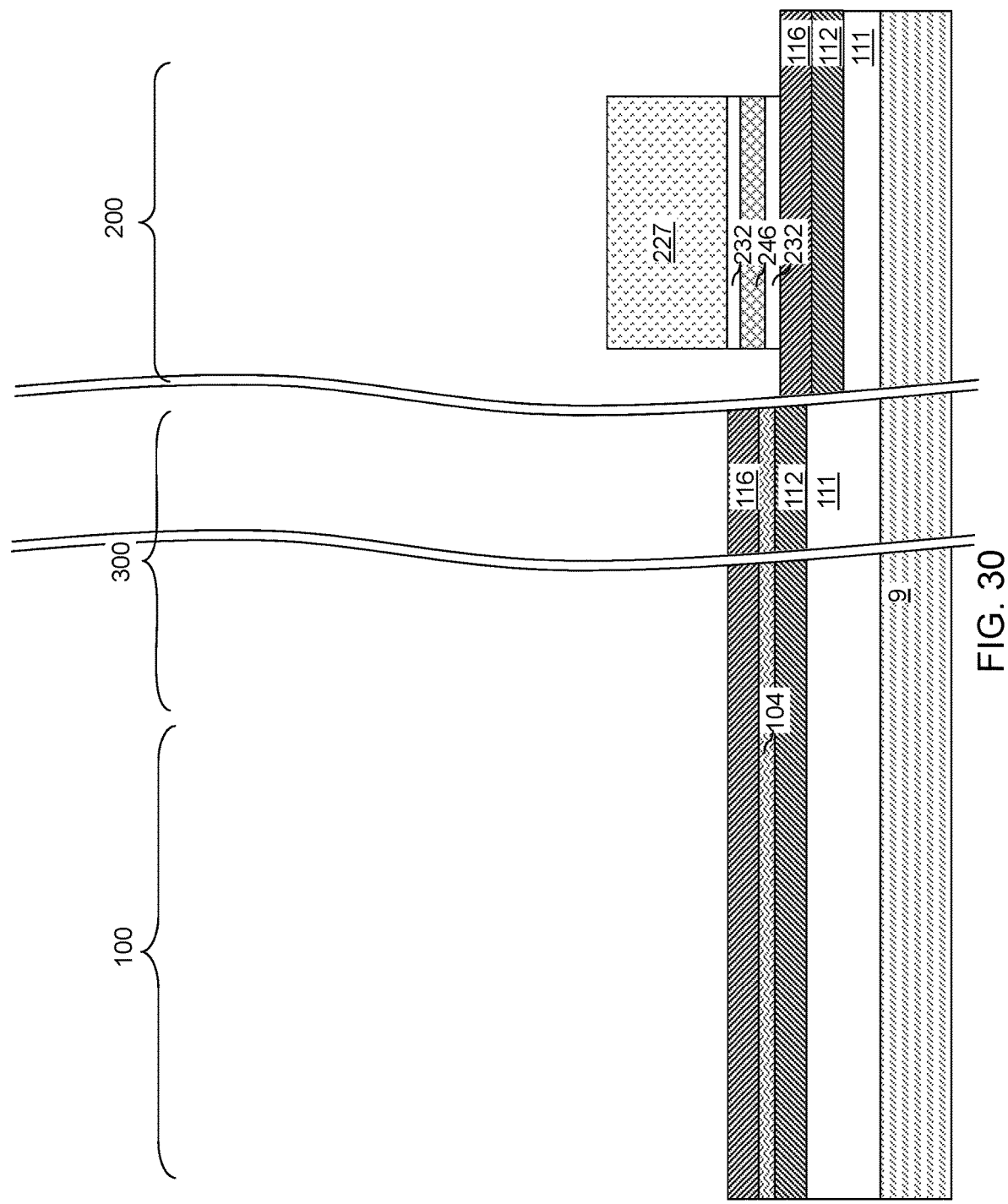
FIG. 30 is a schematic vertical cross-sectional view of the second exemplary structure after formation of plate stacks including a respective metal plate according to the second embodiment of the present disclosure.

Referring to FIG. 30, a first insulating material layer, a metallic material layer, and a second insulating material layer may be deposited over the in-process source-level material layers (112, 103, 104, 105, 116). Each of the first insulating material layer and the second insulating material layer includes an insulating material such as silicon oxide, silicon nitride, or a dielectric metal oxide. The metallic material layer includes any metallic material such as W, Ti, Ta, Ru, Co, Mo, Cu, Ni, Pt, Pd, TiN, TaN, WN, MoN, an alloy thereof, or a stack thereof. The first insulating material layer and the second insulating material layer may have a respective thickness in a range from 5 nm to 100 nm, although lesser and greater thicknesses may also be employed. The thickness of the metallic material layer may be in a range from 10 m to 200 nm, although lesser and greater thicknesses may also be employed.

A photoresist layer 227 can be applied over the second insulating material layer, and can be lithographically patterned to cover discrete areas within a region in which connection via structures are to be subsequently formed (which is hereafter referred to as the connection via region 200). An anisotropic etch process can be performed to transfer the pattern of the photoresist layer through the layer stack of the second insulating material layer, the metallic material layer, and the first insulating material layer in the recess 205. Portions of the second insulating material layer, the metallic material layer, and the first insulating material layer that are not masked by the photoresist layer 227 can be removed by the anisotropic etch process. Each patterned portion of the second insulating material layer and the first insulating material layer constitutes an insulating plate 232. Each patterned portion of the metallic material layer constitutes a metal plate 246 located in the recess 205.

At least one plate stack comprising a first insulating plate 232, a metal plate 246, and a second insulating plate 232 can be formed over the at least one semiconductor material layer (112, 114, 116) within the recess 205 region in which the top surface of the at least one semiconductor material layer (112, 114, 116) is vertically recessed. One, a plurality or each of the sidewalls of a metal plate 246 may be vertically coincident with a respective sidewall of an overlying second insulating plate 232 and with a respective sidewall of an underlying first insulating plate 232. Subsequently, the photoresist layer 227 can be removed, for example, by ashing.

Figure 31A:
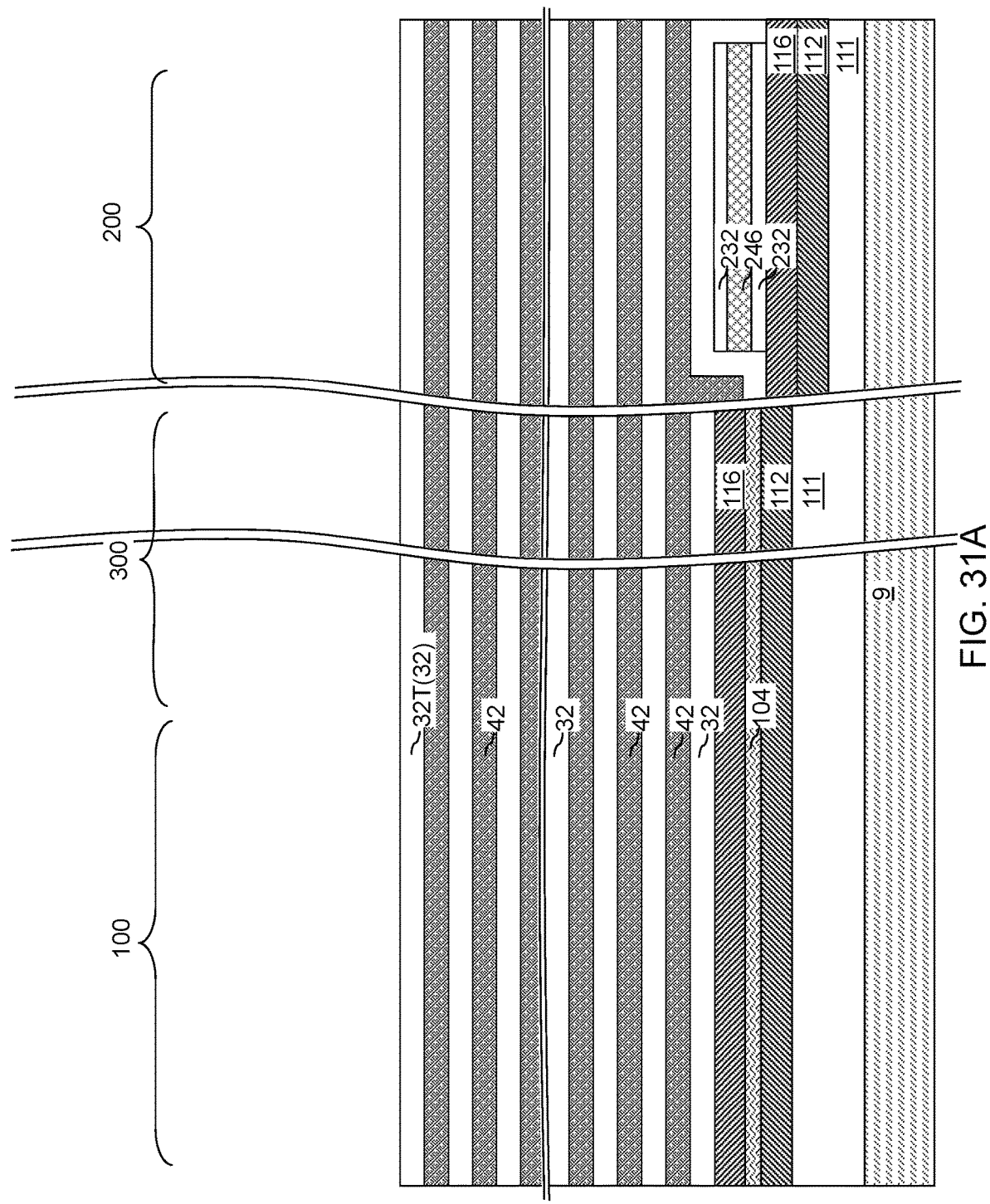
FIGS. 31A and 31B are schematic vertical cross-sectional views of alternative configurations of the second exemplary structure after formation of an alternating stack of insulating layers and sacrificial material layers according to the second embodiment of the present disclosure.

Referring to FIG. 31A, an alternating stack (32, 42) of insulating layers 32 and spacer material layers (such as sacrificial material layers 42) can be formed over the over the at least one semiconductor material layer (112, 114, 116) and the at least one plate stack (232, 246). The processing steps described with reference to FIG. 1 may be employed to form the alternating stack of insulating layers 32 and spacer material layers (such as sacrificial material layers 42).

Figure 31B:
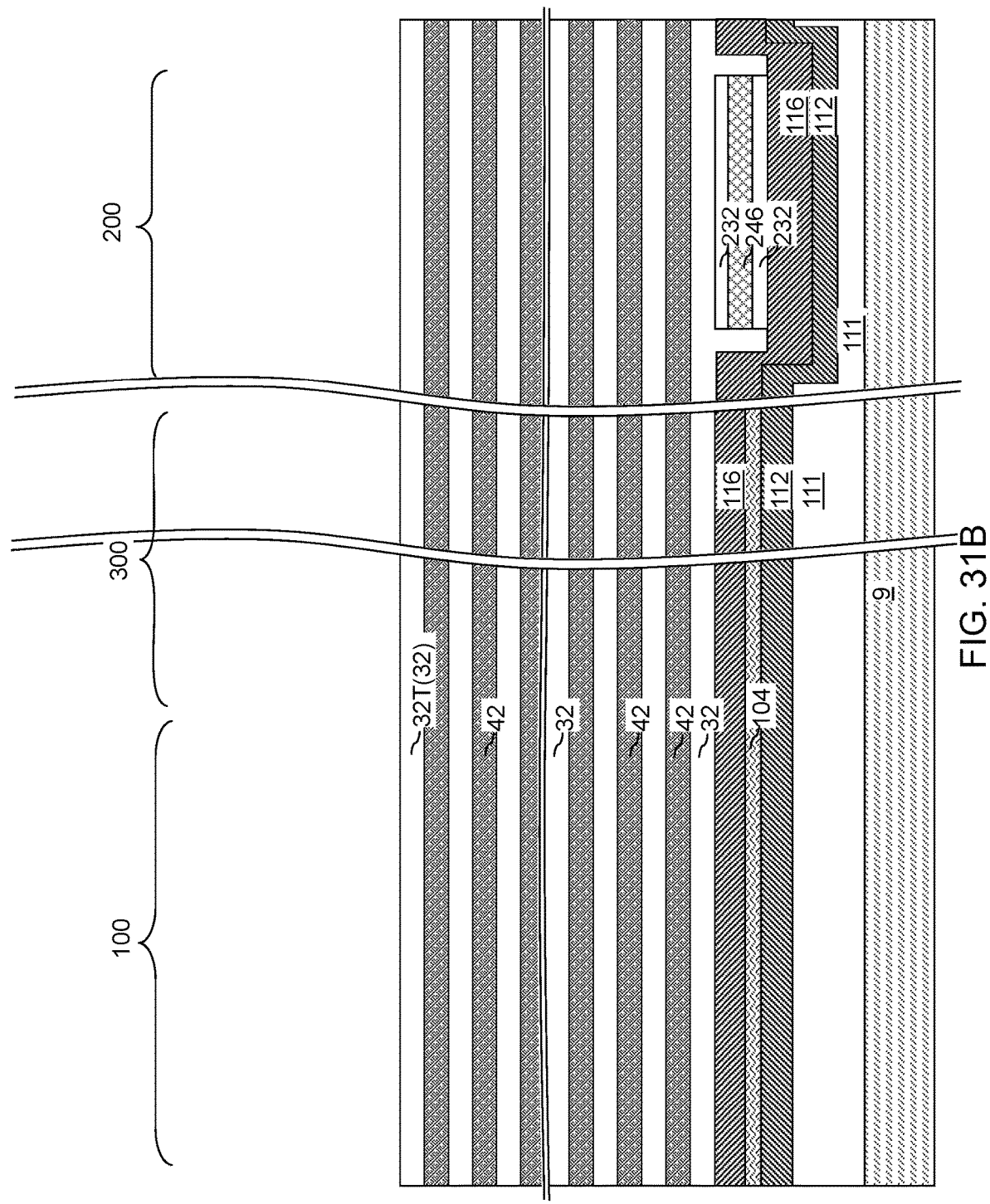

Referring to FIG. 31B, in case each recess 205 is formed within areas in which the metal plates 246 are formed as shown in FIG. 28B, then portions of the alternating stack (32, 42) located outside the areas of the metal plates 246 may be planar. In other words, topographic variations in the surfaces of the layers within the alternating stack (32, 42) may be minimized by forming the recesses 205 only under the metal plates 246 and entirely within the area of the connection via region 200.

Figure 32:
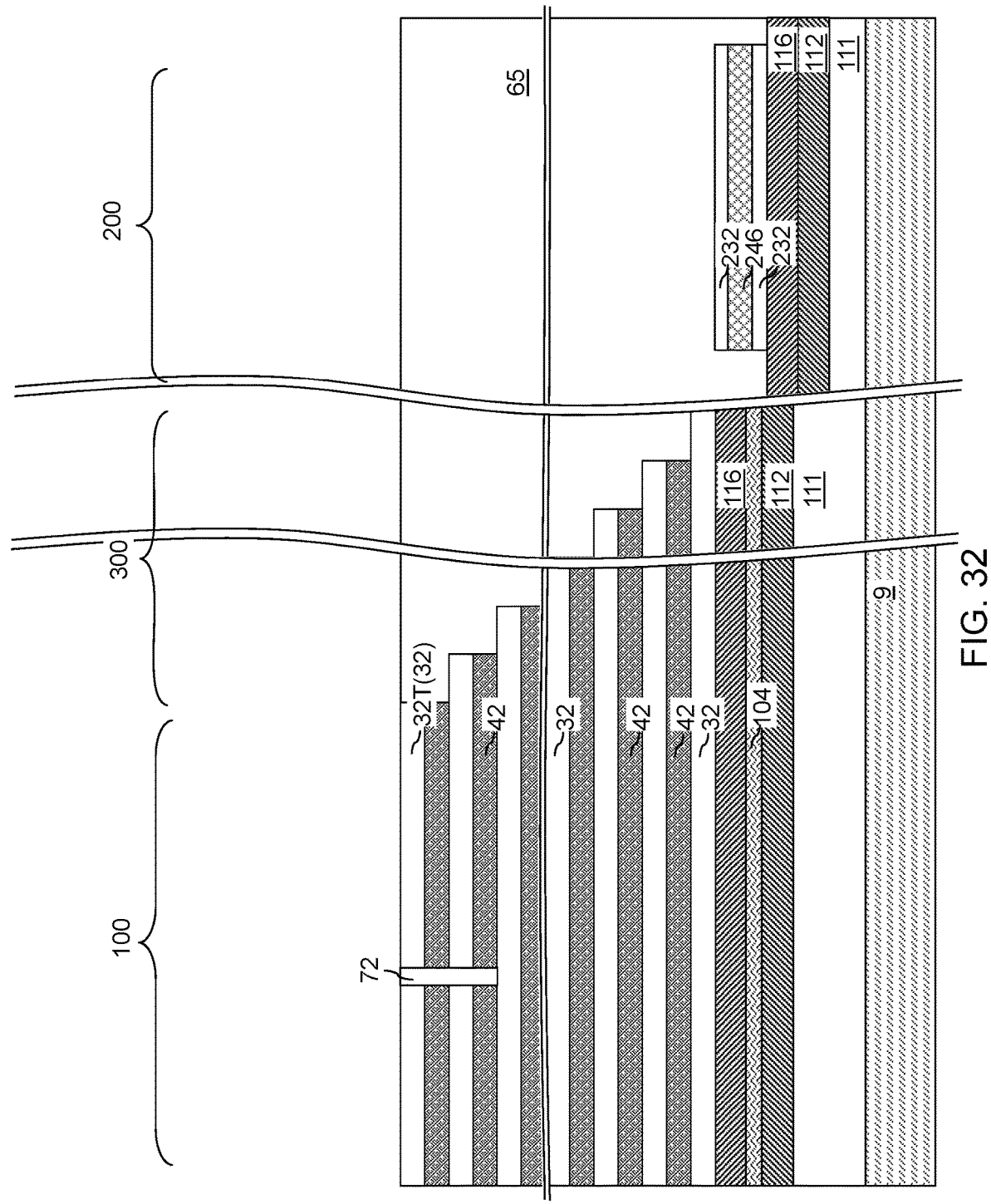
FIG. 32 is a schematic vertical cross-sectional view of the second exemplary structure after formation of stepped surfaces, a stepped dielectric material portion, and drain-select-level isolation structures according to the second embodiment of the present disclosure.

Referring to FIG. 32, the processing steps described with reference to FIG. 2 can be performed with any needed changes to form stepped surfaces on the alternating stack (32, 42). In this case, patterning of the sacrificial material plates 142 and the insulating plates 132 may be omitted.

Subsequently, the processing steps described with reference to FIG. 3 can be performed to form a stepped dielectric material portion 65 and optionally the drain-select-level isolation structures 72. Alternatively, the drain-select-level isolation structures 72 can be formed at a later process step.

Figure 33:
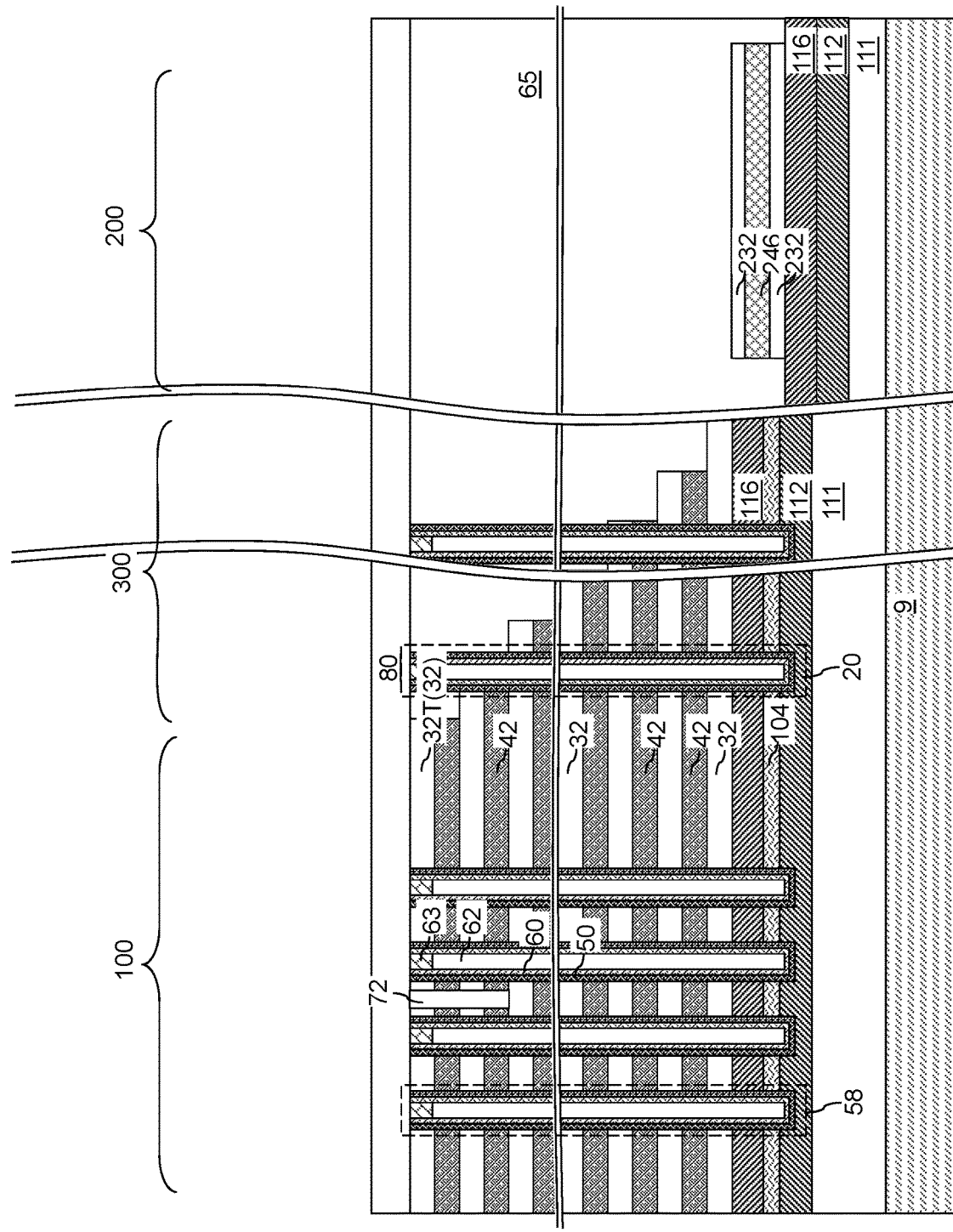
FIG. 33 is a schematic vertical cross-sectional view of the second exemplary structure after formation of memory opening fill structures and support pillar structures according to the second embodiment of the present disclosure.

Referring to FIG. 33, the processing steps described with reference to FIGS. 4 and 5 can be performed to form memory openings 49 and support openings 19, and to form memory opening fill structures 58 in the memory openings 49 and to form support openings 20 in the support openings 19, respectively.

Figure 34A:
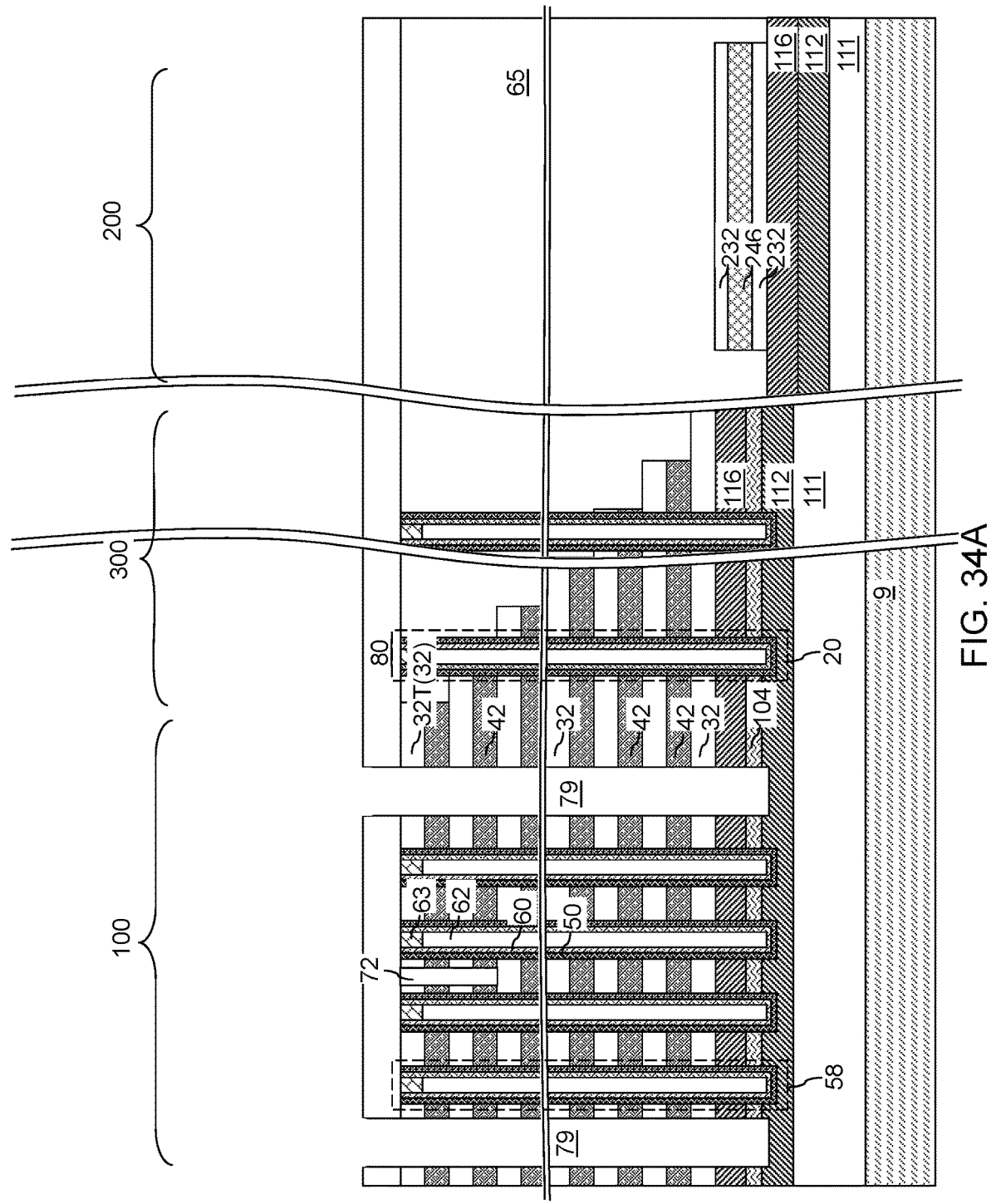
FIG. 34A is a schematic vertical cross-sectional view of the second exemplary structure after formation of a contact-level dielectric layer and through-stack trenches according to the second embodiment of the present disclosure.
Figure 34B:
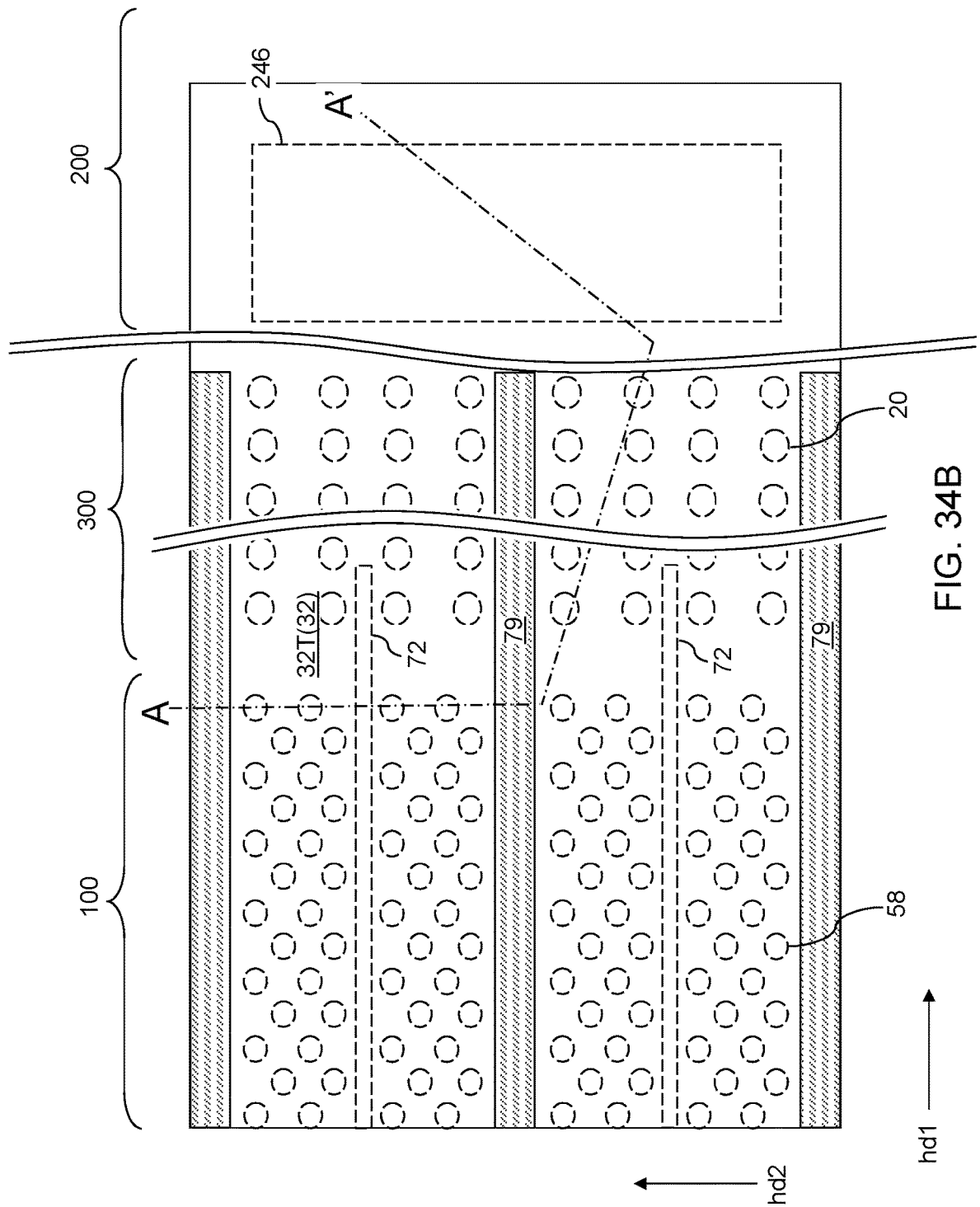
FIG. 34B is a partial see-through top-down view of the exemplary structure of FIG. 34A. The hinged vertical plane A-A' is the plane of the schematic vertical cross-sectional view of FIG. 34A.

Referring to FIGS. 34A and 34B, the processing steps described with reference to FIGS. 6A and 6B can be performed to form a contact-level dielectric layer 80 and through-stack trenches 79. The through-stack trenches 79 may, or may not, cut through any of the metal plates 246. In one embodiment, the metal plates 246 are not physically exposed to the through-stack trenches 79.

Figure 35:
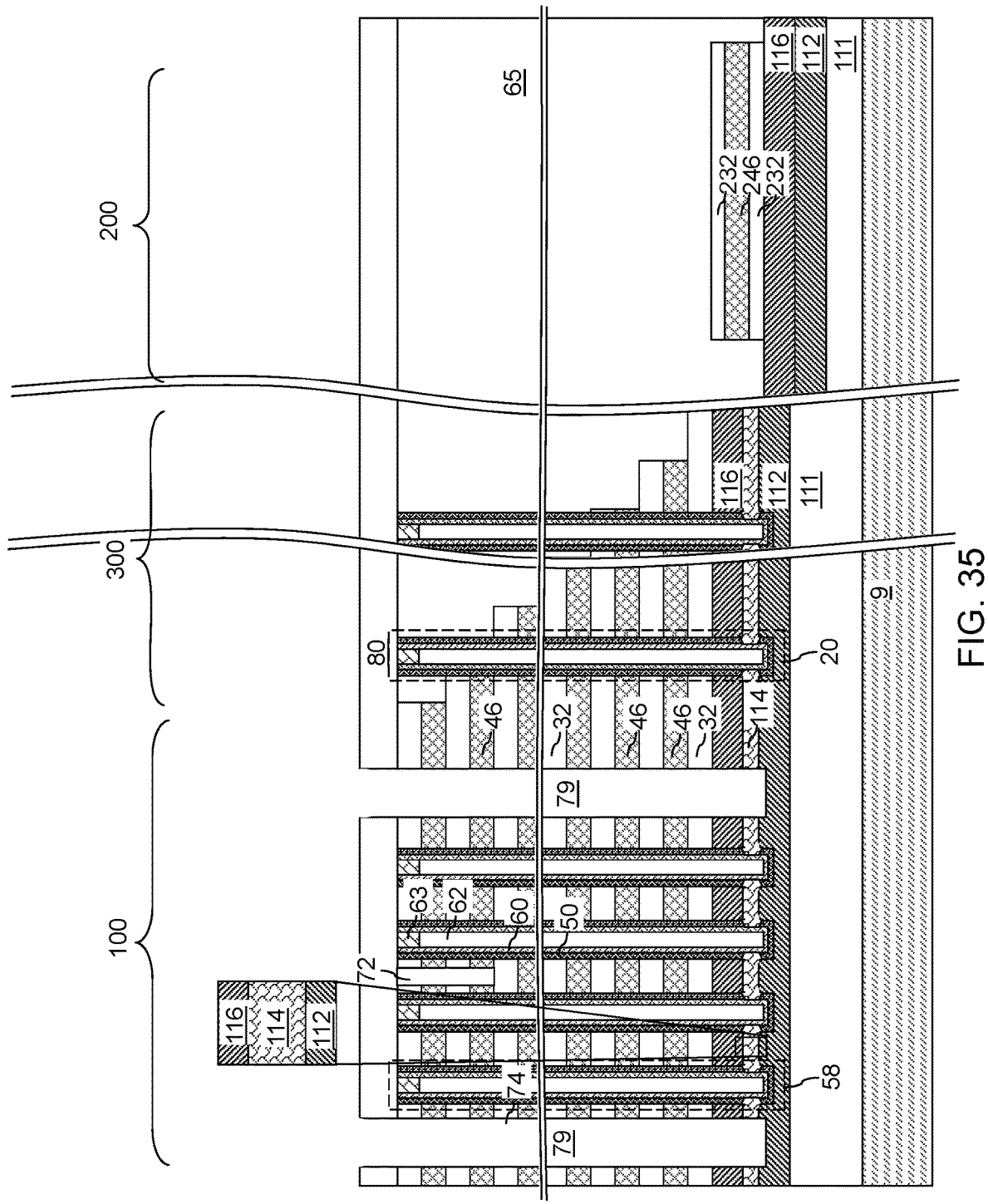
FIG. 35 is a schematic vertical cross-sectional view of the second exemplary structure after formation of a source contact layer and replacement of the sacrificial material layers with electrically conductive layers according to the second embodiment of the present disclosure.

Referring to FIG. 35, the processing steps described with reference to FIGS. 7-9 may be performed to replace the source-level sacrificial layer 104 with a source contact layer 114 in the memory array region 100 and in the staircase region 300. Subsequently, the processing steps described with reference to FIGS. 10 and 11 may be performed to replace the sacrificial material layers 42 with electrically conductive layers 46.

In one embodiment, the metal plates 246 in the second exemplary structure may extend along the second horizontal direction hd2 and have a uniform vertical thickness. The metal plates 246 and the alternating stack (32, 46) may be located on opposite sides of a horizontal plane including an interface between the at least one semiconductor material layer (112, 116) and the alternating stack (32, 46). In one embodiment, the metal plates 246 may comprise a different material than or have a different thickness than that an electrically conductive layer 46 that is most proximal to the horizontal plane including an interface between the at least one semiconductor material layer (112, 116) and the alternating stack (32, 46).

Figure 36:
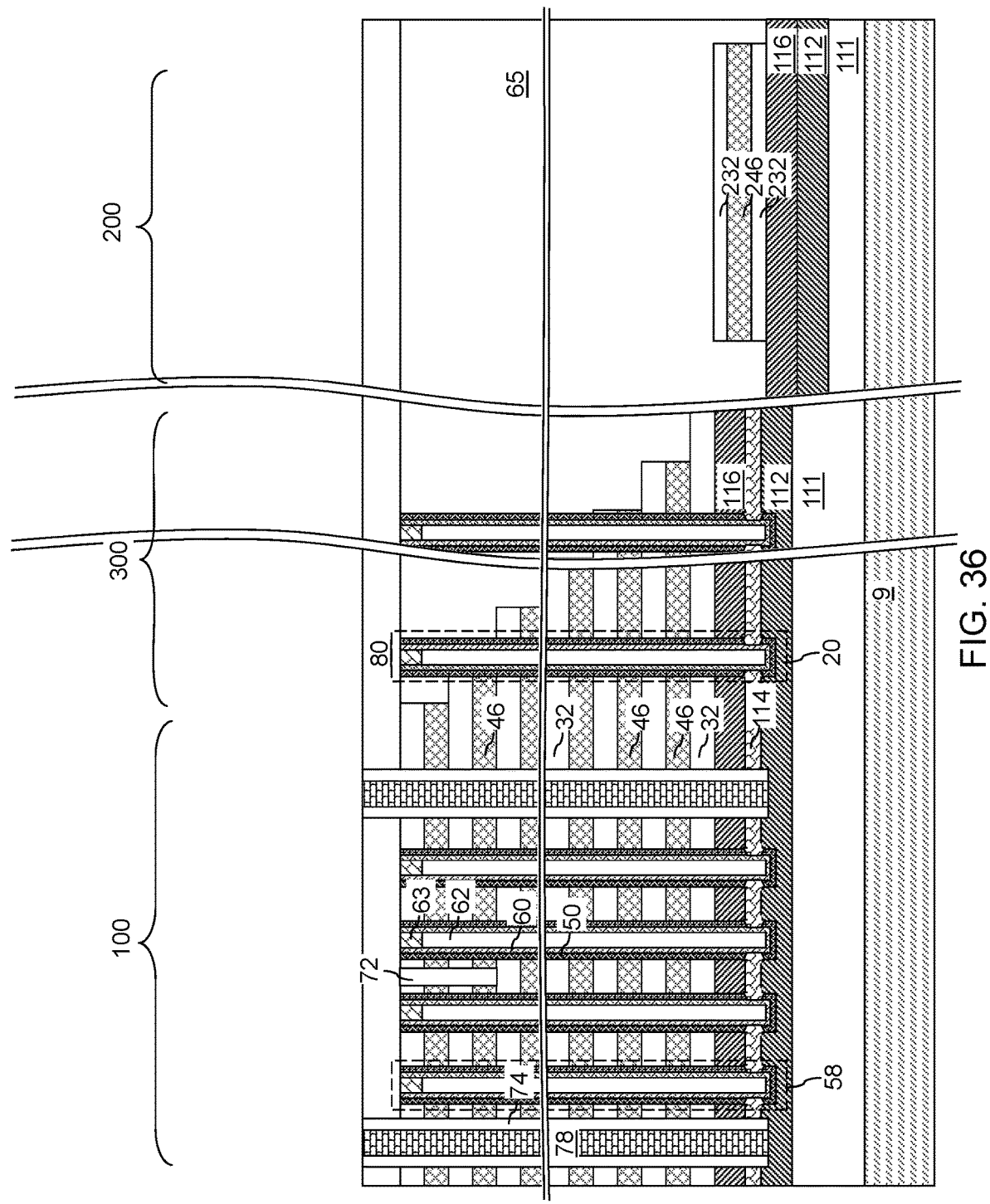
FIG. 36 is a schematic vertical cross-sectional view of the second exemplary structure after formation of trench fill dielectric structures, insulating trench spacers, and through-stack contact via structures according to the second embodiment of the present disclosure.

Referring to FIG. 36, the processing steps described with reference to FIGS. 12, 13, 14, and 15 can be performed to form an optional through-stack trench fill structure (74, 78) within each through-stack trench 79.

Figure 37:
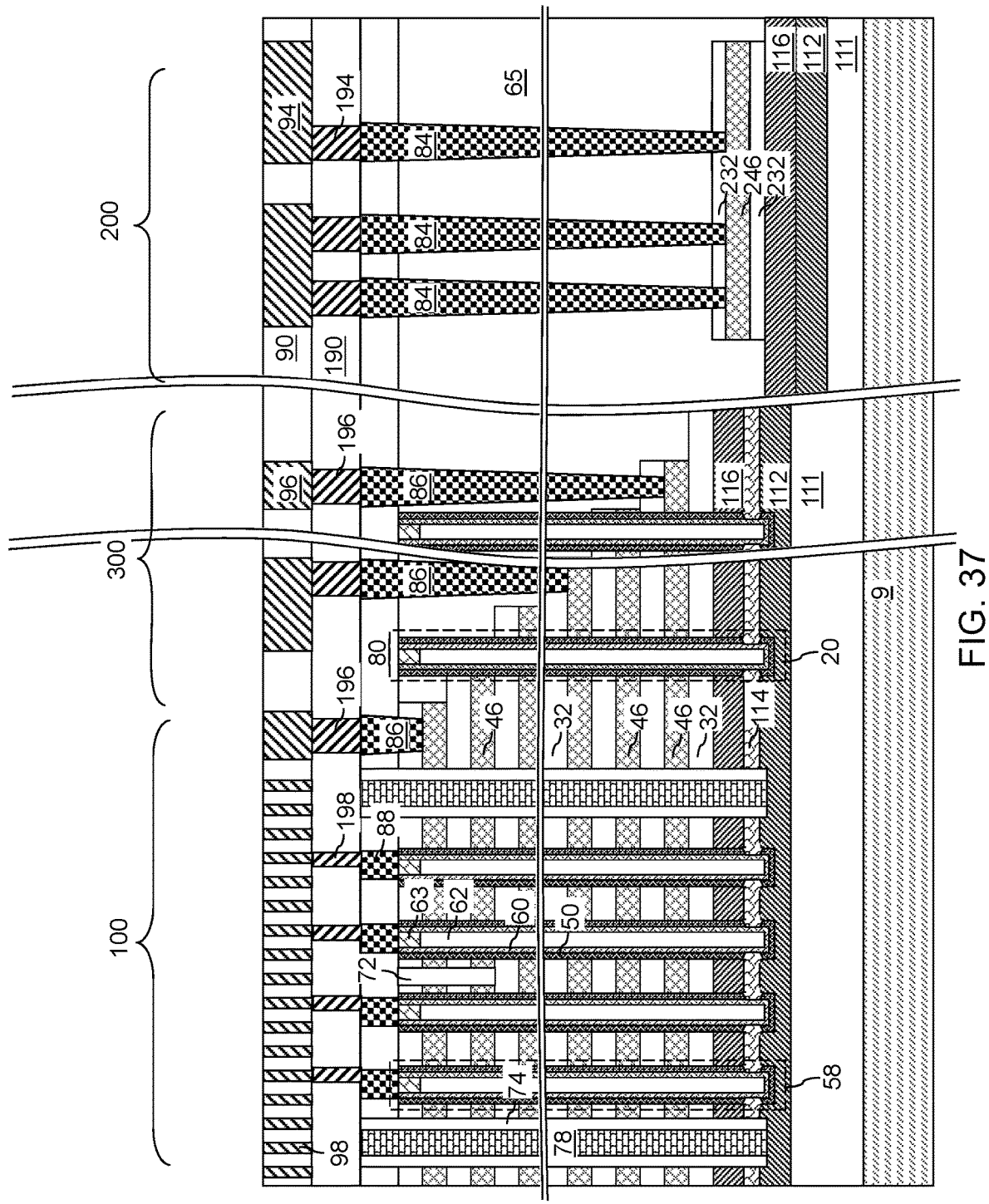
FIG. 37 is a schematic vertical cross-sectional view of the second exemplary structure after formation of additional contact via structures, connection via structures, and bit-line-level metal lines according to the second embodiment of the present disclosure.

Referring to FIG. 37, the processing steps described with reference to FIGS. 16A and 16B can be performed to form various via structure (88, 86, 84). The via structures (88 86, 84) comprise drain contact via structures 88 formed in the drain contact via cavities and contacting a top surface of a respective one of the drain regions 63. The via structures (88, 86, 84) further comprise layer contact via structures 86 formed in the layer contact via cavities and contacting a top surface of a respective one of the electrically conductive layers 46. The via structures (88, 86, 84) further comprise connection via structures 84 formed in the connection via cavities and contacting a top surface of a respective one of the metal plates 246. Each connection via structure 84 may be formed through the dielectric material portion 65 directly on a top surface of a respective metal plate 246. The connection via structures 84 are also referred to as through-memory-level connection via structures. Distal end surfaces of the drain contact via structures 88, distal end surfaces of the layer contact via structures 86, and distal end surfaces of the connection via structures 84 can be located within a same horizontal plane, such as a horizontal plane including the top surface of the contact-level dielectric layer 80.

In the second embodiment, at least one connection via structure 84 vertically extends through the dielectric material portion 65. A metal plate 246 is in contact with a proximal end surface of a respective connection via structure 84. In one embodiment, an insulating plate 232 may be in contact with a front horizontal surface (i.e., a top surface) of each metal plate 246, and another insulating plate may be in contact with a backside surface (i.e., a bottom surface) of each metal plate 246. A sidewall of each metal plate 246 is vertically coincident with a sidewall of a respective overlying insulating plate 232, and with a sidewall of a respective underlying insulating plate 232. In one embodiment, a connection via structure 84 vertically extends through an insulating plate 232 and contacts a top surface of an underlying metal plate 246.

Subsequently, connection via structures (198, 196, 194) embedded in a via-level dielectric layer 190 can be formed.

Further, metal line structures (98, 96, 94) embedded in a first line-level dielectric layer 90 can be formed. Generally, the processing steps described with reference to FIGS. 16A and 16B can be performed to form metal interconnect structures embedded in dielectric material layers.

Figure 38:
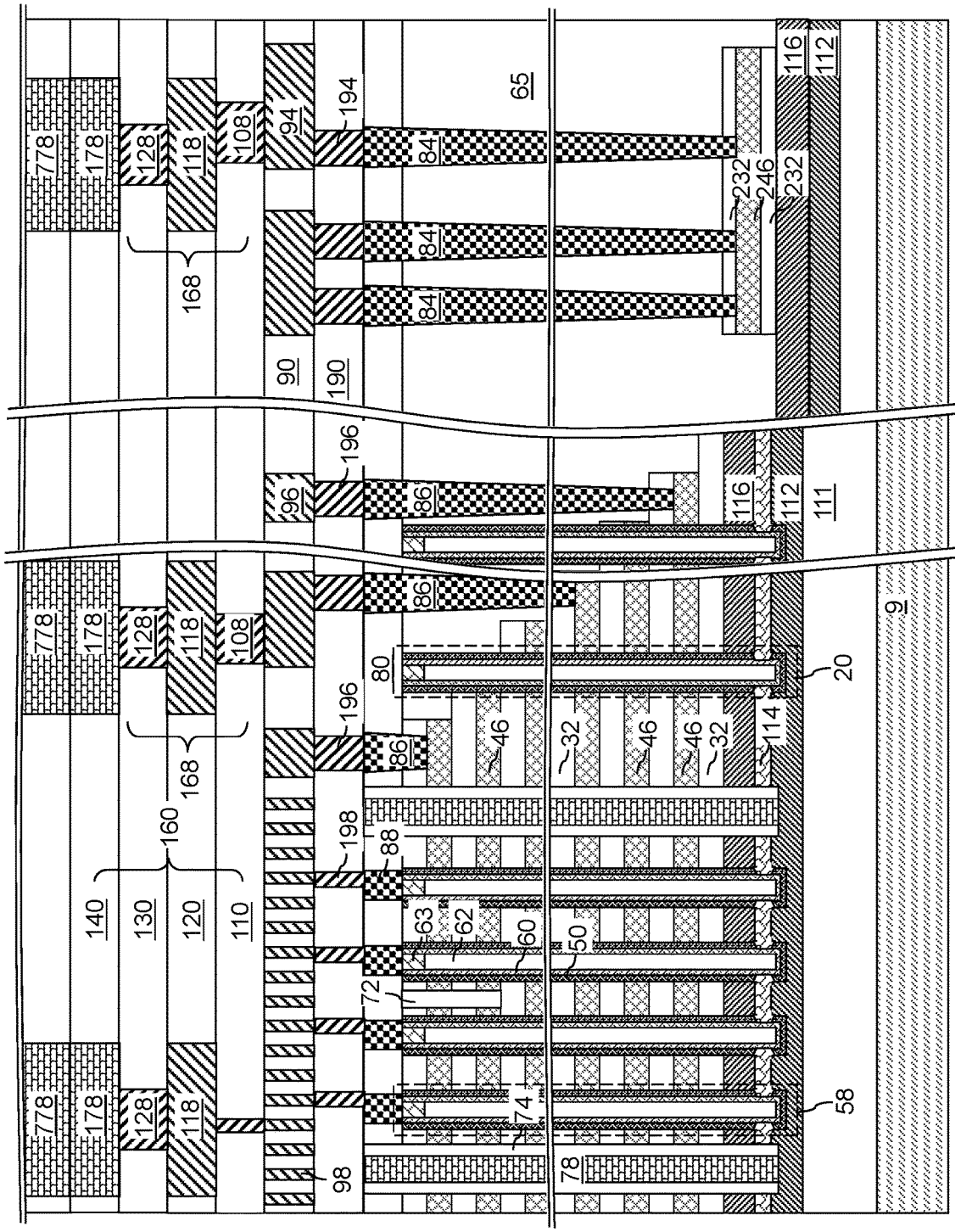
FIG. 38 is a schematic vertical cross-sectional view of a region the second exemplary structure after bonding a logic die to the memory die according to the second embodiment of the present disclosure.

Referring to FIG. 38, the processing steps described with reference to FIGS. 17, 18, and 19 can be performed to provide a memory die 900 and a logic die 700, and to bond the memory die 900 and the logic die 700.

Figure 39:
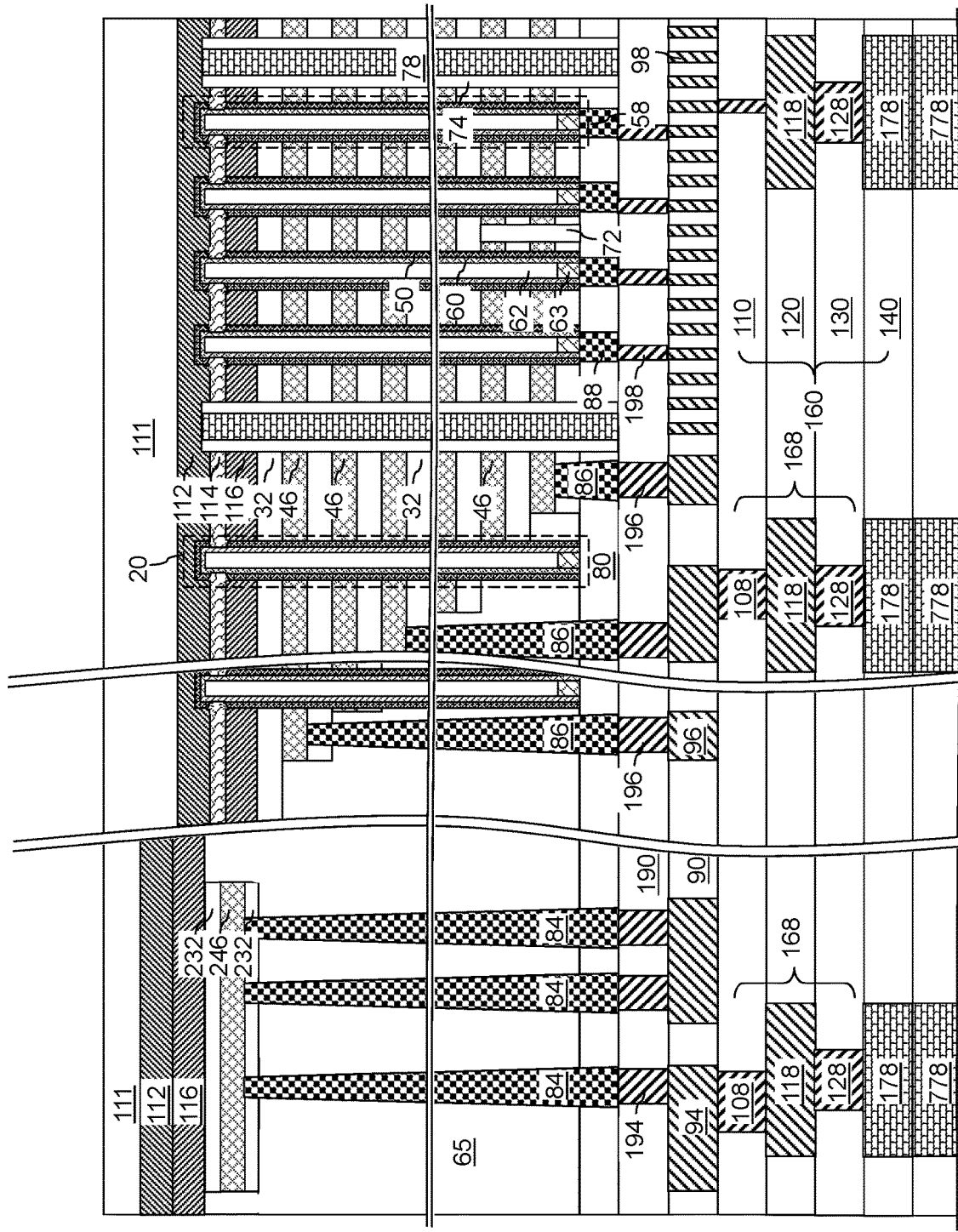
FIG. 39 is a schematic vertical cross-sectional view of the second exemplary structure after removal of the carrier substrate according to the second embodiment of the present disclosure.

Referring to FIG. 39, the processing steps described with reference to FIG. 20 can be performed to remove the carrier substrate 9 from the bonded assembly of the memory die 900 and the logic die 700.

Figure 40:
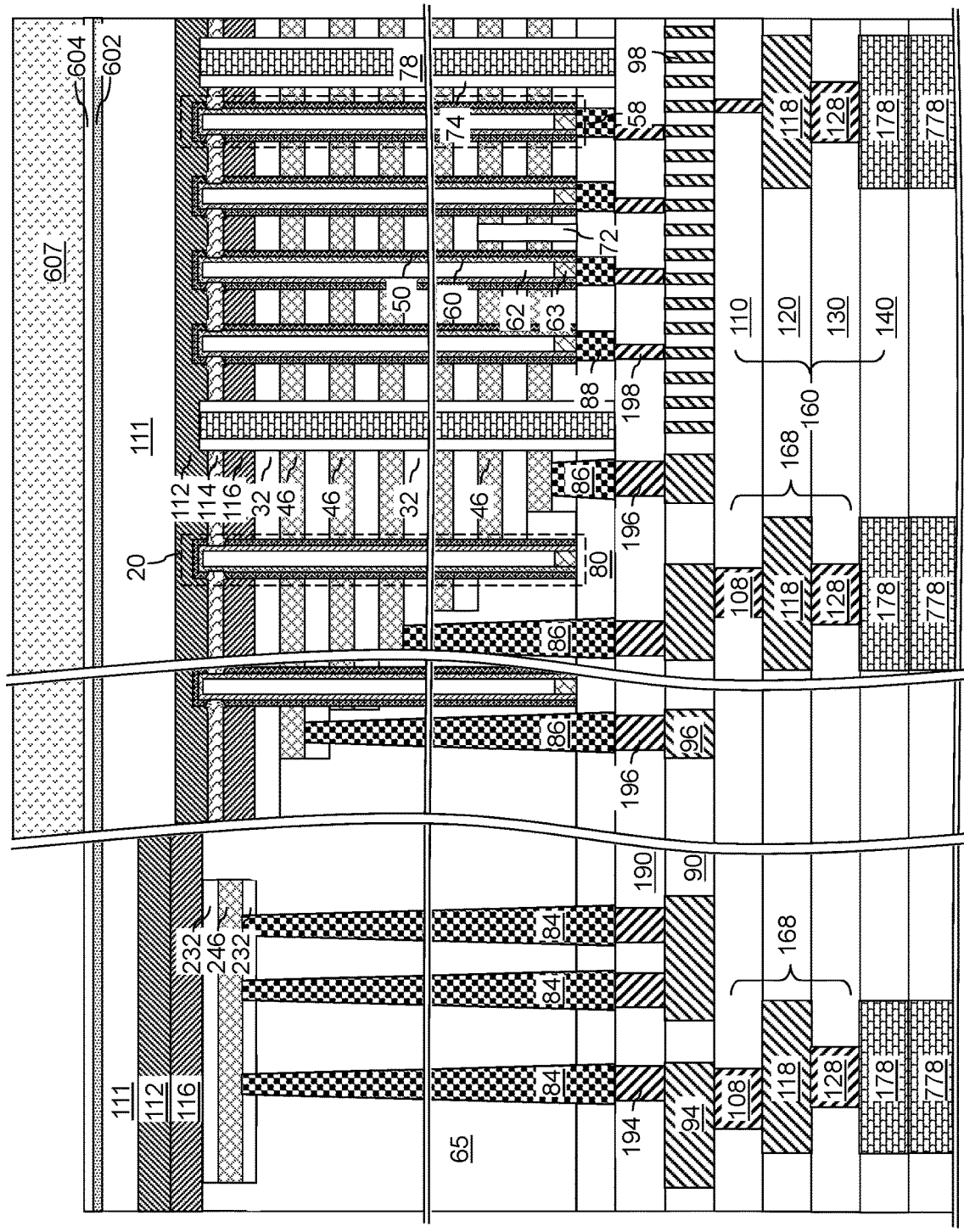
FIG. 40 is a schematic vertical cross-sectional view of the second exemplary structure after formation of backside dielectric liners and a patterned photoresist layer according to the second embodiment of the present disclosure.

Referring to FIG. 40, the processing steps described with reference to FIG. 21 can be performed to form backside dielectric liners (602, 604) and a patterned photoresist layer 607.

Figure 41:
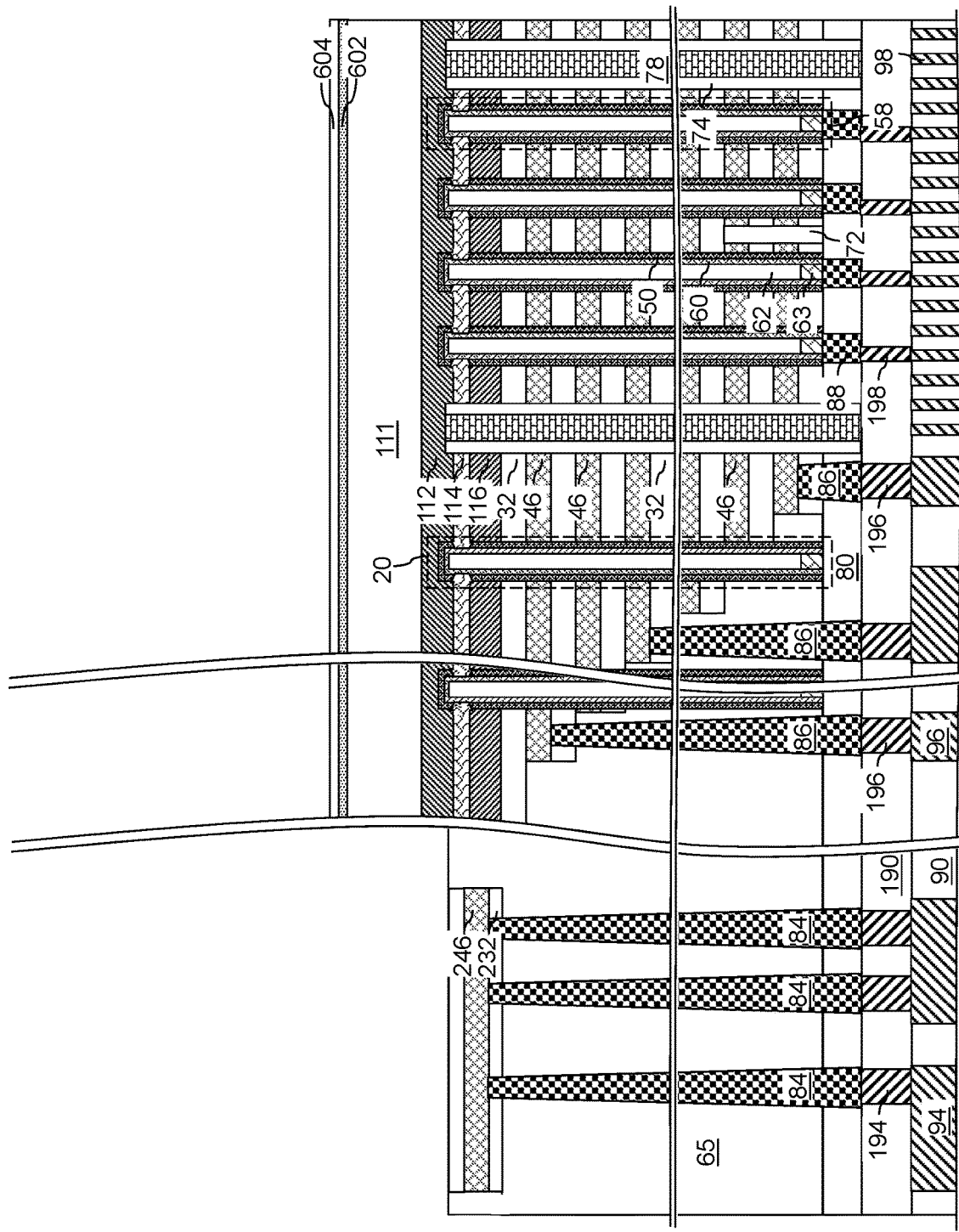
FIG. 41 is a schematic vertical cross-sectional view of the second exemplary structure after removal of unmasked portions of the backside dielectric liners, the buffer dielectric layer, and the source-level material layers according to the second embodiment of the present disclosure.

Referring to FIG. 41, the processing steps described with reference to FIG. 22 can be performed to remove unmasked portions of the backside dielectric liners (602, 604), the buffer dielectric layer 111, and the source-level material layers (112, 116) (i.e., the at least one semiconductor material layer). The patterned photoresist layer 607 can be subsequently removed, for example, by ashing.

Figure 42:
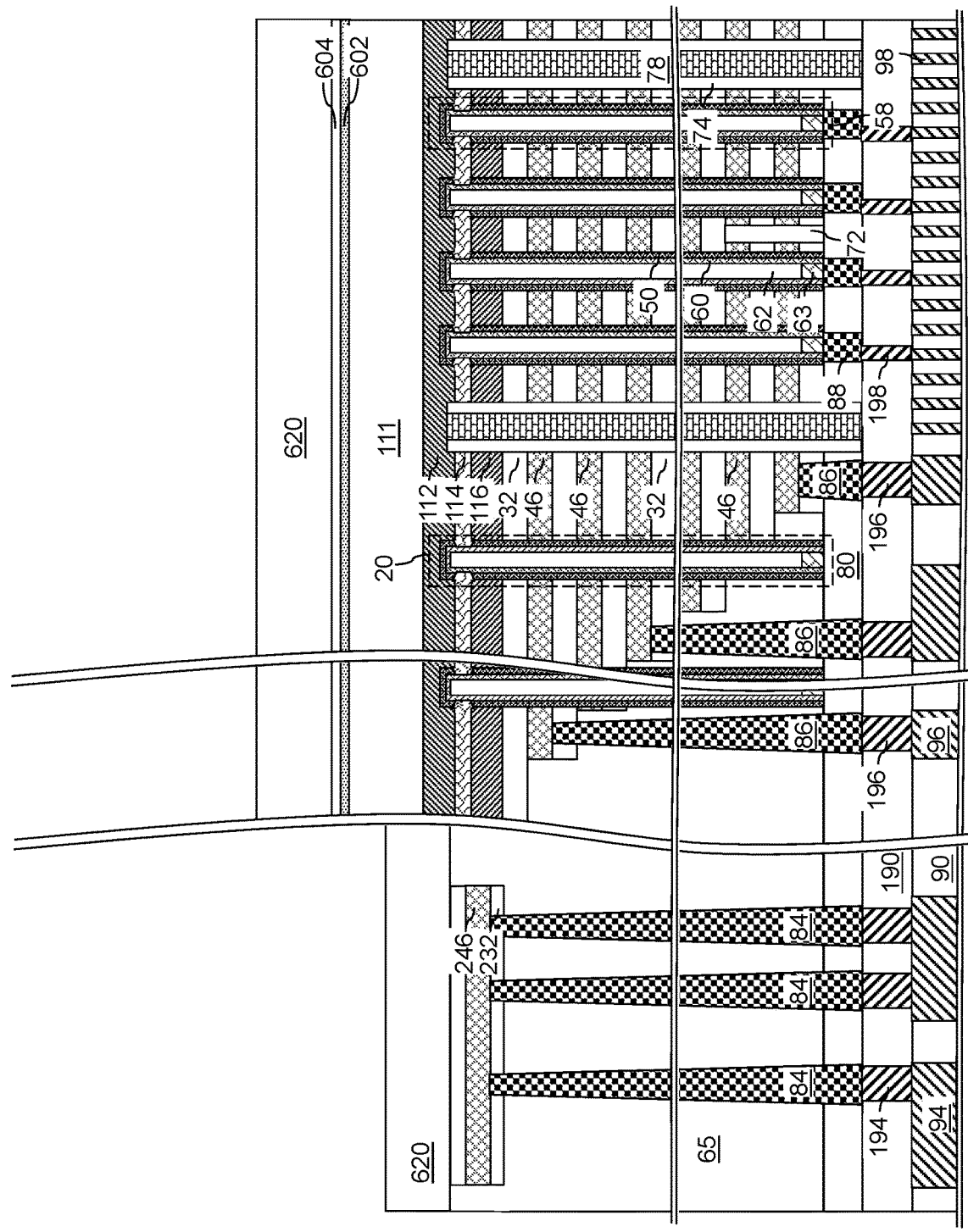
FIG. 42 is a schematic vertical cross-sectional view of the second exemplary structure after formation of a backside dielectric layer according to the second embodiment of the present disclosure.

Referring to FIG. 42, the processing steps described with reference to FIG. 23 can be performed to form a backside dielectric material layer 620.

Figure 43:
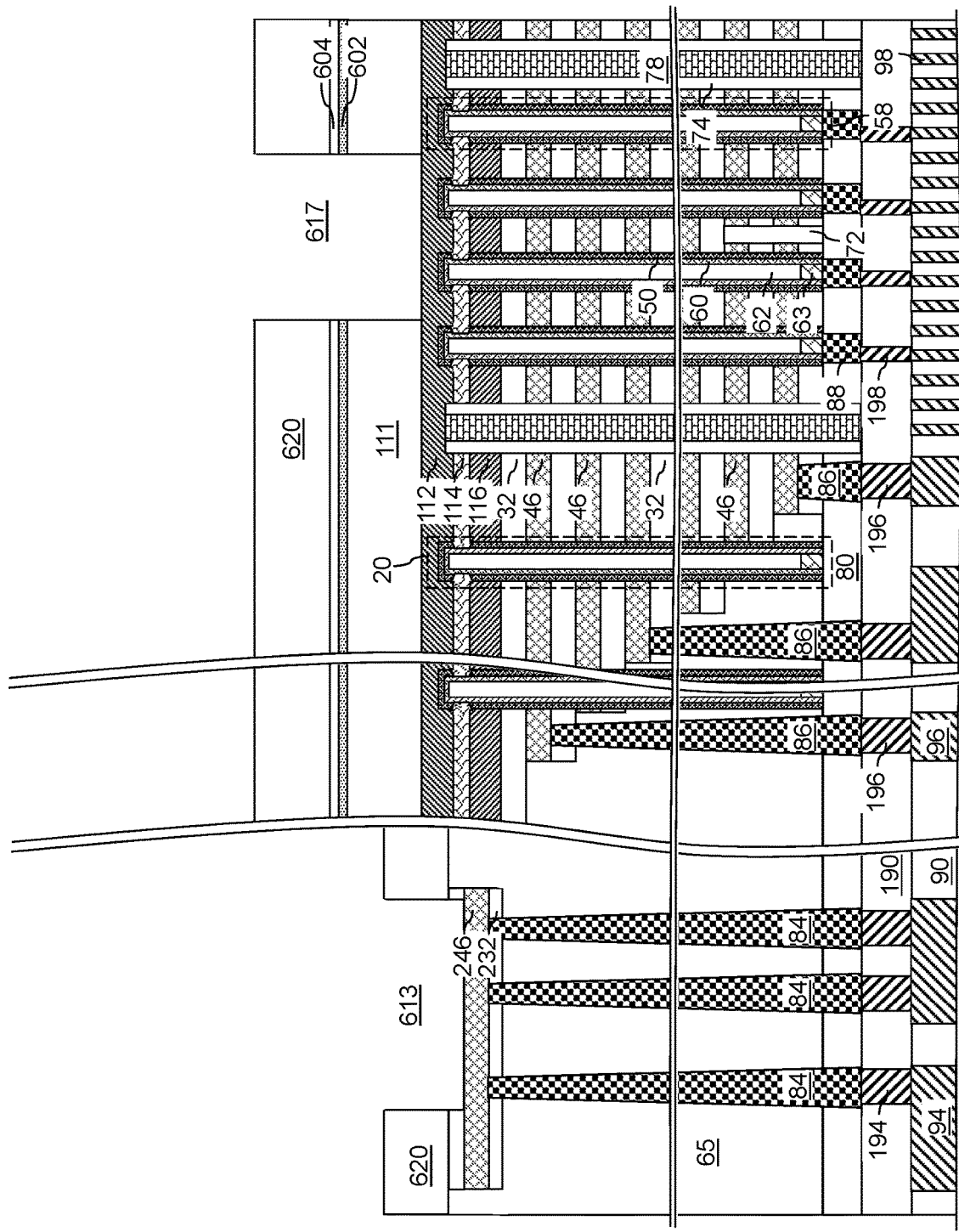
FIG. 43 is a schematic vertical cross-sectional view of the second exemplary structure after formation of backside contact via cavities according to the second embodiment of the present disclosure.

Referring to FIG. 43, the processing steps described with reference to FIG. 24 may be performed with any needed changes to form first backside contact via cavities 613. In this case, the etch process that forms the first backside contact via cavities 613 may etch through the proximal insulating plate 232 within each plate stack (232, 246, 232), and a proximal horizontal surface of each metal plate 246 may be physically exposed to a respective first backside contact via cavity 613.

Subsequently, the processing steps described with reference to FIG. 25 may be performed to form second backside contact via cavities 617.

Figure 44:
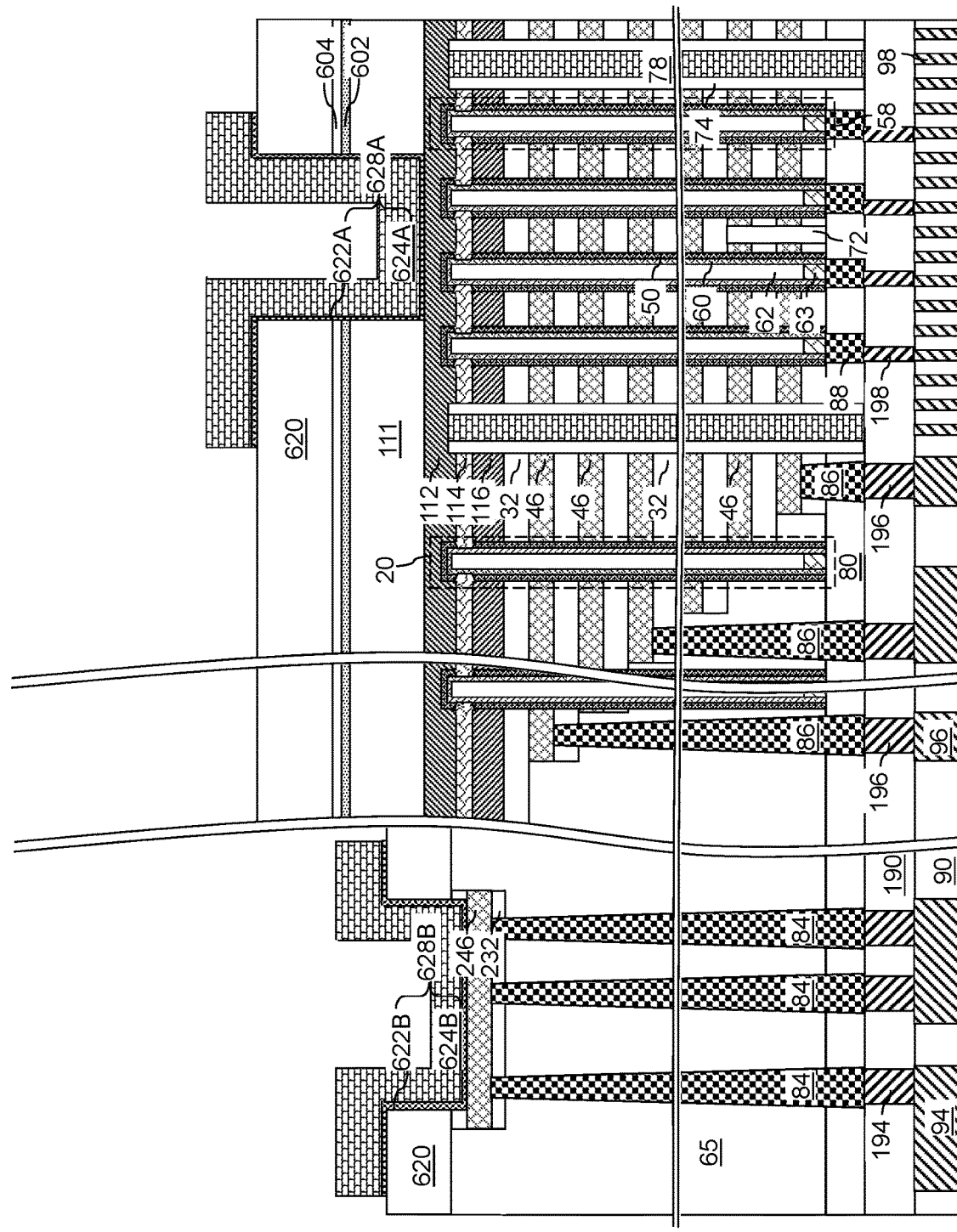
FIG. 44 is a schematic vertical cross-sectional view of the second exemplary structure after formation of backside contact pad structures according to the second embodiment of the present disclosure.

Referring to FIG. 44, the processing steps described with reference to FIG. 26 can be performed to form contact pad structures (628A, 628B). The contact pad structures (628A, 628B) may comprise at least one source contact pad structure 628A and at least one backside contact pad structure 628B that is formed directly on the backside surface(s) of a respective subset of metal plate 246. Each backside contact pad structure 628B can be in contact with at least one metal plate 246, can be spaced from at least one connection via structure 84 by the at least one metal plate 246, and can be electrically connected to the at least one connection via structure 84 through the at least one metal plate 246.

Figure 45:
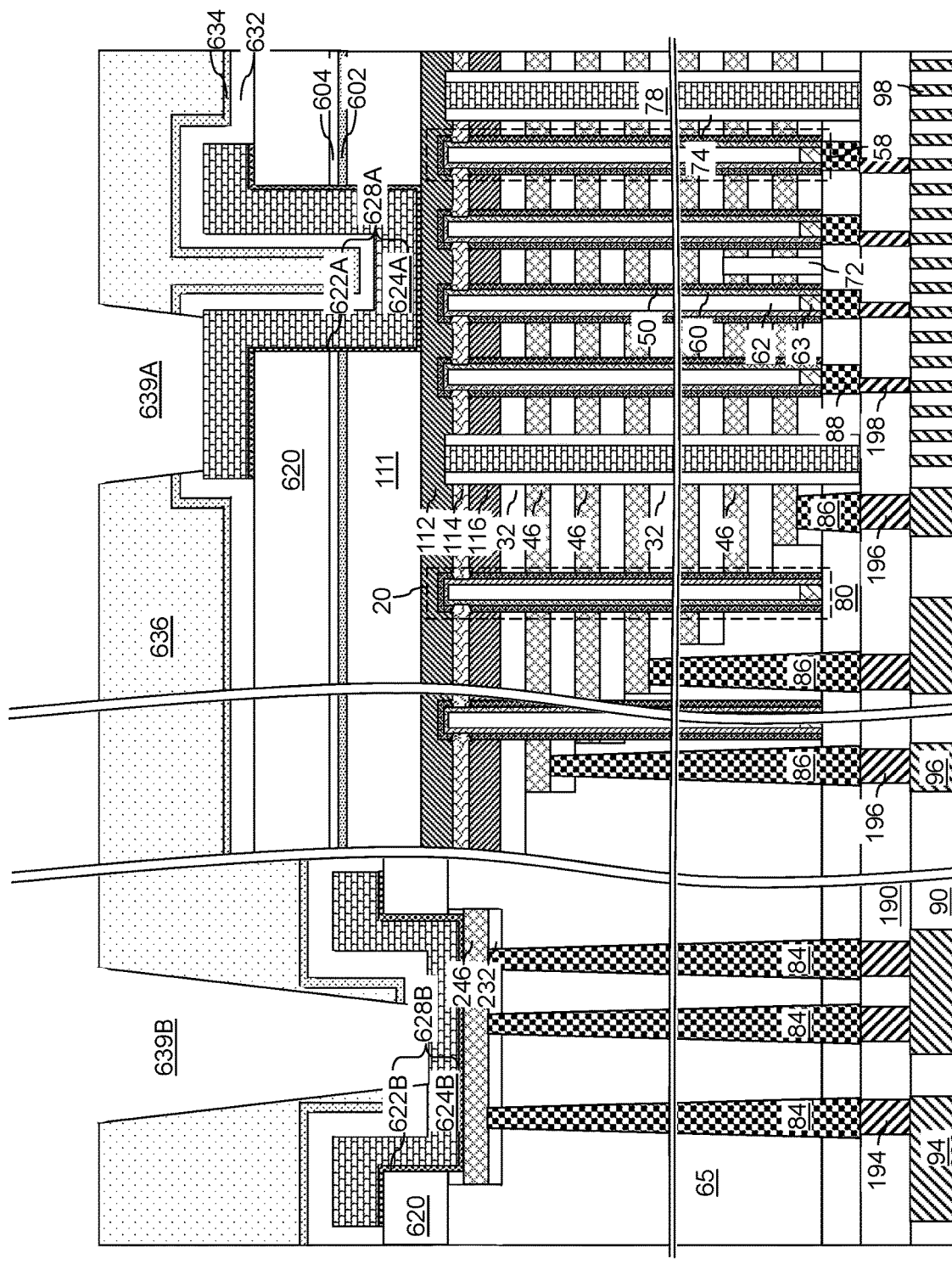
FIG. 45 is a schematic vertical cross-sectional view of the second exemplary structure after formation of a passivation dielectric layer and via cavities according to the second embodiment of the present disclosure.

Referring to FIG. 45, the processing steps described with reference to FIG. 27A can be performed to form at least one backside dielectric cover layer (632, 634) and a passivation dielectric layer 636, and to form via cavities (639A, 639B). Generally, the at least one backside dielectric cover layer (632, 634) comprises openings therethrough. Each opening may have an end periphery that is located on a backside surface of a respective one of the source contact pad structures 628A and the backside contact pad structures 628B.

Figure 46B:
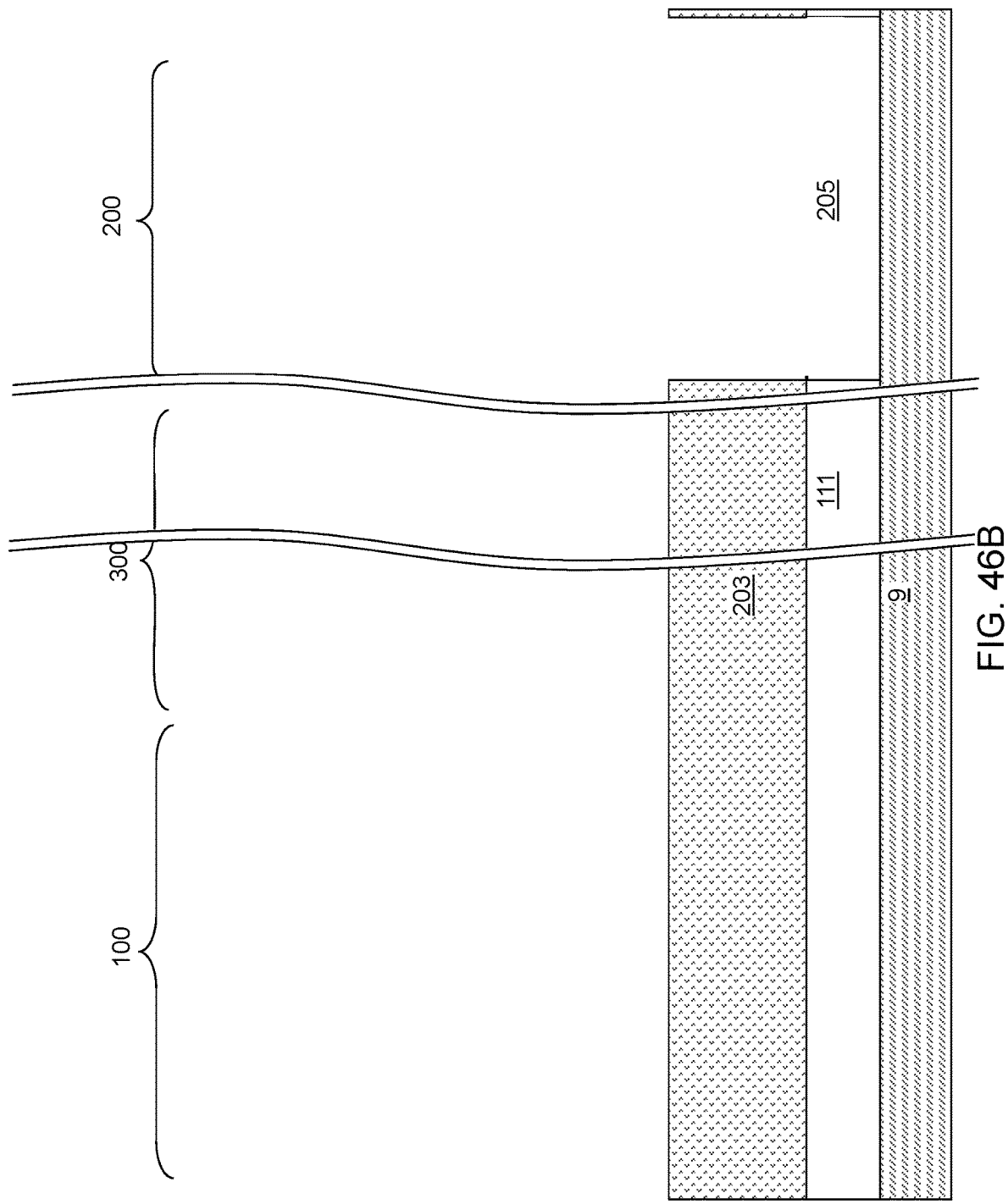
FIG. 46B is a schematic vertical cross-sectional view of an alternative configuration of the third exemplary structure after formation of a recess region through a buffer dielectric layer according to a third embodiment of the present disclosure.

Referring to FIGS. 46A and 46B, a third exemplary structure according to a third embodiment of the present disclosure is illustrated. The third exemplary structure comprises a carrier substrate 9 and a buffer dielectric layer 111 that is formed on the carrier substrate 9. The carrier substrate 9 may be the same as in the first exemplary structure illustrated in FIG. 1. The buffer dielectric layer 111 can be deposited one a front-side of the carrier substrate 9. The buffer dielectric layer 111 includes a dielectric material that is different from the material of the carrier substrate 9. For example, a buffer dielectric layer 111 may comprise silicon oxide. The thickness of the buffer dielectric layer 111 may be in a range from 5 nm to 1,000 nm, such as from 20 nm to 500 nm, although lesser and greater thicknesses may also be employed.

A photoresist layer 203 can be formed on a front surface of the buffer dielectric layer 111, and can be lithographically patterned to form an opening within an area in which connection via structures are to be subsequently formed. Generally, the area of the opening in the photoresist layer 203 may be entirely within the area of the connection via region 200. An etch process can be performed to etch through portions of the buffer dielectric layer 111 that are not masked by the photoresist layer 203. A recess region 205 is formed within which a horizontal surface of the carrier substrate 9 is physically exposed. The physically exposed horizontal surface of the carrier substrate 9 may also be vertically recessed relative to a horizontal plane including an interface between the carrier substrate 9 and the buffer dielectric layer 111. The lateral offset between the periphery of the recess region 205 and the periphery of the area in which the metal plates are to be subsequently formed may vary. FIG. 46A illustrates an example in which the lateral offset distance is relatively large, and FIG. 46B illustrates an example in which the lateral offset distance is relatively small. Generally, the lateral offset between the periphery of the recess region 205 and the periphery of the area in which the metal plates are to be subsequently formed may be less than the total thickness of the alternating stack (32, 42) to be subsequently formed, and may be about, or may be less than, the thickness of a single insulating layer 32 as illustrated in FIG. 46B. The photoresist layer 203 can be subsequently removed, for example, by ashing.

Figure 47B:
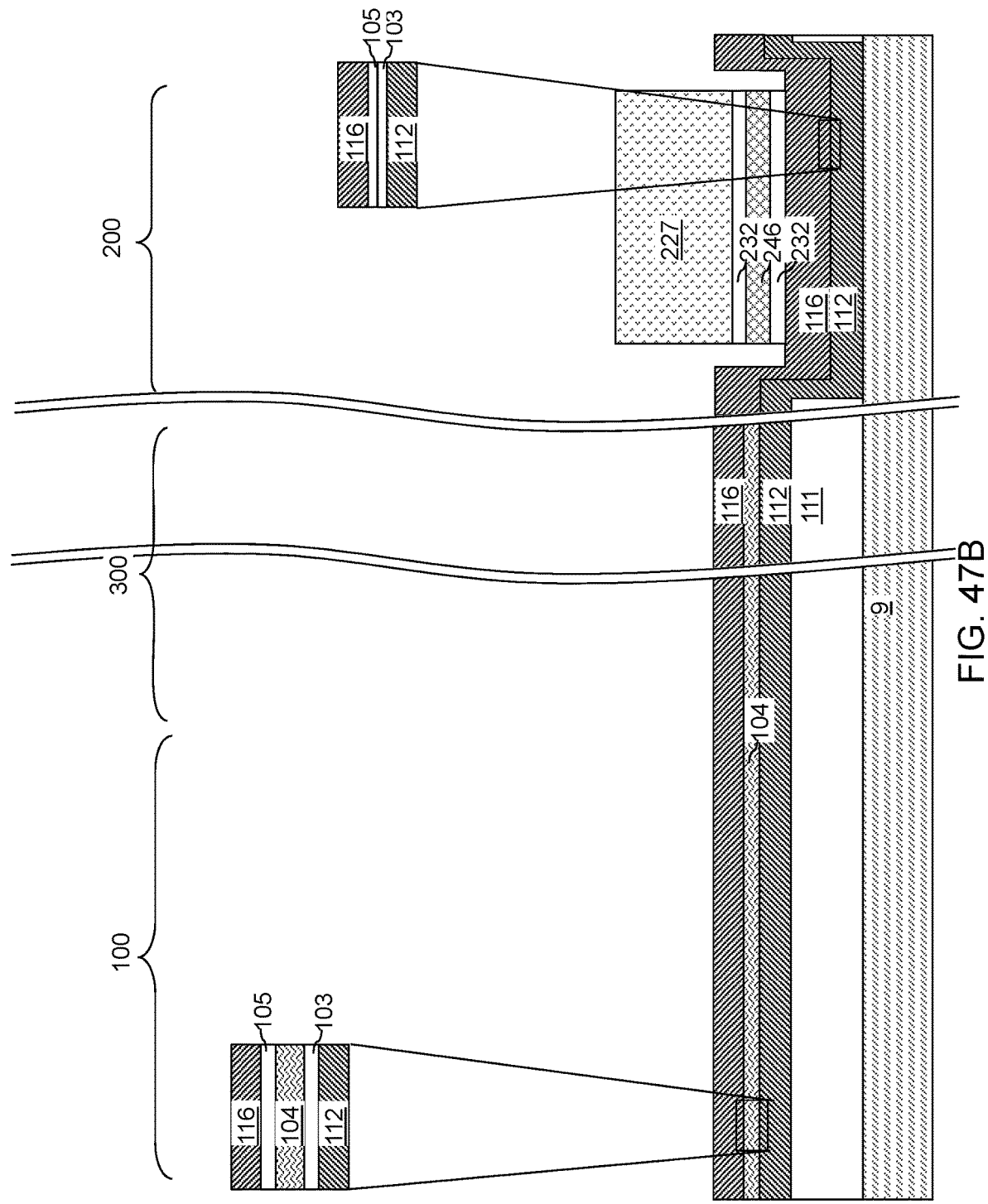
FIG. 47B is a schematic vertical cross-sectional view of an alternative configuration of the third exemplary structure after formation of in-process source-level material layers and plate stacks including a respective metal plate according to the third embodiment of the present disclosure.

Referring to FIGS. 47A and 47B, the processing steps described with reference to FIG. 28 can be performed to form in-process source-level material layers (112, 103, 104, 105, 116). As discussed above, the source-level sacrificial layer 104 may be present in the memory array region 100 and in the staircase region 300, and may be absent in the connection via region 200. Subsequently, the processing steps described with reference to FIG. 30 may be performed to form at least one plate stack comprising a first insulating plate 232, a metal plate 246, and a second insulating plate 232 over the at least one semiconductor material layer (112, 116) within a region in which the top surface of the at least one semiconductor material layer (112, 116) is vertically recessed. One, a plurality, or each of the sidewalls of a metal plate 246 may be vertically coincident with a respective sidewall of an overlying second insulating plate 232 and with a respective sidewall of an underlying first insulating plate 232. The lateral offset between sidewalls of each metal plate 246 and adjacent physically exposed sidewalls of the second source-level semiconductor layer 116 and the may vary. FIG. 47A illustrates an example in which the lateral offset distance is relatively large (i.e., the sidewalls are located outside the illustrated area), and FIG. 47B illustrates an example in which the lateral offset distance is relatively small. Generally, the lateral offset between sidewalls of each metal plate 246 and adjacent physically exposed sidewalls of the second source-level semiconductor layer 116 may be less than the total thickness of the alternating stack (32, 42) to be subsequently formed, and may be about, or may be less than, the thickness of a single insulating layer 32 as illustrated in FIG. 47B.

Figure 48:
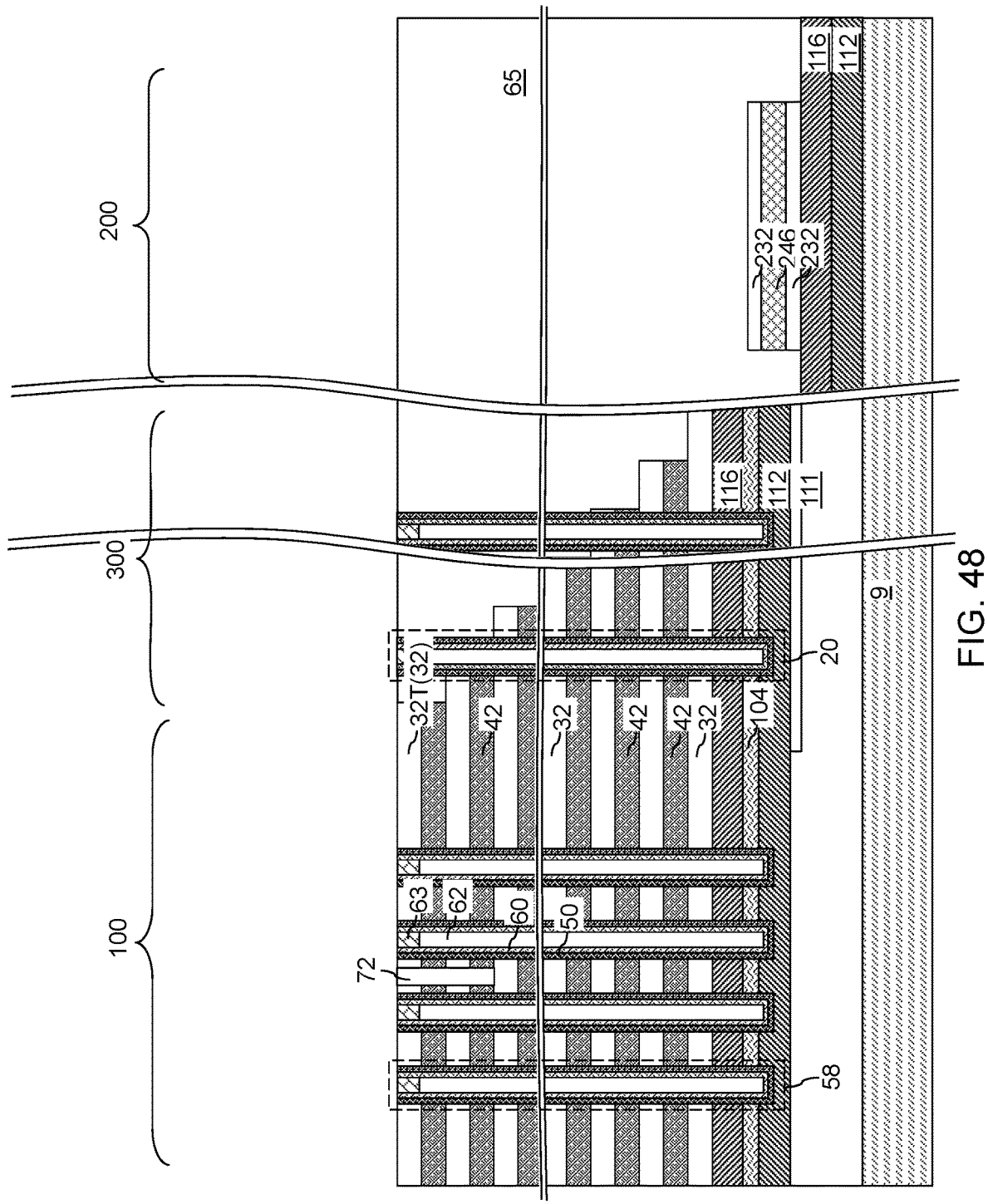
FIG. 48 is a schematic vertical cross-sectional view of the third exemplary structure after formation of an alternating stack of insulating layers and sacrificial material layers, stepped surfaces, a stepped dielectric material portion, and drain-select-level isolation structures according to the third embodiment of the present disclosure.

Referring to FIG. 48, the processing steps described with reference to FIGS. 31, 32, and 33 can be performed to form an alternating stack (32, 42), a stepped dielectric material portion 65, drain-select-level isolation structures 72, memory opening fill structures 58, and support pillar structures.

Figure 49:
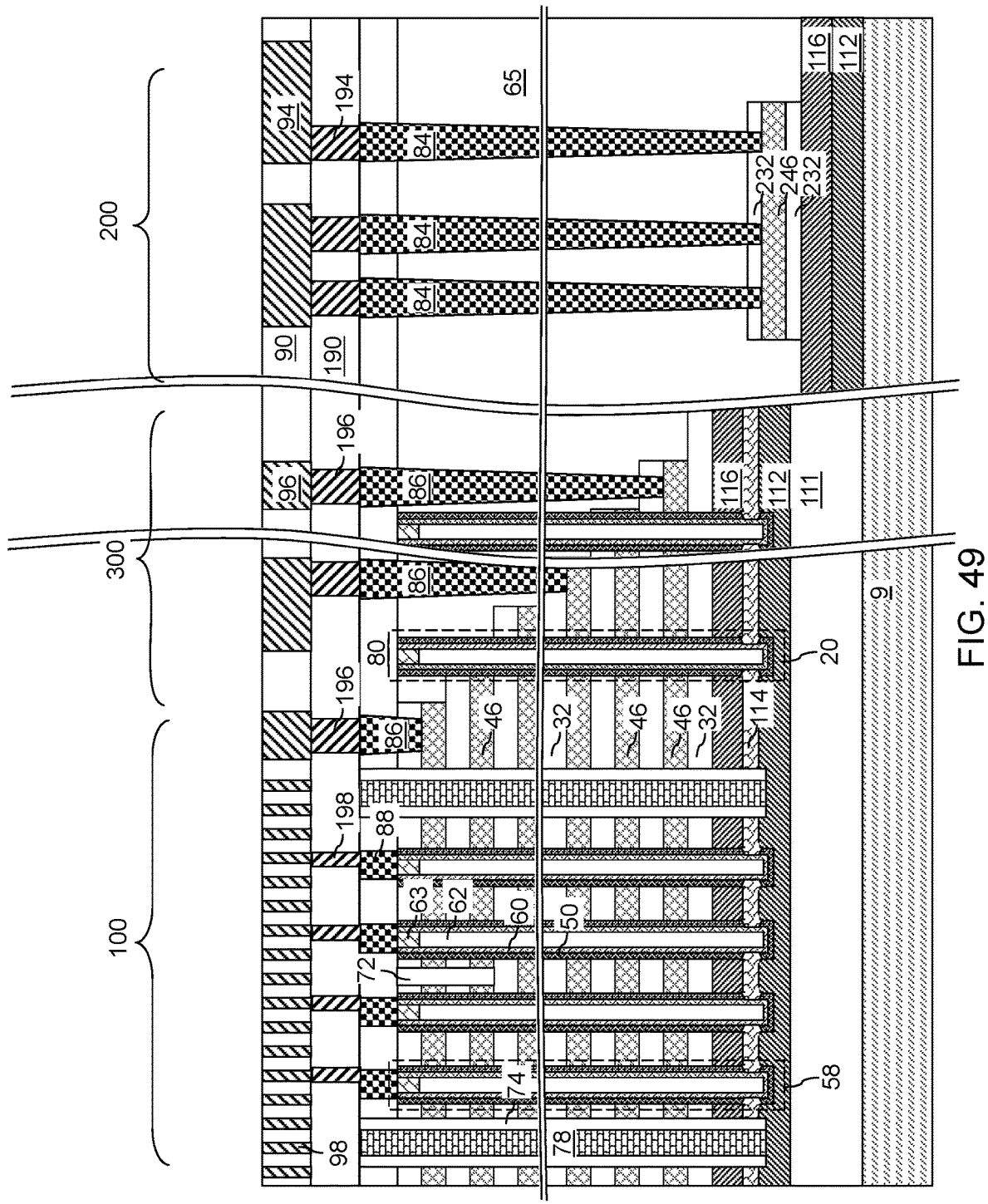
FIG. 49 is a schematic vertical cross-sectional view of the third exemplary structure after formation of electrically conductive layers, through-stack trench fill structures, additional contact via structures, connection via structures, and bit-line-level metal lines according to the third embodiment of the present disclosure.

Referring to FIG. 49, the processing steps described with reference to FIGS. 34A and 34B, and 35-37 can be performed to form a contact-level dielectric layer 80 and through-stack trenches 79, to replace the source-level sacrificial layer 104 with a source contact layer 114, to replace the sacrificial material layers 42 with electrically conductive layers 46, to form a through-stack trench fill structure (74, 78) within each through-stack trench 79, to form various via structure (88, 86, 84), to form connection via structures (198, 196, 194) embedded in a via-level dielectric layer 190, and to form metal line structures (98, 96, 94) embedded in a first line-level dielectric layer 90.

Figure 50:
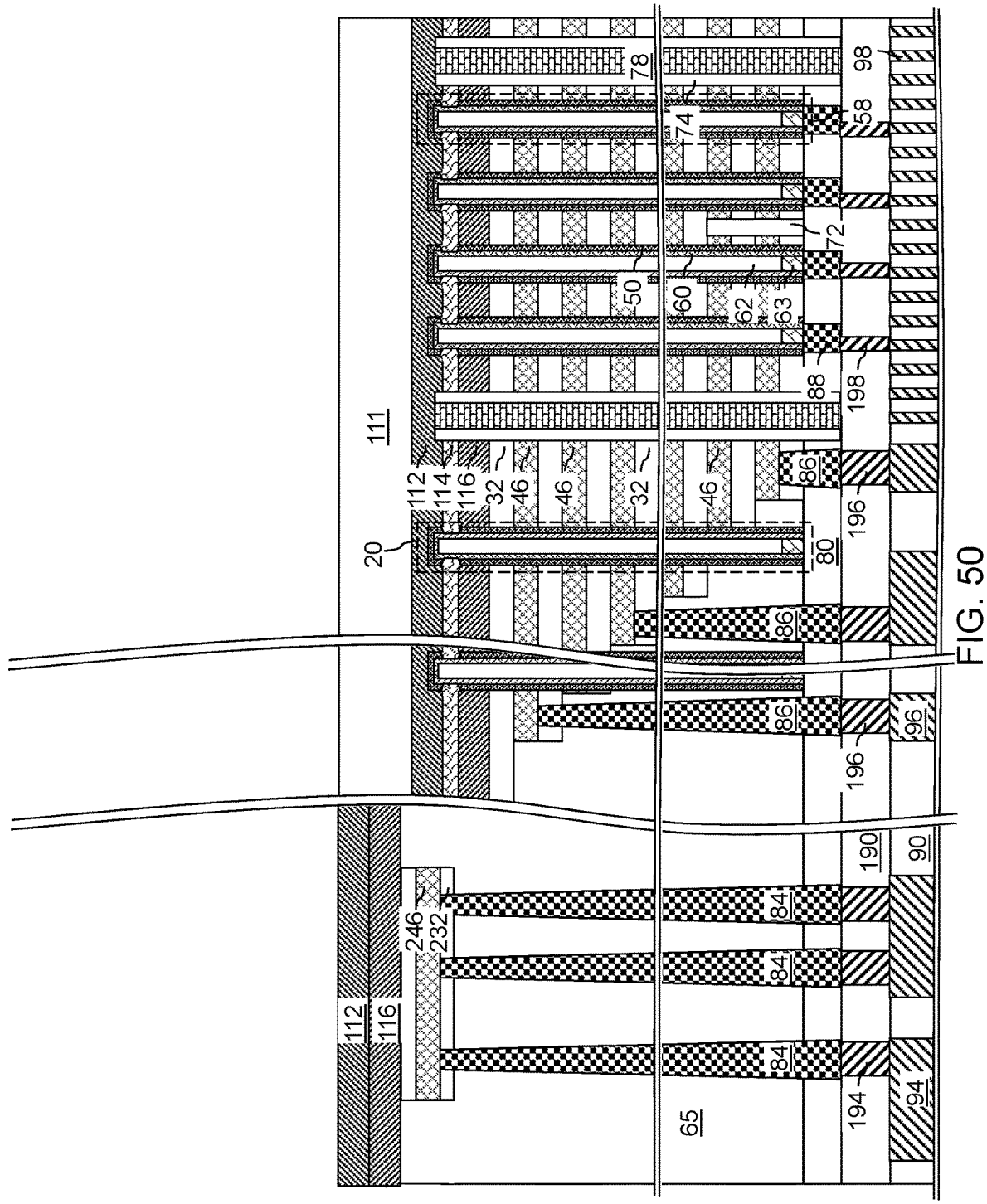
FIG. 50 is a schematic vertical cross-sectional view of the third exemplary structure after bonding a logic die to the memory die, and after removal of the carrier substrate according to the third embodiment of the present disclosure.

Referring to FIG. 50, the processing steps of FIGS. 38 and 39 can be performed to provide a memory die 900 and a logic die 700, to bond the memory die 900 and the logic die 700, and to remove the carrier substrate 9 from the bonded assembly of the memory die 900 and the logic die 700.

Figure 51:
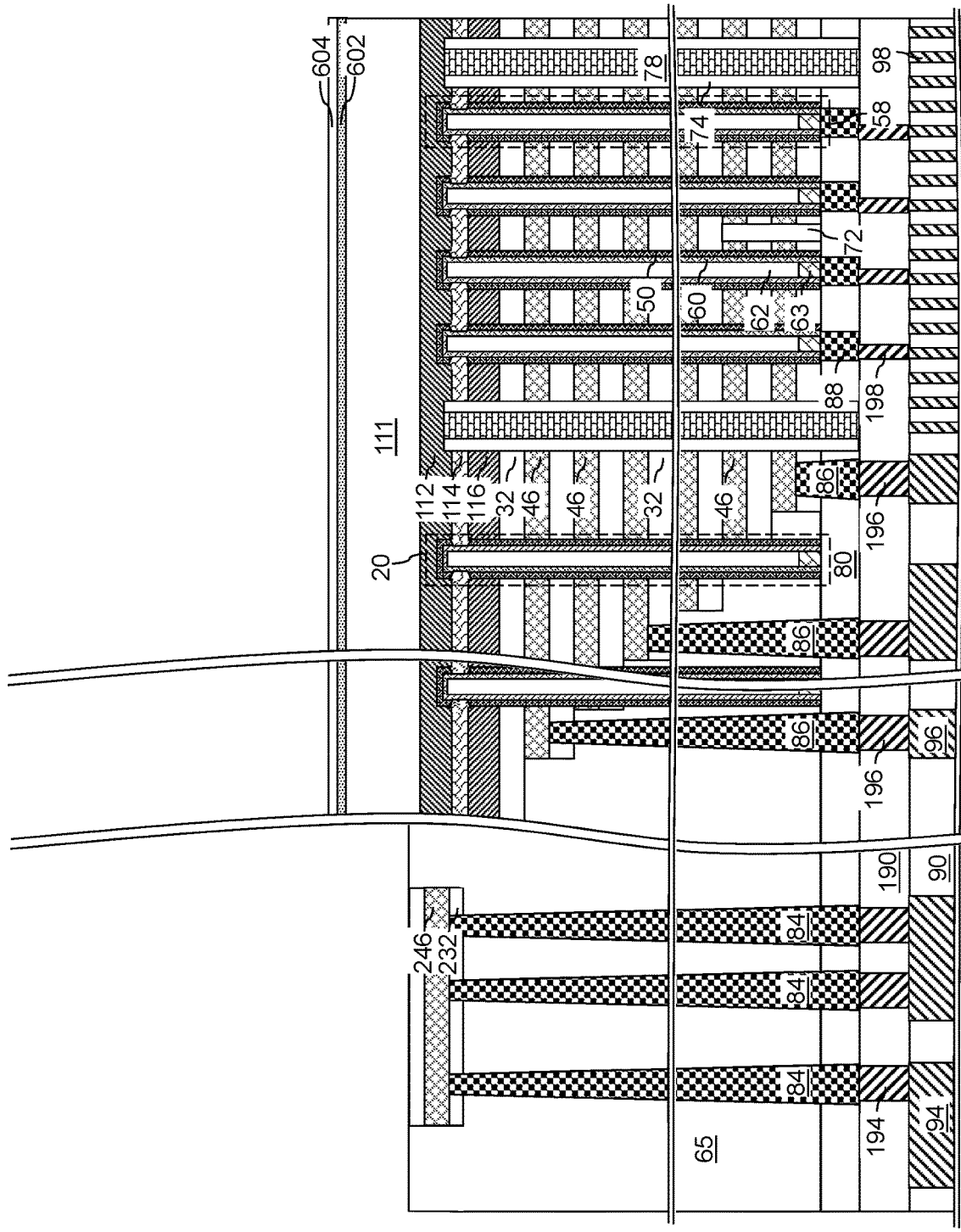
FIG. 51 is a schematic vertical cross-sectional view of the third exemplary structure after formation of backside dielectric liners, and patterning the backside dielectric liners, and the source-level material layers according to the third embodiment of the present disclosure.

Referring to FIG. 51, the processing steps of FIG. 40 can be performed to form backside dielectric liners (602, 604). The backside dielectric liners (602, 604) and the source-level material layers (112, 103, 105, 116) are patterned to expose the insulating plate 232 in the connection via region 200.

Figure 52:
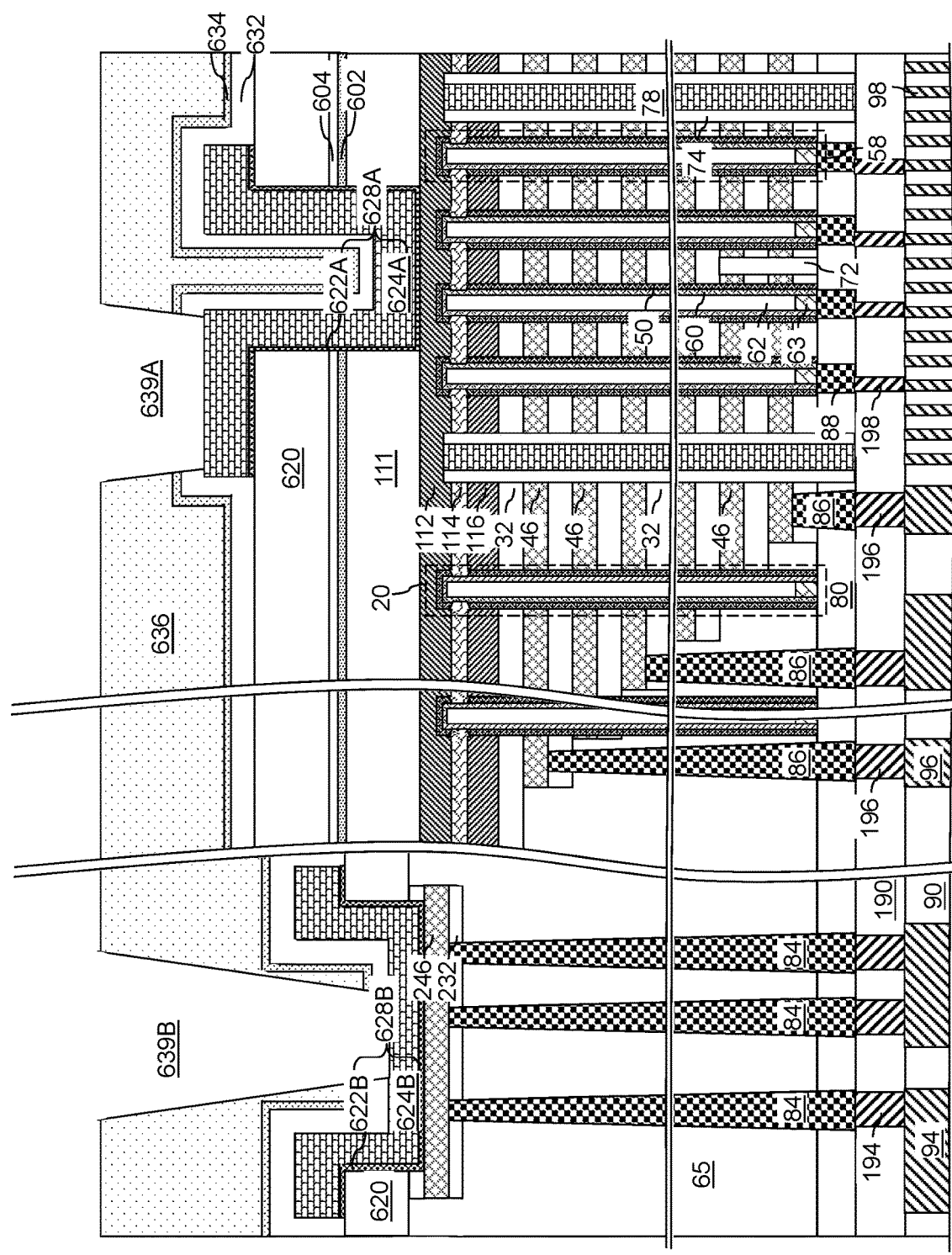
FIG. 52 is a schematic vertical cross-sectional view of the third exemplary structure after formation and patterning of a backside dielectric layer according to the third embodiment of the present disclosure.

Referring to FIG. 52, the backside dielectric material layer 620 is formed over the physically exposed insulating plate 232 over the backside dielectric liners (602, 604). The backside dielectric material layer 620 and the exposed insulating plate 232 are then patterned to form a first backside via cavity 613. The at least one metal plate 246 is exposed in the first backside via cavity 613. A second backside via cavity 617 may be formed at the same time as the first backside via cavity 613 or during a subsequent step.

Thereafter, the contact pad structures (628A, 628B), at least one backside dielectric cover layer (632, 634) and a passivation dielectric layer 636, and via cavities (639A, 639B) are formed as described above with respect to the second embodiment. As in the previously described exemplary structures, the backside contact pad structure 628B can contact the backside horizontal surface of at least one metal plate 246, and can contact at least one sidewall (such as a plurality of sidewalls) of the at least one metal plate 246, and may contact at least one sidewall of an insulating plate 232.

Figure 53:
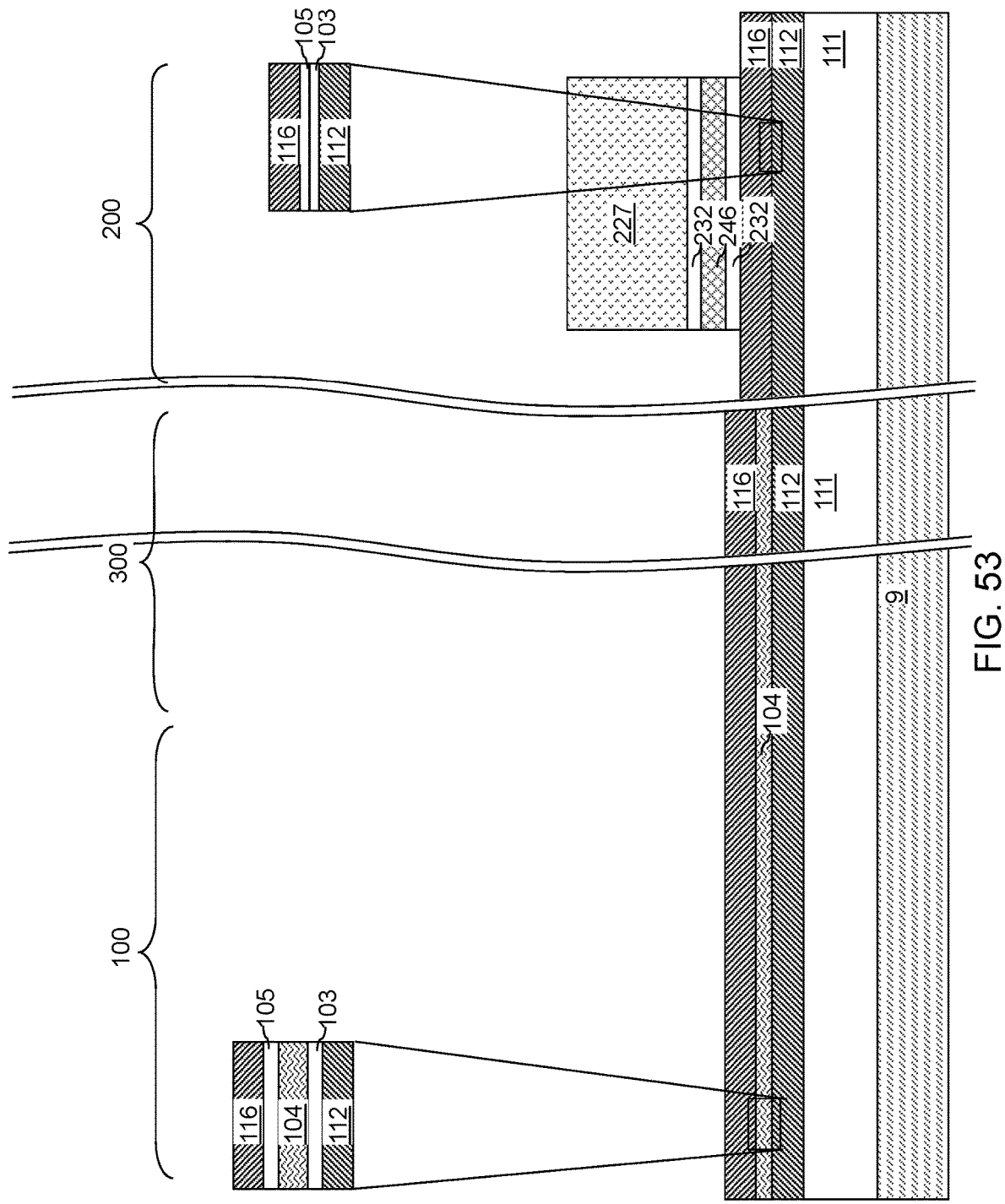
FIG. 53 is a schematic vertical cross-sectional view of a fourth exemplary structure after formation of a buffer dielectric layer, in-process source-level material layer, and plate stacks including a respective metal plate according to a fourth embodiment of the present disclosure.

Referring to FIG. 53, a fourth exemplary structure according to a fourth embodiment of the present disclosure can be derived from the second exemplary structure illustrated in FIG. 30 or from the third exemplary structure illustrated in FIG. 47 by omitting formation of the recess 205 into or through the buffer dielectric layer 111. In this case, at least one plate stack comprising a first insulating plate 232, a metal plate 246, and a second insulating plate 232 can be formed above a horizontal plane including a topmost surface of the at least one semiconductor material layer (112, 116) within the region 200 in which connection via structures are to be subsequently formed. One, a plurality or each of the sidewalls of a metal plate 246 may be vertically coincident with a respective sidewall of an overlying second insulating plate 232 and with a respective sidewall of an underlying first insulating plate 232.

Figure 54:
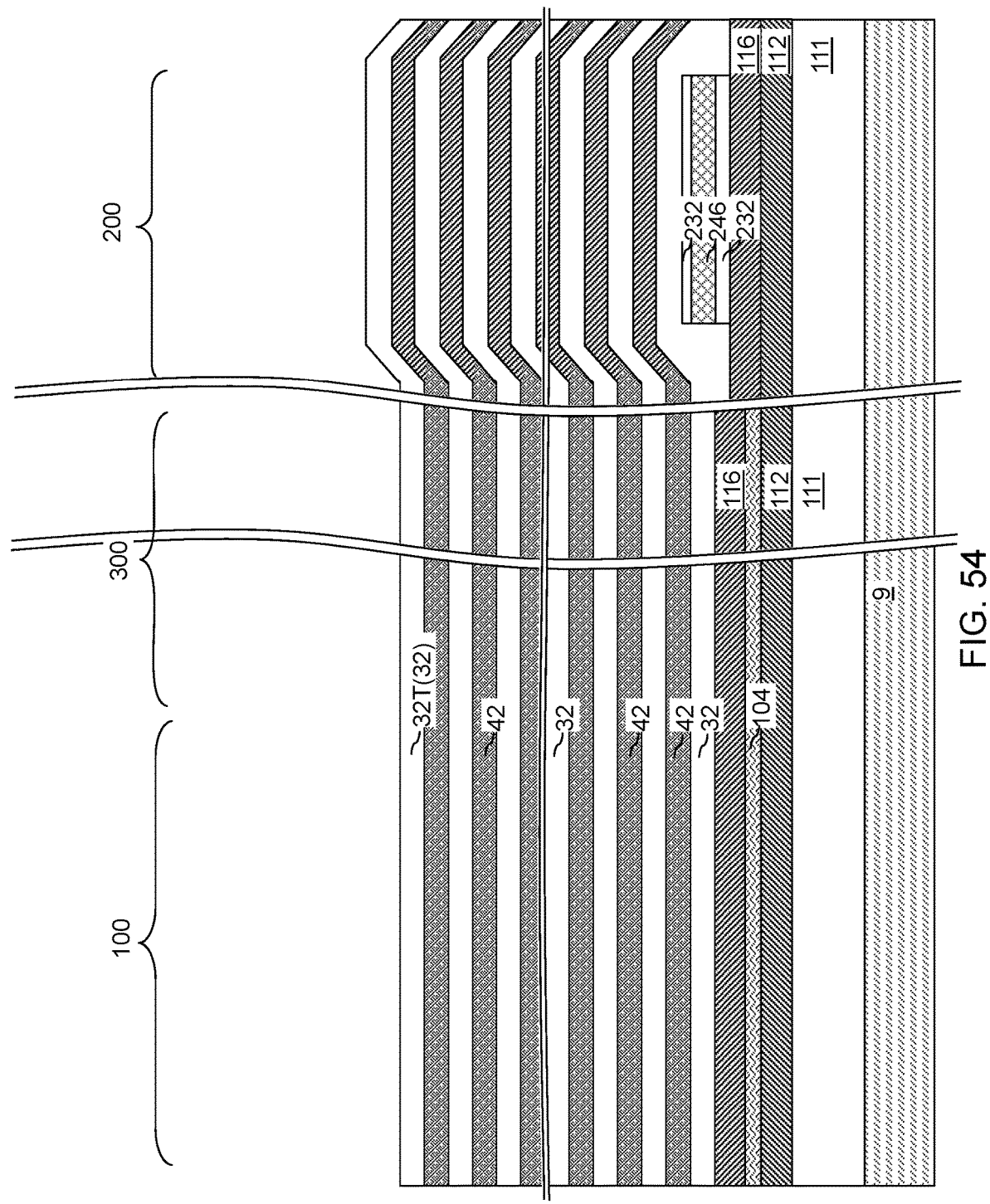
FIG. 54 is a schematic vertical cross-sectional view of the fourth exemplary structure after formation of an alternating stack of insulating layers and sacrificial material layers according to the fourth embodiment of the present disclosure.

Referring to FIG. 54, the processing steps described with reference to FIG. 31 can be performed to form an alternating stack of insulating layers 32 and sacrificial material layers 46.

Figure 55:
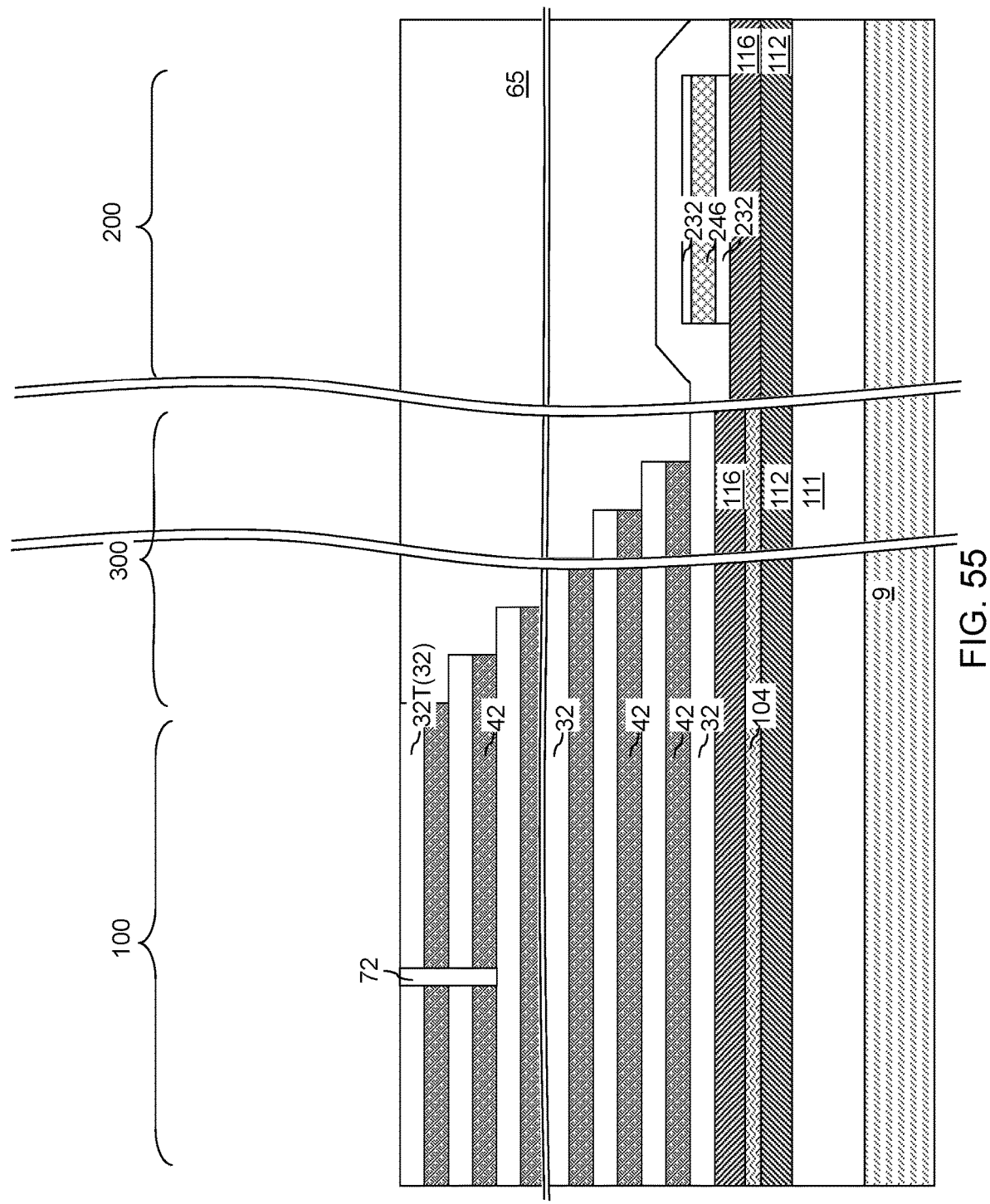
FIG. 55 is a schematic vertical cross-sectional view of the fourth exemplary structure after formation of stepped surfaces, a stepped dielectric material portion, and drain-select-level isolation structures according to the fourth embodiment of the present disclosure.

Referring to FIG. 55, the processing steps described with reference to FIG. 2 can be performed with any needed changes to form stepped surfaces on the alternating stack (32, 42). In this case, patterning of the sacrificial material plates 142 and the insulating plates 132 may be omitted.

Subsequently, the processing steps described with reference to FIG. 3 can be performed to form a stepped dielectric material portion 65 and optionally the drain-select-level isolation structures 72.

Figure 56:
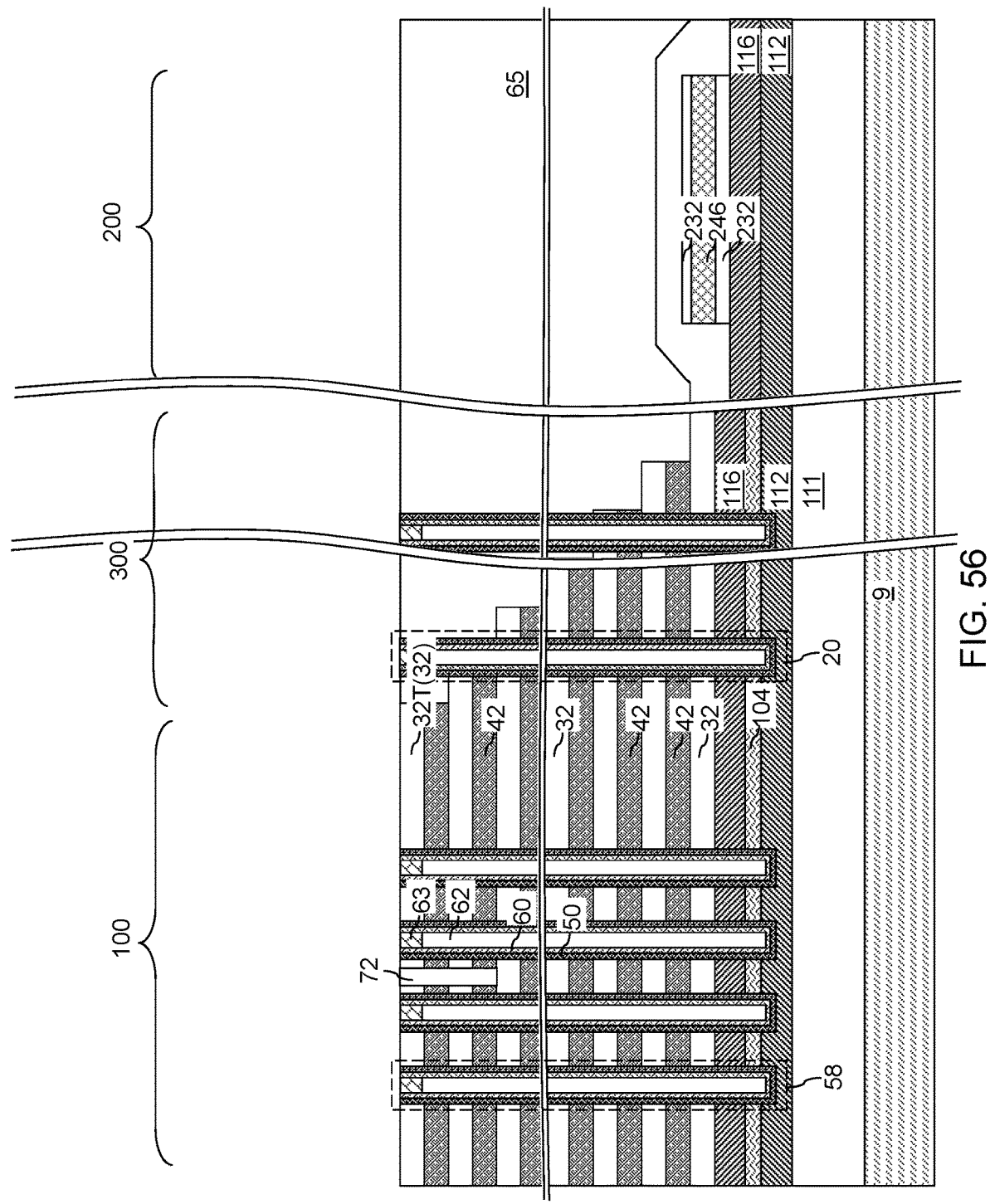
FIG. 56 is a schematic vertical cross-sectional view of the fourth exemplary structure after formation of memory opening fill structures and support pillar structures according to the fourth embodiment of the present disclosure.

Referring to FIG. 56, the processing steps described with reference to FIGS. 4 and 5 can be performed to form memory openings 49 and support openings 19, and to form memory opening fill structures 58 in the memory openings 49 and to form support openings 20 in the support openings 19, respectively.

Figure 57B:
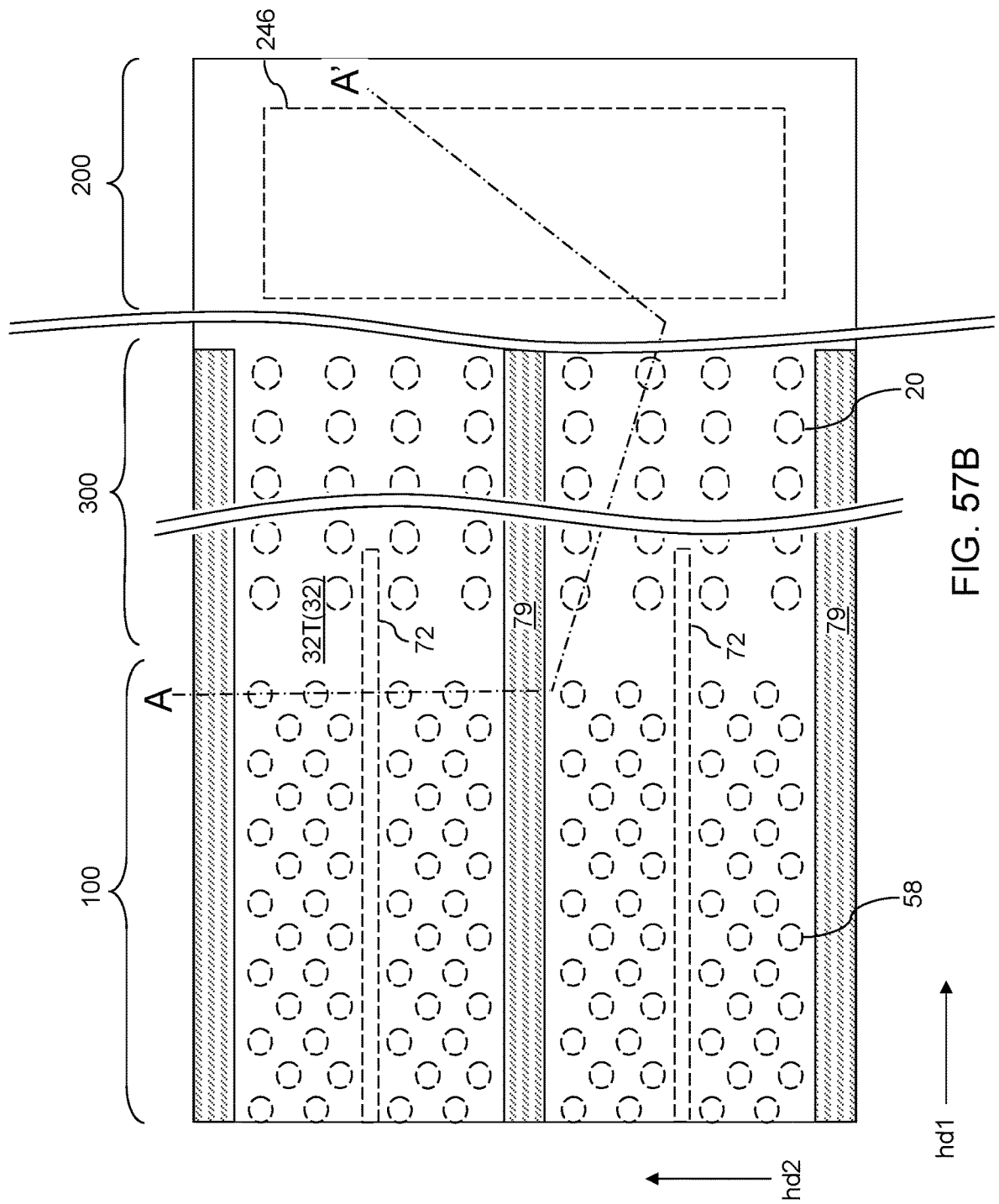
FIG. 57B is a partial see-through top-down view of the exemplary structure of FIG. 57A. The hinged vertical plane A-A' is the plane of the schematic vertical cross-sectional view of FIG. 57A.

Referring to FIGS. 57A and 57B, the processing steps described with reference to FIGS. 6A and 6B can be performed to form a contact-level dielectric layer 80 and through-stack trenches 79. The through-stack trenches 79 may or may not cut through any of the metal plates 246. In one embodiment, the metal plates 246 are not physically exposed to the through-stack trenches 79.

Figure 58:
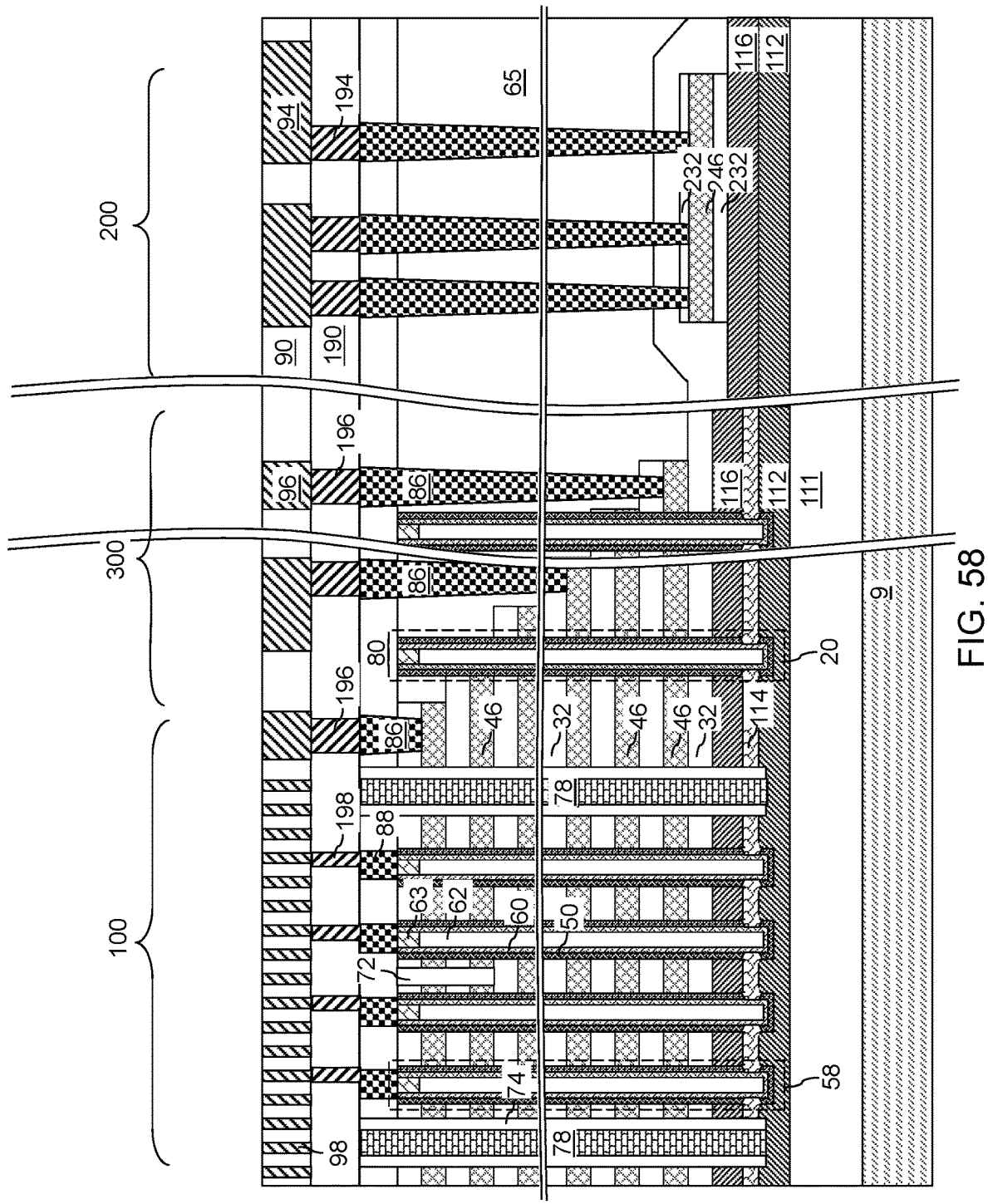
FIG. 58 is a schematic vertical cross-sectional view of the third exemplary structure after formation of electrically conductive layers, through-stack trench fill structures, additional contact via structures, connection via structures, and bit-line-level metal lines according to the fourth embodiment of the present disclosure.

Referring to FIG. 58, the processing steps described with reference to FIGS. 7-9 may be performed to replace the source-level sacrificial layer 104 with a source contact layer 114 in the memory array region 100 and the staircase region 300. Subsequently, the processing steps described with reference to FIGS. 10 and 11 may be performed to replace the sacrificial material layers 42 with electrically conductive layers 46.

In one embodiment, the metal plates 246 in the fourth exemplary structure extend along the second horizontal direction hd2 and have a uniform vertical thickness. The metal plates 246 and the alternating stack (32, 46) may be located on a same side of a horizontal plane including an interface between the at least one semiconductor material layer (112, 116) and the alternating stack (32, 46). In one embodiment, the metal plates 246 may comprise a different material than or have a different thickness than a thickness of an electrically conductive layer 46 that is most proximal to the horizontal plane including an interface between the at least one semiconductor material layer (112, 116) and the alternating stack (32, 46).

Subsequently, the processing steps described with reference to FIGS. 12, 13, 14, and 15 can be performed to form a through-stack trench fill structure (74, 78) within each through-stack trench 79. The processing steps described with reference to FIGS. 16A and 16B can be performed to form various via structure (88, 86, 84).

Subsequently, connection via structures (198, 196, 194) embedded in a via-level dielectric layer 190 can be formed. Further, metal line structures (98, 96, 94) embedded in a first line-level dielectric layer 90 can be formed. Generally, the processing steps described with reference to FIGS. 16A and 16B can be performed to form metal interconnect structures embedded in dielectric material layers.

Figure 59:
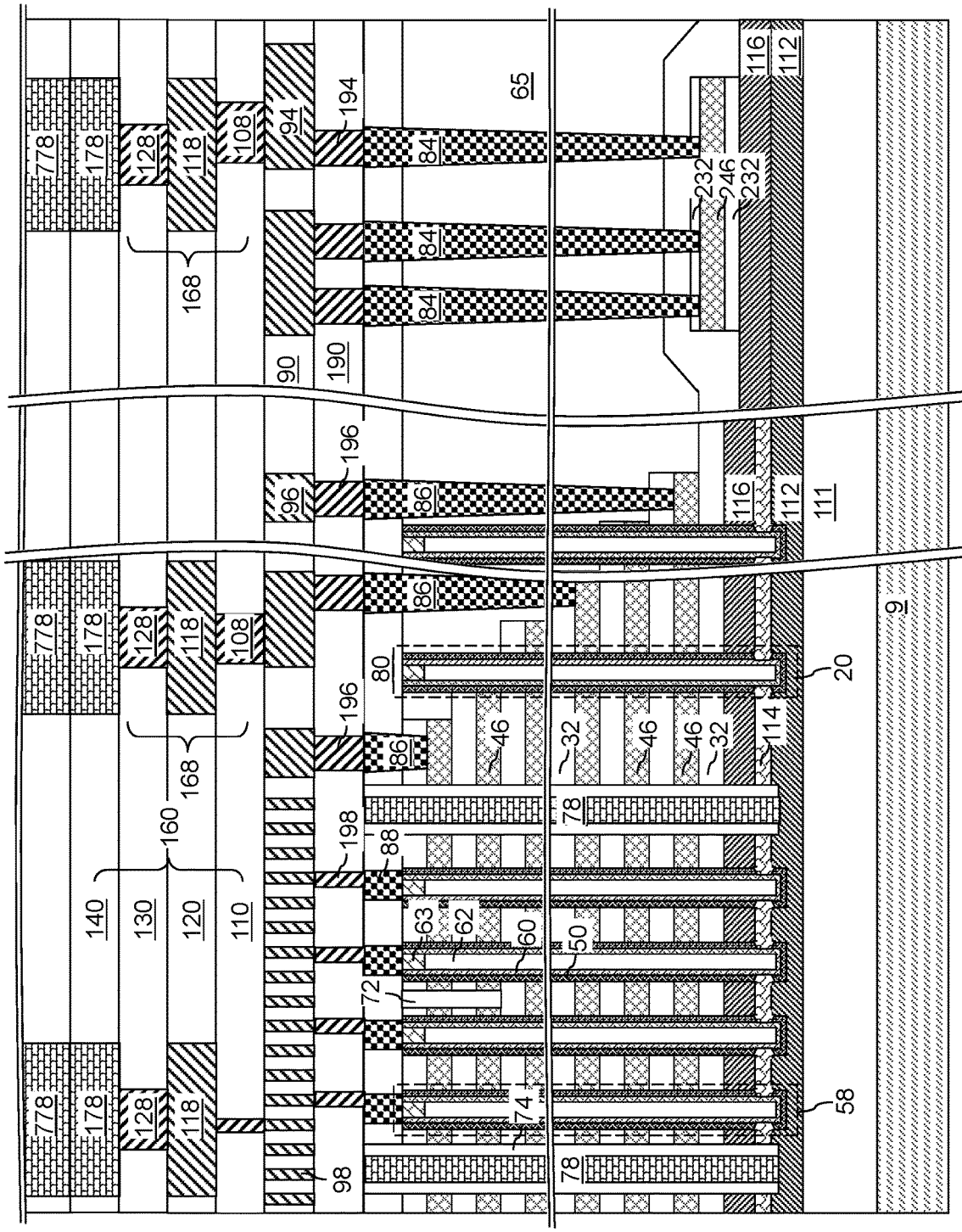
FIG. 59 is a schematic vertical cross-sectional view of a region the fourth exemplary structure after bonding a logic die to the memory die according to the fourth embodiment of the present disclosure.

Referring to FIG. 59, the processing steps described with reference to FIGS. 17, 18, and 19 can be performed to provide a memory die 900 and a logic die 700, and to bond the memory die 900 and the logic die 700.

Figure 60:
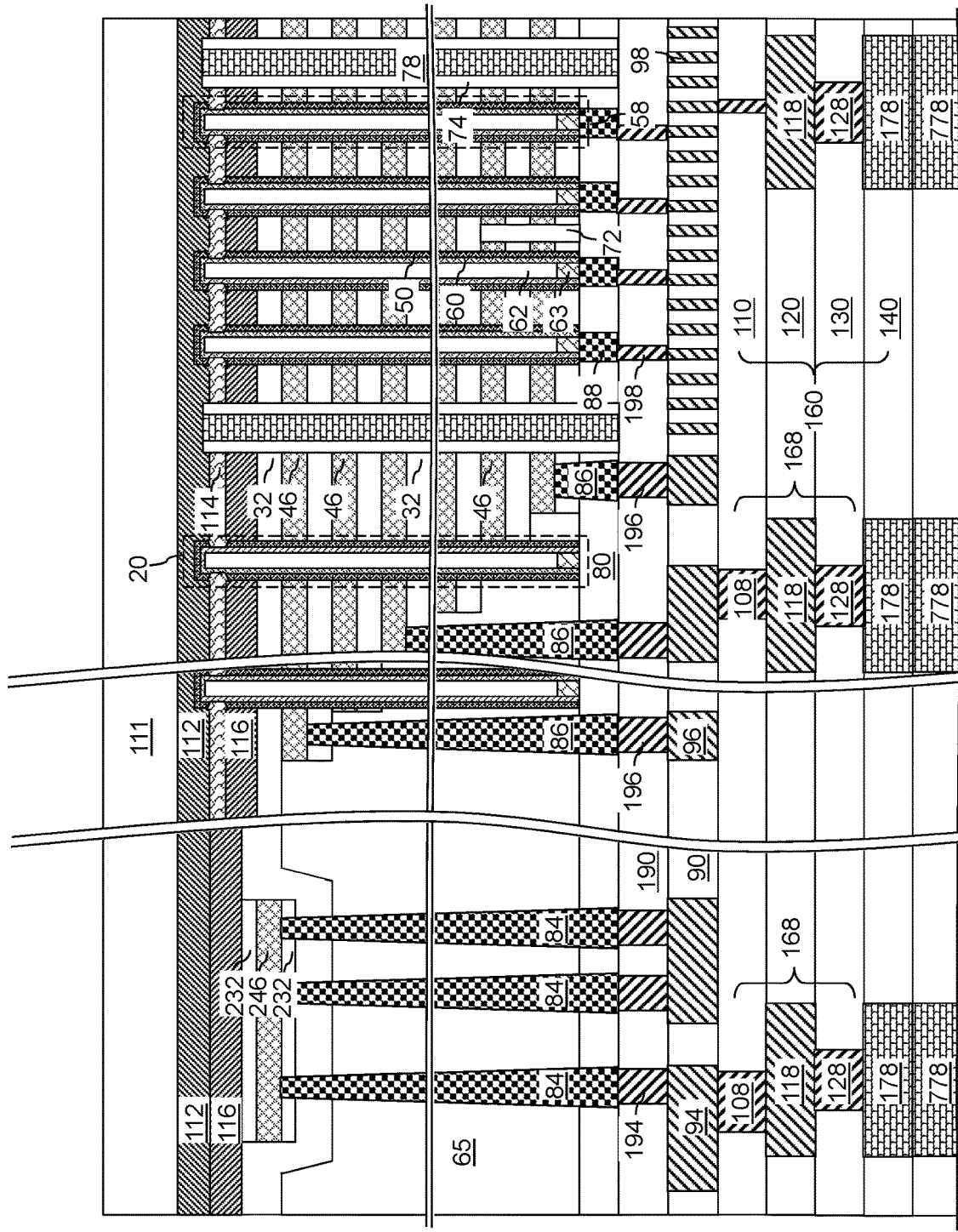
FIG. 60 is a schematic vertical cross-sectional view of the fourth exemplary structure after removal of the carrier substrate according to the fourth embodiment of the present disclosure.

Referring to FIG. 60, the processing steps described with reference to FIG. 20 can be performed to remove the carrier substrate 9 from the bonded assembly of the memory die 900 and the logic die 700.

Figure 61:
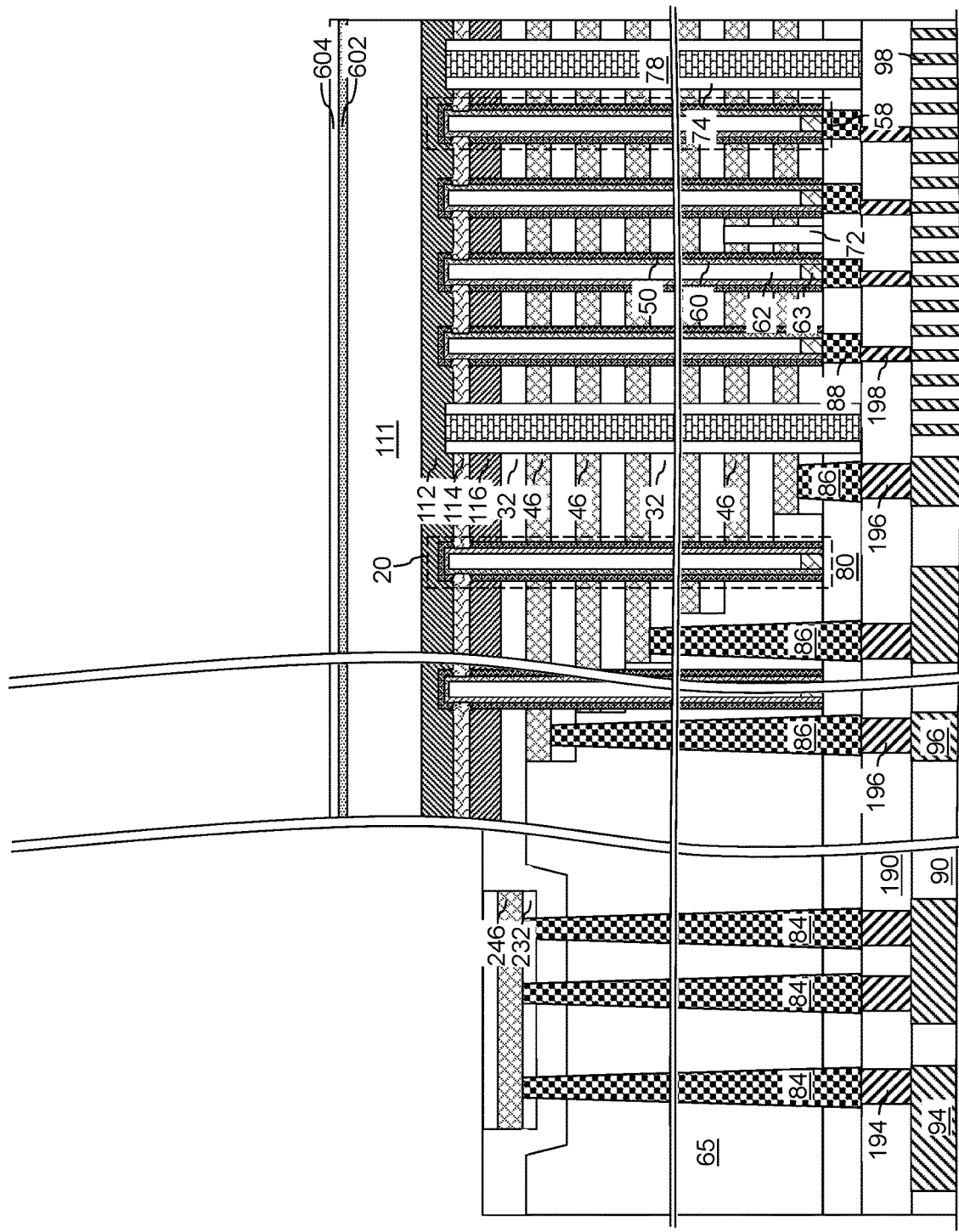
FIG. 61 is a schematic vertical cross-sectional view of the fourth exemplary structure after formation of backside dielectric liners, and patterning the backside dielectric liners, the buffer dielectric layer, and the source-level material layers according to the fourth embodiment of the present disclosure.

Referring to FIG. 61, the processing steps described with reference to FIG. 21 can be performed to form backside dielectric liners (602, 604) and a patterned photoresist layer. Subsequently, the processing steps described with reference to FIG. 22 can be performed to remove unmasked portions of the backside dielectric liners (602, 604), the buffer dielectric layer 222, and the source-level material layers (112, 103, 105 116). The patterned photoresist layer can be subsequently removed, for example, by ashing.

Figure 62:
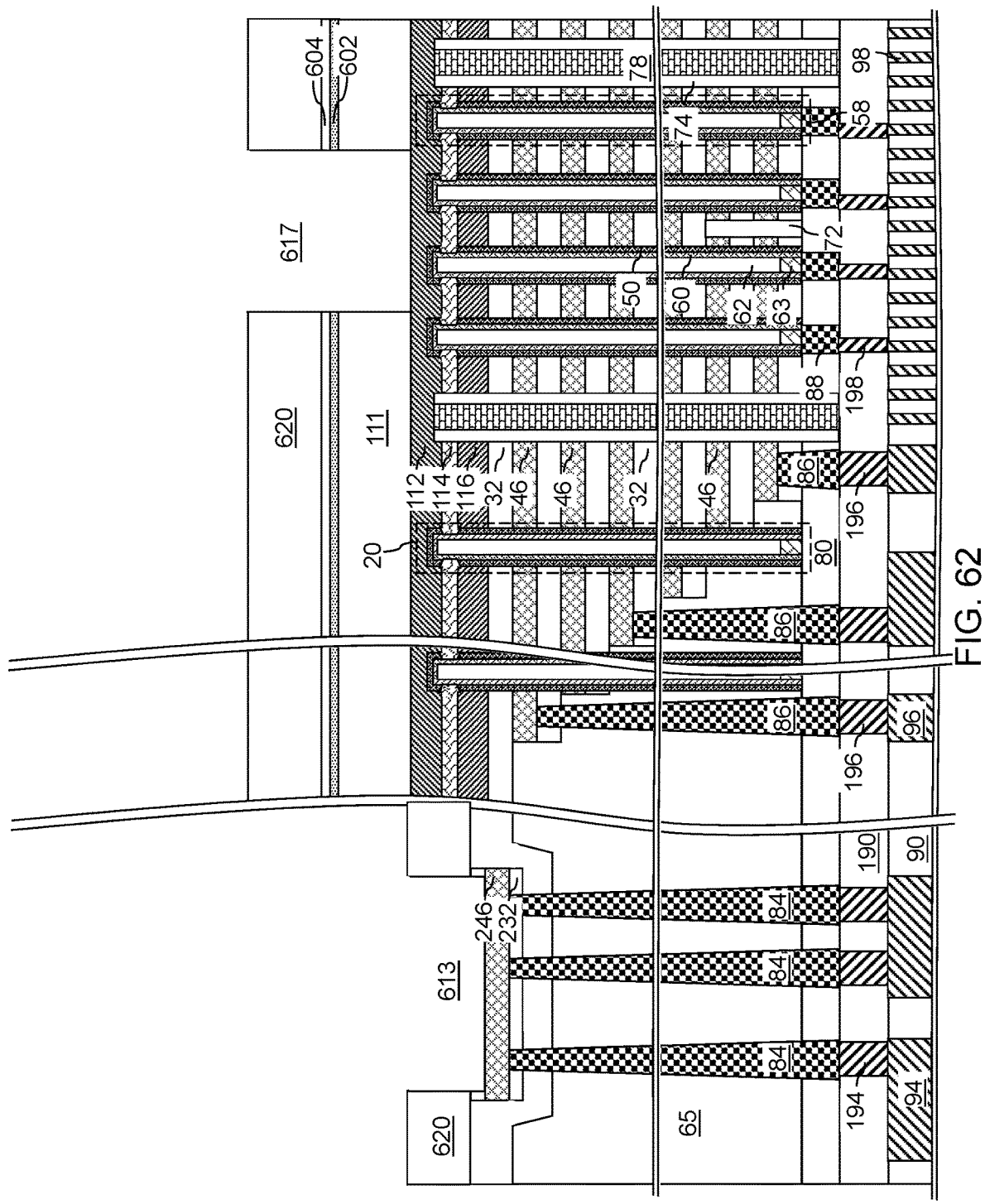
FIG. 62 is a schematic vertical cross-sectional view of the fourth exemplary structure after formation of a backside dielectric layer and backside contact via cavities according to the fourth embodiment of the present disclosure.

Referring to FIG. 62, the processing steps described with reference to FIG. 23 can be performed to form a backside dielectric material layer 620. Subsequently, the processing steps described with reference to FIG. 24 may be performed with any needed changes to form first backside contact via cavities 613. In this case, the etch process that forms the first backside contact via cavities 613 may etch through the proximal insulating plate 232 within each plate stack (232, 246) of the proximal insulating plate 232, the metal plate 246, and the distal insulating plate 232, and a proximal horizontal surface of each metal plate 246 may be physically exposed to a respective first backside contact via cavity 613. Subsequently, the processing steps described with reference to FIG. 25 may be performed to form second backside contact via cavities 617.

Figure 63:
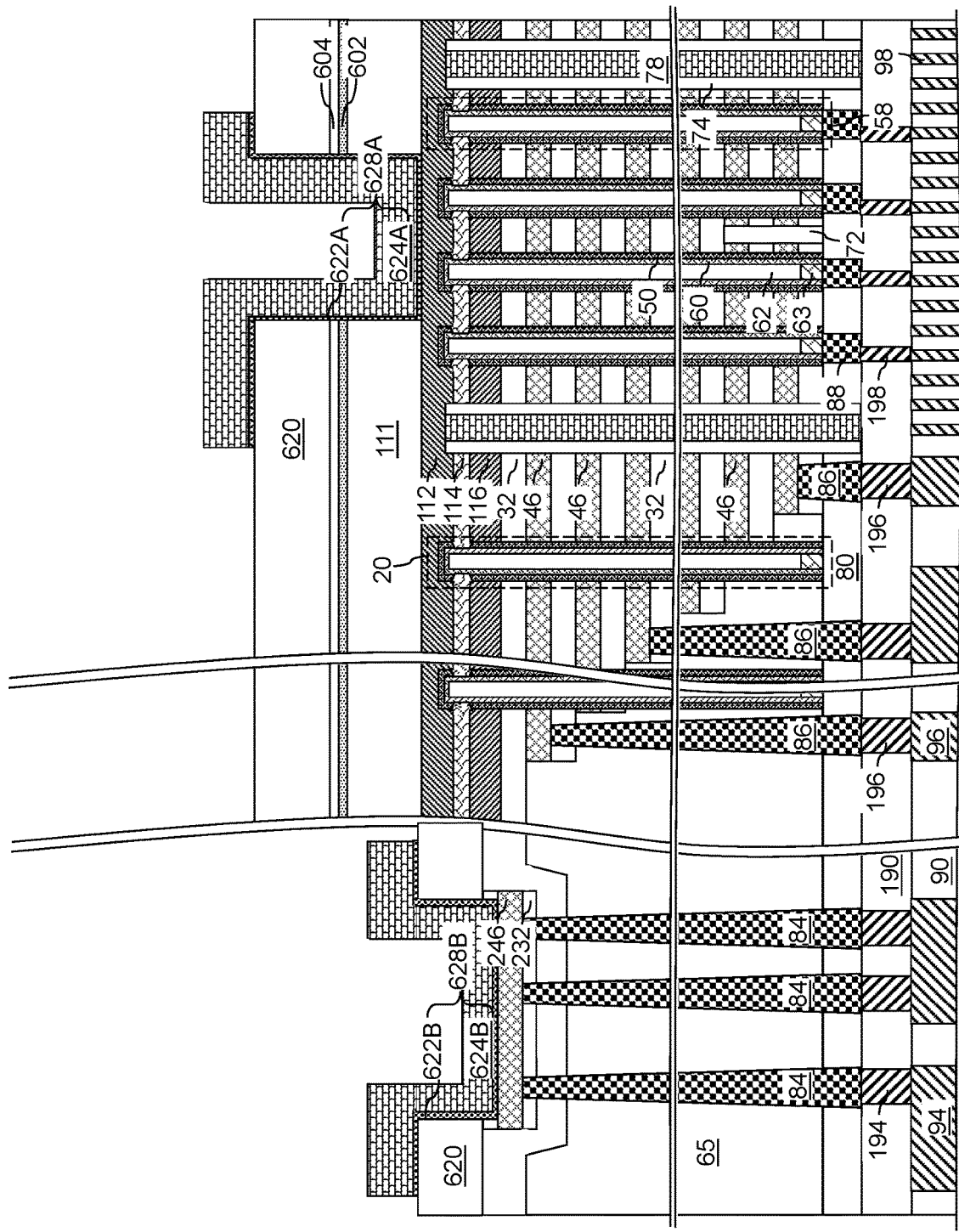
FIG. 63 is a schematic vertical cross-sectional view of the fourth exemplary structure after formation of backside contact pad structures according to the fourth embodiment of the present disclosure.

Referring to FIG. 63, the processing steps described with reference to FIG. 26 can be performed to form contact pad structures (628A, 628B). The contact pad structures (628A, 628B) may comprise at least one source contact pad structure 628A and at least one backside contact pad structure 628B that is formed directly on the backside surface(s) of a respective subset of metal plate 246. Each backside contact pad structure 628B can be in contact with at least one metal plate 246, can be spaced from at least one connection via structure 84 by the at least one metal plate 246, and can be electrically connected to the at least one connection via structure 84 through the at least one metal plate 246.

Figure 64:
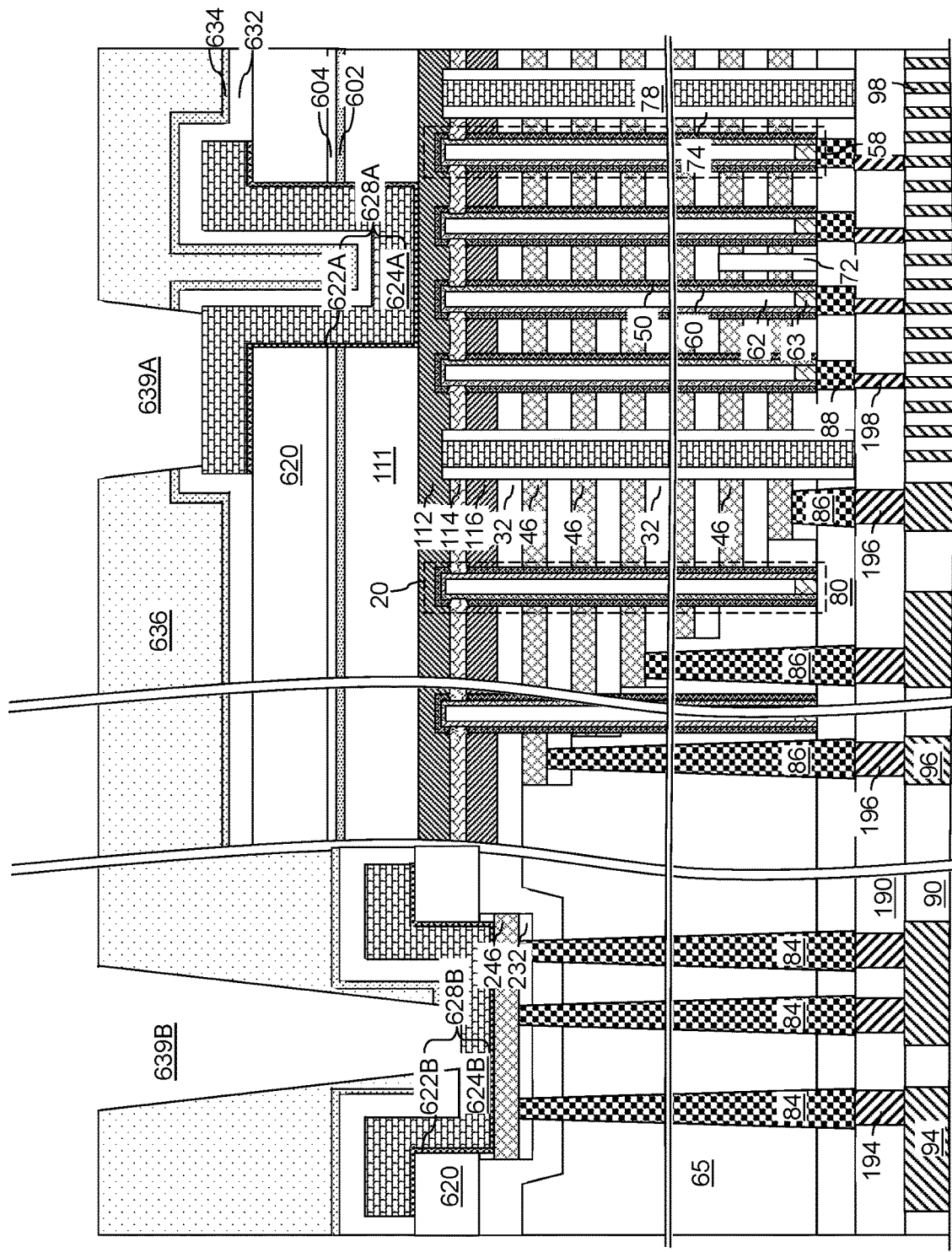
FIG. 64 is a schematic vertical cross-sectional view of the fourth exemplary structure after formation of a passivation dielectric layer and via cavities according to the fourth embodiment of the present disclosure.

Referring to FIG. 64, the processing steps described with reference to FIG. 27A can be performed to form at least one backside dielectric cover layer (632, 634) and a passivation dielectric layer 636, and to form via cavities (639A, 639B). Generally, the at least one backside dielectric cover layer (632, 634) comprises openings therethrough. Each opening may have an end periphery that is located on a backside surface of a respective one of the source contact pad structures 628A and the backside contact pad structures 628B.

Referring collectively to FIGS. 1-64 and according to various embodiments related to the first through fourth exemplary structures, a semiconductor structure is provided, which comprises: an alternating stack (32, 46) of insulating layers 32 and electrically conductive layers 46 that is located on a front side of at least one semiconductor material layer (112, 114, 116); memory openings 49 vertically extending through the alternating stack (32, 46); memory opening fill structures 58 located in the memory openings 49 and comprising a respective vertical semiconductor channel 60 and a respective vertical stack of memory elements, wherein the at least one semiconductor material layer (112, 114, 116) is in contact with the vertical semiconductor channels 60; a dielectric material portion 65; a connection via structure 84 vertically extending through the dielectric material portion 65; a metal plate (146, 246) in contact with a proximal end surface of the connection via structure 84; and a backside contact pad structure 628B in contact with the metal plate (146, 246) and spaced from the connection via structure 84 by the metal plate (146, 246).

In one embodiment, the connection via structure 84 has a variable horizontal cross-sectional area that increases with a vertical distance from a horizontal plane including a horizontal interface between the backside contact pad structure 628B and the metal plate (146, 246).

In one embodiment, the metal plate (146, 246) extends along a horizontal direction and has a uniform vertical thickness.

In one embodiment, lateral extents of the electrically conductive layers 46 decrease with a vertical distance from the at least one semiconductor material layer (112, 114, 116); and the dielectric material portion 65 contacts stepped surfaces of the alternating stack (32, 46) and has a variable lateral extent that increases with a vertical distance from a horizontal plane including an interface between the alternating stack (32, 46) and the at least one semiconductor material layer (112, 114, 116).

In one embodiment, the semiconductor structure comprises: a contact-level dielectric layer 80 located on a front side of the alternating stack (32, 46); and drain contact via structures 88 vertically extending through the contact-level dielectric layer 80 and contacting an end surface of a respective one of the memory opening fill structures 58, wherein distal end surfaces of the drain contact via structures 88 and a distal end surface of the connection via structure 84 are located within a same horizontal plane.

In one embodiment, the semiconductor structure comprises an insulating plate (132, 232) in contact with a front horizontal surface of the metal plate (146, 246), wherein a sidewall of the metal plate (146, 246) is vertically coincident with a respective sidewall of the insulating plate (132, 232), and the connection via structure 84 vertically extends through the insulating plate (132, 232).

In one embodiment, the semiconductor structure comprises: a backside dielectric material layer 620 that is located on a backside of the at least one semiconductor material layer (112, 114, 116) and laterally surrounding and contacting the backside contact pad structure 628B; and at least one backside dielectric cover layer (632, 634) located on a backside of the backside dielectric material layer 620 and comprising an opening therethrough, wherein an end periphery of the opening is located on a backside surface of the backside contact pad structure 628B.

In one embodiment, the at least one semiconductor material layer (112, 114, 116) comprises a source contact layer 114 including a doped semiconductor material; and each of the vertical semiconductor channels 60 comprises a respective cylindrical surface in contact with a respective surface segment of the source contact layer 114.

In one embodiment, the semiconductor structure comprises a source contact pad structure 628A contacting a backside surface of the at least one semiconductor material layer (112, 114, 116) and comprising a same set of materials as the backside contact pad structure 628B.

In one embodiment, the metal plate (146, 246) comprises a same material as, and has a same vertical thickness as, an electrically conductive layer 46 of the electrically conductive layers 46 that is most proximal to a horizontal plane including an interface between the at least one semiconductor material layer (112, 114, 116) and the alternating stack (32, 46).

In one embodiment, the semiconductor structure comprises a dielectric trench fill structure 76 contacting a sidewall of the dielectric material portion 65, and is laterally spaced from the electrically conductive layers 46 by the stepped dielectric material portion 65.

In one embodiment, the semiconductor structure comprises a through-stack contact via structure 78 that is laterally surrounded by an insulating trench spacer 74, and contacts the at least one semiconductor material layer (112, 114, 116).

In one embodiment, the metal plate (146, 246) and the at least one semiconductor material layer (112, 114, 116) are located on a same side of a horizontal plane including an interface between the at least one semiconductor material layer (112, 114, 116) and the alternating stack (32, 46).

In one embodiment, the metal plate (146, 246) and the alternating stack (32, 46) are located on a same side of a horizontal plane including an interface between the at least one semiconductor material layer (112, 114, 116) and the alternating stack (32, 46); and the metal plate (146, 246) comprises a different material than, or has a different thickness than a thickness of, an electrically conductive layer 46 of the electrically conductive layers 46 that is most proximal to the horizontal plane including an interface between the at least one semiconductor material layer (112, 114, 116) and the alternating stack (32, 46).

In one embodiment, first metal interconnect structures are embedded in first dielectric material layers over the alternating stack and the metal plate, first bonding pads are electrically contacting the first metal interconnect structures, and a semiconductor die comprising semiconductor devices, second metal interconnect structures embedded in second dielectric material layers and second bonding pads which are bonded to the first bonding pads.

Figure 65:
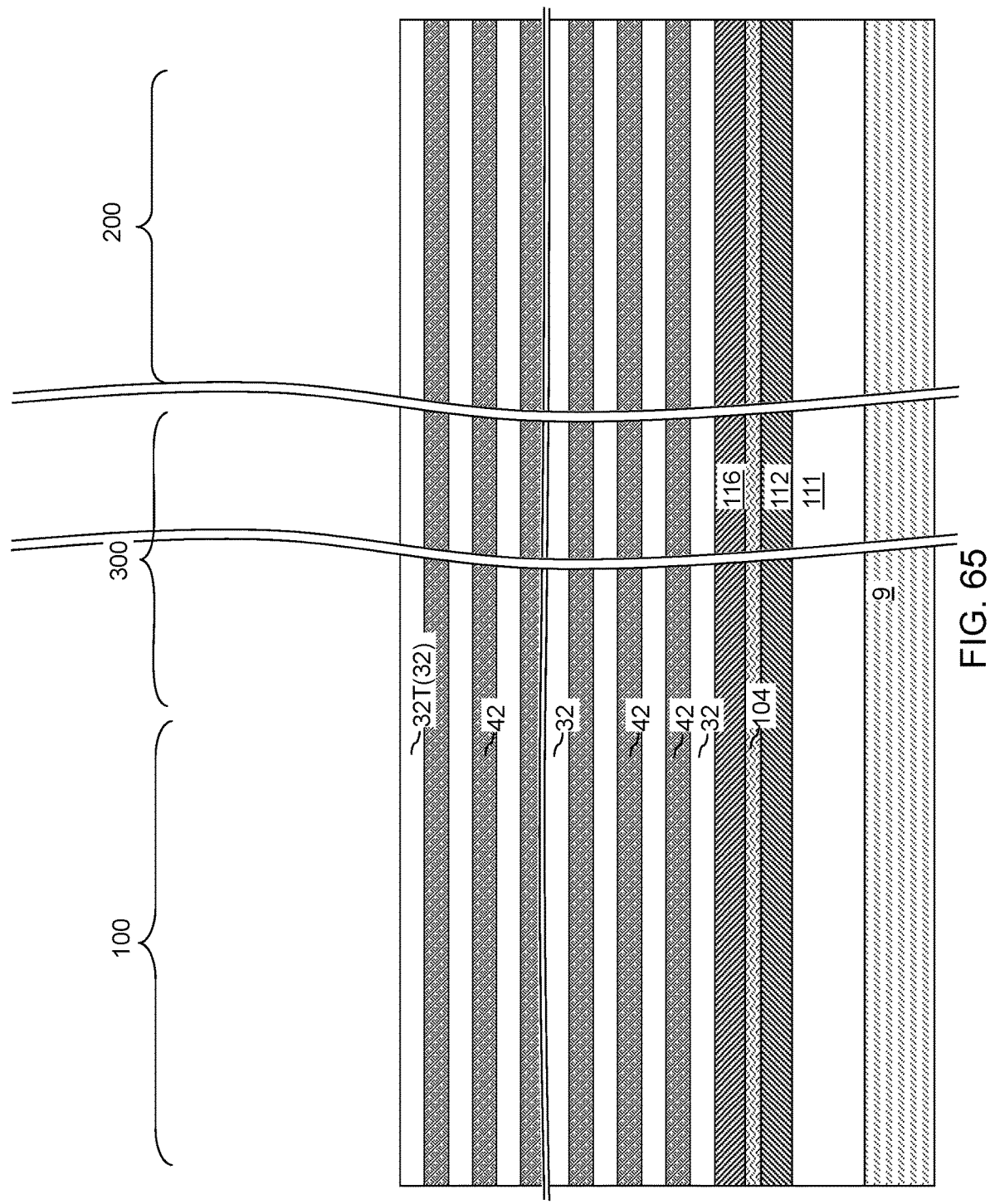
FIG. 65 is a schematic vertical cross-sectional view of a fifth exemplary structure after formation of a buffer dielectric layer, in-process source-level material layers, and an alternating stack of insulating layers and sacrificial material layers over a carrier substrate according to a fifth embodiment of the present disclosure.

Referring to FIG. 65, a fifth exemplary structure according to a fifth embodiment of the present disclosure is illustrated, which may be the same as the first exemplary structure illustrated in FIG. 1.

Figure 66:
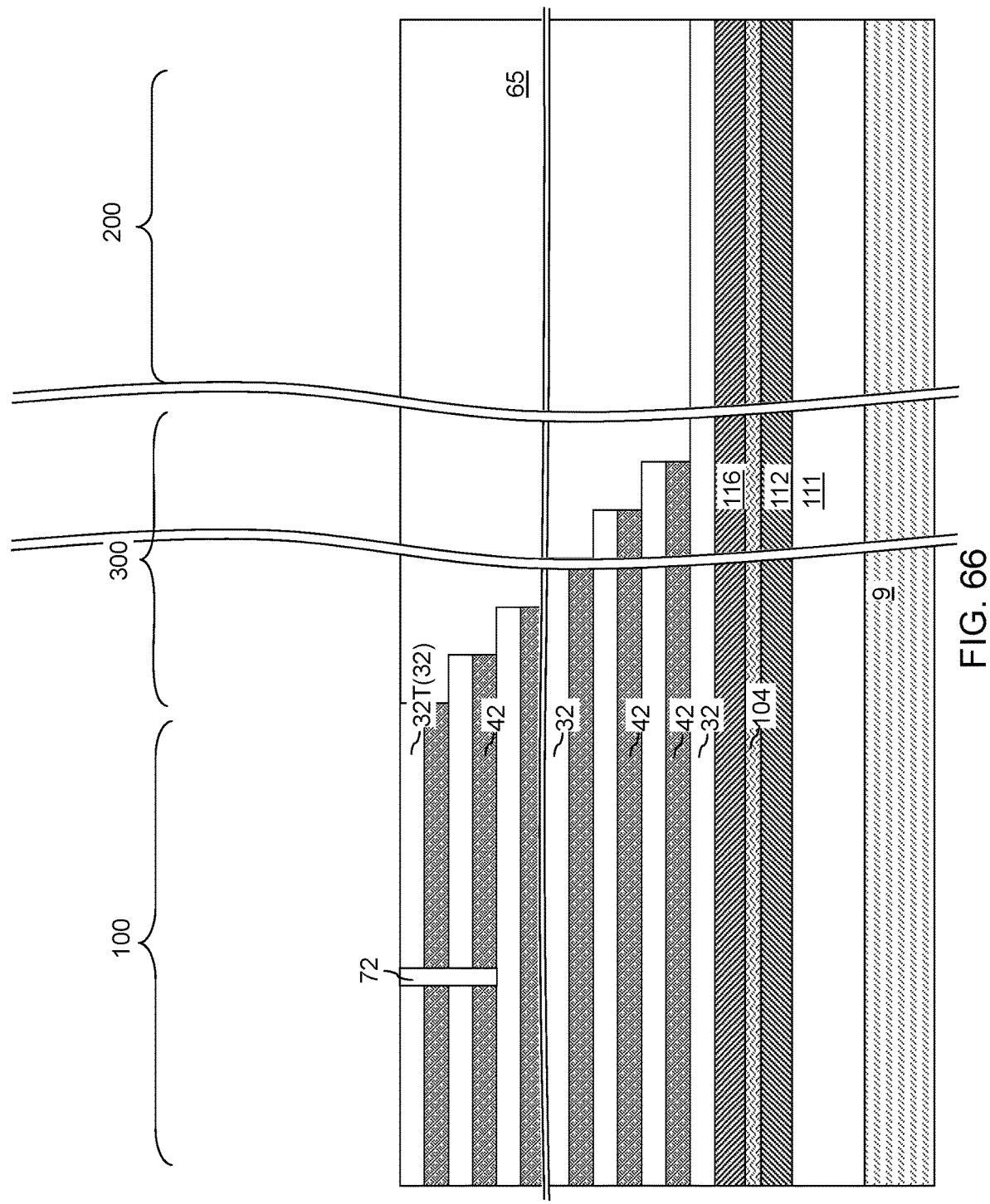
FIG. 66 is a schematic vertical cross-sectional view of the fifth exemplary structure after formation of stepped surfaces, a stepped dielectric material portion, and drain-select-level isolation structures according to the fifth embodiment of the present disclosure.

Referring to FIG. 66, the processing steps described with reference to FIG. 2 can be performed with any needed changes to form stepped surfaces on the alternating stack (32, 42) in a staircase region. In this case, formation of the sacrificial material plates 142 and the insulating plates 132 may be omitted. Subsequently, the processing steps described with reference to FIG. 3 can be performed to form a stepped dielectric material portion 65 and drain-select-level isolation structures 72.

Figure 67:
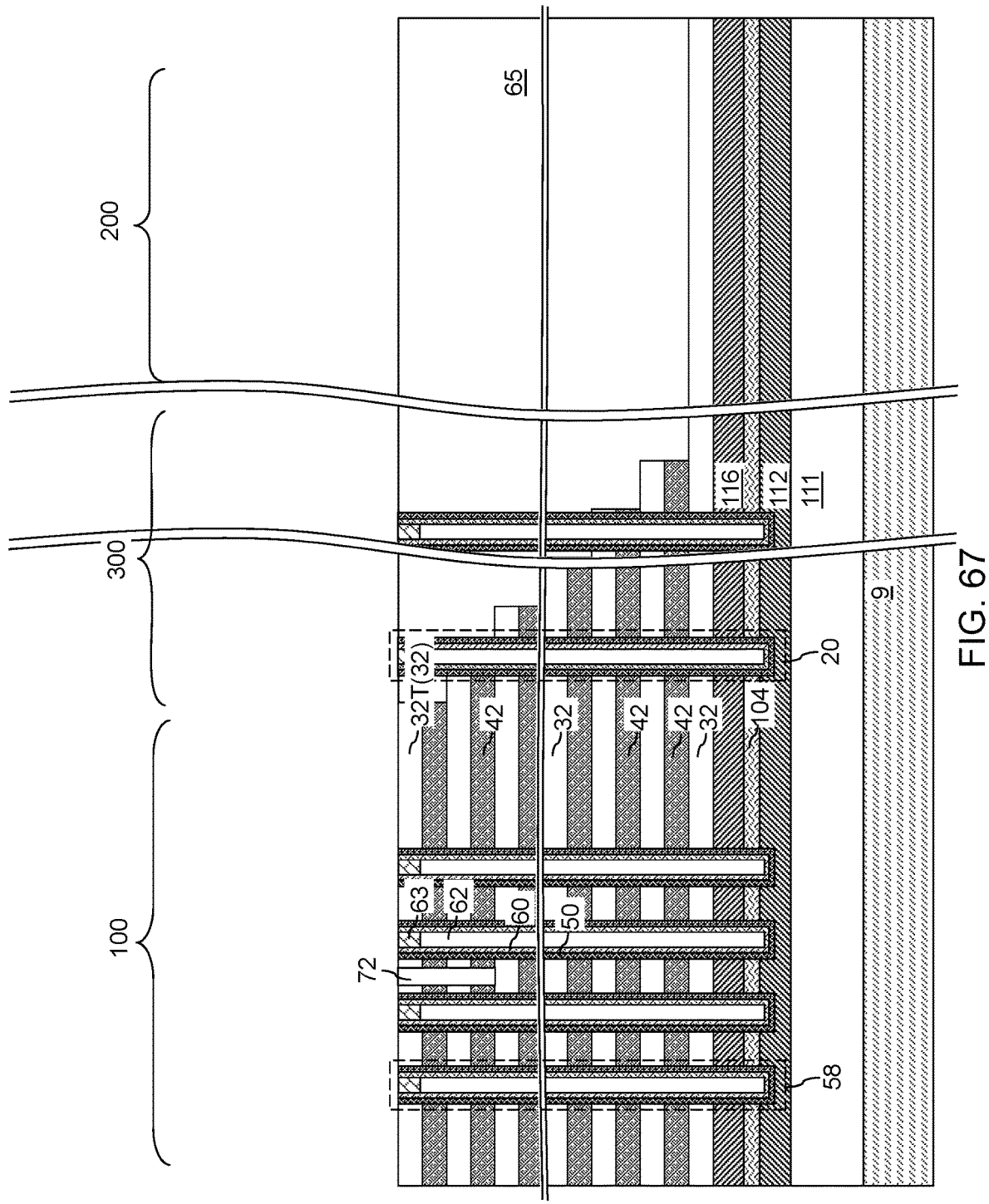
FIG. 67 is a schematic vertical cross-sectional view of the fifth exemplary structure after formation of memory opening fill structures and support pillar structures according to the fifth embodiment of the present disclosure.

Referring to FIG. 67, the processing steps described with reference to FIG. 4 can be performed to form memory openings 49 and support openings 19. Subsequently, the processing steps described with reference to FIG. 5 can be performed to form memory opening fill structures 58 and support pillar structures 20.

Figure 68:
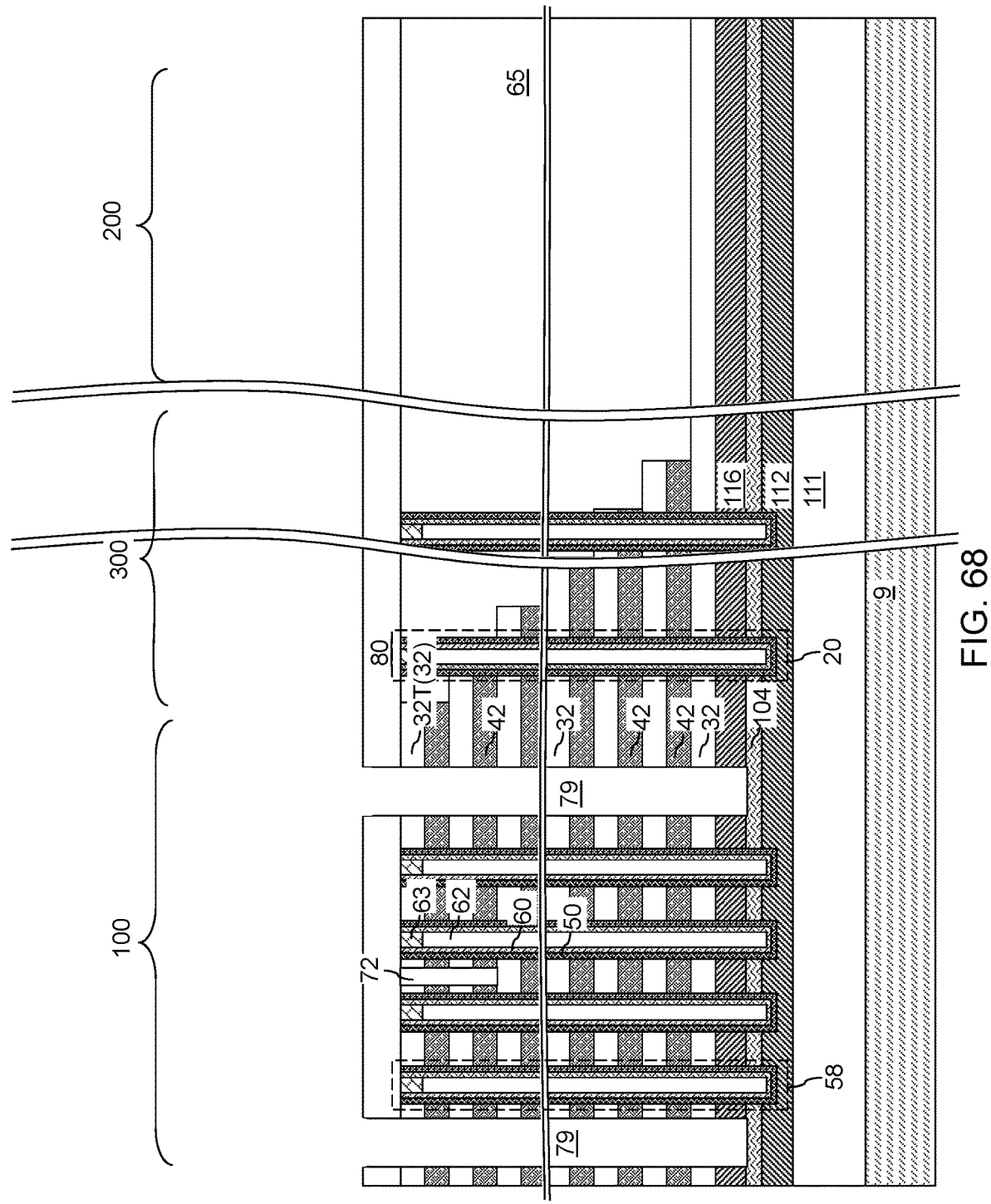
FIG. 68 is a schematic vertical cross-sectional view of the fifth exemplary structure after formation of a contact-level dielectric layer and through-stack trenches according to the fifth embodiment of the present disclosure.

Referring to FIG. 68, the processing steps described with reference to FIGS. 6A and 6B can be performed to form a contact-level dielectric layer 80 and through-stack trenches 79. A surface of the source-level sacrificial layer 104 can be physically exposed at the bottom of each through-stack trench 79.

Figure 69:
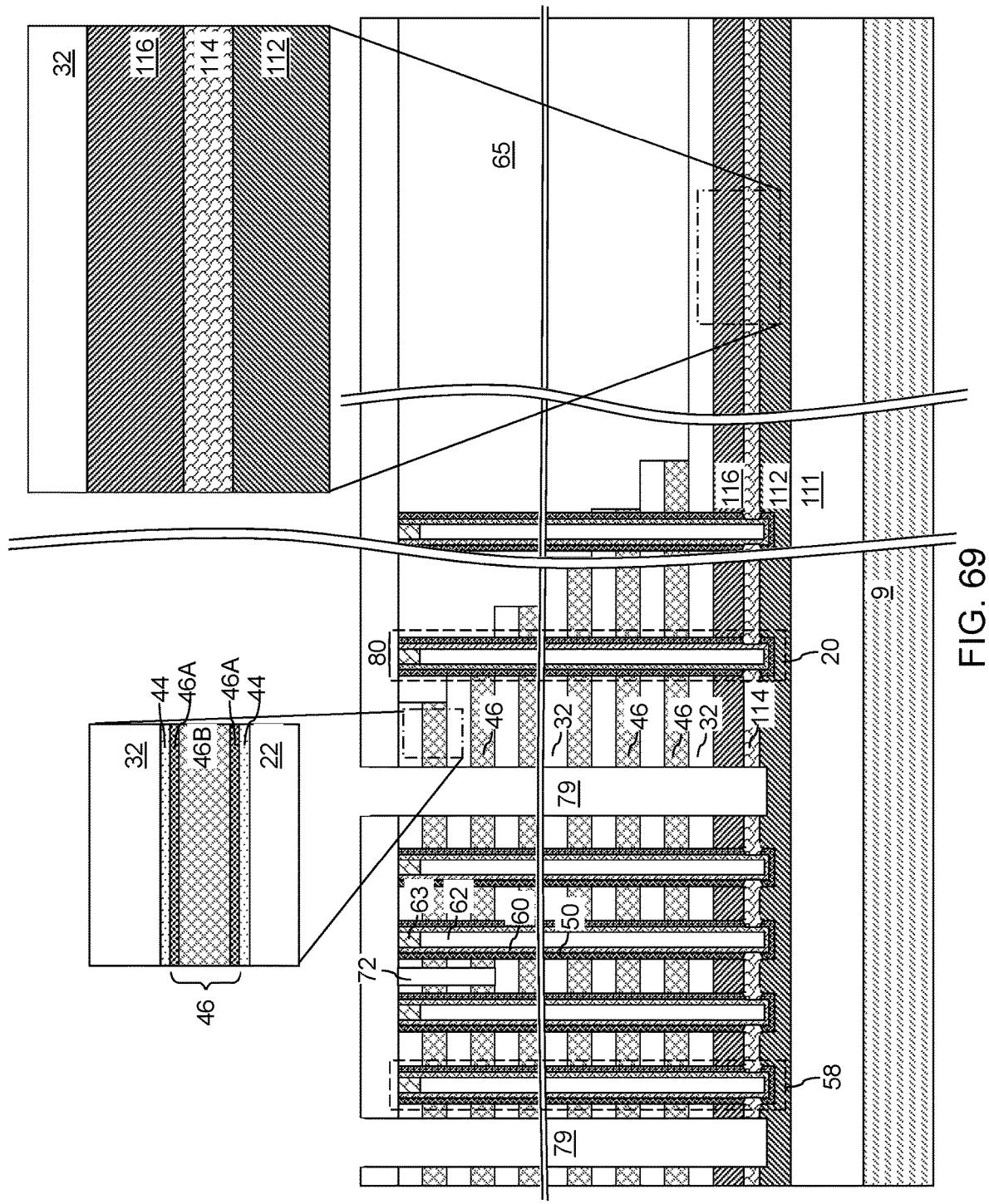
FIG. 69 is a schematic vertical cross-sectional view of the fifth exemplary structure after formation of a source contact layer and replacement of sacrificial material layers with electrically conductive layers according to the fifth embodiment of the present disclosure.

Referring to FIG. 69, the processing steps described with reference to FIGS. 7-9 may be performed to replace the source-level sacrificial layer 104 with a source contact layer 114. Subsequently, the processing steps described with reference to FIGS. 10 and 11 may be performed to replace the sacrificial material layers 42 with electrically conductive layers 46.

In one embodiment, a backside blocking dielectric layer 44 may be deposited within each backside recess 43 prior to formation of the electrically conductive layers 46. In this case, the backside blocking dielectric layer 44 can be deposited directly on cylindrical surface segments of the memory opening fill structures 58, cylindrical surface segments of the support pillar structures 20, and on horizontal surfaces of the insulating layers 32. As discussed above, the backside blocking dielectric layer 44 comprises a dielectric material that functions as a control gate dielectric for control gates/word lines, which comprise the electrically conductive layers 46. In one embodiment, the backside blocking dielectric layer 44 may comprise and/or may consist essentially of a dielectric metal oxide, such as aluminum oxide. The thickness of the backside blocking dielectric layer 44 may be in a range from 1 nm to 12 nm, such as from 2 nm to 6 nm, although lesser and greater thicknesses may also be employed.

The electrically conductive layers 46 can be formed by depositing a metallic barrier liner 46A and a metallic fill material layer 46B within each of the backside recesses 43. The metallic barrier liner 46A comprises a metallic barrier material such as a conductive metallic nitride. For example, the metallic barrier liner 46A may comprise and/or may consist essentially of Ti, Ta, TiN, TaN, WN, or MoN. The metallic barrier liner 46A may be deposited by a conformal deposition process such as a chemical vapor deposition process. The thickness of the metallic barrier liner 46A may be in a range from 1 nm to 6 nm, although lesser and greater thicknesses may also be employed.

The metallic fill material layer 46B comprises, and/or consists essentially of, a metal such as W, Ti, Ta, Co, Ru, Mo, Cu, etc. The metallic fill material layer 46B may be formed by a conformal deposition process such as a chemical vapor deposition process. As discussed above, excess portions of at least one conductive material that is deposited to form the electrically conductive layers 46 can be removed from inside the through-stack trenches 79 and from above the contact-level dielectric layer 80 by an etch back process. Each electrically conductive layer 46 comprises a respective metallic barrier liner 46A and a respective metallic fill material layer 46B.

Figure 70:
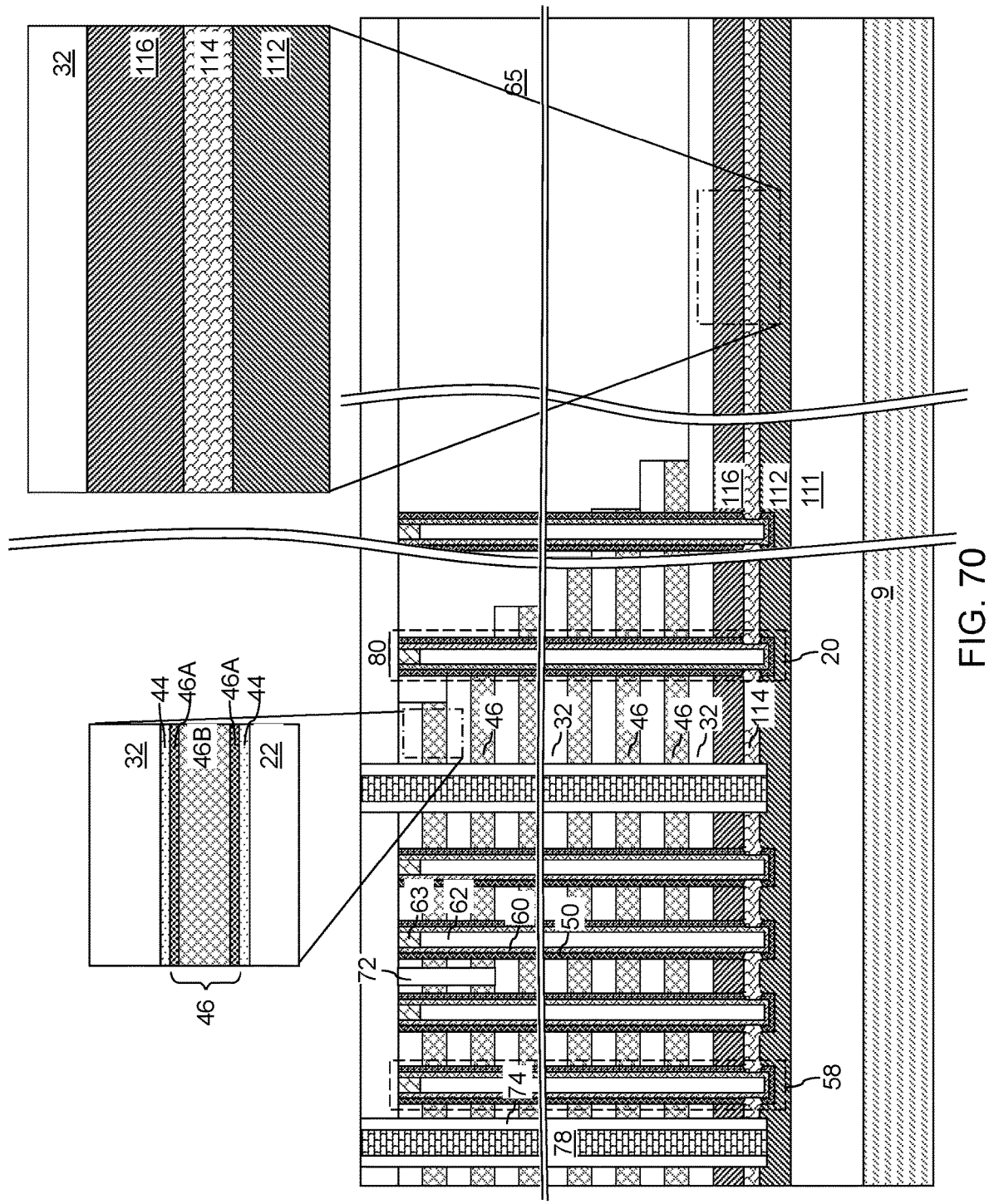
FIG. 70 is a schematic vertical cross-sectional view of the fifth exemplary structure after formation of through-stack trench fill structures according to the fifth embodiment of the present disclosure.

Referring to FIG. 70, processing steps described with reference to FIGS. 12-15 can be performed to form through-stack trench fill structures (74, 78) in the through-stack trenches 79.

Figure 71:
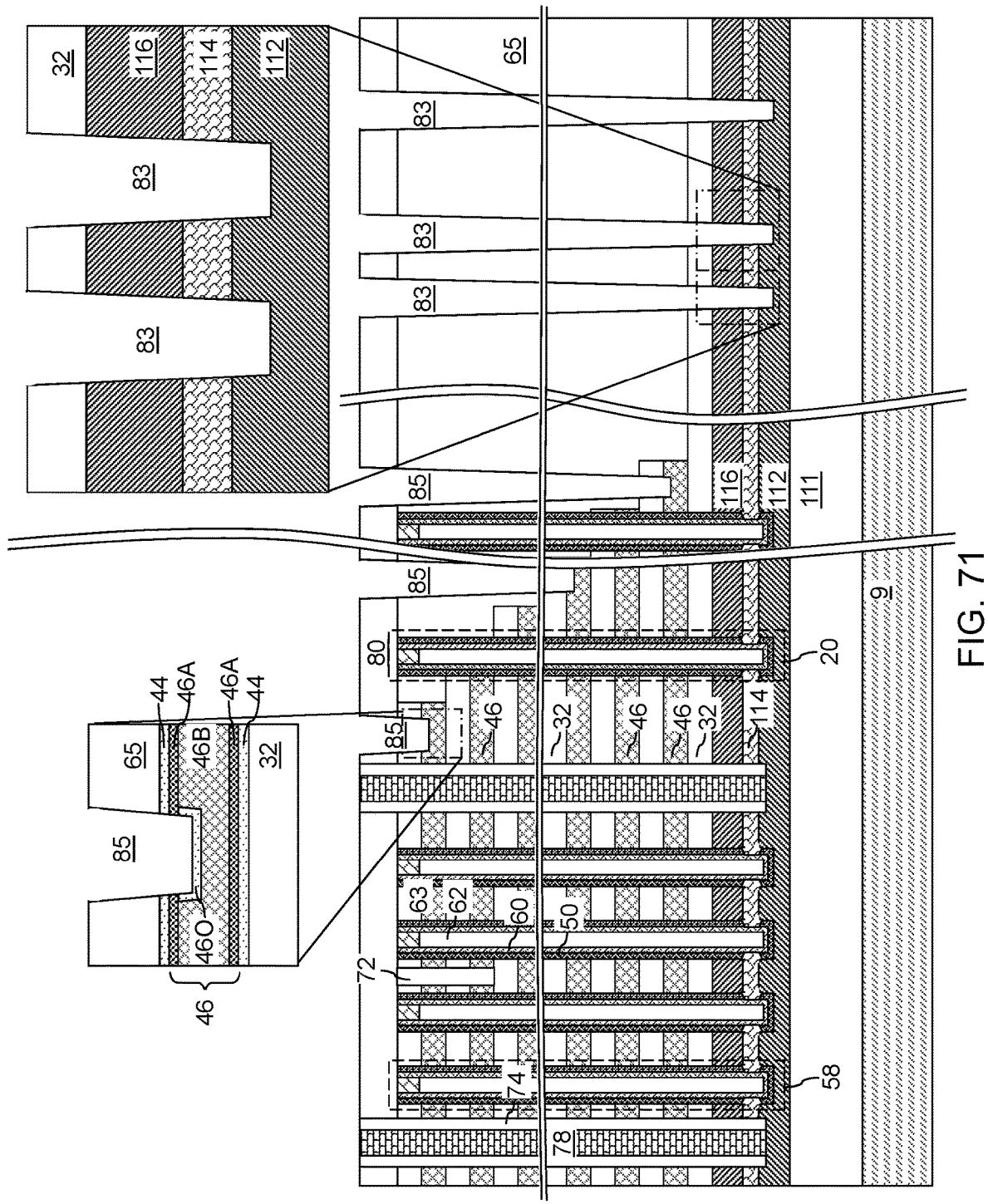
FIG. 71 is a schematic vertical cross-sectional view of the fifth exemplary structure after formation of layer contact via cavities and connection via cavities according to the fifth embodiment of the present disclosure.

Referring to FIG. 71, a first photoresist layer (not shown) can be applied over the contact-level dielectric layer 80, and can be lithographically patterned to form openings over the stepped surfaces of the alternating stack (32, 46) in the staircase region. A first anisotropic etch process can be performed to etch through portions of the contact-level dielectric layer 80 and the stepped dielectric material portion 65 that underlie the openings in the first photoresist layer. The chemistry of the first anisotropic etch process can be selected such that the first anisotropic etch process etches the materials of the contact-level dielectric layer 80, the stepped dielectric material portion 65, and the backside blocking dielectric layers 44 selective to the metallic materials of the metallic barrier liners 46A and the metallic fill material layers 46B. In other words, the electrically conductive layers 46 function as etch stop layers for the first anisotropic etch process. Layer contact via cavities 85 are formed underneath the openings in the first photoresist layer. Each layer contact via cavity 85 vertically extends from the top surface of the contact-level dielectric layer 80 into a respective electrically conductive layer 46.

In one embodiment, one, a plurality or each of the layer contact via cavities 85 may extend into a respective electrically conductive layer 46 such that a recessed top surface of the respective electrically conductive layer 46 is vertically recessed relative to the topmost surface of the respective electrically conductive layer 46. The vertical recess distance of the recessed top surface may be in a range from 0.1% to 90% of the thickness of the respective electrically conductive layer 46. In some embodiments, a metal oxide surface layer 460 may be formed on the recessed surfaces of the electrically conductive layers 46 underneath the layer contact via cavities 85. The metal oxide surface layer 460 may comprise an oxide of the metal within the metallic fill material layer 46B. For example, if the metallic fill material layer 46B comprises tungsten, then the metal oxide surface layer 460 may comprise tungsten oxide. The first photoresist layer can be removed, for example, by ashing.

Connection via cavities 83 may be formed through the stepped dielectric material portion 65, a bottommost insulating layer 32, and at least some of the source-level material layers (112, 114, 116). The connection via cavities 83 may be formed at the same time as the layer contact via cavities 85 using the first anisotropic etch process and the patterned first photoresist layer as a mask.

Alternatively, a second photoresist layer (not shown) can be applied over the contact-level dielectric layer 80, and can be lithographically patterned to form openings over an area in which the electrically conductive layers 46 and the through-stack trench fill structures (74, 78) are not present. A second anisotropic etch process can be performed to etch through portions of the contact-level dielectric layer 80, the stepped dielectric material portion 65, a bottommost insulating layer 32, and source-level material layers (112, 114, 116) that are not masked by the second photoresist layer. Connection via cavities 83 can be formed underneath the openings in the second photoresist layer. In one embodiment, the connection via cavities 83 may vertically extend through the second source-level semiconductor layer 116 and the source contact layer 114 and into an upper portion of the first source-level semiconductor layer 112. The second photoresist layer can be removed, for example, by ashing.

Generally, contact via cavities, such as the layer contact via cavities 85, can be formed through the dielectric material portion 65 on a respective one of the electrically conductive layers 46. A connection via cavity 83 can be formed through the contact-level dielectric layer 80 and the dielectric material portion 65 into the at least one semiconductor material layer (112, 114, 116).

Figure 72B:
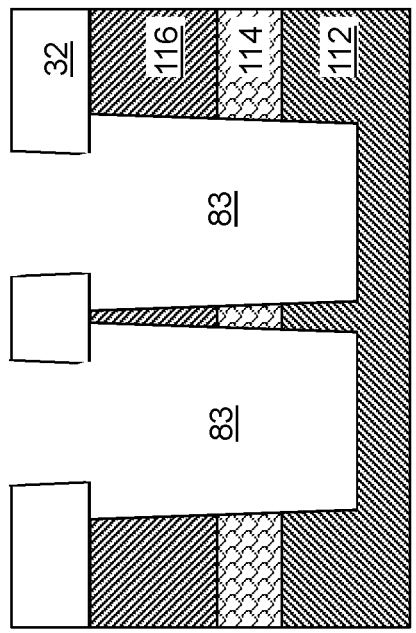
FIG. 72B is a schematic vertical cross-sectional view of bottom regions of connection via cavities during an isotropic etch process that laterally expands bottom regions of the connection via cavities according to the fifth embodiment of the present disclosure.
Figure 72A:
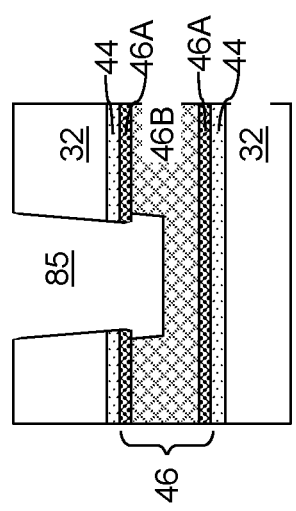
FIG. 72A is a schematic vertical cross-sectional view of a bottom region of a layer contact via cavity after removal of a metal oxide surface layer according to the fifth embodiment of the present disclosure.

Referring to FIGS. 72A and 72B, a surface clean process, such as a wet clean process, can be performed to remove the metal oxide surface layer 460 and to recess the semiconductor materials of the source-level material layers (112, 114, 116) without etching the metallic materials of the electrically conductive layers 46 or the dielectric material of the insulating layers 32. For example, a wet etch process employing hot trimethyl-2 hydroxyethyl ammonium hydroxide ("hot TMY") may be performed to selectively remove the metal oxide surface layer 460 (e.g., a tungsten oxide layer) and to selectively etch proximal portions of the materials of the source-level material layers (112, 114, 116) at the bottom of each of the connection via cavities 83. The isotropic etch process expands a bottom portion of each of the connection via cavities 83 below a horizontal plane including an interface between the alternating stack (32, 46) and the source-level material layers (112, 114, 116).

Figure 73B:
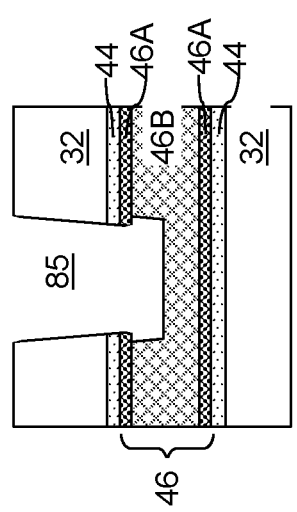
FIG. 73B is a schematic vertical cross-sectional view of bottom regions of connection via cavities after the isotropic etch process according to the fifth embodiment of the present disclosure.
Figure 73A:
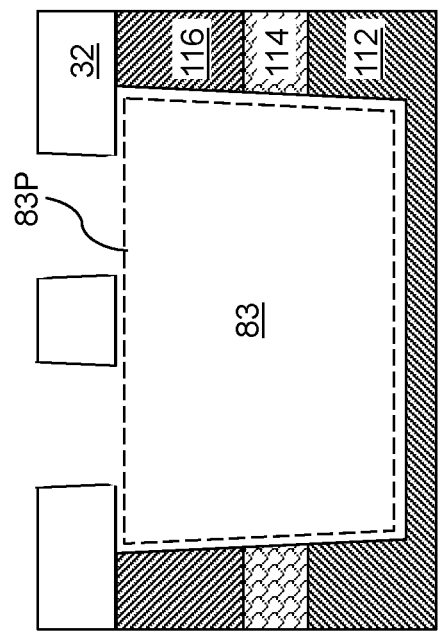
FIG. 73A is a schematic vertical cross-sectional view of a bottom region of a layer contact via cavity after the isotropic etch process according to the fifth embodiment of the present disclosure.

Referring to FIGS. 73A and 73B, the isotropic etch process can be continued until neighboring pairs of connection via cavities 83 merge as the bottom portions of the connection via cavities 83 expand below the horizontal plane including the interface between the alternating stack (32, 46) and the source-level material layers (112, 114, 116).

Each merged portion of the connection via cavities 83 located below the horizontal plane including the interface between the alternating stack (32, 46) and the source-level material layers (112, 114, 116) may have a general shape of a pad, and is herein referred to as a pad cavity 83P. Thus, multiple connection via cavities 83 may be interconnected with each other through a common pad cavity 83P.

Generally, a pad cavity 83P can be formed by recessing portions of the at least one semiconductor material layer (112, 114, 116) around bottom regions of two or more connection via cavities 83. A continuous void comprising two or more connection via cavities 83 and the pad cavity 83P is formed. In one embodiment, a top portion of a pad cavity 83P may be vertically bounded by a first horizontal plane located at an interface between the alternating stack (32, 46) and the at least one semiconductor material layer (112, 114, 116).

Figure 74B:
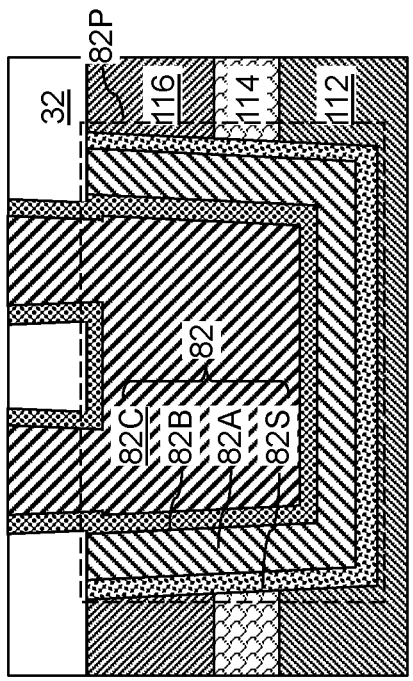
FIG. 74B is a schematic vertical cross-sectional view of bottom regions of connection via cavities after formation of a metal portion according to the fifth embodiment of the present disclosure.
Figure 74A:
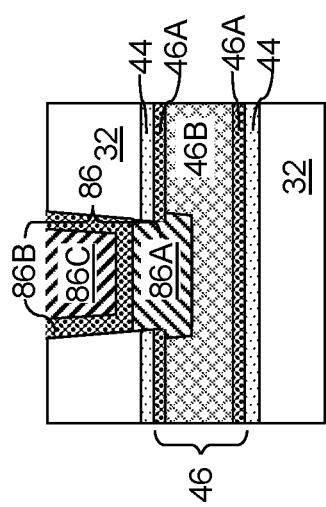
FIG. 74A is a schematic vertical cross-sectional view of a bottom region of a layer contact via cavity after formation of a metal portion according to the fifth embodiment of the present disclosure.

Referring to FIGS. 74A and 74B, a selective metal deposition process can be performed to grow metal portions from physically exposed metallic surfaces or physically exposed semiconductor surfaces while suppressing growth of any metal from physically exposed dielectric surfaces. Such a selective metal deposition process may comprise a CVD or ALD process that uses a metal precursor gas that nucleates on and forms metal deposits on metallic surfaces and semiconductor surfaces without growing the metal on dielectric surfaces. Such metal precursor gases include but are not limited to tungsten hexafluoride in a selective CVD process, or alternating ruthenium oxide deposition and hydrogen reduction steps in a selective ALD process. Other and metal precursor gases may be employed provided that growth of a metal can be suppressed on dielectric surfaces, such as the surfaces of the insulating layers 32.

A metal portion can be formed at a base region of each layer contact via cavity 85 and at a peripheral region of each pad cavity 83P. Each metal portion that is formed at a base region of a layer contact via cavity 85 is herein referred to as a first base metal portion 86A. Each metal portion that is formed at a peripheral region of each pad cavity 83P is herein referred to as a second base metal portion 82A. Each first base metal portion 86A grows from a physically exposed surface of a respective electrically conductive layer 46 at a base region of a respective layer contact via cavity 85 during the selective metal deposition process. Each second base metal portion 82A grows from a physically exposed surface of the source-level material layers (112, 114, 116) at a peripheral region of a respective pad cavity 83P during the selective metal deposition process. In one embodiment, the entirety of each base metal portion 82A may be formed within a volume of a respective pad cavity 83P.

In some embodiments in which the second base metal portions 82A comprise and/or consists essentially of a metal that forms a metal-semiconductor alloy such as metal silicide, a surface metal-semiconductor compound layer (e.g., metal silicide layer) 82S may be formed between the at least one semiconductor material layer (112, 114, 116) and each of the second base metal portions 82A by reacting a surface portion of the at least one semiconductor material layer (112, 114, 116) and a surface portion of the second base metal portion 82A during or after the selective metal deposition process. The thickness of the surface metal-semiconductor compound layers 82S may be in a range from 1 nm to 20 nm, such as from 2 nm to 10 nm, although lesser and greater thicknesses may also be employed. In an illustrative example, the first base metal portion 86A and the second base metal portion 82A both comprise tungsten and the surface metal-semiconductor compound layer 82S comprises tungsten silicide.

Generally, a base metallic material can be selectively deposited on physically exposed surfaces of the electrically conductive layers 46 and on physically exposed surfaces of the at least one semiconductor material of the source-level material layers (112, 114, 116). A first base metal portion 86A is formed on each physically exposed surface of each electrically conductive layers 46, and a second base metal portion 82A is formed on each physically exposed surface of the at least one semiconductor material of the at least one semiconductor material layer (112, 114, 116) of the source-level material layers (112, 114, 116). A surface metal silicide 82S may be formed between the source-level material layers (112, 114, 116) and the second base metal portion 82A.

Figure 75:
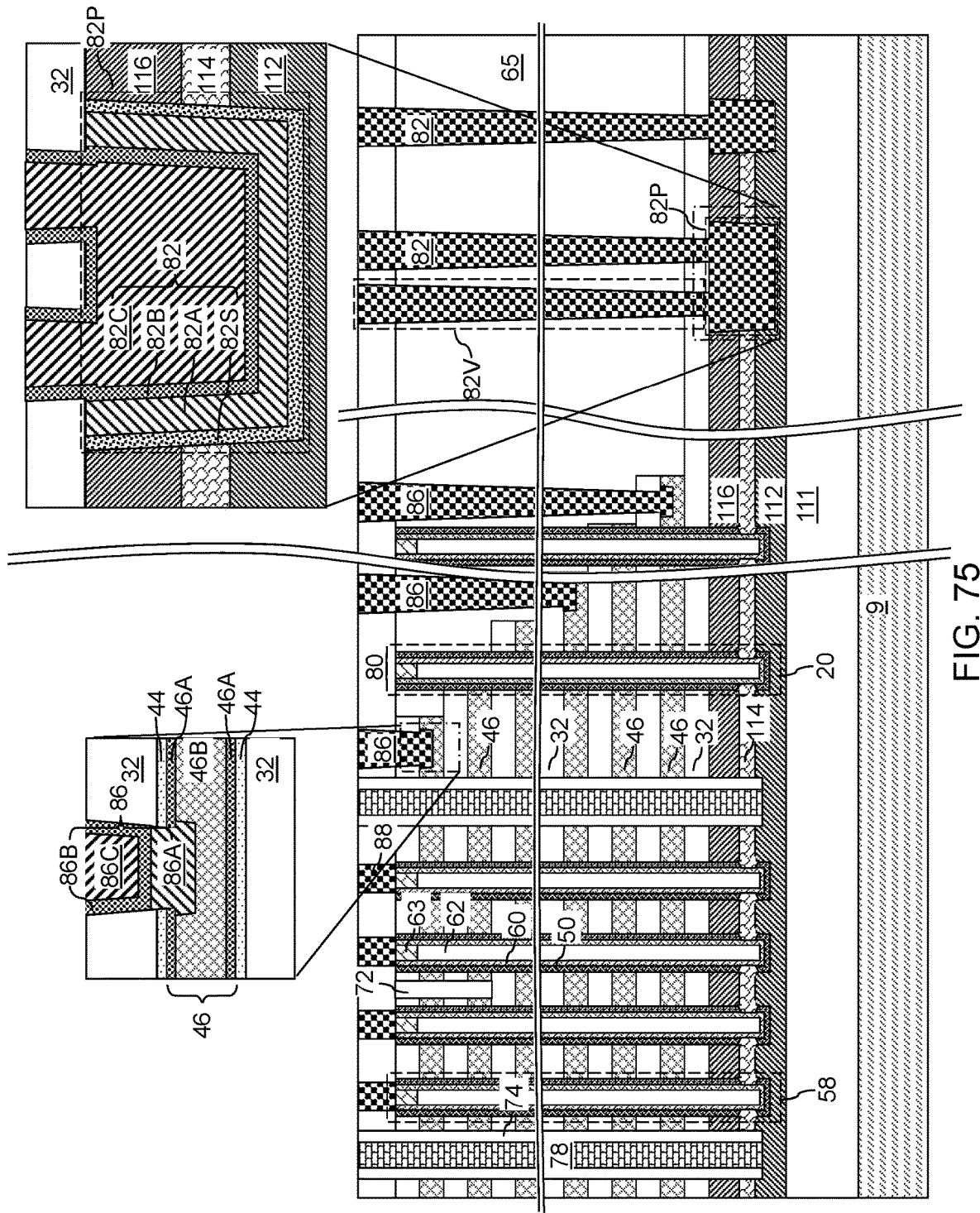
FIG. 75 is a schematic vertical cross-sectional view of the fifth exemplary structure after formation of layer contact via structures and connection via structures according to the fifth embodiment of the present disclosure.

Referring to FIG. 75, drain contact via cavities can be formed over the drain regions 63 in the memory opening fill structures 58. For example, a photoresist layer (not shown) can be applied over the contact-level dielectric layer 80, and can be lithographically patterned to form openings over the memory opening fill structures 58. Each opening in the photoresist layer may have an areal overlap within a top surface of a drain region 63 in a respective underlying memory opening fill structure 58. The layer contact via cavities 85 and the connection via cavities 83 may be covered with the photoresist layer. An anisotropic etch process can be performed to etch through portions of the contact-level dielectric layer 80 that are not masked by the first photoresist layer. Drain contact via cavities can be formed underneath the openings in the first photoresist layer. A top surface of a drain region 63 may be physically exposed at the bottom of each drain contact via cavity. The photoresist layer can be removed, for example, by ashing.

A metallic barrier material can be non-selectively deposited on the physically exposed surfaces of the first base metal portions 86A, the second base metal portions 82A, and the drain regions 63, and all other physically exposed surfaces of the drain contact via cavities, the layer contact via cavities 85, and the connection via cavities 83. A first metallic barrier liner 86B can be formed on each first base metal portion 86A, a second metallic barrier liner 82B can be formed on each second base metal portion 82A, and a third metallic barrier liner (not expressly shown) can be formed on each drain region 63. The metallic barrier material may be deposited by a conformal deposition process (such as chemical vapor deposition) or a non-conformal deposition process (such as physical vapor deposition). The metallic barrier material may include a metal, such as Ti or Ta and/or a conductive metallic nitride material such as TiN, TaN, WN, or MoN. The thickness of the metallic barrier material may be in a range from 3 nm to 30 nm, such as from 6 nm to 15 nm, although lesser and greater thicknesses may also be employed.

A metallic fill material can be deposited in remaining volumes of the drain cavities, the layer contact via cavities 85, and the connection via cavities 83. The metallic fill material may comprise a metal such as W, Ti, Ta, Ru, Co, Mo, Cu, or a combination thereof. The metallic fill material may be deposited by a conformal deposition method such as chemical vapor deposition. Excess portions of the metallic fill material and the metallic barrier material can be removed from above the horizontal plane including the top surface of the contact-level dielectric layer 80 by a planarization process. For example, a chemical mechanical polishing (CMP) process may be employed to effect the planarization process. Each remaining portion of the metallic fill material that fills a respective layer contact via cavity 85 constitutes a first metallic fill material portion 86C. Each remaining portion of the metallic fill material that fills a respective connection via cavity 83 constitutes a second metallic fill material portion 82C. Each remaining portion of the metallic fill material portion that fills a respective drain cavity constitutes a third metallic fill material portion (not expressly shown).

Each contiguous combination of a first base metal portion 86A, a first metallic barrier liner 86B, and a first metallic fill material portion 86C constitutes a layer contact via structure (e.g., word line contact via structure) 86. Each contiguous combination of a second base metal portion 82A, an optional surface metal-semiconductor alloy layer 82S, a second metallic barrier liner 82B, and a second metallic fill material portion 82C constitutes an integrated via and pad structure 82. The integrated via and pad structure 82 is formed in a continuous void including a pad cavity 83P and at least one connection via cavity 83. Each continuous combination of a third metallic barrier liner and a third metallic fill material portion that is formed in a respective drain contact via cavity constitutes a drain contact via structure 88.

Generally, the layer contact via structures 86 are contact via structure that contact a respective one of the electrically conductive layers 46. As such, the layer contact via structures 86 vertically extend through the dielectric material portion 65 and contact a respective one of the electrically conductive layers 46. Each integrated via and pad structure 82 comprises at least one conductive via portion 82V vertically extending through the dielectric material portion 65 and contacting a front side of a conductive pad portion 82P. A backside contact pad structure 628B contacts a planar backside surface of the integrated via and pad structure 82 (i.e., the planar backside surface of the pad portion 82P).

In one embodiment, each of the layer contact via structures 86 comprises a first base metal portion 86A in contact with the respective one of the electrically conductive layers 46, a first metallic liner 86B in contact with the first base metal portion 86A, and a first metallic fill material portion 86C that is laterally surrounded by the first metallic liner 86B and vertically spaced from the first base metal portion 86A by a horizontally-extending portion of the first metallic liner 86B.

In one embodiment, each integrated via and pad structure 82 comprises a second base metal portion 82A located entirely within the conductive pad portion 82P, a second metallic liner 82B contacting the second base metal portion 82A, and a second metallic fill material portion 82C laterally surrounded by the second metallic liner 82B.

In one embodiment, the first base metal portions 86A and the second base metal portion 82A have a first material composition (such as a material composition of a first metal, e.g., tungsten); the first metallic liners 86B and the second metallic liner 82B have a second material composition (such as a material composition of a conductive metallic nitride material) and a same thickness; and the first metallic fill material portions and the second metallic fill material portion 82C have a third metallic composition (such as a material composition of a second metal (e.g., tungsten) which may be the same as, or may be different from, the material composition of the first metal).

In one embodiment, one, a plurality or each of the integrated via and pad structure 82 may comprise a respective additional conductive via portion 82V that is physically connected to the conductive pad portion 82P; and the second metallic liner 82B and the second metallic fill material portion 82C continuously extend from the conductive via portion 82V, through a portion of the conductive pad portion 82P, and into the respective additional conductive via portion 82V.

In one embodiment, an end periphery of the conductive via portion 82V is adjoined to a horizontal top surface of the conductive pad portion 82P; the conductive pad portion 82P comprises a segment of the second metallic liner 82B and a segment of the second metallic fill material portion 82C; a first area of the horizontal top surface of the conductive pad portion 82P comprises a surface of the second metallic liner 82B; and a second area of the horizontal top surface of the conductive pad portion 82P comprises a surface of the second base metal portion 82A.

In one embodiment, each of the electrically conductive layers 46 comprises a metallic barrier liner 46A and a metallic fill material layer 46B; and the metallic barrier liner 46A and the metallic fill material layer 46B are in direct contact with a respective one of the first base metal portions 86A. In one embodiment, each of the electrically conductive layers 46 is vertically spaced from neighboring insulating layers 32 of the insulating layers 32 by backside blocking dielectric layers 44 comprising a dielectric material; and each of the first base metal portions 86A is in direct contact with a respective surface segment of the backside blocking dielectric layers 44. In one embodiment, each of the first base metal portions 86A is in direct contact with a respective one of the insulating layers 32 at a respective cylindrical contact area.

In one embodiment, a vertical extent of the second metallic liner 82B is greater than a vertical extent of the conductive via portion 82V, and is less than a sum of a vertical extent of the conductive pad portion 82P and the vertical extent of the conductive via portion 82V.

In one embodiment, at least one semiconductor material layer (112, 114, 116) may contact the alternating stack (32, 46) at an interface located within a first horizontal plane. In one embodiment, the conductive pad portion 82P comprises a horizontal surface located within the first horizontal plane; and the conductive via portion 82V is adjoined to the conductive pad portion 82P at a periphery located within the first horizontal plane.

In one embodiment, distal end surfaces of the layer contact via structures 86 and a distal end surface of the conductive via portion 82V are located within a second horizontal plane (such as a horizontal plane including a top surface of the contact-level dielectric layer 80) that is more distal from the first horizontal plane than a most distal surface of the alternating stack (32, 46) is from the first horizontal plane.

In one embodiment, the integrated via and pad structure 82 comprises a surface metal-semiconductor compound layer 82S that includes a compound of a metal within the second base metal portion 82A and a semiconductor material within the at least one semiconductor material layer (112, 114, 116).

In one embodiment, each conductive via portion 82V may have a variable horizontal cross-sectional area that increases with a vertical distance from the conductive pad portion 82P.

Figure 76:
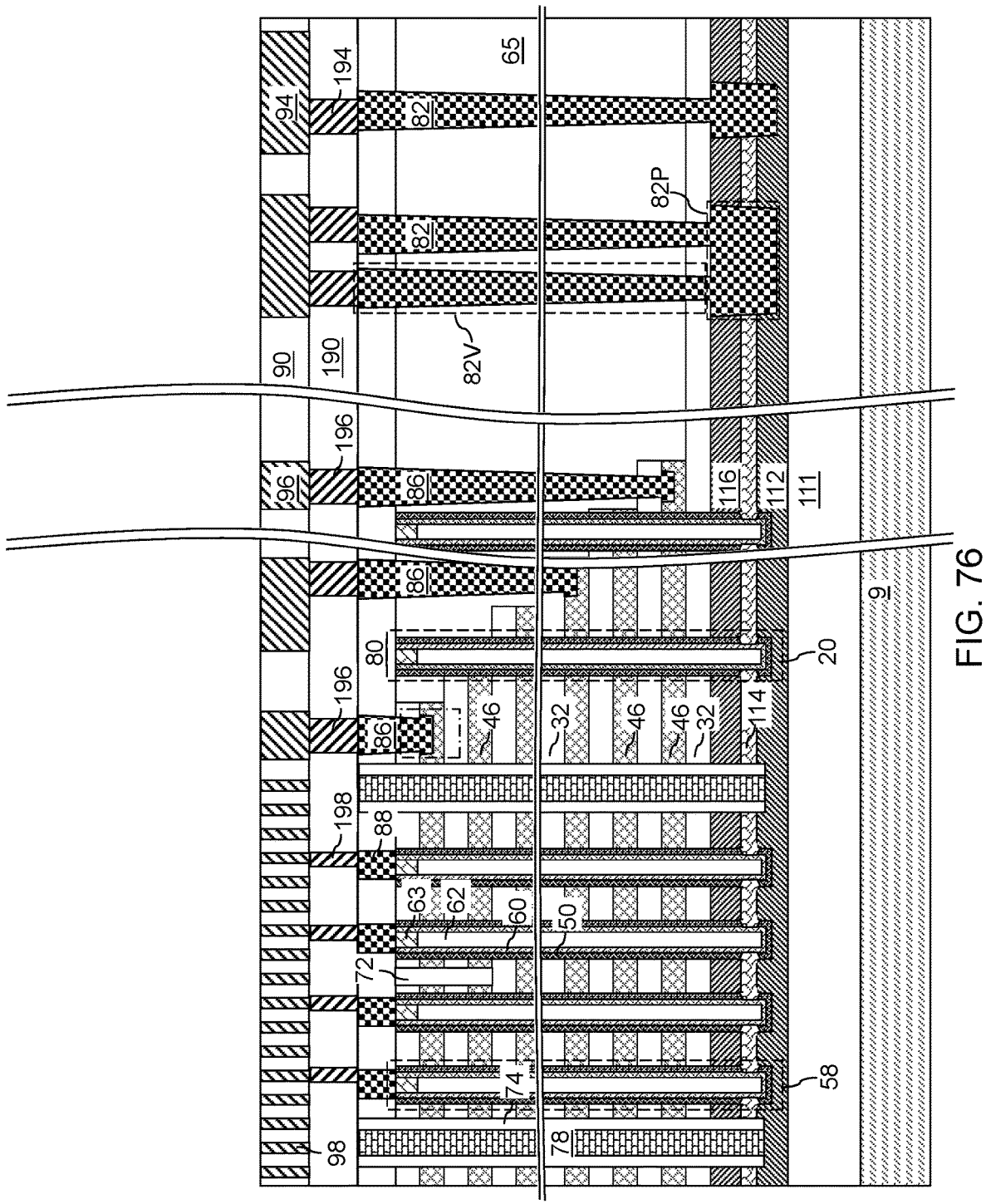
FIG. 76 is a schematic vertical cross-sectional view of the fifth exemplary structure after formation of additional connection via structures and bit-line-level metal lines according to the fifth embodiment of the present disclosure.

Referring to FIG. 76, a subset of the processing steps described with reference to FIGS. 16A and 16B may be performed to form connection via structures (198, 196, 194) embedded in the via-level dielectric layer 190, and to form metal line structures (98, 96, 94) embedded in the first line-level dielectric layer 90.

Figure 77:
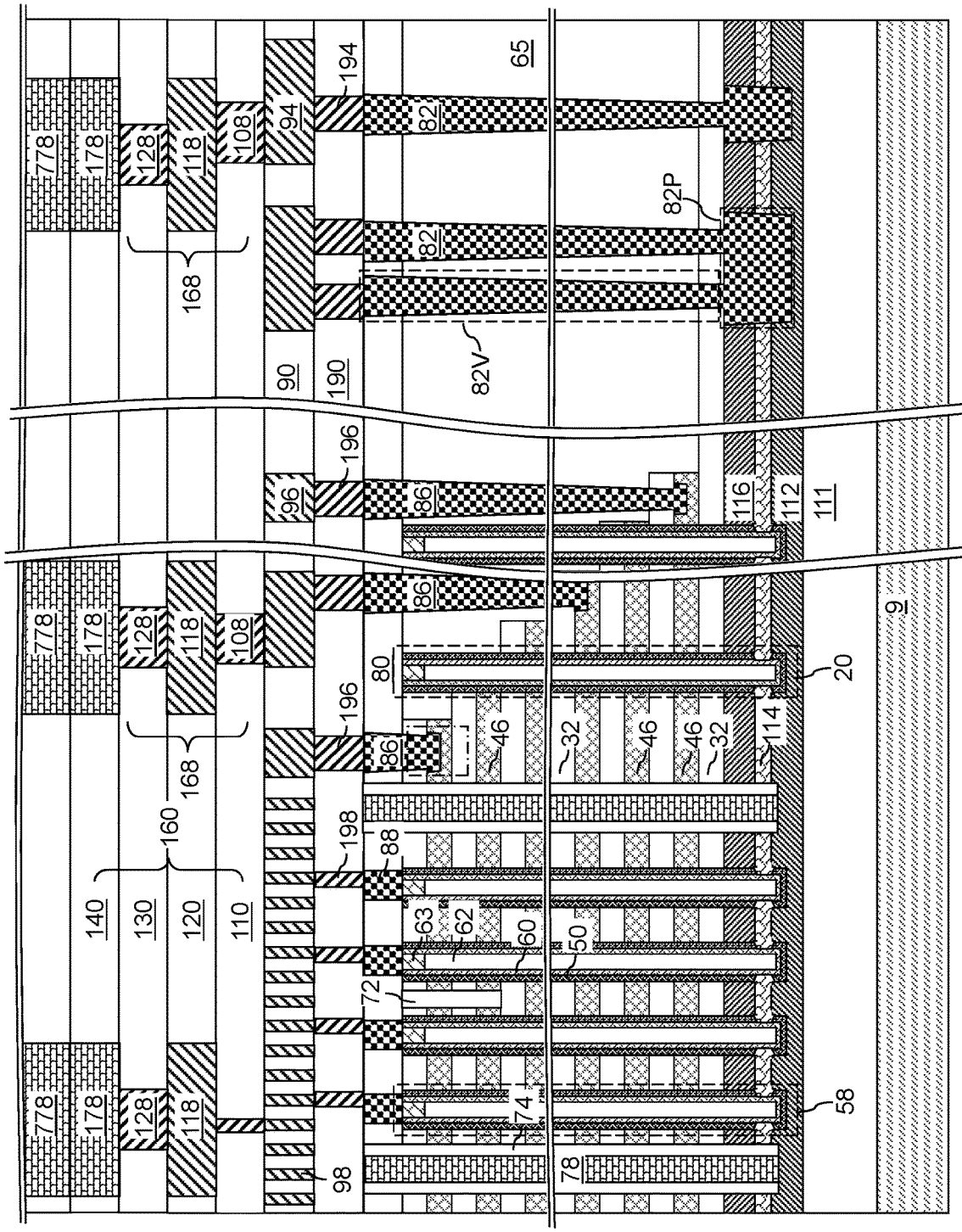
FIG. 77 is a schematic vertical cross-sectional view of the fifth exemplary structure after bonding a logic die to the memory die according to the fifth embodiment of the present disclosure.

Referring to FIG. 77, the processing steps described with reference to FIGS. 17, 18, and 19 can be performed to provide a memory die 900 and a logic die 700, and to bond the memory die 900 and the logic die 700.

Figure 78:
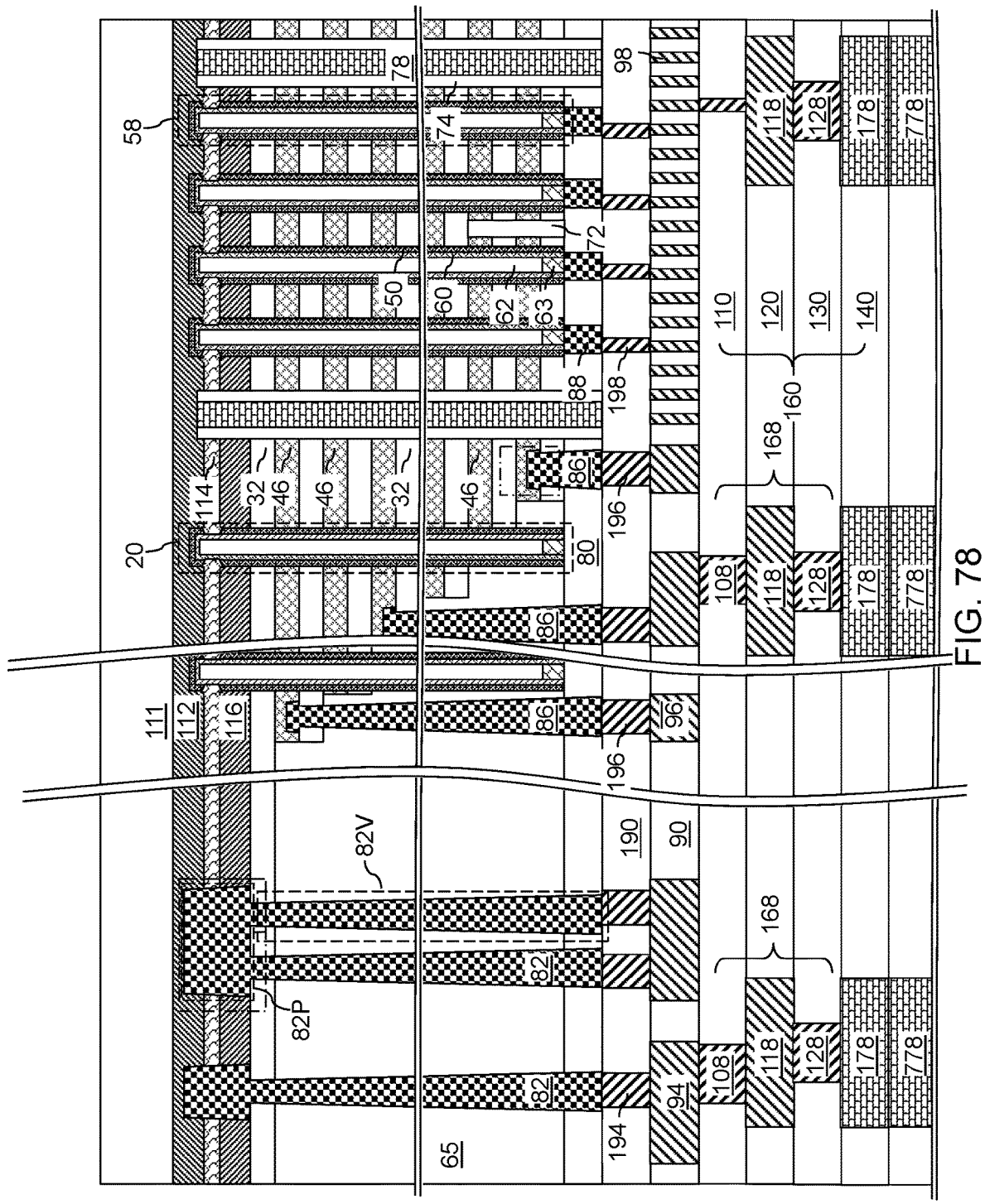
FIG. 78 is a schematic vertical cross-sectional view of the fifth exemplary structure after removal of the carrier substrate according to the fifth embodiment of the present disclosure.

Referring to FIG. 78, the processing steps described with reference to FIG. 20 can be performed to remove the carrier substrate 9 from the bonded assembly of the memory die 900 and the logic die 700.

Figure 79:
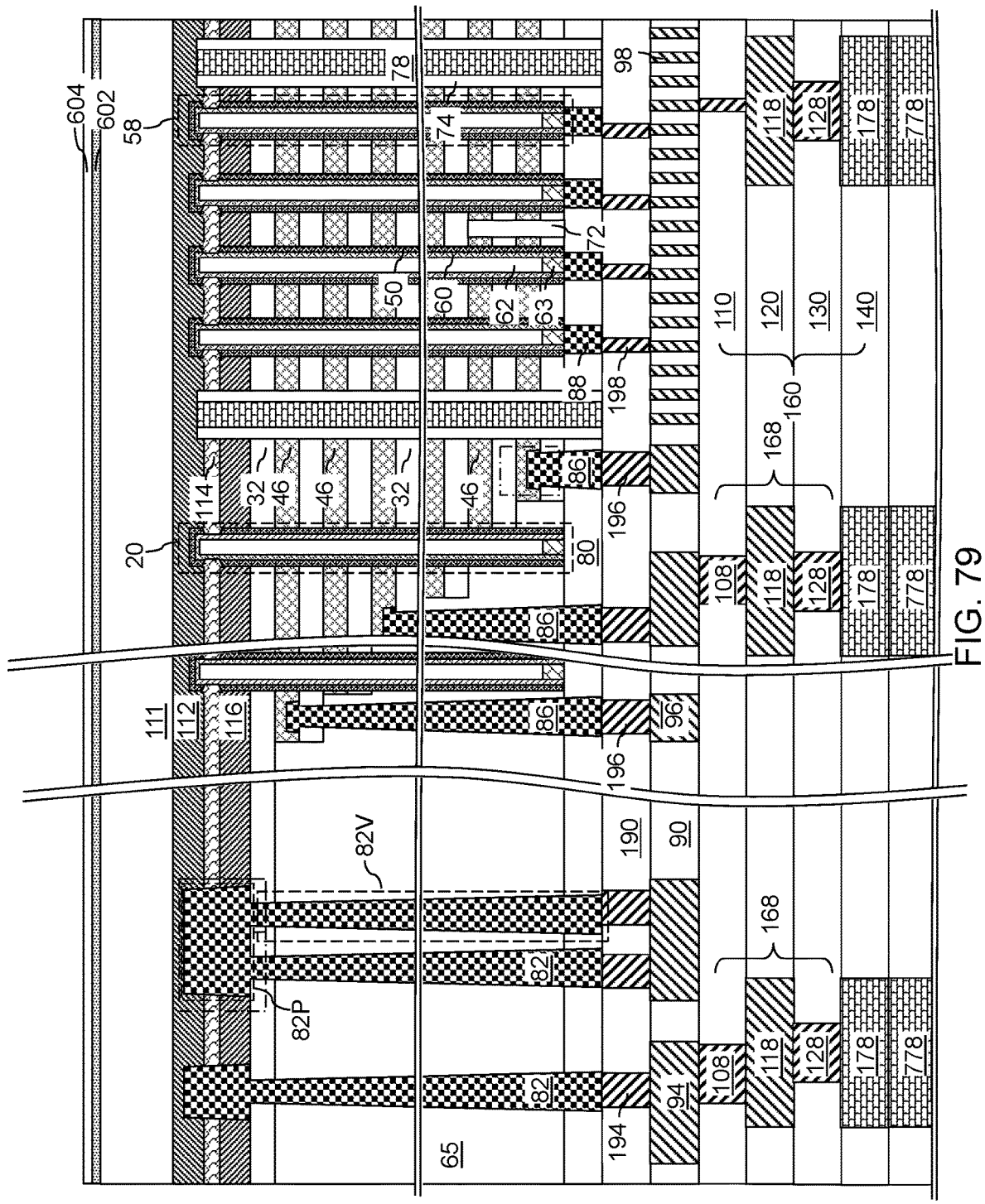
FIG. 79 is a schematic vertical cross-sectional view of the fifth exemplary structure after formation of backside dielectric liners according to the fifth embodiment of the present disclosure.

Referring to FIG. 79, the processing steps described with reference to FIG. 21 can be performed to form backside dielectric liners (602, 604).

Figure 80:
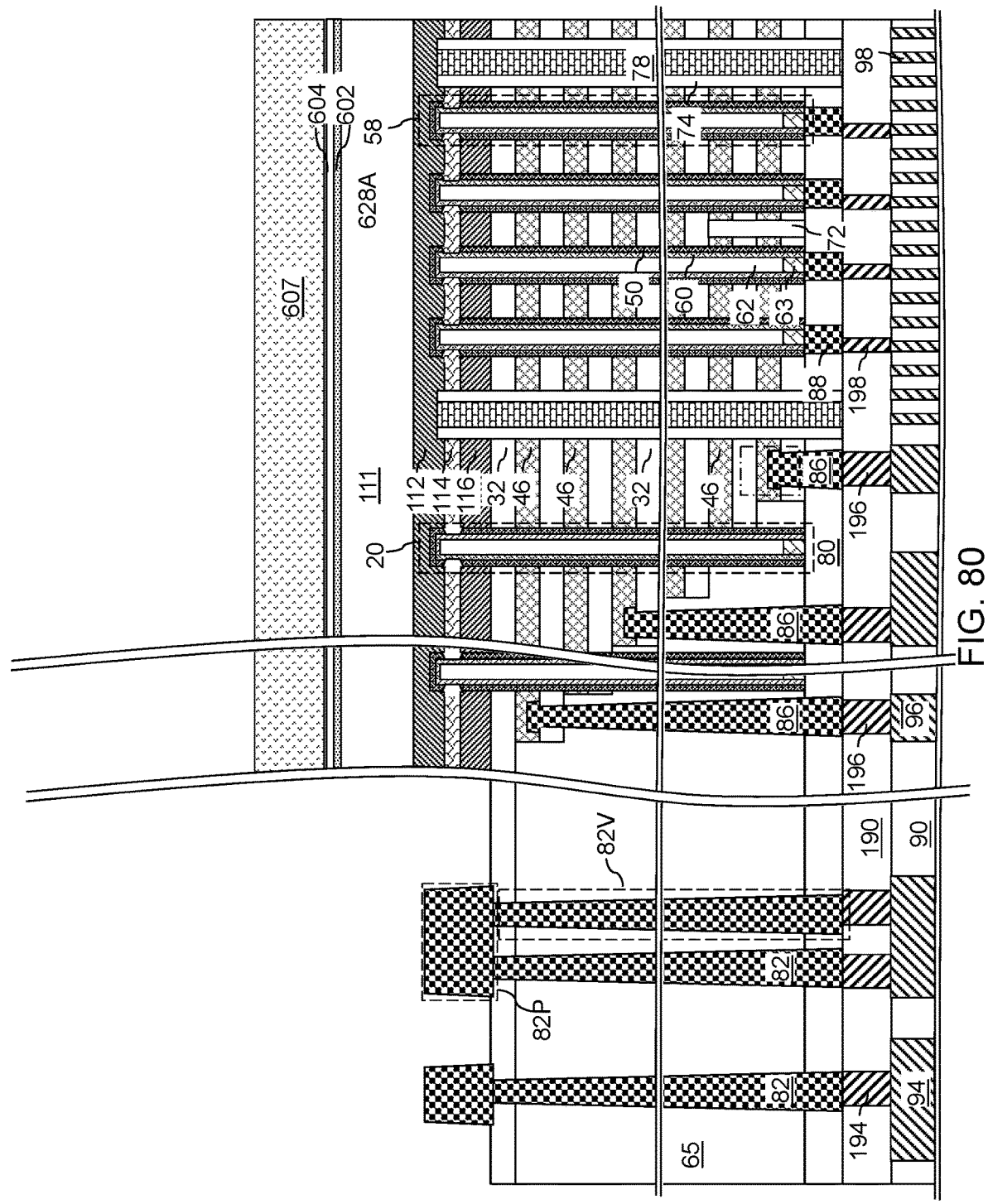
FIG. 80 is a schematic vertical cross-sectional view of the fifth exemplary structure after removal of unmasked portions of the backside dielectric liners, the buffer dielectric layer, and the source-level material layers according to the fifth embodiment of the present disclosure.

Referring to FIG. 80, the patterned photoresist layer 607 is formed over the backside dielectric liners (602, 604). The backside dielectric liners (602, 604), the buffer dielectric layer 111, and the source-level material layers (112, 114, 116) are patterned to remove unmasked portions of the backside dielectric liners (602, 604), the buffer dielectric layer 111, and the source-level material layers (112, 114, 116) so that bottom surfaces of the integrated via and pad structures 82 are physically exposed.

Figure 81:
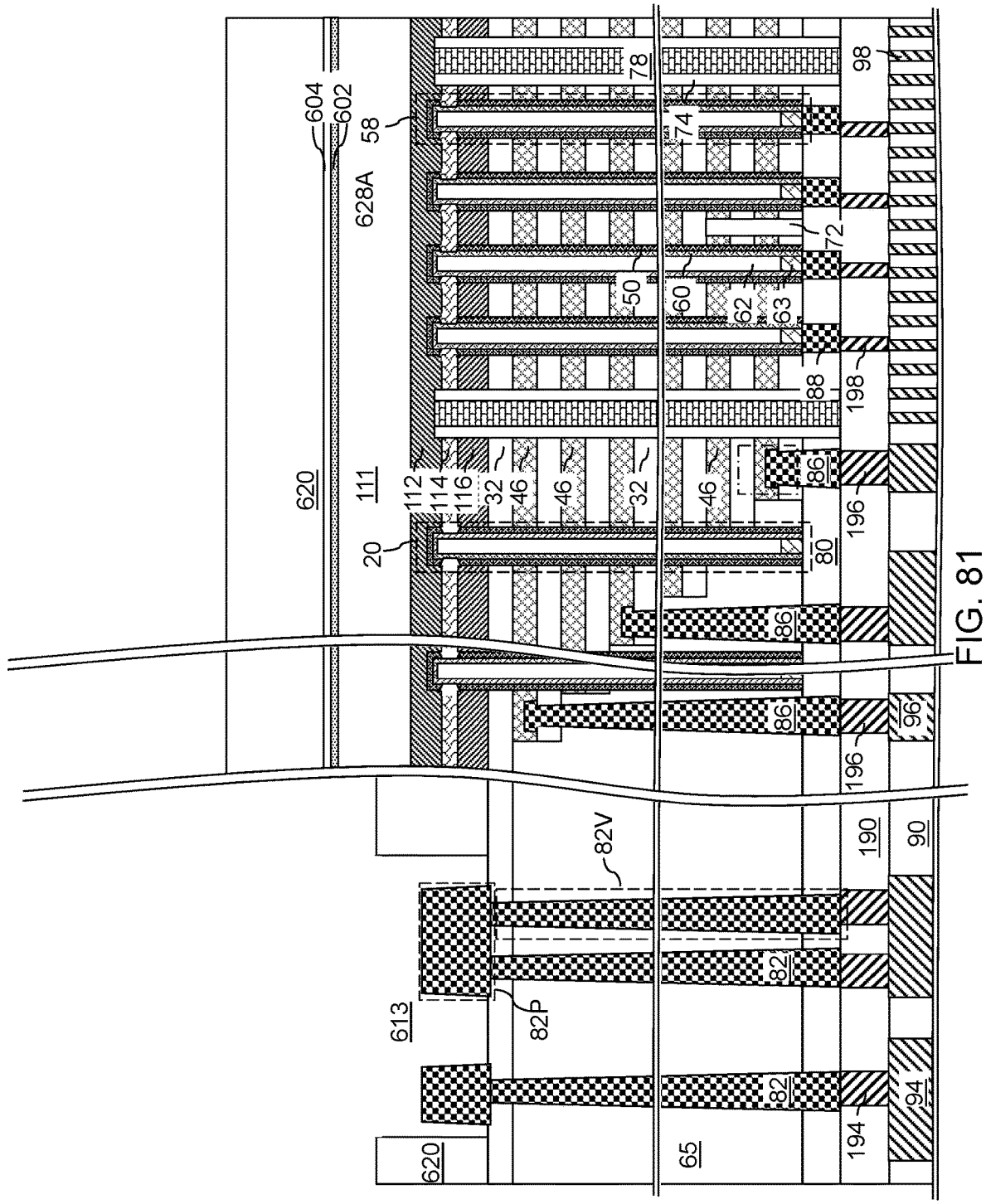
FIG. 81 is a schematic vertical cross-sectional view of the fifth exemplary structure after formation of a backside dielectric layer according to the fifth embodiment of the present disclosure.

Referring to FIG. 81, the backside dielectric material layer 620 is formed over the integrated via and pad structures 82 and over the backside dielectric liners (602, 604). The backside dielectric material layer 620 is then patterned to form a first backside via cavity 613 that extends through a portion of the backside dielectric material layer 620 overlying the integrated via and pad structures 82. At least the bottom surfaces of the integrated via and pad structures 82 (e.g., bottom surfaces and optionally at least one sidewall of the pad portions 82P) are physically exposed is exposed to the first backside via cavity 613. A second backside via cavity 617 may be formed at the same time as the first backside via cavity 613 or during a subsequent step.

Figure 82:
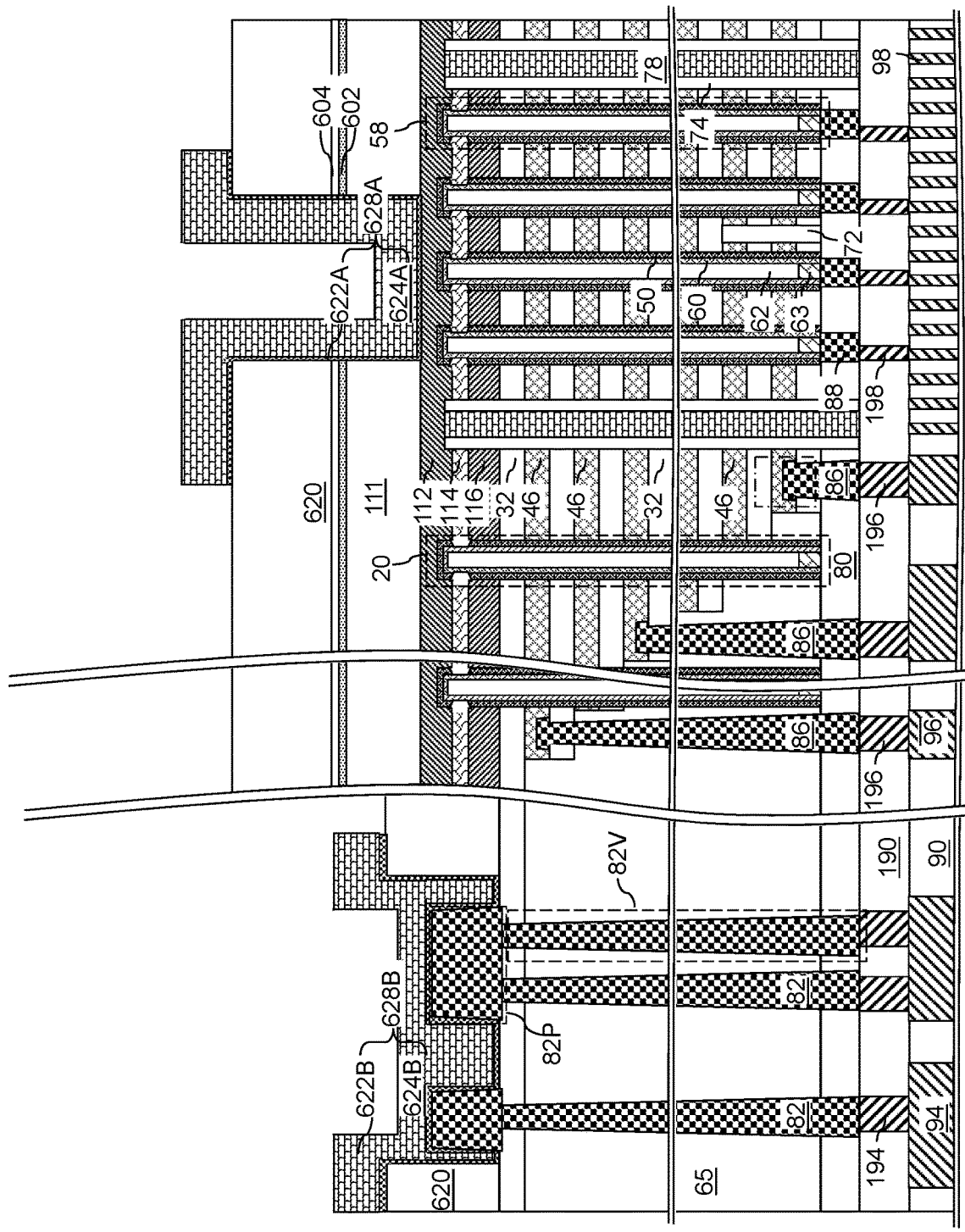
FIG. 82 is a schematic vertical cross-sectional view of the fifth exemplary structure after formation of backside contact pad structures according to the fifth embodiment of the present disclosure.

Referring to FIG. 82, the contact pad structures (628A, 628B) are formed as described above with respect to the first or second embodiments. As in the previously described exemplary structures, the backside contact pad structure 628B can contact the backside horizontal surfaces of the integrated via and pad structures 82 (i.e., the bottom of the pad portions 82P), and can contact at least one sidewall (such as a plurality of sidewalls) of the integrated via and pad structures 82 (i.e., the sidewall(s) of the pad portions 82P). The at least one backside dielectric cover layer (632, 634), a passivation dielectric layer 636, and via cavities (639A, 639B) are then formed as described above with respect to the first or second embodiments.

Figure 83:
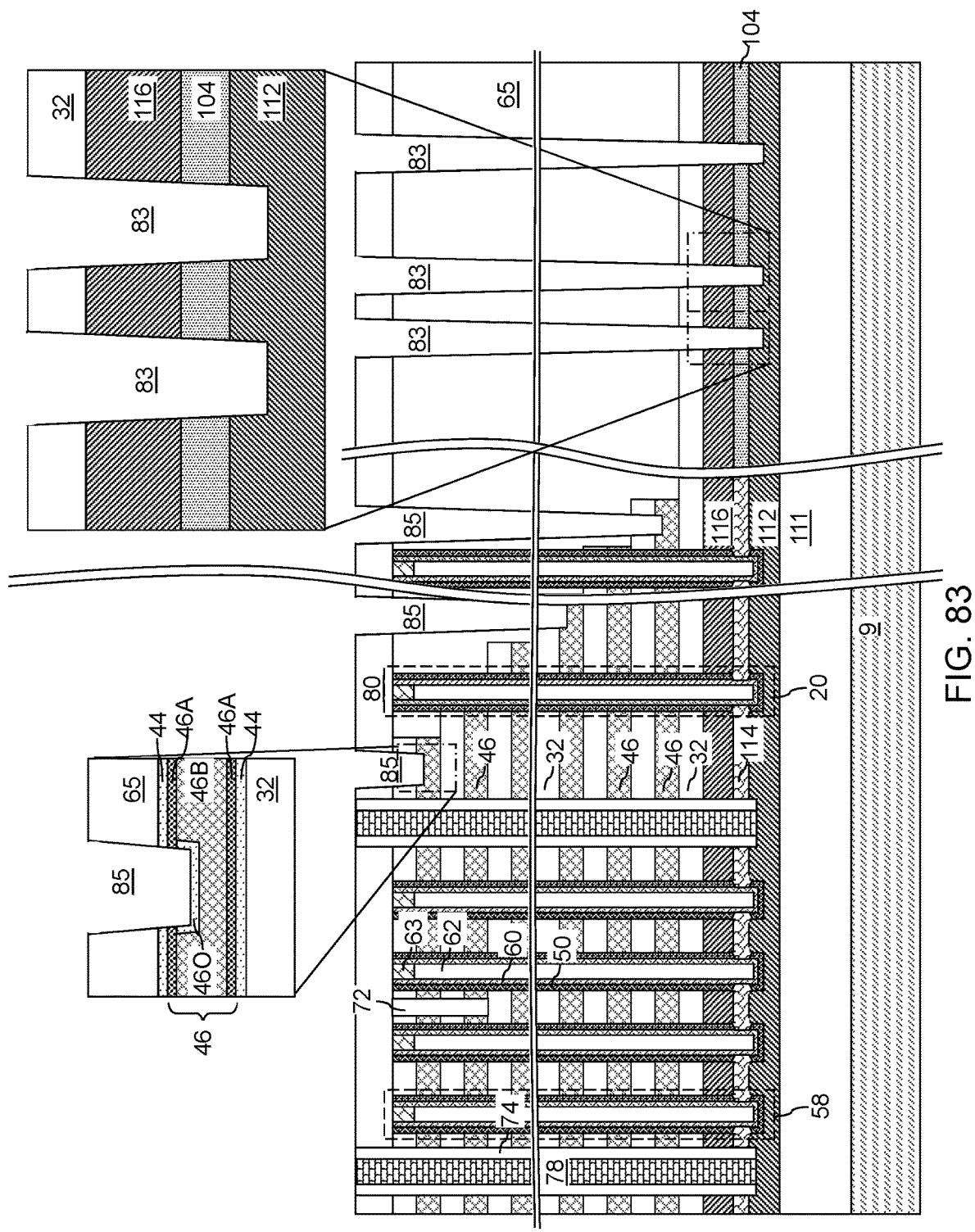
FIG. 83 is a schematic vertical cross-sectional view of a sixth exemplary structure after formation of layer contact via cavities and connection via cavities according to a sixth embodiment of the present disclosure.

Referring to FIG. 83, a sixth exemplary structure according to a sixth embodiment of the present disclosure is illustrated at a processing step that corresponds to the processing step of FIG. 71. The sixth exemplary structure can be derived from the fifth exemplary structure by modifying the pattern of the through-stack trenches 79 such that a portion of the source-level sacrificial layer 104 that is located in a connection via region is not replaced with a source contact layer 114. In this case, the layout of the through-stack trenches 79 can be modified such that the through-stack trenches 79 are laterally spaced from the connection via region by a lateral spacing that is greater than a lateral etch distance of the isotropic etch process that etches the material of the source-level sacrificial layer 104. The lateral extent of the source cavity 109 does not extend into the connection via region. Thus, the lateral extent of the source contact layer 114 does not extend into the connection via region, where the source-level sacrificial layer 104 is still present.

During an anisotropic etch process that etches the connection via cavities 83, the etch chemistries of terminal steps of the anisotropic etch process can be selected such that the anisotropic etch process sequentially etches through the second source-level semiconductor layer 116 and the source-level sacrificial layer 104, and etches an upper portion of the first source-level semiconductor layer 112.

Figure 84B:
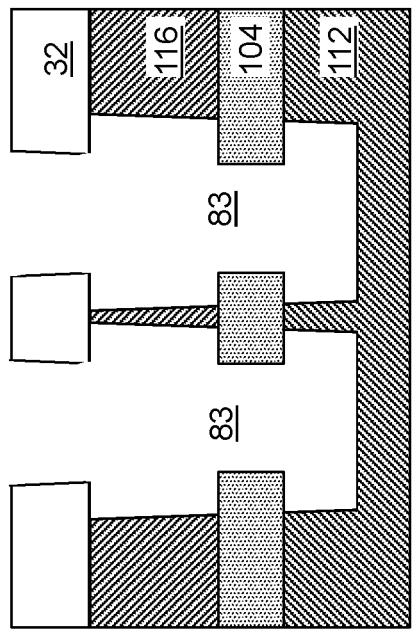
FIG. 84B is a schematic vertical cross-sectional view of bottom regions of connection via cavities during an isotropic etch process that laterally expands bottom regions of the connection via cavities according to the sixth embodiment of the present disclosure.
Figure 84A:
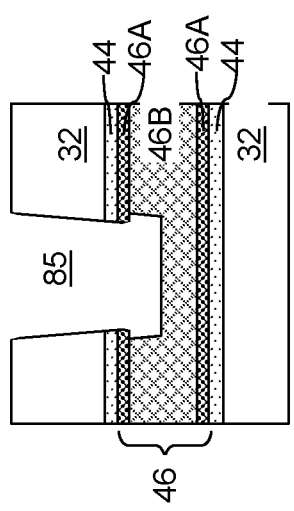
FIG. 84A is a schematic vertical cross-sectional view of a bottom region of a layer contact via cavity after removal of a metal oxide surface layer according to the sixth embodiment of the present disclosure.

Referring to FIGS. 84A and 84B, the processing steps described with reference to FIGS. 72A and 72B can be performed to recess the semiconductor materials of the first source-level semiconductor layer 112 and the second source-level semiconductor layer 116 without etching the metallic materials of the electrically conductive layers 46, the dielectric material of the insulating layers 32, or the material of the source-level sacrificial layer 104. In one embodiment, the source-level sacrificial layer 104 comprises silicon nitride, a wet etch process using TMY may be performed to selectively etch proximal portions of the materials of the first source-level semiconductor layer 112 and the second source-level semiconductor layer 116 at the bottom of each of the connection via cavities 83. The isotropic etch process expands a bottom portion of each of the connection via cavities 83 below a horizontal plane including an interface between the alternating stack (32, 46) and the source-level material layers (112, 114, 116).

Figure 85B:
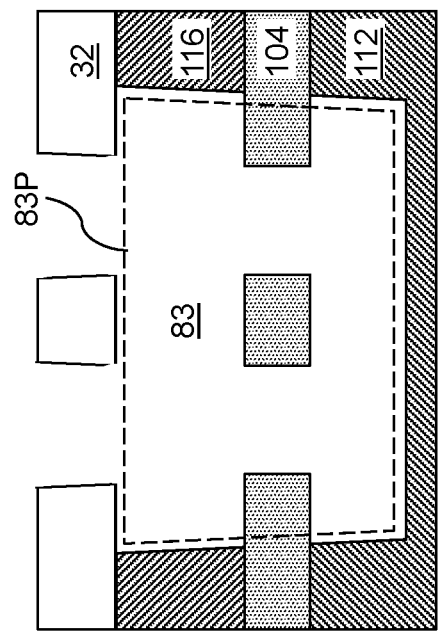
FIG. 85B is a schematic vertical cross-sectional view of bottom regions of connection via cavities after the isotropic etch process according to the sixth embodiment of the present disclosure.
Figure 85A:
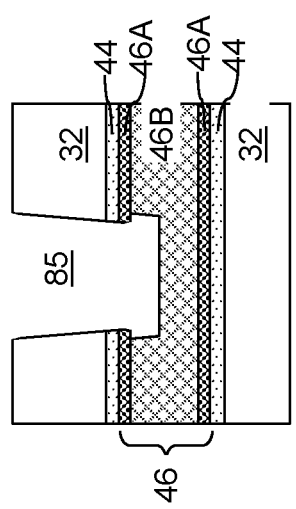
FIG. 85A is a schematic vertical cross-sectional view of a bottom region of a layer contact via cavity after the isotropic etch process according to the sixth embodiment of the present disclosure.

Referring to FIGS. 85A and 85B, the isotropic etch process can be continued until neighboring pairs of connection via cavities 83 merge as the bottom portions of the connection via cavities 83 expand below the horizontal plane including the interface between the alternating stack (32, 46) and the source-level material layers (112, 114, 116). Each merged portion of the connection via cavities 83 located below the horizontal plane including the interface between the alternating stack (32, 46) and the source-level material layers (112, 114, 116) may have a general shape of a pad, and is herein referred to as a pad cavity 83P. Thus, multiple connection via cavities 83 may be interconnected to each other through a common pad cavity 83P. In the sixth exemplary structure, portions of the source-level sacrificial layer 104, which may be portions of a dielectric material layer, such as a silicon nitride layer, may protrude from sidewalls of a pad cavity 83P and may include multiple holes therethrough, which correspond to the etched volumes of the source-level sacrificial layer 104 during formation of discrete connection via cavities 83 prior to the processing steps of FIGS. 86A and 86B.

Generally, a pad cavity 83P can be formed by recessing portions of the at least one semiconductor material layer (112, 116) around bottom regions of two or more connection via cavities 83. A continuous void comprising two or more connection via cavities 83 and the pad cavity 83P is formed. In one embodiment, a top portion of a pad cavity 83P may be vertically bounded by a first horizontal plane located at an interface between the alternating stack (32, 46) and the at least one semiconductor material layer (112, 114, 116).

Figure 86B:
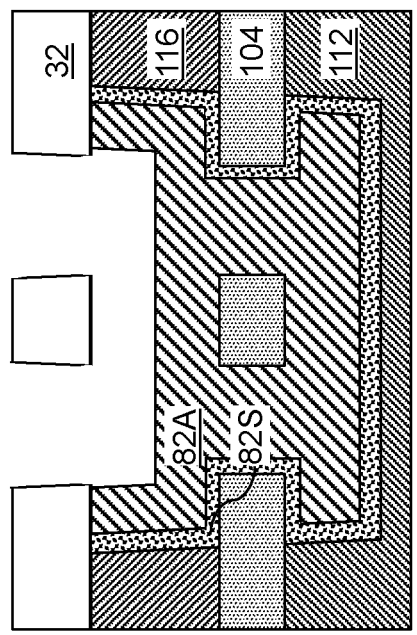
FIG. 86B is a schematic vertical cross-sectional view of bottom regions of connection via cavities after formation of a second base metal portion according to the sixth embodiment of the present disclosure.
Figure 86A:
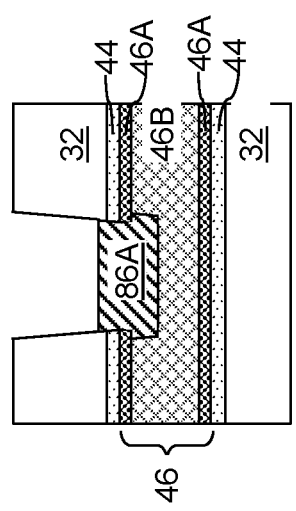
FIG. 86A is a schematic vertical cross-sectional view of a bottom region of a layer contact via cavity after formation of a first base metal portion according to the sixth embodiment of the present disclosure.

Referring to FIGS. 86A and 86B, the processing steps of FIGS. 74A and 74B can be performed to form the first base metal portion 86A, the second base metal portion 82A, and optionally the surface metal-semiconductor compound layers 82S.

Figure 87:
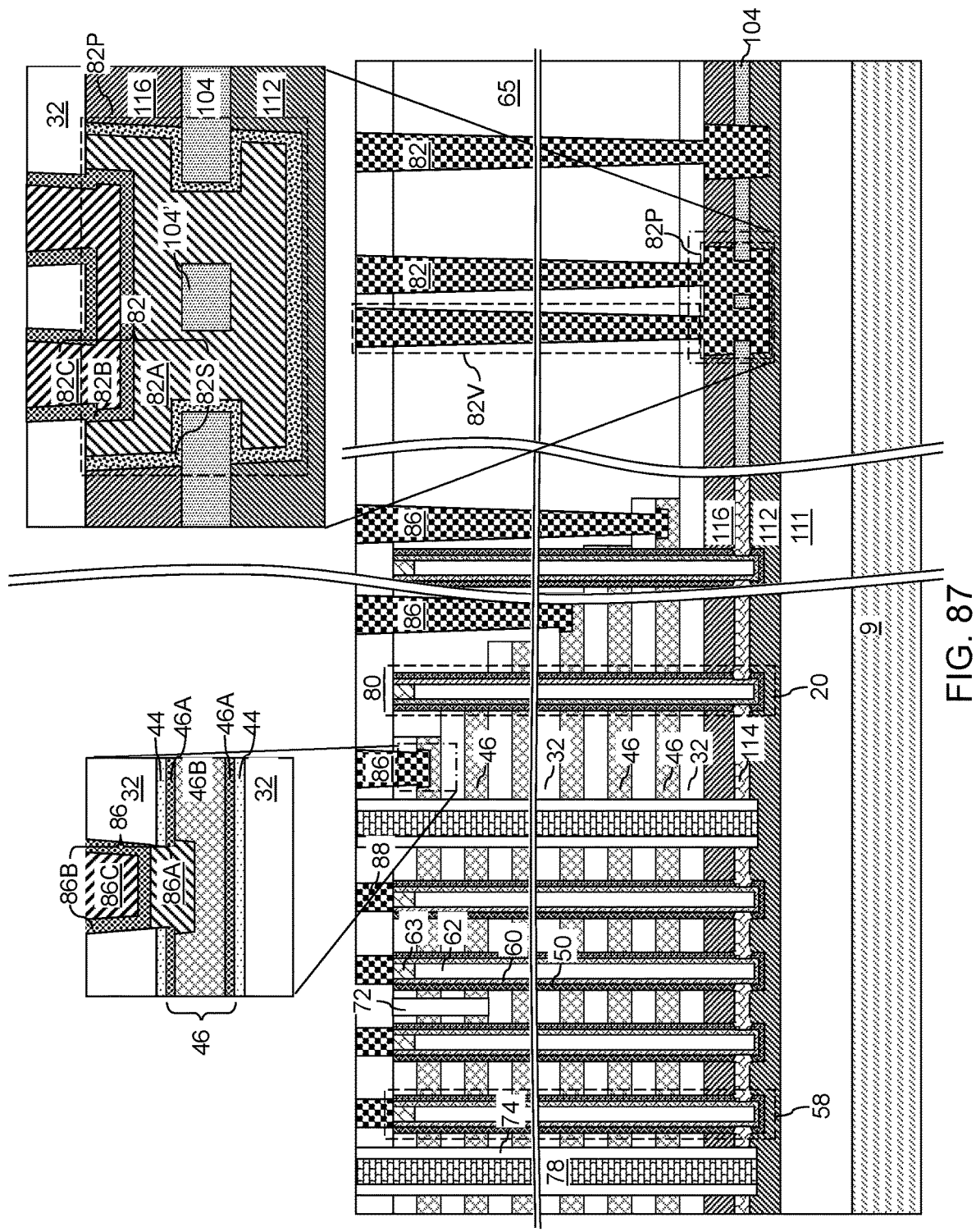
FIG. 87 is a schematic vertical cross-sectional view of the sixth exemplary structure after formation of layer contact via structures and connection via structures according to the sixth embodiment of the present disclosure.

Referring to FIG. 87, the processing steps of FIG. 75 can be performed to form layer contact via structures 86, connection via structures 84, and drain contact via structures 88. Subsequently, the processing steps of FIGS. 76-82 can be performed to provide various additional components. In this case, the anisotropic etch process that etches an unmasked portion of the source contact layer 114 may be modified to additionally etch an unmasked portion of the source-level sacrificial layer 104. Non-semiconductor-material portions 104' may be embedded within a conductive via portion 82P of an integrated via and pad structure 82. In one embodiment, a non-semiconductor material portion 104' may comprise a plurality of openings therethrough. In one embodiment, a non-semiconductor material portion 104' may be a dielectric material portion, such as a perforated silicon nitride plate.

The various embodiments of the present disclosure can be employed to provide a reliable electrical contact between backside contact pad structure 628B and least one connection via structure (84, 82V) through a planar metal pad (146, 246) or a conductive pad portion 82P. The planar metal pad (146, 246) or the planar conductive pad portion 82P act as an etch stop during etching of the cavity 613 and provide a more reliable contact to the backside contact pad structure 628B than exposed vertically protruding tips of the least one connection via structure (84, 82V). Further, electrical contact with electrically conductive layers 46 or the backside contact pad structure 628B may be enhanced through base metal portions (82A, 86A) that can be selectively deposited on metallic surfaces and semiconductor surfaces.

Although the foregoing refers to particular preferred embodiments, it will be understood that the claims are not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:
1. A semiconductor structure, comprising:
an alternating stack of insulating layers and electrically conductive layers;
memory openings vertically extending through the alternating stack;
memory opening fill structures located in the memory openings and comprising a respective vertical semiconductor channel and a respective vertical stack of memory elements;
a dielectric material portion;
contact via structures vertically extending through the dielectric material portion and contacting a respective one of the electrically conductive layers;
an integrated via and pad structure comprising a conductive via portion vertically extending through the dielectric material portion and contacting a front side of a conductive pad portion; and
a backside contact pad structure contacting a planar backside surface of the integrated via and pad structure;
wherein each of the contact via structures comprises a first base metal portion in contact with the respective one of the electrically conductive layers, a first metallic liner in contact with the first base metal portion, and a first metallic fill material portion that is laterally surrounded by the first metallic liner and vertically spaced from the first base metal portion by a horizontally-extending portion of the first metallic liner.

2. The semiconductor structure of claim 1, wherein the integrated via and pad structure comprises a second base metal portion located entirely within the conductive pad portion, a second metallic liner contacting the second base metal portion, and a second metallic fill material portion laterally surrounded by the second metallic liner.

3. The semiconductor structure of claim 2, wherein:
the first base metal portions and the second base metal portion have a first material composition;
the first metallic liners and the second metallic liner have a second material composition and a same thickness; and
the first metallic fill material portions and the second metallic fill material portion have a third metallic composition.

4. The semiconductor structure of claim 2, wherein:
the integrated via and pad structure comprises an additional conductive via portion that is physically connected to the conductive pad portion; and
the second metallic liner and the second metallic fill material portion continuously extend from the conductive via portion, through a portion of the conductive pad portion, and into the additional conductive via portion.

5. The semiconductor structure of claim 2, wherein:
an end periphery of the conductive via portion is adjoined to a horizontal top surface of the conductive pad portion;
the conductive pad portion comprises a segment of the second metallic liner and a segment of the second metallic fill material portion;
a first area of the horizontal top surface of the conductive pad portion comprises a surface of the second metallic liner; and
a second area of the horizontal top surface of the conductive pad portion comprises a surface of the second base metal portion.

6. The semiconductor structure of claim 2, wherein a vertical extent of the second metallic liner is greater than a vertical extent of the conductive via portion, and is less than a sum of a vertical extent of the conductive pad portion and the vertical extent of the conductive via portion.

7. The semiconductor structure of claim 1, wherein:
each of the electrically conductive layers comprises a metallic barrier liner and a metallic fill material layer; and
the metallic barrier liner and the metallic fill material layer are in direct contact with a respective one of the first base metal portions.

8. The semiconductor structure of claim 7, wherein:
each of the electrically conductive layers is vertically spaced from neighboring insulating layers of the insulating layers by backside blocking dielectric layers comprising a dielectric material; and
each of the first base metal portions is in direct contact with a respective surface segment of the backside blocking dielectric layers.

9. The semiconductor structure of claim 7, wherein each of the first base metal portions is in direct contact with a respective one of the insulating layers at a respective cylindrical contact area.

10. A semiconductor structure, comprising:
an alternating stack of insulating layers and electrically conductive layers;
memory openings vertically extending through the alternating stack;
memory opening fill structures located in the memory openings and comprising a respective vertical semiconductor channel and a respective vertical stack of memory elements;
a dielectric material portion;
contact via structures vertically extending through the dielectric material portion and contacting a respective one of the electrically conductive layers;
an integrated via and pad structure comprising a conductive via portion vertically extending through the dielectric material portion and contacting a front side of a conductive pad portion;
a backside contact pad structure contacting a planar backside surface of the integrated via and pad structure; and
at least one source-level semiconductor material layer contacting the alternating stack at an interface located within a first horizontal plane and contacting end portions of the vertical semiconductor channels;
wherein:
distal end surfaces of the contact via structures and a distal end surface of the conductive via portion are located within a second horizontal plane that is more distal from the first horizontal plane than a most distal surface of the alternating stack is from the first horizontal plane; and
the integrated via and pad structure comprises a surface metal-semiconductor compound layer that includes a compound of a metal within a second base metal portion and a semiconductor material within the at least one semiconductor material layer.

11. A semiconductor structure, comprising:
an alternating stack of insulating layers and electrically conductive layers;
memory openings vertically extending through the alternating stack;
memory opening fill structures located in the memory openings and comprising a respective vertical semiconductor channel and a respective vertical stack of memory elements;
a dielectric material portion;
contact via structures vertically extending through the dielectric material portion and contacting a respective one of the electrically conductive layers;
an integrated via and pad structure comprising a conductive via portion vertically extending through the dielectric material portion and contacting a front side of a conductive pad portion; and
a backside contact pad structure contacting a planar backside surface of the integrated via and pad structure,
wherein the conductive via portion has a variable horizontal cross-sectional area that increases with a vertical distance from the conductive pad portion.

* * * * *